United States Patent [19]

Kaplan et al.

[11] Patent Number: 5,325,091
[45] Date of Patent: Jun. 28, 1994

[54] TEXT-COMPRESSION TECHNIQUE USING FREQUENCY-ORDERED ARRAY OF WORD-NUMBER MAPPERS

[75] Inventors: Ronald M. Kaplan, Palo Alto; John T. Maxwell, III, Cupertino, both of Calif.

[73] Assignee: Xerox Corporation, Stamford, Conn.

[21] Appl. No.: 942,665

[22] Filed: Sep. 9, 1992

Related U.S. Application Data

[63] Continuation-in-part of Ser. No. 929,252, Aug. 13, 1992.

[51] Int. Cl.$^5$ ............................................. H03M 7/30
[52] U.S. Cl. ........................................ 341/51; 341/95
[58] Field of Search ............................. 341/50, 51, 95

[56] References Cited

U.S. PATENT DOCUMENTS 4,597,057  6/1986  Snow .................................. 364/900

OTHER PUBLICATIONS

Kaplan et al., U.S. Patent Application Serial No. 07/776,909, "Number/Word and Word/Number Mapping," filed Oct. 16, 1991.

Daniel M. Sunday, "A Very Fast Substring Search Algorithm," *Communications of the ACM*, Aug. 1990/vol. 33, No. 8.

*Primary Examiner*—Howard L. Williams
*Attorney, Agent, or Firm*—Townsend and Townsend Khourie and Crew

[57] ABSTRACT

A text-compression technique utilizes a plurality of word-number mappers ("WNMs") in a frequency-ordered hierarchical structure. The particular structure of the set of WNMs depends on the specific encoding regime, but can be summarized as follows. Each WNM in the set is characterized by an ordinal WNM number and a WNM size (maximum number of tokens) that is in general a non-decreasing function of the WNM number. A given token is assigned a number pair, the first being one of the WNM numbers, and the second being the token's position or number in that WNM. Typically, the most frequently occurring tokens are mapped with a smaller-numbered WNM. The set of WNMs is generated on a first pass through the database to be compressed. The database is parsed into tokens, and a rank-order list based on the frequency of occurrence is generated. This list is partitioned in a manner to define the set of WNMs. Actual compression of the data base occurs on a second pass, using the set of WNMs generated on the first pass. The database is parsed into tokens, and for each token, the set of WNMs is searched to find the token. Once the token is found, it is assigned the appropriate number pair and is encoded. This proceeds until the entire database has been compressed.

21 Claims, 4 Drawing Sheets

TEXT-COMPRESSION TECHNIQUE USING FREQUENCY-ORDERED ARRAY OF WORD-NUMBER MAPPERS

CROSS REFERENCE TO RELATED APPLICATIONS

This application is a continuation-in-part of copending application Ser. No. 07/929,252 filed on Aug. 13, 1992 is pending.

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

The present invention relates generally to data compression techniques, and more specifically to a text compression technique that is suitable for compressing text databases having a large number of different words.

Computer users are coming to expect large text databases at their fingertips, and this trend will continue as portable and hand-held computerized devices become more common. Compression ratio is a major issue, since many of the reference works that are candidates for being made available are rather long. A separate issue is whether the text has to be decompressed in order to search for particular strings. Many techniques are efficient in terms of compression ratio, but are context sensitive (i.e., searching the text requires decompression and decompressing one part requires decompressing other unrelated parts). This extra decompression step may slow down the search process to an unacceptable degree, thereby necessitating the use of faster (more expensive) hardware components.

One technique that has shown considerable promise and that has found its way into a number of commercial products in the last few years uses a data structure referred to as a word-number mapper ("WNM"). The WNM can be regarded conceptually as a table wherein each distinct word and punctuation mark, referred to as a token, in the database has an associated unique number. The table thus provides a unique bidirectional word-number mapping. The actual WNM is implemented as a highly compressed data structure.

Compression of the database occurs generally as follows. First the text is parsed into a sequence of alternating word and punctuation mark tokens, which are accumulated to build up the table. The table only includes one entry for each token type, no matter how often that type occurs in the text database. In a second pass, the text is again parsed into tokens, and each token is encoded by its unique number in the table. In one regime, most of the tokens are encoded as a two-byte number, but some are encoded as a single byte. By way of specific example, the Bible was found to have approximately 13,000 different token types while the Physician's Desk Reference was found to have approximately 25,000 different token types.

Decompression is the inverse process to compression. The numerical codes in the compressed string are converted to the corresponding uncompressed tokens using the same WNM that was used to compress the text in the first place. Account must be taken of the manner that the string of numerical codes was stored in the compression process.

SUMMARY OF THE INVENTION

The present invention provides a text-compression technique that is characterized by a relatively high compression ratio (on the order of 4:1 as opposed to the more typical 2.5:1). The technique is especially useful where the text database contains a very large number of distinct token types, and is based in part on the recognition that certain of the prior art techniques would break down if the number of distinct token types were to exceed the largest number that could be encoded in a particular size code.

In brief, the present invention utilizes a plurality of word-number mappers ("WNMs") in a frequency-ordered hierarchical structure. The particular structure of the set of WNMs depends on the specific encoding regime, but can be summarized as follows. Each WNM in the set is characterized by an ordinal WNM number and a WNM size (maximum number of tokens) that is in general a non-decreasing function of the WNM number. A given token is assigned a number pair, the first being one of the WNM numbers, and the second being the token's position or number in that WNM. Typically, the most frequently occurring tokens are mapped with a smaller-numbered WNM. This means that they can be represented by a shorter code (fewer bits).

The set of WNMs is generated on a first pass through the database to be compressed. The database is parsed into tokens, and a rank-order list based on the frequency of occurrence is generated. This list is partitioned in a manner to define the set of WNMs, with the particular details depending on the particular encoding regime. In a specific embodiment, the coding is on a nibble (four-bit) basis, with a given code having a variable number of nibbles. Provision is made so that the length of a particular code can be determined. In the specific embodiment, one of the bits is used to signify whether or not that nibble is the last nibble in the possibly multi-nibble code.

In the context of this particular coding regime, the eight most frequently occurring token types are assigned a three-bit number and are coded in a single nibble. These tokens define the first, eight-token WNM. The 64 next most frequently occurring token types are assigned a six-bit number and are coded in two nibbles. These tokens define the second, 64-token WNM. The 512 next most frequently occurring token types are assigned a 9-bit number and are coded in three nibbles. This encoding in increasing length codes based on lower frequency of occurrence continues until all of the token types have been assigned a number pair.

Actual compression of the data base occurs on a second pass, using the set of WNMs generated on the first pass. The database is parsed into tokens, and for each token, the set of WNMs is searched to find the token. Once the token is found, it is assigned the appropriate number pair and is encoded. This proceeds until the entire database has been compressed.

Searching for a particular string does not require decompression. Rather, the target string, as entered by the user, is compressed according to the same regime to yield a string of one or more nibbles, and a suitable substring searching algorithm is employed. Once the compressed search string is found in the compressed database, a suitable amount of the surrounding text (e.g., the paragraph that contains the search string) may be decompressed. The text can be searched backward and forward from the located search string to find the immediately preceding paragraph and immediately following paragraph breaks if it is desired to display the entire paragraph containing the search string.

A further aspect of the present invention is that it can be adapted for use with a database that is different from the database that was used to generate the set of WNMs. When the database that is to be compressed is different, there is no guarantee that the set of WNMs constructed using the original database will contain all the tokens in the new database. In fact, there is a strong likelihood that there will be some new tokens that are missing from the set of WNMs.

According to this aspect of the invention, a unique number pair is assigned to each possible individual character during the construction of the WNMs. When it is discovered during the compression that a token is absent from the WNMs, an auxiliary scheme is used. In one such scheme, the token is encoded as a plurality of individual character codes. This guarantees the ability to encode every possible string. While this tends to make the coded representation of the token longer than its original (say ASCII) representation, the provision of this facility allows normal search and decompression procedures to be carried out without modification. With such a set of WNMs, it is also possible to break a missing token into fragments that include multiple-character combinations which are already included in the WNMs. It is also possible to assign number pairs to a collection of common word segments so that words that are absent from the WNMs can be encoded as concatenations of word segments, individual characters, and known words that are present. This may permit unknown tokens to be represented in fewer bits than their original representations.

A further understanding of the nature and advantages of the present invention may be realized by reference to the remaining portions of the specification and the drawings.

DESCRIPTION OF SPECIFIC EMBODIMENT(S)

Overview

The present invention relates to a text compression technique with associated search and decompression techniques. The starting point is a raw text database such as a dictionary, encyclopedia, or novel, which may be in ASCII or any other format. In the first of two phases, the text database is analyzed and certain database-dependent data structures are generated. The data structures are then used to compress the database. In the present invention the data structures include a set of word-number mappers ("WNMs"). In the second phase, an end user, having been provided with the compressed database and relevant portions of the data structures, is able to decompress selected portions of the text, perhaps in response to a search for a particular target string.

Accordingly, the computer system or systems on which the software routines are developed and tested and on which the uncompressed text is processed are likely to be fairly powerful machines, such as a high-end personal computer or workstation. The end user machine can also be one of these, but can also be a small hand-held consumer device dedicated solely to searching and decompressing the particular text.

Figure 1A:
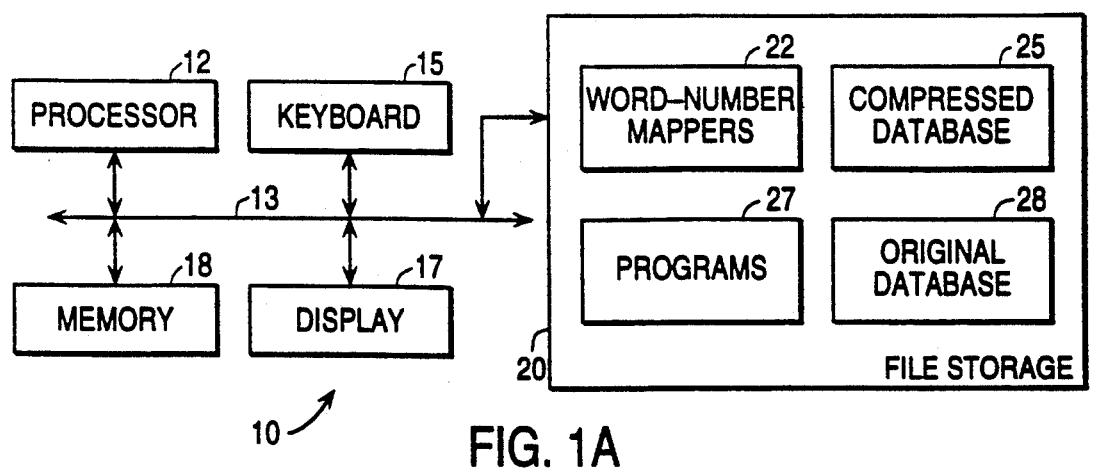
FIG. 1A is a block diagram of a general-purpose computer system embodying the present invention.

FIG. 1A is a block diagram of a typical general-purpose computer system 10 that might be used for developing the compressed database and data structures. The actual computer architecture is standard, including a processor 12, which communicates with a number of peripherals via a bus subsystem 13. The peripherals typically include a keyboard 15 for user inputs, a display 17 for input echoes and visual outputs, a memory including RAM 18 for processing data, and disk storage 20 for storing the WNMs 22, the compressed database 25, suitable programs 27, and possibly the raw text database 28. The computer would presumably be provided with I/O ports and other peripherals, which are not shown.

Figure 1B:
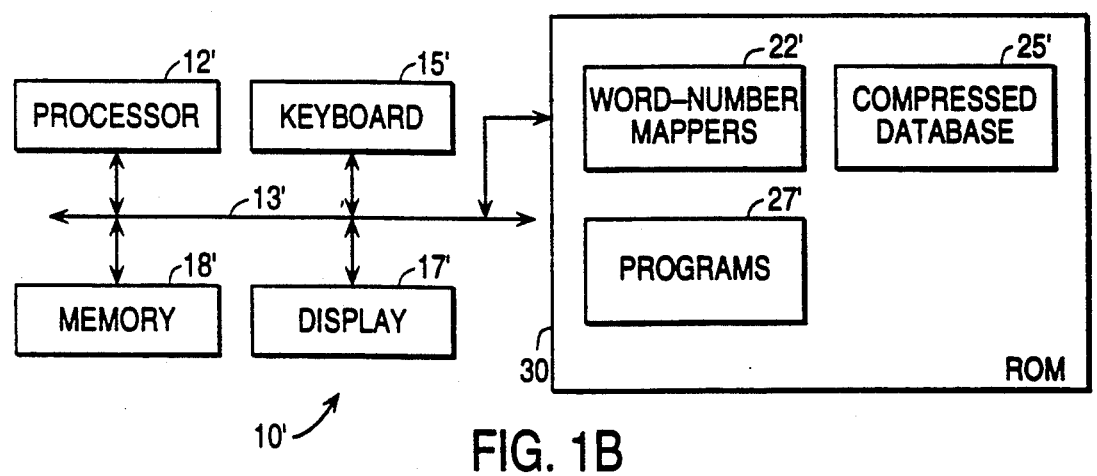
FIG. 1B is a block diagram of a computer suitable for an end user.

FIG. 1B is a block diagram of a typical computer 10' as might be embodied in a hand-held consumer device allowing the user to access the database. Primed reference numerals will be used for elements that functionally correspond to those in FIG. 1A The computer includes a processor 12', a keyboard or other input device 15', a display 17', RAM 18', and a ROM 30 in which are stored WNMs 22, compressed database 25', as well as the routines 27' necessary to access and display desired portions of the compressed database in uncompressed form.

Generating WNMs

Figure 2:
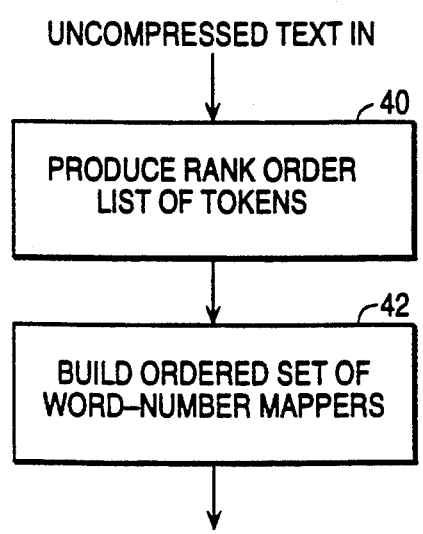
FIG. 2 is a flow diagram of the first phase of text compression according to the invention.

FIG. 2 is a flow diagram illustrating a technique for generating the WNMs. First, the original database is accessed, one token at a time, and a rank order list of tokens is generated (step 40). To this end, the text is parsed into a sequence of alternating word and punctuation-mark substring tokens. For example, the text string "Actually, the quick brown dog jumped over the lazy fox." would be parsed into the sequence:

"Actually" ", " "the" "" "quick" "" "brown" ""
"dog" "" "jumped" "" "over" "" "the" "" "lazy"
"" "fox" "."

The most commonly-occurring punctuation sequence, normally a single space, is defined as a default separator. All occurrences of that token are removed, with the understanding that unless there is a specific mark (e.g., $_{13}$) to indicate otherwise, the default separator is assumed to be present between every pair of tokens. Following this convention, the sample text becomes:

"Actually" "$_{13}$, " "the" "quick" "brown" "dog"
"jumped" "over" "the" "lazy" "dog" "$_{13\cdot 13}$"

The tokens are listed in order of frequency occurrence with each token being listed only once.

Figure 3:
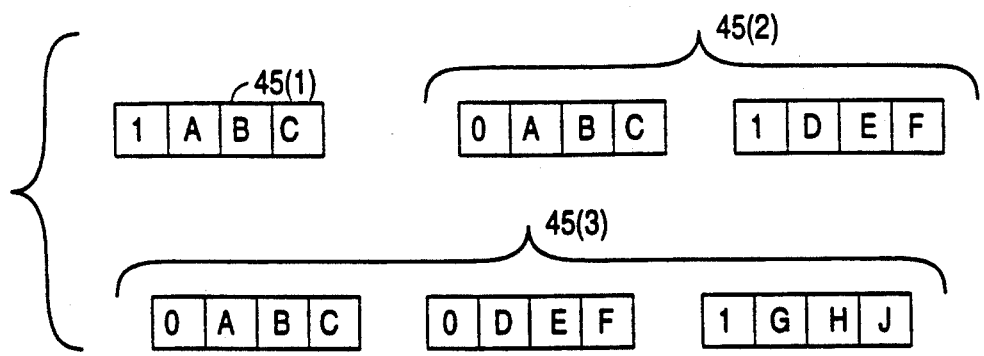
FIG. 3 illustrates schematically the variable length encoding of tokens.

The rank order list of tokens is then subdivided and an ordered set of WNMs is constructed (step 42). The list is segmented in a manner that depends on the particular coding regime. In the particular embodiment, the code digit is a four-bit nibble, and a token may comprise one or more code digits. FIG. 3 shows encoded tokens 45(1), 45(2), and 45(3) having one, two, and three nibbles, respectively. The letters A—J signify possible bit values (1 or 0). One bit (the letters order bit) in each code digit is reserved as a continuation bit, indicating whether that code digit is the last code digit of all the code digits that make up a particular coded token.

For the general case where the code digit is n bits with one bit as a continuation bit, there are $2^{(n-1)*i}$ possible distinct tokens that can be encoded in i digits. In the specific case, there are eight possible single-nibble codes, 64 possible two-nibble codes, 512 possible three-nibble codes, etc. The eight most common tokens are represented as a single nibble, with the continuation bit set to "1" to indicate that the nibble is the last (and only) nibble in the coded token. The 64 next most frequently-occurring tokens are encoded in two nibbles, the first nibble having the continuation bit set to "0" and the second having it set to "1".

Each WNM is characterized by an ordinal WNM number and a WNM size that is the maximum number of tokens for the WNM. The first WNM assigns a unique number between 0 and 7 to each of the eight most frequently-occurring tokens, the second WNM assigns a unique number between 0 and 63 to each of the 64 next most frequently occurring tokens, the third WNM assigns a unique number between 0 and 511 to the 512 next most commonly occurring tokens, and so on. Thus, each token type has an associated unique number pair, namely the number of the WNM in which the token is stored and the token's number or position in that WNM.

Appendix A shows the token lists for the first three WNMs for a representative database (Random-House Encyclopedia). The underscore character is the no-space indicator; the vertical up arrow indicates that the letter that follows is uppercase; two up arrows indicate that the word that follows is all uppercase; the vertical bar indicates a carriage return; two backslashes indicate a tab; the left and right curly brackets indicate the start and end of a cross-reference; and other special characters represent special characters or formatting information. While the list within which a token occurs is indicative of frequency, the order of tokens within a given list is not.

A particularly efficient WNM is described in commonly-owned copending application Ser. No. 07/776,909, filed Oct. 16, 1991, to Kaplan et al. This application, titled "Number/Word and Word/Number Mapping," is hereby incorporated by reference. The WNMs are constructed using finite state machine ("FSM") technology, with the resulting data structure requiring only about one byte per word.

Compression, Decompression, and Searching

Figure 4:
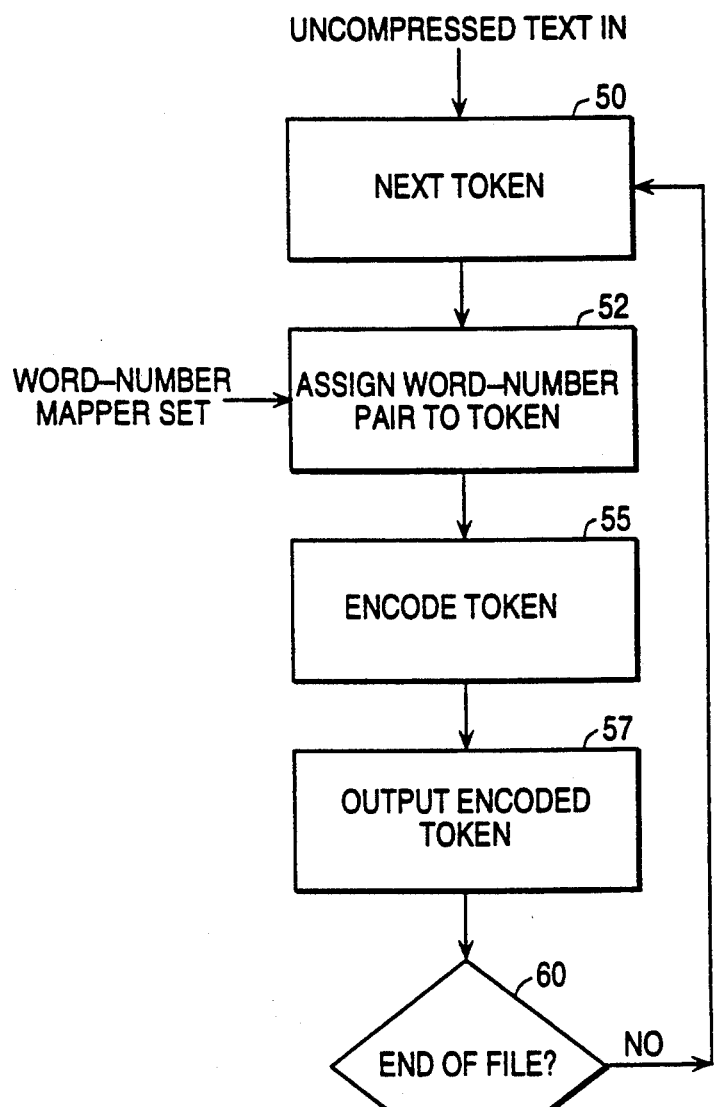
FIG. 4 is a flow diagram illustrating the second phase of text compression according to the invention.

FIG. 4 is a flow diagram illustrating a technique for compressing the text database. The uncompressed text string is read in and parsed into tokens as discussed above, and the next token (which in the first instance is the first) is extracted (step 50). The token is communicated to the WNM set, which provides the unique word number pair associated with that token (step 52). Based on the number pair, the token is encoded as illustrated in FIG. 3 (step 55). In general, the number of nibbles used is determined by the ordinal WNM number. The encoded token, which may be from one nibble to as many nibbles as there are WNMs in the set, is output for insertion into the compressed database (step 57). A check is made (step 60) to determine whether there are any more tokens in the database that have not been encoded. If there are, a branch is taken to step 50 where the next token is obtained; otherwise the compression is considered complete. The above sequence repeats until all the tokens in the input string have been encoded.

Figure 5:
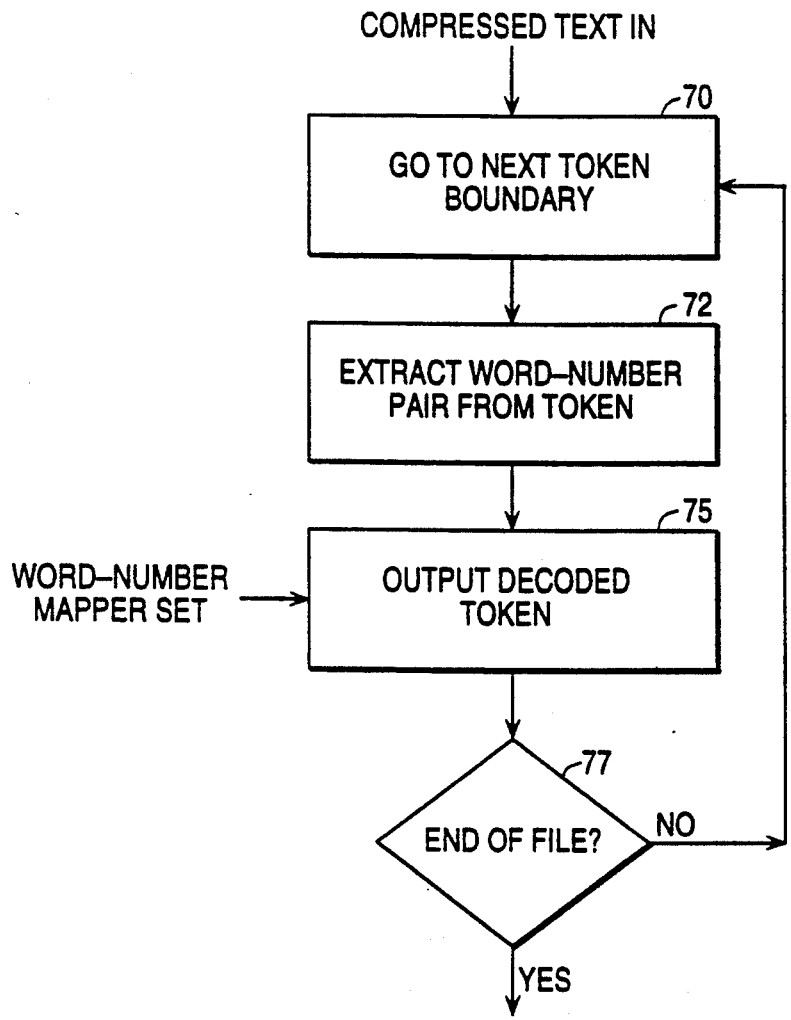
FIG. 5 is a flow diagram of text decompression according to the invention.
Figure 6:
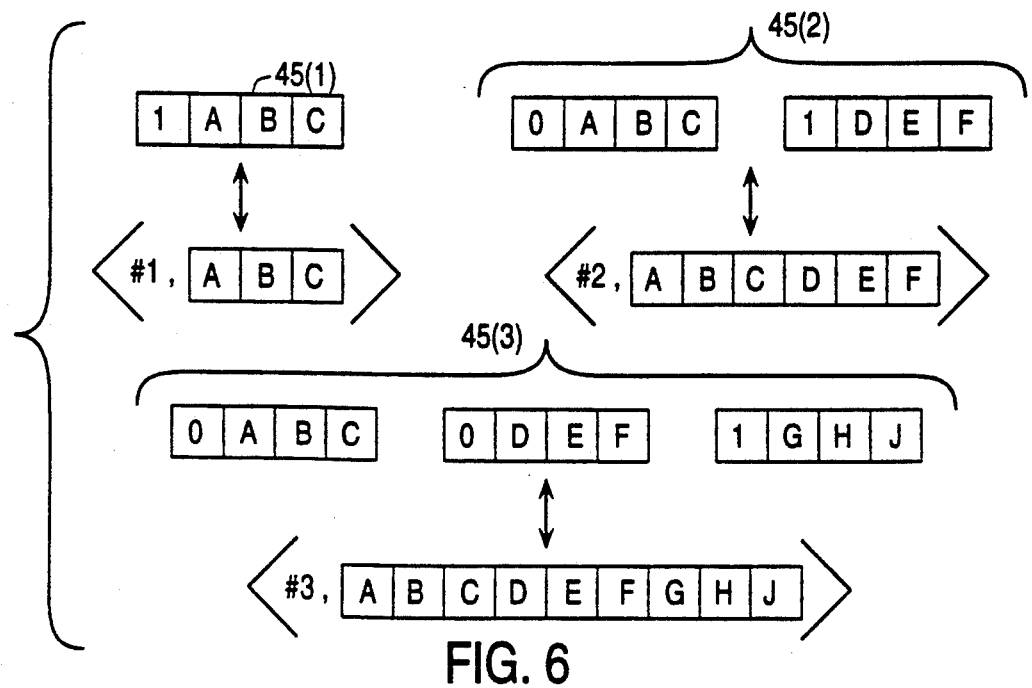
FIG. 6 illustrates schematically the extraction of number pairs from coded data, and vice versa.

FIG. 5 is a flow diagram illustrating a technique for decompressing a string of compressed text. The technique is basically the inverse of the compression technique described above. The next token boundary (which in the first instance is the first token boundary) is found (step 70), and the number pair is extracted from the encoded token (step 72). As discussed above, the token boundary is determined by a nibble having its high-order bit set. This first number in the number pair is determined by the number of nibbles in the encoded token, and the second number is generated by concatenating the data portions of the nibbles. This is accomplished by shifting and ORing the various trios of data bits, or by any other suitable technique. This transformation and its inverse are shown schematically in FIG. 6. The number so generated is communicated to the appropriate numbered WNM, and the decoded token is output (step 75) to become part of the decompressed text string. A check is made (step 77) to determine whether there are any more tokens in the string. If there are, a branch is taken to step 72 where the next token is obtained; otherwise, the decompression is considered complete.

Searching for a target string in the compressed database is carried out in a straightforward manner and does not require decompression. The target string, which may be entered by the user, is compressed according to the same regime that was used to compress the original database. The search for the compressed target string in the compressed database can be conducted by any efficient substring searching algorithm, such as the well known Boyer-Moore algorithm (and derivatives) and the Knuth-Morris-Pratt algorithm. See for example, Daniel M. Sunday, "A Very Fast Substring Search Algorithm", *Communications ACM*, Aug. 1990, Vol. 33, No. 8, pp. 32–142.

When a match is found, a simple test is performed to confirm that the matched string is not the suffix of a longer string of code digits encoding some other word. In particular, it is determined whether the continuation bit of the immediately preceding code digit is set to 1. If so, the matching string is the desired one; otherwise the search continues.

Once the target string is found, it is decompressed. In some instances, some amount of surrounding text is also decompressed. This can be accomplished by decompressing a given number of tokens in each direction, or by searching for paragraph breaks in both directions and decompressing the intervening tokens, depending on what is desired.

Database with Missing Tokens

Figure 7:
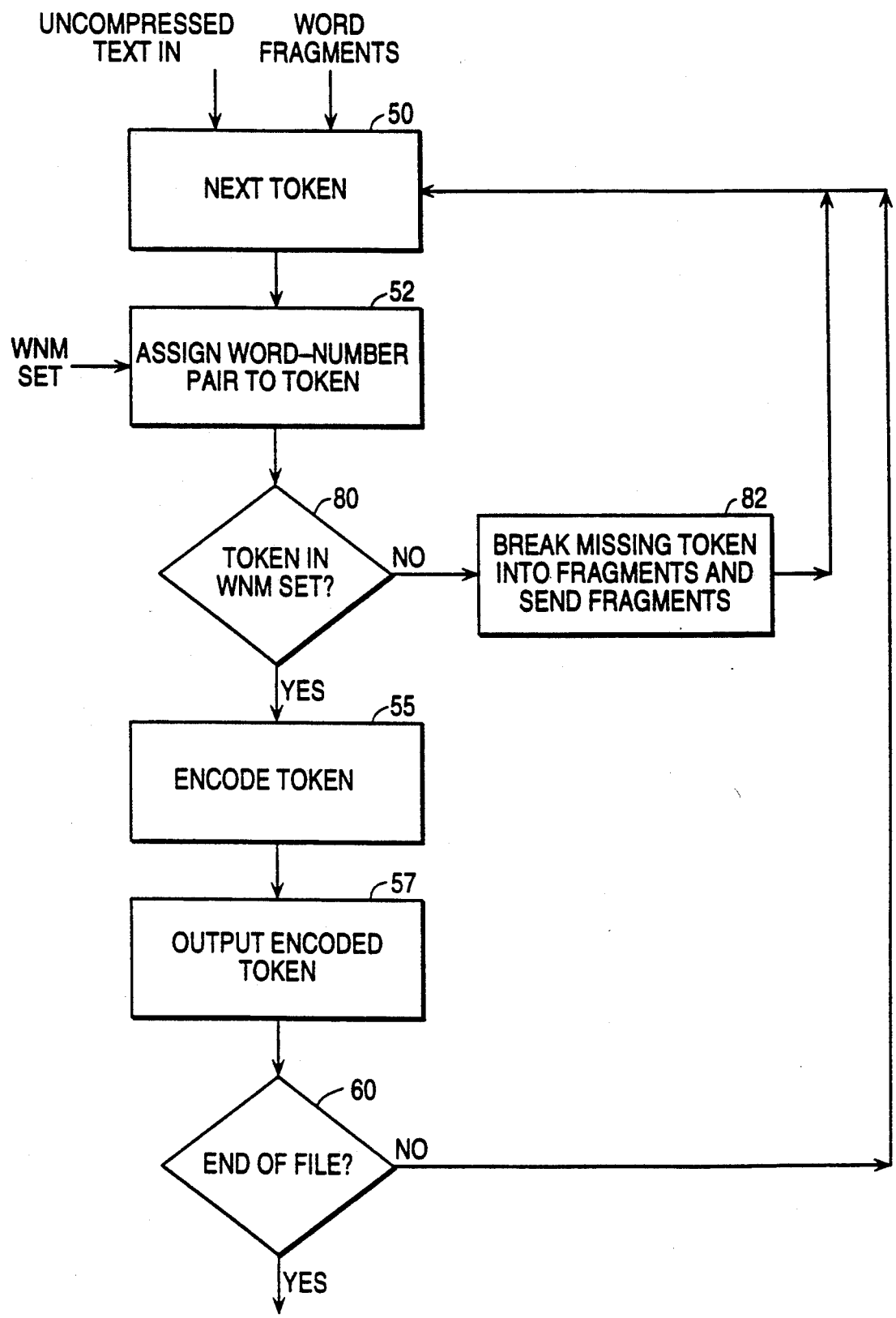
FIG. 7 is a flow diagram of text compression with possibly missing tokens.

FIG. 7 is a flow diagram illustrating an adaptation of the compression technique described above to accommodate a situation where the database to be compressed is different from the database that was used to create the WNM tables. Thus, while the above discussion assumed that every token would be present in the set of WNMs, the situation being discussed here is that some tokens in the input text stream are not present in the WNMs. These may be referred to as missing tokens. The adaptation described below can also be applied to the prior art compression technique using a single WNM.

The basic technique entails two modifications. First, the WNM(s) are provided with an additional set of tokens that include at least the individual characters that are not already in the database. For example, "a" and "I" are likely to be in the database because they are common words, but "b" and "t" are unlikely to be present. Therefore, a possibility is to reserve tokens in the three-nibble range (the 512-token WNM) for the single characters. The additional set of tokens may also include common word fragments such as suffixes and prefixes Examples would be "un", "non-", "ment", and "ing". The fragment tokens would be delimited by the "no-space" character.

The second modification is that an auxiliary coding scheme is provided for the case where a token is not found in the WNM(s). In the preferred scheme, the missing tokens are decomposed into fragments, which may be words that were in the original database or may be the additional tokens discussed above. These fragments are encoded in the same way other tokens are encoded.

The basic flow is generally as described above in connection with FIG. 4, and corresponding reference numerals are used where appropriate. The modifications include a check (step 80) whether the incoming token was found in the WNM(s). If it was, encoding of the token and output to the compressed database occurs (steps 55 and 57). If not, a branch is taken to break the missing token into fragments (step 82). The fragments are made available as the input stream at step 50 and processing continues. At step 82, it is not generally assumed that the fragment will be present in the WMN(s), and each fragment is therefore subject to further fragmentation if it is found to be missing (and is more than one character long).

There are a number of possible strategies for fragmenting a missing token, and the precise flow will depend on the particular strategy chosen. For example, a missing token can be decomposed into single characters and each character encoded. This simple scheme guarantees that each fragment will be found. More elaborate schemes would attempt to produce larger fragments that would be found. For example, one possible scheme would send the largest possible fragment (say all but the last letter of the missing token), and if that fragment were found to be missing, the next largest fragment (say all but the last two letters of the missing token) would be sent. This process would be repeated until a fragment of some size was found not to be missing. At that point, the remaining fragment would be sent, and if it were found to be missing, successively smaller fragments would be sent. If the missing token will be made up of at least some multi-character tokens, the net result may well be shorter than the original ASCII. There is obviously a trade-off between compression time and compression ratio. As a practical matter, the overall result would not be significantly degraded since the number of missing tokens is likely to be a small percentage of the overall number of tokens.

The elements that are concatenated to make up a missing word must all be connected without intervening spaces. This could be accomplished by placing a cancel-separator (no-space) token between each fragment, but this might increase the size of the compaction compared to an alternative method. In the alternative, a small set of special strings is added to the database only for the purpose of being used in fragments. These special strings can therefore have the cancel-separator mark included on one side or the other. If $_{13}$ is the cancel-separator mark, then we add the strings "a$_{13}$", "b", "c", not only for letters but also for all other possible byte codes. Then a missing word, say "aardvark" can be encoded as the sequence of tokens "a$_{13}$" "a$_{13}$" "r$_{13}$" "d$_{13}$" "v$_{13}$" "a$_{13}$" "r$_{13}$" k$_{13}$".

If this is followed by a space in the original text, then another token must be added at the end to cancel out the final cancel-separator. The token "" (the empty string) can serve this purpose: The space that normally would appear before this token is suppressed by the "k$_{13}$", leaving only the space that would normally appear afterwards. With strings of this kind, every possible string can be encoded in no more than N+1 tokens, where N is the length of the string.

Longer word fragments such as prefixes and suffixes can also be coded according to this strategy. Common prefixes will always have a cancel-separator attached to their ends, so that they can simply be concatenated with the root-word to the right, while common suffixes will have the cancel mark to the left. Thus, "untalkative" could be coded as "un$_{13}$" "talk" "$_{13}$ative".

These additional tokens can be distributed into the different WNMs according to an intuitive estimate of how likely they are to be used in coding missing strings. Alternatively, a more precise allocation of fragments to WNMs can be accomplished in the following way. A fairly large corpus is gathered of the sort of texts that the system will typically be applied to. That corpus is divided into two halves, at random, and one half is used to build the list of known tokens. Then this token list is used to tokenize the second half, except that now fragments are used to tokenize words that are not already in the first-half list. The WNMs are then built from the ranklist obtained from tokenizing the second half of the corpus in this way.

Discussion of the Software

Appendix B (©1992 Unpublished Work, Xerox Corporation) provides a code listing in the Interlisp programming language (described in the Interlisp Reference Manual and commercially available from Venue Corporation) of the programs necessary to implement the essential features of this invention. These include first-pass routines for tokenizing a text file, producing a ranklist of tokens, building a sequence of WNMs according to the ranklist and a specification of digit sizes. Second pass routines tokenize the text again but use the WNMs and digitspec from the first pass to produce a file containing the compact encoding of the original text file. A simple routine for decompressing the compact file to recover the original is also given along with a simple search routine.

This particular search routine does not require that all the digits be of the same width; therefore it maintains its alignment of tokens as it goes along so as to avoid depending on the continuation bit of a previous digit. It will be obvious to one skilled in the art how to remove the token-alignment loop in favor of the prior continuation test when the digits are known to be of equal width, and also then how to modify this routine to conduct the search in backwards order. Similarly, the tokenizer in Appendix A does not attempt to combine high-frequency word sequences such as "of" followed by "the" into a single token "of the" but it will be obvious to one skilled in the art how this can be accomplished.

Certain ancillary routines are not included, but can be easily created by one skilled in the art. These routines and a brief description of their behavior is listed here:

NULLFSM: creates a data-structure representing a finite state machine that accepts the null or empty language, the empty set of strings.

ADDSTRINGTOFSM: Given an FSM data structure and a string, modifies the FSM so that it accepts the given string as well as all previous strings accepted. This can be defined as (UNION FSM (STRINGTOFSM STRING)), where UNION and STRINGTOFSM (which creates an FSM representing a single string) are straightforward operations.

Information about further routines not included in Appendix A is given in the above-mentioned commonly assigned application Ser. No. 07/776,909. These are:

WRITE-WORDNUMBER-MAPPERS: This is a simple variation of the routine described in the referenced application for creating a binary file representation of a compact word-number mapper from an FSM. This one creates an ordered set of mappers from an ordered list of FSMs.

READ-WORDNUMBER-MAPPERS: Reads the binary file representation of an ordered set of word-number mappers (created by WRITE-WORDNUMBER-MAPPERS) into an ordered list in memory, where they can be used to perform GetWordForNumber and GetNumberForWord.

GetWordForNumber: The routine described in the word-number mapping application for obtaining the string corresponding to a given number.

GetNumber-ForWord: The routine described in the word-number mapping application for obtaining the number corresponding to a given string.

Conclusion

In conclusion, it can be seen that the present invention provides a particularly effective compression technique. The technique is readily adaptable to databases with a large number of distinct tokens, and further can be used with unknown databases.

While the above is a complete description of a specific embodiment of the invention, alternatives are possible. For example, the encoding could be by a different regime. For example, with eight-bit code digits, there would be seven bits of precision, which means that a smaller percentage of the bits would be devoted to overhead (continuation bits). However, the most frequently occurring eight words would require twice the number of bits in their compressed form. The steepness of the frequency distribution determines which digit encoding is most advantageous. While it is possible to have digits of varying length in a single token (e.g., 4-4-8-8), such an encoding scheme makes it impossible to search backwards.

Therefore, the above description should not be taken as limiting the scope of the invention which is defined by the claims.

Appendix A

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 8  XX XX XX XX XX XX XX | 8 | 1  6  XX XX XX XX XX 1 | 8 | 2  XX 7  XX XX XX XX XX | 9 |
| 1  7  XX XX XX XX XX XX | 8 | 2  XX 5  XX XX XX XX 1 | 8 | 1  1  7  XX XX XX XX XX | 9 |
| 2  XX 6  XX XX XX XX XX | 8 | 1  1  5  XX XX XX XX 1 | 8 | 3  XX XX 6  XX XX XX XX | 9 |
| 1  1  6  XX XX XX XX XX | 8 | 3  XX XX 4  XX XX XX 1 | 8 | 1  2  XX 6  XX XX XX XX | 9 |
| 3  XX XX 5  XX XX XX XX | 8 | 1  2  XX 4  XX XX XX 1 | 8 | 2  XX 1  6  XX XX XX XX | 9 |
| 1  2  XX 5  XX XX XX XX | 8 | 2  XX 1  4  XX XX XX 1 | 8 | 1  1  1  6  XX XX XX XX | 9 |
| 2  XX 1  5  XX XX XX XX | 8 | 1  1  1  4  XX XX XX 1 | 8 | 4  XX XX XX 5  XX XX XX | 9 |
| 1  1  1  5  XX XX XX XX | 8 | 4  XX XX XX 3  XX XX 1 | 8 | 1  3  XX XX 5  XX XX XX | 9 |
| 4  XX XX XX 4  XX XX XX | 8 | 1  3  XX XX 3  XX XX 1 | 8 | 2  XX 2  XX 5  XX XX XX | 9 |
| 1  3  XX XX 4  XX XX XX | 8 | 2  XX 2  XX 3  XX XX 1 | 8 | 1  1  2  XX 5  XX XX XX | 9 |
| 2  XX 2  XX 4  XX XX XX | 8 | 1  1  2  XX 3  XX XX 1 | 8 | 3  XX XX 1  5  XX XX XX | 9 |
| 1  1  2  XX 4  XX XX XX | 8 | 3  XX XX 1  3  XX XX 1 | 8 | 1  2  XX 1  5  XX XX XX | 9 |
| 3  XX XX 1  4  XX XX XX | 8 | 1  2  XX 1  3  XX XX 1 | 8 | 2  XX 1  1  5  XX XX XX | 9 |
| 1  2  XX 1  4  XX XX XX | 8 | 2  XX 1  1  3  XX XX 1 | 8 | 1  1  1  1  5  XX XX XX | 9 |
| 2  XX 1  1  4  XX XX XX | 8 | 1  1  1  1  3  XX XX 1 | 8 | 5  XX XX XX XX 4  XX XX | 9 |
| 1  1  1  1  4  XX XX XX | 8 | 5  XX XX XX XX 2  XX 1 | 8 | 1  4  XX XX XX 4  XX XX | 9 |
| 5  XX XX XX XX 3  XX XX | 8 | 1  4  XX XX XX 2  XX 1 | 8 | 2  XX 3  XX XX 4  XX XX | 9 |
| 1  4  XX XX XX 3  XX XX | 8 | 2  XX 3  XX XX 2  XX 1 | 8 | 1  1  3  XX XX 4  XX XX | 9 |
| 2  XX 3  XX XX 3  XX XX | 8 | 1  1  3  XX XX 2  XX 1 | 8 | 3  XX XX 2  XX 4  XX XX | 9 |
| 1  1  3  XX XX 3  XX XX | 8 | 3  XX XX 2  XX 2  XX 1 | 8 | 1  2  XX 2  XX 4  XX XX | 9 |
| 3  XX XX 2  XX 3  XX XX | 8 | 1  2  XX 2  XX 2  XX 1 | 8 | 2  XX 1  2  XX 4  XX XX | 9 |
| 1  2  XX 2  XX 3  XX XX | 8 | 2  XX 1  2  XX 2  XX 1 | 8 | 1  1  1  2  XX 4  XX XX | 9 |
| 2  XX 1  2  XX 3  XX XX | 8 | 1  1  1  2  XX 2  XX 1 | 8 | 4  XX XX XX 1  4  XX XX | 9 |
| 1  1  1  2  XX 3  XX XX | 8 | 4  XX XX XX 1  2  XX 1 | 8 | 1  3  XX XX 1  4  XX XX | 9 |
| 4  XX XX XX 1  3  XX XX | 8 | 1  3  XX XX 1  2  XX 1 | 8 | 2  XX 2  XX 1  4  XX XX | 9 |
| 1  3  XX XX 1  3  XX XX | 8 | 2  XX 2  XX 1  2  XX 1 | 8 | 1  1  2  XX 1  4  XX XX | 9 |
| 2  XX 2  XX 1  3  XX XX | 8 | 1  1  2  XX 1  2  XX 1 | 8 | 3  XX XX 1  1  4  XX XX | 9 |
| 1  1  2  XX 1  3  XX XX | 8 | 3  XX XX 1  1  2  XX 1 | 8 | 1  2  XX 1  1  4  XX XX | 9 |
| 3  XX XX 1  1  3  XX XX | 8 | 1  2  XX 1  1  2  XX 1 | 8 | 2  XX 1  1  1  4  XX XX | 9 |
| 1  2  XX 1  1  3  XX XX | 8 | 2  XX 1  1  1  2  XX 1 | 8 | 1  1  1  1  1  4  XX XX | 9 |
| 2  XX 1  1  1  3  XX XX | 8 | 1  1  1  1  1  2  XX 1 | 8 | 6  XX XX XX XX XX 3  XX | 9 |
| 1  1  1  1  1  3  XX XX | 8 | 6  XX XX XX XX XX 1  1 | 8 | 1  5  XX XX XX XX 3  XX | 9 |
| 6  XX XX XX XX XX 2  XX | 8 | 1  5  XX XX XX XX 1  1 | 8 | 2  XX 4  XX XX XX 3  XX | 9 |
| 1  5  XX XX XX XX 2  XX | 8 | 2  XX 4  XX XX XX 1  1 | 8 | 1  1  4  XX XX XX 3  XX | 9 |
| 2  XX 4  XX XX XX 2  XX | 8 | 1  1  4  XX XX XX 1  1 | 8 | 3  XX XX 3  XX XX 3  XX | 9 |
| 1  1  4  XX XX XX 2  XX | 8 | 3  XX XX 3  XX XX 1  1 | 8 | 1  2  XX 3  XX XX 3  XX | 9 |
| 3  XX XX 3  XX XX 2  XX | 8 | 1  2  XX 3  XX XX 1  1 | 8 | 2  XX 1  3  XX XX 3  XX | 9 |
| 1  2  XX 3  XX XX 2  XX | 8 | 2  XX 1  3  XX XX 1  1 | 8 | 1  1  1  3  XX XX 3  XX | 9 |
| 2  XX 1  3  XX XX 2  XX | 8 | 1  1  1  3  XX XX 1  1 | 8 | 4  XX XX XX 2  XX 3  XX | 9 |
| 1  1  1  3  XX XX 2  XX | 8 | 4  XX XX XX 2  XX 1  1 | 8 | 1  3  XX XX 2  XX 3  XX | 9 |
| 4  XX XX XX 2  XX 2  XX | 8 | 1  3  XX XX 2  XX 1  1 | 8 | 2  XX 2  XX 2  XX 3  XX | 9 |
| 1  3  XX XX 2  XX 2  XX | 8 | 2  XX 2  XX 2  XX 1  1 | 8 | 1  1  2  XX 2  XX 3  XX | 9 |
| 2  XX 2  XX 2  XX 2  XX | 8 | 1  1  2  XX 2  XX 1  1 | 8 | 3  XX XX 1  2  XX 3  XX | 9 |
| 1  1  2  XX 2  XX 2  XX | 8 | 3  XX XX 1  2  XX 1  1 | 8 | 1  2  XX 1  2  XX 3  XX | 9 |
| 3  XX XX 1  2  XX 2  XX | 8 | 1  2  XX 1  2  XX 1  1 | 8 | 2  XX 1  1  2  XX 3  XX | 9 |
| 1  2  XX 1  2  XX 2  XX | 8 | 2  XX 1  1  2  XX 1  1 | 8 | 1  1  1  1  2  XX 3  XX | 9 |
| 2  XX 1  1  2  XX 2  XX | 8 | 1  1  1  1  2  XX 1  1 | 8 | 5  XX XX XX XX 1  3  XX | 9 |
| 1  1  1  1  2  XX 2  XX | 8 | 5  XX XX XX XX 1  1  1 | 8 | 1  4  XX XX XX 1  3  XX | 9 |
| 5  XX XX XX XX 1  2  XX | 8 | 1  4  XX XX XX 1  1  1 | 8 | 2  XX 3  XX XX 1  3  XX | 9 |
| 1  4  XX XX XX 1  2  XX | 8 | 2  XX 3  XX XX 1  1  1 | 8 | 1  1  3  XX XX 1  3  XX | 9 |
| 2  XX 3  XX XX 1  2  XX | 8 | 1  1  3  XX XX 1  1  1 | 8 | 3  XX XX 2  XX 1  3  XX | 9 |
| 1  1  3  XX XX 1  2  XX | 8 | 3  XX XX 2  XX 1  1  1 | 8 | 1  2  XX 2  XX 1  3  XX | 9 |
| 3  XX XX 2  XX 1  2  XX | 8 | 1  2  XX 2  XX 1  1  1 | 8 | 2  XX 1  2  XX 1  3  XX | 9 |
| 1  2  XX 2  XX 1  2  XX | 8 | 2  XX 1  2  XX 1  1  1 | 8 | 1  1  1  2  XX 1  3  XX | 9 |
| 2  XX 1  2  XX 1  2  XX | 8 | 1  1  1  2  XX 1  1  1 | 8 | 4  XX XX XX 1  1  3  XX | 9 |
| 1  1  1  2  XX 1  2  XX | 8 | 4  XX XX XX 1  1  1  1 | 8 | 1  3  XX XX 1  1  3  XX | 9 |
| 4  XX XX XX 1  1  2  XX | 8 | 1  3  XX XX 1  1  1  1 | 8 | 2  XX 2  XX 1  1  3  XX | 9 |
| 1  3  XX XX 1  1  2  XX | 8 | 2  XX 2  XX 1  1  1  1 | 8 | 1  1  2  XX 1  1  3  XX | 9 |
| 2  XX 2  XX 1  1  2  XX | 8 | 1  1  2  XX 1  1  1  1 | 8 | 3  XX XX 1  1  1  3  XX | 9 |
| 1  1  2  XX 1  1  2  XX | 8 | 3  XX XX 1  1  1  1  1 | 8 | 1  2  XX 1  1  1  3  XX | 9 |
| 3  XX XX 1  1  1  2  XX | 8 | 1  2  XX 1  1  1  1  1 | 8 | 2  XX 1  1  1  1  3  XX | 9 |
| 1  2  XX 1  1  1  2  XX | 8 | 2  XX 1  1  1  1  1  1 | 8 | 1  1  1  1  1  1  3  XX | 9 |
| 2  XX 1  1  1  1  2  XX | 8 | 1  1  1  1  1  1  1  1 | 8 | 7  XX XX XX XX XX XX 2 | 9 |
| 1  1  1  1  1  1  2  XX | 8 | 9  XX XX XX XX XX XX XX | 9 | 1  6  XX XX XX XX XX 2 | 9 |
| 7  XX XX XX XX XX XX 1 | 8 | 1  8  XX XX XX XX XX XX | 9 | 2  XX 5  XX XX XX XX 2 | 9 |

| Inputs (from stagger position) 0 1 2 3 4 5 6 7 | Output |
|---|---|
| 1  1  5  XX XX XX XX 2 | 9 |
| 3  XX XX 4  XX XX XX 2 | 9 |
| 1  2  XX 4  XX XX XX 2 | 9 |
| 2  XX 1  4  XX XX XX 2 | 9 |
| 1  1  1  4  XX XX XX 2 | 9 |
| 4  XX XX XX 3  XX XX 2 | 9 |
| 1  3  XX XX 3  XX XX 2 | 9 |
| 2  XX 2  XX 3  XX XX 2 | 9 |
| 1  1  2  XX 3  XX XX 2 | 9 |
| 3  XX XX 1  3  XX XX 2 | 9 |
| 1  2  XX 1  3  XX XX 2 | 9 |
| 2  XX 1  1  3  XX XX 2 | 9 |
| 1  1  1  1  3  XX XX 2 | 9 |
| 5  XX XX XX XX 2  XX 2 | 9 |
| 1  4  XX XX XX 2  XX 2 | 9 |
| 2  XX 3  XX XX 2  XX 2 | 9 |
| 1  1  3  XX XX 2  XX 2 | 9 |
| 3  XX XX 2  XX 2  XX 2 | 9 |
| 1  2  XX 2  XX 2  XX 2 | 9 |
| 2  XX 1  2  XX 2  XX 2 | 9 |
| 1  1  1  2  XX 2  XX 2 | 9 |
| 4  XX XX XX 1  2  XX 2 | 9 |
| 1  3  XX XX 1  2  XX 2 | 9 |
| 2  XX 2  XX 1  2  XX 2 | 9 |
| 1  1  2  XX 1  2  XX 2 | 9 |
| 3  XX XX 1  1  2  XX 2 | 9 |
| 1  2  XX 1  1  2  XX 2 | 9 |
| 2  XX 1  1  1  2  XX 2 | 9 |
| 1  1  1  1  1  2  XX 2 | 9 |
| 6  XX XX XX XX XX 1  2 | 9 |
| 1  5  XX XX XX XX 1  2 | 9 |
| 2  XX 4  XX XX XX 1  2 | 9 |
| 1  1  4  XX XX XX 1  2 | 9 |
| 3  XX XX 3  XX XX 1  2 | 9 |
| 1  2  XX 3  XX XX 1  2 | 9 |
| 2  XX 1  3  XX XX 1  2 | 9 |
| 1  1  1  3  XX XX 1  2 | 9 |
| 4  XX XX XX 2  XX 1  2 | 9 |
| 1  3  XX XX 2  XX 1  2 | 9 |
| 2  XX 2  XX 2  XX 1  2 | 9 |
| 1  1  2  XX 2  XX 1  2 | 9 |
| 3  XX XX 1  2  XX 1  2 | 9 |
| 1  2  XX 1  2  XX 1  2 | 9 |
| 2  XX 1  1  2  XX 1  2 | 9 |
| 1  1  1  1  2  XX 1  2 | 9 |
| 5  XX XX XX XX 1  1  2 | 9 |
| 1  4  XX XX XX 1  1  2 | 9 |
| 2  XX 3  XX XX 1  1  2 | 9 |
| 1  1  3  XX XX 1  1  2 | 9 |
| 3  XX XX 2  XX 1  1  2 | 9 |
| 1  2  XX 2  XX 1  1  2 | 9 |
| 2  XX 1  2  XX 1  1  2 | 9 |
| 1  1  1  2  XX 1  1  2 | 9 |
| 4  XX XX XX 1  1  1  2 | 9 |
| 1  3  XX XX 1  1  1  2 | 9 |
| 2  XX 2  XX 1  1  1  2 | 9 |
| 1  1  2  XX 1  1  1  2 | 9 |
| 3  XX XX 1  1  1  1  2 | 9 |
| 1  2  XX 1  1  1  1  2 | 9 |
| 2  XX 1  1  1  1  1  2 | 9 |
| 1  1  1  1  1  1  1  2 | 9 |
| 10 XX XX XX XX XX XX XX | 10 |
| 1  9  XX XX XX XX XX XX | 10 |
| 2  XX 8  XX XX XX XX XX | 10 |
| 1  1  8  XX XX XX XX XX | 10 |

| Inputs (from stagger position) 0 1 2 3 4 5 6 7 | Output |
|---|---|
| 3  XX XX 7  XX XX XX XX | 10 |
| 1  2  XX 7  XX XX XX XX | 10 |
| 2  XX 1  7  XX XX XX XX | 10 |
| 1  1  1  7  XX XX XX XX | 10 |
| 4  XX XX XX 6  XX XX XX | 10 |
| 1  3  XX XX 6  XX XX XX | 10 |
| 2  XX 2  XX 6  XX XX XX | 10 |
| 1  1  2  XX 6  XX XX XX | 10 |
| 3  XX XX 1  6  XX XX XX | 10 |
| 1  2  XX 1  6  XX XX XX | 10 |
| 2  XX 1  1  6  XX XX XX | 10 |
| 1  1  1  1  6  XX XX XX | 10 |
| 5  XX XX XX XX 5  XX XX | 10 |
| 1  4  XX XX XX 5  XX XX | 10 |
| 2  XX 3  XX XX 5  XX XX | 10 |
| 1  1  3  XX XX 5  XX XX | 10 |
| 3  XX XX 2  XX 5  XX XX | 10 |
| 1  2  XX 2  XX 5  XX XX | 10 |
| 2  XX 1  2  XX 5  XX XX | 10 |
| 1  1  1  2  XX 5  XX XX | 10 |
| 4  XX XX XX 1  5  XX XX | 10 |
| 1  3  XX XX 1  5  XX XX | 10 |
| 2  XX 2  XX 1  5  XX XX | 10 |
| 1  1  2  XX 1  5  XX XX | 10 |
| 3  XX XX 1  1  5  XX XX | 10 |
| 1  2  XX 1  1  5  XX XX | 10 |
| 2  XX 1  1  1  5  XX XX | 10 |
| 1  1  1  1  1  5  XX XX | 10 |
| 6  XX XX XX XX XX 4  XX | 10 |
| 1  5  XX XX XX XX 4  XX | 10 |
| 2  XX 4  XX XX XX 4  XX | 10 |
| 1  1  4  XX XX XX 4  XX | 10 |
| 3  XX XX 3  XX XX 4  XX | 10 |
| 1  2  XX 3  XX XX 4  XX | 10 |
| 2  XX 1  3  XX XX 4  XX | 10 |
| 1  1  1  3  XX XX 4  XX | 10 |
| 4  XX XX XX 2  XX 4  XX | 10 |
| 1  3  XX XX 2  XX 4  XX | 10 |
| 2  XX 2  XX 2  XX 4  XX | 10 |
| 1  1  2  XX 2  XX 4  XX | 10 |
| 3  XX XX 1  2  XX 4  XX | 10 |
| 1  2  XX 1  2  XX 4  XX | 10 |
| 2  XX 1  1  2  XX 4  XX | 10 |
| 1  1  1  1  2  XX 4  XX | 10 |
| 5  XX XX XX XX 1  4  XX | 10 |
| 1  4  XX XX XX 1  4  XX | 10 |
| 2  XX 3  XX XX 1  4  XX | 10 |
| 1  1  3  XX XX 1  4  XX | 10 |
| 3  XX XX 2  XX 1  4  XX | 10 |
| 1  2  XX 2  XX 1  4  XX | 10 |
| 2  XX 1  2  XX 1  4  XX | 10 |
| 1  1  1  2  XX 1  4  XX | 10 |
| 4  XX XX XX 1  1  4  XX | 10 |
| 1  3  XX XX 1  1  4  XX | 10 |
| 2  XX 2  XX 1  1  4  XX | 10 |
| 1  1  2  XX 1  1  4  XX | 10 |
| 3  XX XX 1  1  1  4  XX | 10 |
| 1  2  XX 1  1  1  4  XX | 10 |
| 2  XX 1  1  1  1  4  XX | 10 |
| 1  1  1  1  1  1  4  XX | 10 |
| 7  XX XX XX XX XX XX 3 | 10 |
| 1  6  XX XX XX XX XX 3 | 10 |
| 2  XX 5  XX XX XX XX 3 | 10 |
| 1  1  5  XX XX XX XX 3 | 10 |
| 3  XX XX 4  XX XX XX 3 | 10 |

| Inputs (from stagger position) 0 1 2 3 4 5 6 7 | Output |
|---|---|
| 1  2  XX 4  XX XX XX 3 | 10 |
| 2  XX 1  4  XX XX XX 3 | 10 |
| 1  1  1  4  XX XX XX 3 | 10 |
| 4  XX XX XX 3  XX XX 3 | 10 |
| 1  3  XX XX 3  XX XX 3 | 10 |
| 2  XX 2  XX 3  XX XX 3 | 10 |
| 1  1  2  XX 3  XX XX 3 | 10 |
| 3  XX XX 1  3  XX XX 3 | 10 |
| 1  2  XX 1  3  XX XX 3 | 10 |
| 2  XX 1  1  3  XX XX 3 | 10 |
| 1  1  1  1  3  XX XX 3 | 10 |
| 5  XX XX XX XX 2  XX 3 | 10 |
| 1  4  XX XX XX 2  XX 3 | 10 |
| 2  XX 3  XX XX 2  XX 3 | 10 |
| 1  1  3  XX XX 2  XX 3 | 10 |
| 3  XX XX 2  XX 2  XX 3 | 10 |
| 1  2  XX 2  XX 2  XX 3 | 10 |
| 2  XX 1  2  XX 2  XX 3 | 10 |
| 1  1  1  2  XX 2  XX 3 | 10 |
| 4  XX XX XX 1  2  XX 3 | 10 |
| 1  3  XX XX 1  2  XX 3 | 10 |
| 2  XX 2  XX 1  2  XX 3 | 10 |
| 1  1  2  XX 1  2  XX 3 | 10 |
| 3  XX XX 1  1  2  XX 3 | 10 |
| 1  2  XX 1  1  2  XX 3 | 10 |
| 2  XX 1  1  1  2  XX 3 | 10 |
| 1  1  1  1  1  2  XX 3 | 10 |
| 6  XX XX XX XX XX 1  3 | 10 |
| 1  5  XX XX XX XX 1  3 | 10 |
| 2  XX 4  XX XX XX 1  3 | 10 |
| 1  1  4  XX XX XX 1  3 | 10 |
| 3  XX XX 3  XX XX 1  3 | 10 |
| 1  2  XX 3  XX XX 1  3 | 10 |
| 2  XX 1  3  XX XX 1  3 | 10 |
| 1  1  1  3  XX XX 1  3 | 10 |
| 4  XX XX XX 2  XX 1  3 | 10 |
| 1  3  XX XX 2  XX 1  3 | 10 |
| 2  XX 2  XX 2  XX 1  3 | 10 |
| 1  1  2  XX 2  XX 1  3 | 10 |
| 3  XX XX 1  2  XX 1  3 | 10 |
| 1  2  XX 1  2  XX 1  3 | 10 |
| 2  XX 1  1  2  XX 1  3 | 10 |
| 1  1  1  1  2  XX 1  3 | 10 |
| 5  XX XX XX XX 1  1  3 | 10 |
| 1  4  XX XX XX 1  1  3 | 10 |
| 2  XX 3  XX XX 1  1  3 | 10 |
| 1  1  3  XX XX 1  1  3 | 10 |
| 3  XX XX 2  XX 1  1  3 | 10 |
| 1  2  XX 2  XX 1  1  3 | 10 |
| 2  XX 1  2  XX 1  1  3 | 10 |
| 1  1  1  2  XX 1  1  3 | 10 |
| 4  XX XX XX 1  1  1  3 | 10 |
| 1  3  XX XX 1  1  1  3 | 10 |
| 2  XX 2  XX 1  1  1  3 | 10 |
| 1  1  2  XX 1  1  1  3 | 10 |
| 3  XX XX 1  1  1  1  3 | 10 |
| 1  2  XX 1  1  1  1  3 | 10 |
| 2  XX 1  1  1  1  1  3 | 10 |
| 1  1  1  1  1  1  1  3 | 10 |
| 11 XX XX XX XX XX XX XX | 11 |
| 1  10 XX XX XX XX XX XX | 11 |
| 2  XX 9  XX XX XX XX XX | 11 |
| 1  1  9  XX XX XX XX XX | 11 |
| 3  XX XX 8  XX XX XX XX | 11 |
| 1  2  XX 8  XX XX XX XX | 11 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 2 XX 1 8 XX XX XX XX | 11 | 1 1 1 4 XX XX XX 4 | 11 | 4 XX XX XX 8 XX XX XX | 12 |
| 1 1 1 8 XX XX XX XX | 11 | 4 XX XX XX 3 XX XX 4 | 11 | 1 3 XX XX 8 XX XX XX | 12 |
| 4 XX XX XX 7 XX XX XX | 11 | 1 3 XX XX 3 XX XX 4 | 11 | 2 XX 2 XX 8 XX XX XX | 12 |
| 1 3 XX XX 7 XX XX XX | 11 | 2 XX 2 XX 3 XX XX 4 | 11 | 1 1 2 XX 8 XX XX XX | 12 |
| 2 XX 2 XX 7 XX XX XX | 11 | 1 1 2 XX 3 XX XX 4 | 11 | 3 XX XX 1 8 XX XX XX | 12 |
| 1 1 2 XX 7 XX XX XX | 11 | 3 XX XX 1 3 XX XX 4 | 11 | 1 2 XX 1 8 XX XX XX | 12 |
| 3 XX XX 1 7 XX XX XX | 11 | 1 2 XX 1 3 XX XX 4 | 11 | 2 XX 1 1 8 XX XX XX | 12 |
| 1 2 XX 1 7 XX XX XX | 11 | 2 XX 1 1 3 XX XX 4 | 11 | 1 1 1 1 8 XX XX XX | 12 |
| 2 XX 1 1 7 XX XX XX | 11 | 1 1 1 1 3 XX XX 4 | 11 | 5 XX XX XX XX 7 XX XX | 12 |
| 1 1 1 1 7 XX XX XX | 11 | 5 XX XX XX XX 2 XX 4 | 11 | 1 4 XX XX XX 7 XX XX | 12 |
| 5 XX XX XX XX 6 XX XX | 11 | 1 4 XX XX XX 2 XX 4 | 11 | 2 XX 3 XX XX 7 XX XX | 12 |
| 1 4 XX XX XX 6 XX XX | 11 | 2 XX 3 XX XX 2 XX 4 | 11 | 1 1 3 XX XX 7 XX XX | 12 |
| 2 XX 3 XX XX 6 XX XX | 11 | 1 1 3 XX XX 2 XX 4 | 11 | 3 XX XX 2 XX 7 XX XX | 12 |
| 1 1 3 XX XX 6 XX XX | 11 | 3 XX XX 2 XX 2 XX 4 | 11 | 1 2 XX 2 XX 7 XX XX | 12 |
| 3 XX XX 2 XX 6 XX XX | 11 | 1 2 XX 2 XX 2 XX 4 | 11 | 2 XX 1 2 XX 7 XX XX | 12 |
| 1 2 XX 2 XX 6 XX XX | 11 | 2 XX 1 2 XX 2 XX 4 | 11 | 1 1 1 2 XX 7 XX XX | 12 |
| 2 XX 1 2 XX 6 XX XX | 11 | 1 1 1 2 XX 2 XX 4 | 11 | 4 XX XX XX 1 7 XX XX | 12 |
| 1 1 1 2 XX 6 XX XX | 11 | 4 XX XX XX 1 2 XX 4 | 11 | 1 3 XX XX 1 7 XX XX | 12 |
| 4 XX XX XX 1 6 XX XX | 11 | 1 3 XX XX 1 2 XX 4 | 11 | 2 XX 2 XX 1 7 XX XX | 12 |
| 1 3 XX XX 1 6 XX XX | 11 | 2 XX 2 XX 1 2 XX 4 | 11 | 1 1 2 XX 1 7 XX XX | 12 |
| 2 XX 2 XX 1 6 XX XX | 11 | 1 1 2 XX 1 2 XX 4 | 11 | 3 XX XX 1 1 7 XX XX | 12 |
| 1 1 2 XX 1 6 XX XX | 11 | 3 XX XX 1 1 2 XX 4 | 11 | 1 2 XX 1 1 7 XX XX | 12 |
| 3 XX XX 1 1 6 XX XX | 11 | 1 2 XX 1 1 2 XX 4 | 11 | 2 XX 1 1 1 7 XX XX | 12 |
| 1 2 XX 1 1 6 XX XX | 11 | 2 XX 1 1 1 2 XX 4 | 11 | 1 1 1 1 1 7 XX XX | 12 |
| 2 XX 1 1 1 6 XX XX | 11 | 1 1 1 1 1 2 XX 4 | 11 | 6 XX XX XX XX XX 6 XX | 12 |
| 1 1 1 1 1 6 XX XX | 11 | 6 XX XX XX XX XX 1 4 | 11 | 1 5 XX XX XX XX 6 XX | 12 |
| 6 XX XX XX XX XX 5 XX | 11 | 1 5 XX XX XX XX 1 4 | 11 | 2 XX 4 XX XX XX 6 XX | 12 |
| 1 5 XX XX XX XX 5 XX | 11 | 2 XX 4 XX XX XX 1 4 | 11 | 1 1 4 XX XX XX 6 XX | 12 |
| 2 XX 4 XX XX XX 5 XX | 11 | 1 1 4 XX XX XX 1 4 | 11 | 3 XX XX 3 XX XX 6 XX | 12 |
| 1 1 4 XX XX XX 5 XX | 11 | 3 XX XX 3 XX XX 1 4 | 11 | 1 2 XX 3 XX XX 6 XX | 12 |
| 3 XX XX 3 XX XX 5 XX | 11 | 1 2 XX 3 XX XX 1 4 | 11 | 2 XX 1 3 XX XX 6 XX | 12 |
| 1 2 XX 3 XX XX 5 XX | 11 | 2 XX 1 3 XX XX 1 4 | 11 | 1 1 1 3 XX XX 6 XX | 12 |
| 2 XX 1 3 XX XX 5 XX | 11 | 1 1 1 3 XX XX 1 4 | 11 | 4 XX XX XX 2 XX 6 XX | 12 |
| 1 1 1 3 XX XX 5 XX | 11 | 4 XX XX XX 2 XX 1 4 | 11 | 1 3 XX XX 2 XX 6 XX | 12 |
| 4 XX XX XX 2 XX 5 XX | 11 | 1 3 XX XX 2 XX 1 4 | 11 | 2 XX 2 XX 2 XX 6 XX | 12 |
| 1 3 XX XX 2 XX 5 XX | 11 | 2 XX 2 XX 2 XX 1 4 | 11 | 1 1 2 XX 2 XX 6 XX | 12 |
| 2 XX 2 XX 2 XX 5 XX | 11 | 1 1 2 XX 2 XX 1 4 | 11 | 3 XX XX 1 2 XX 6 XX | 12 |
| 1 1 2 XX 2 XX 5 XX | 11 | 3 XX XX 1 2 XX 1 4 | 11 | 1 2 XX 1 2 XX 6 XX | 12 |
| 3 XX XX 1 2 XX 5 XX | 11 | 1 2 XX 1 2 XX 1 4 | 11 | 2 XX 1 1 2 XX 6 XX | 12 |
| 1 2 XX 1 2 XX 5 XX | 11 | 2 XX 1 1 2 XX 1 4 | 11 | 1 1 1 1 2 XX 6 XX | 12 |
| 2 XX 1 1 2 XX 5 XX | 11 | 1 1 1 1 2 XX 1 4 | 11 | 5 XX XX XX XX 1 6 XX | 12 |
| 1 1 1 1 2 XX 5 XX | 11 | 5 XX XX XX XX 1 1 4 | 11 | 1 4 XX XX XX 1 6 XX | 12 |
| 5 XX XX XX XX 1 5 XX | 11 | 1 4 XX XX XX 1 1 4 | 11 | 2 XX 3 XX XX 1 6 XX | 12 |
| 1 4 XX XX XX 1 5 XX | 11 | 2 XX 3 XX XX 1 1 4 | 11 | 1 1 3 XX XX 1 6 XX | 12 |
| 2 XX 3 XX XX 1 5 XX | 11 | 1 1 3 XX XX 1 1 4 | 11 | 3 XX XX 2 XX 1 6 XX | 12 |
| 1 1 3 XX XX 1 5 XX | 11 | 3 XX XX 2 XX 1 1 4 | 11 | 1 2 XX 2 XX 1 6 XX | 12 |
| 3 XX XX 2 XX 1 5 XX | 11 | 1 2 XX 2 XX 1 1 4 | 11 | 2 XX 1 2 XX 1 6 XX | 12 |
| 1 2 XX 2 XX 1 5 XX | 11 | 2 XX 1 2 XX 1 1 4 | 11 | 1 1 1 2 XX 1 6 XX | 12 |
| 2 XX 1 2 XX 1 5 XX | 11 | 1 1 1 2 XX 1 1 4 | 11 | 4 XX XX XX 1 1 6 XX | 12 |
| 1 1 1 2 XX 1 5 XX | 11 | 4 XX XX XX 1 1 1 4 | 11 | 1 3 XX XX 1 1 6 XX | 12 |
| 4 XX XX XX 1 1 5 XX | 11 | 1 3 XX XX 1 1 1 4 | 11 | 2 XX 2 XX 1 1 6 XX | 12 |
| 1 3 XX XX 1 1 5 XX | 11 | 2 XX 2 XX 1 1 1 4 | 11 | 1 1 2 XX 1 1 6 XX | 12 |
| 2 XX 2 XX 1 1 5 XX | 11 | 1 1 2 XX 1 1 1 4 | 11 | 3 XX XX 1 1 1 6 XX | 12 |
| 1 1 2 XX 1 1 5 XX | 11 | 3 XX XX 1 1 1 1 4 | 11 | 1 2 XX 1 1 1 6 XX | 12 |
| 3 XX XX 1 1 1 5 XX | 11 | 1 2 XX 1 1 1 1 4 | 11 | 2 XX 1 1 1 1 6 XX | 12 |
| 1 2 XX 1 1 1 5 XX | 11 | 2 XX 1 1 1 1 1 4 | 11 | 1 1 1 1 1 1 6 XX | 12 |
| 2 XX 1 1 1 1 5 XX | 11 | 1 1 1 1 1 1 1 4 | 11 | 7 XX XX XX XX XX XX 5 | 12 |
| 1 1 1 1 1 1 5 XX | 11 | 12 XX XX XX XX XX XX XX | 12 | 1 6 XX XX XX XX XX 5 | 12 |
| 7 XX XX XX XX XX XX 4 | 11 | 1 11 XX XX XX XX XX XX | 12 | 2 XX 5 XX XX XX XX 5 | 12 |
| 1 6 XX XX XX XX XX 4 | 11 | 2 XX 10 XX XX XX XX XX | 12 | 1 1 5 XX XX XX XX 5 | 12 |
| 2 XX 5 XX XX XX XX 4 | 11 | 1 1 10 XX XX XX XX XX | 12 | 3 XX XX 4 XX XX XX 5 | 12 |
| 1 1 5 XX XX XX XX 4 | 11 | 3 XX XX 9 XX XX XX XX | 12 | 1 2 XX 4 XX XX XX 5 | 12 |
| 3 XX XX 4 XX XX XX 4 | 11 | 1 2 XX 9 XX XX XX XX | 12 | 2 XX 1 4 XX XX XX 5 | 12 |
| 1 2 XX 4 XX XX XX 4 | 11 | 2 XX 1 9 XX XX XX XX | 12 | 1 1 1 4 XX XX XX 5 | 12 |
| 2 XX 1 4 XX XX XX 4 | 11 | 1 1 1 9 XX XX XX XX | 12 | 4 XX XX XX 3 XX XX 5 | 12 |

| Inputs (from stagger position) 0 1 2 3 4 5 6 7 | Output |
|---|---|
| 1  3  XX XX 3  XX XX 5 | 12 |
| 2  XX 2  XX 3  XX XX 5 | 12 |
| 1  1  2  XX 3  XX XX 5 | 12 |
| 3  XX XX 1  3  XX XX 5 | 12 |
| 1  2  XX 1  3  XX XX 5 | 12 |
| 2  XX 1  1  3  XX XX 5 | 12 |
| 1  1  1  1  3  XX XX 5 | 12 |
| 5  XX XX XX XX 2  XX 5 | 12 |
| 1  4  XX XX XX 2  XX 5 | 12 |
| 2  XX 3  XX XX 2  XX 5 | 12 |
| 1  1  3  XX XX 2  XX 5 | 12 |
| 3  XX XX 2  XX 2  XX 5 | 12 |
| 1  2  XX 2  XX 2  XX 5 | 12 |
| 2  XX 1  2  XX 2  XX 5 | 12 |
| 1  1  1  2  XX 2  XX 5 | 12 |
| 4  XX XX XX 1  2  XX 5 | 12 |
| 1  3  XX XX 1  2  XX 5 | 12 |
| 2  XX 2  XX 1  2  XX 5 | 12 |
| 1  1  2  XX 1  2  XX 5 | 12 |
| 3  XX XX 1  1  2  XX 5 | 12 |
| 1  2  XX 1  1  2  XX 5 | 12 |
| 2  XX 1  1  1  2  XX 5 | 12 |
| 1  1  1  1  1  2  XX 5 | 12 |
| 6  XX XX XX XX XX 1  5 | 12 |
| 1  5  XX XX XX XX 1  5 | 12 |
| 2  XX 4  XX XX XX 1  5 | 12 |
| 1  1  4  XX XX XX 1  5 | 12 |
| 3  XX XX 3  XX XX 1  5 | 12 |
| 1  2  XX 3  XX XX 1  5 | 12 |
| 2  XX 1  3  XX XX 1  5 | 12 |
| 1  1  1  3  XX XX 1  5 | 12 |
| 4  XX XX XX 2  XX 1  5 | 12 |
| 1  3  XX XX 2  XX 1  5 | 12 |
| 2  XX 2  XX 2  XX 1  5 | 12 |
| 1  1  2  XX 2  XX 1  5 | 12 |
| 3  XX XX 1  2  XX 1  5 | 12 |
| 1  2  XX 1  2  XX 1  5 | 12 |
| 2  XX 1  1  2  XX 1  5 | 12 |
| 1  1  1  1  2  XX 1  5 | 12 |
| 5  XX XX XX XX 1  1  5 | 12 |
| 1  4  XX XX XX 1  1  5 | 12 |
| 2  XX 3  XX XX 1  1  5 | 12 |
| 1  1  3  XX XX 1  1  5 | 12 |
| 3  XX XX 2  XX 1  1  5 | 12 |
| 1  2  XX 2  XX 1  1  5 | 12 |
| 2  XX 1  2  XX 1  1  5 | 12 |
| 1  1  1  2  XX 1  1  5 | 12 |
| 4  XX XX XX 1  1  1  5 | 12 |
| 1  3  XX XX 1  1  1  5 | 12 |
| 2  XX 2  XX 1  1  1  5 | 12 |
| 1  1  2  XX 1  1  1  5 | 12 |
| 3  XX XX 1  1  1  1  5 | 12 |
| 1  2  XX 1  1  1  1  5 | 12 |
| 2  XX 1  1  1  1  1  5 | 12 |
| 1  1  1  1  1  1  1  5 | 12 |
| 13 XX XX XX XX XX XX XX | 13 |
| 1  12 XX XX XX XX XX XX | 13 |
| 2  XX 11 XX XX XX XX XX | 13 |
| 1  1  11 XX XX XX XX XX | 13 |
| 3  XX XX 10 XX XX XX XX | 13 |
| 1  2  XX 10 XX XX XX XX | 13 |
| 2  XX 1  10 XX XX XX XX | 13 |
| 1  1  1  10 XX XX XX XX | 13 |
| 4  XX XX XX 9  XX XX XX | 13 |
| 1  3  XX XX 9  XX XX XX | 13 |

| Inputs (from stagger position) 0 1 2 3 4 5 6 7 | Output |
|---|---|
| 2  XX 2  XX 9  XX XX XX | 13 |
| 1  1  2  XX 9  XX XX XX | 13 |
| 3  XX XX 1  9  XX XX XX | 13 |
| 1  2  XX 1  9  XX XX XX | 13 |
| 2  XX 1  1  9  XX XX XX | 13 |
| 1  1  1  1  9  XX XX XX | 13 |
| 5  XX XX XX XX 8  XX XX | 13 |
| 1  4  XX XX XX 8  XX XX | 13 |
| 2  XX 3  XX XX 8  XX XX | 13 |
| 1  1  3  XX XX 8  XX XX | 13 |
| 3  XX XX 2  XX 8  XX XX | 13 |
| 1  2  XX 2  XX 8  XX XX | 13 |
| 2  XX 1  2  XX 8  XX XX | 13 |
| 1  1  1  2  XX 8  XX XX | 13 |
| 4  XX XX XX 1  8  XX XX | 13 |
| 1  3  XX XX 1  8  XX XX | 13 |
| 2  XX 2  XX 1  8  XX XX | 13 |
| 1  1  2  XX 1  8  XX XX | 13 |
| 3  XX XX 1  1  8  XX XX | 13 |
| 1  2  XX 1  1  8  XX XX | 13 |
| 2  XX 1  1  1  8  XX XX | 13 |
| 1  1  1  1  1  8  XX XX | 13 |
| 6  XX XX XX XX XX 7  XX | 13 |
| 1  5  XX XX XX XX 7  XX | 13 |
| 2  XX 4  XX XX XX 7  XX | 13 |
| 1  1  4  XX XX XX 7  XX | 13 |
| 3  XX XX 3  XX XX 7  XX | 13 |
| 1  2  XX 3  XX XX 7  XX | 13 |
| 2  XX 1  3  XX XX 7  XX | 13 |
| 1  1  1  3  XX XX 7  XX | 13 |
| 4  XX XX XX 2  XX 7  XX | 13 |
| 1  3  XX XX 2  XX 7  XX | 13 |
| 2  XX 2  XX 2  XX 7  XX | 13 |
| 1  1  2  XX 2  XX 7  XX | 13 |
| 3  XX XX 1  2  XX 7  XX | 13 |
| 1  2  XX 1  2  XX 7  XX | 13 |
| 2  XX 1  1  2  XX 7  XX | 13 |
| 1  1  1  1  2  XX 7  XX | 13 |
| 5  XX XX XX XX 1  7  XX | 13 |
| 1  4  XX XX XX 1  7  XX | 13 |
| 2  XX 3  XX XX 1  7  XX | 13 |
| 1  1  3  XX XX 1  7  XX | 13 |
| 3  XX XX 2  XX 1  7  XX | 13 |
| 1  2  XX 2  XX 1  7  XX | 13 |
| 2  XX 1  2  XX 1  7  XX | 13 |
| 1  1  1  2  XX 1  7  XX | 13 |
| 4  XX XX XX 1  1  7  XX | 13 |
| 1  3  XX XX 1  1  7  XX | 13 |
| 2  XX 2  XX 1  1  7  XX | 13 |
| 1  1  2  XX 1  1  7  XX | 13 |
| 3  XX XX 1  1  1  7  XX | 13 |
| 1  2  XX 1  1  1  7  XX | 13 |
| 2  XX 1  1  1  1  7  XX | 13 |
| 1  1  1  1  1  1  7  XX | 13 |
| 7  XX XX XX XX XX XX 6 | 13 |
| 1  6  XX XX XX XX XX 6 | 13 |
| 2  XX 5  XX XX XX XX 6 | 13 |
| 1  1  5  XX XX XX XX 6 | 13 |
| 3  XX XX 4  XX XX XX 6 | 13 |
| 1  2  XX 4  XX XX XX 6 | 13 |
| 2  XX 1  4  XX XX XX 6 | 13 |
| 1  1  1  4  XX XX XX 6 | 13 |
| 4  XX XX XX 3  XX XX 6 | 13 |
| 1  3  XX XX 3  XX XX 6 | 13 |
| 2  XX 2  XX 3  XX XX 6 | 13 |

| Inputs (from stagger position) 0 1 2 3 4 5 6 7 | Output |
|---|---|
| 1  1  2  XX 3  XX XX 6 | 13 |
| 3  XX XX 1  3  XX XX 6 | 13 |
| 1  2  XX 1  3  XX XX 6 | 13 |
| 2  XX 1  1  3  XX XX 6 | 13 |
| 1  1  1  1  3  XX XX 6 | 13 |
| 5  XX XX XX XX 2  XX 6 | 13 |
| 1  4  XX XX XX 2  XX 6 | 13 |
| 2  XX 3  XX XX 2  XX 6 | 13 |
| 1  1  3  XX XX 2  XX 6 | 13 |
| 3  XX XX 2  XX 2  XX 6 | 13 |
| 1  2  XX 2  XX 2  XX 6 | 13 |
| 2  XX 1  2  XX 2  XX 6 | 13 |
| 1  1  1  2  XX 2  XX 6 | 13 |
| 4  XX XX XX 1  2  XX 6 | 13 |
| 1  3  XX XX 1  2  XX 6 | 13 |
| 2  XX 2  XX 1  2  XX 6 | 13 |
| 1  1  2  XX 1  2  XX 6 | 13 |
| 3  XX XX 1  1  2  XX 6 | 13 |
| 1  2  XX 1  1  2  XX 6 | 13 |
| 2  XX 1  1  1  2  XX 6 | 13 |
| 1  1  1  1  1  2  XX 6 | 13 |
| 6  XX XX XX XX XX 1  6 | 13 |
| 1  5  XX XX XX XX 1  6 | 13 |
| 2  XX 4  XX XX XX 1  6 | 13 |
| 1  1  4  XX XX XX 1  6 | 13 |
| 3  XX XX 3  XX XX 1  6 | 13 |
| 1  2  XX 3  XX XX 1  6 | 13 |
| 2  XX 1  3  XX XX 1  6 | 13 |
| 1  1  1  3  XX XX 1  6 | 13 |
| 4  XX XX XX 2  XX 1  6 | 13 |
| 1  3  XX XX 2  XX 1  6 | 13 |
| 2  XX 2  XX 2  XX 1  6 | 13 |
| 1  1  2  XX 2  XX 1  6 | 13 |
| 3  XX XX 1  2  XX 1  6 | 13 |
| 1  2  XX 1  2  XX 1  6 | 13 |
| 2  XX 1  1  2  XX 1  6 | 13 |
| 1  1  1  1  2  XX 1  6 | 13 |
| 5  XX XX XX XX 1  1  6 | 13 |
| 1  4  XX XX XX 1  1  6 | 13 |
| 2  XX 3  XX XX 1  1  6 | 13 |
| 1  1  3  XX XX 1  1  6 | 13 |
| 3  XX XX 2  XX 1  1  6 | 13 |
| 1  2  XX 2  XX 1  1  6 | 13 |
| 2  XX 1  2  XX 1  1  6 | 13 |
| 1  1  1  2  XX 1  1  6 | 13 |
| 4  XX XX XX 1  1  1  6 | 13 |
| 1  3  XX XX 1  1  1  6 | 13 |
| 2  XX 2  XX 1  1  1  6 | 13 |
| 1  1  2  XX 1  1  1  6 | 13 |
| 3  XX XX 1  1  1  1  6 | 13 |
| 1  2  XX 1  1  1  1  6 | 13 |
| 2  XX 1  1  1  1  1  6 | 13 |
| 1  1  1  1  1  1  1  6 | 13 |
| 14 XX XX XX XX XX XX XX | 14 |
| 1  13 XX XX XX XX XX XX | 14 |
| 2  XX 12 XX XX XX XX XX | 14 |
| 1  1  12 XX XX XX XX XX | 14 |
| 3  XX XX 11 XX XX XX XX | 14 |
| 1  2  XX 11 XX XX XX XX | 14 |
| 2  XX 1  11 XX XX XX XX | 14 |
| 1  1  1  11 XX XX XX XX | 14 |
| 4  XX XX XX 10 XX XX XX | 14 |
| 1  3  XX XX 10 XX XX XX | 14 |
| 2  XX 2  XX 10 XX XX XX | 14 |
| 1  1  2  XX 10 XX XX XX | 14 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 3  XX XX 1  10 XX XX XX | 14 | 1  2  XX 1  3  XX XX 7 | 14 | 2  XX 1  1  11 XX XX XX | 15 |
| 1  2  XX 1  10 XX XX XX | 14 | 2  XX 1  1  3  XX XX 7 | 14 | 1  1  1  1  11 XX XX XX | 15 |
| 2  XX 1  1  10 XX XX XX | 14 | 1  1  1  1  3  XX XX 7 | 14 | 5  XX XX XX XX 10 XX XX | 15 |
| 1  1  1  1  10 XX XX XX | 14 | 5  XX XX XX XX 2  XX 7 | 14 | 1  4  XX XX XX 10 XX XX | 15 |
| 5  XX XX XX XX 9  XX XX | 14 | 1  4  XX XX XX 2  XX 7 | 14 | 2  XX 3  XX XX 10 XX XX | 15 |
| 1  4  XX XX XX 9  XX XX | 14 | 2  XX 3  XX XX 2  XX 7 | 14 | 1  1  3  XX XX 10 XX XX | 15 |
| 2  XX 3  XX XX 9  XX XX | 14 | 1  1  3  XX XX 2  XX 7 | 14 | 3  XX XX 2  XX 10 XX XX | 15 |
| 1  1  3  XX XX 9  XX XX | 14 | 3  XX XX 2  XX 2  XX 7 | 14 | 1  2  XX 2  XX 10 XX XX | 15 |
| 3  XX XX 2  XX 9  XX XX | 14 | 1  2  XX 2  XX 2  XX 7 | 14 | 2  XX 1  2  XX 10 XX XX | 15 |
| 1  2  XX 2  XX 9  XX XX | 14 | 2  XX 1  2  XX 2  XX 7 | 14 | 1  1  1  2  XX 10 XX XX | 15 |
| 2  XX 1  2  XX 9  XX XX | 14 | 1  1  1  2  XX 2  XX 7 | 14 | 4  XX XX XX 1  10 XX XX | 15 |
| 1  1  1  2  XX 9  XX XX | 14 | 4  XX XX XX 1  2  XX 7 | 14 | 1  3  XX XX 1  10 XX XX | 15 |
| 4  XX XX XX 1  9  XX XX | 14 | 1  3  XX XX 1  2  XX 7 | 14 | 2  XX 2  XX 1  10 XX XX | 15 |
| 1  3  XX XX 1  9  XX XX | 14 | 2  XX 2  XX 1  2  XX 7 | 14 | 1  1  2  XX 1  10 XX XX | 15 |
| 2  XX 2  XX 1  9  XX XX | 14 | 1  1  2  XX 1  2  XX 7 | 14 | 3  XX XX 1  1  10 XX XX | 15 |
| 1  1  2  XX 1  9  XX XX | 14 | 3  XX XX 1  1  2  XX 7 | 14 | 1  2  XX 1  1  10 XX XX | 15 |
| 3  XX XX 1  1  9  XX XX | 14 | 1  2  XX 1  1  2  XX 7 | 14 | 2  XX 1  1  1  10 XX XX | 15 |
| 1  2  XX 1  1  9  XX XX | 14 | 2  XX 1  1  1  2  XX 7 | 14 | 1  1  1  1  1  10 XX XX | 15 |
| 2  XX 1  1  1  9  XX XX | 14 | 1  1  1  1  1  2  XX 7 | 14 | 6  XX XX XX XX XX 9  XX | 15 |
| 1  1  1  1  1  9  XX XX | 14 | 6  XX XX XX XX XX 1  7 | 14 | 1  5  XX XX XX XX 9  XX | 15 |
| 6  XX XX XX XX XX 8  XX | 14 | 1  5  XX XX XX XX 1  7 | 14 | 2  XX 4  XX XX XX 9  XX | 15 |
| 1  5  XX XX XX XX 8  XX | 14 | 2  XX 4  XX XX XX 1  7 | 14 | 1  1  4  XX XX XX 9  XX | 15 |
| 2  XX 4  XX XX XX 8  XX | 14 | 1  1  4  XX XX XX 1  7 | 14 | 3  XX XX 3  XX XX 9  XX | 15 |
| 1  1  4  XX XX XX 8  XX | 14 | 3  XX XX 3  XX XX 1  7 | 14 | 1  2  XX 3  XX XX 9  XX | 15 |
| 3  XX XX 3  XX XX 8  XX | 14 | 1  2  XX 3  XX XX 1  7 | 14 | 2  XX 1  3  XX XX 9  XX | 15 |
| 1  2  XX 3  XX XX 8  XX | 14 | 2  XX 1  3  XX XX 1  7 | 14 | 1  1  1  3  XX XX 9  XX | 15 |
| 2  XX 1  3  XX XX 8  XX | 14 | 1  1  1  3  XX XX 1  7 | 14 | 4  XX XX XX 2  XX 9  XX | 15 |
| 1  1  1  3  XX XX 8  XX | 14 | 4  XX XX XX 2  XX 1  7 | 14 | 1  3  XX XX 2  XX 9  XX | 15 |
| 4  XX XX XX 2  XX 8  XX | 14 | 1  3  XX XX 2  XX 1  7 | 14 | 2  XX 2  XX 2  XX 9  XX | 15 |
| 1  3  XX XX 2  XX 8  XX | 14 | 2  XX 2  XX 2  XX 1  7 | 14 | 1  1  2  XX 2  XX 9  XX | 15 |
| 2  XX 2  XX 2  XX 8  XX | 14 | 1  1  2  XX 2  XX 1  7 | 14 | 3  XX XX 1  2  XX 9  XX | 15 |
| 1  2  XX 2  XX 8  XX | 14 | 3  XX XX 1  2  XX 1  7 | 14 | 1  2  XX 1  2  XX 9  XX | 15 |
| 3  XX XX 1  2  XX 8  XX | 14 | 1  2  XX 1  2  XX 1  7 | 14 | 2  XX 1  1  2  XX 9  XX | 15 |
| 1  2  XX 1  2  XX 8  XX | 14 | 2  XX 1  1  2  XX 1  7 | 14 | 1  1  1  1  2  XX 9  XX | 15 |
| 2  XX 1  1  2  XX 8  XX | 14 | 1  1  1  1  2  XX 1  7 | 14 | 5  XX XX XX XX 1  9  XX | 15 |
| 1  1  1  1  2  XX 8  XX | 14 | 5  XX XX XX XX 1  1  7 | 14 | 1  4  XX XX XX 1  9  XX | 15 |
| 5  XX XX XX XX 1  8  XX | 14 | 1  4  XX XX XX 1  1  7 | 14 | 2  XX 3  XX XX 1  9  XX | 15 |
| 1  4  XX XX XX 1  8  XX | 14 | 2  XX 3  XX XX 1  1  7 | 14 | 1  1  3  XX XX 1  9  XX | 15 |
| 2  XX 3  XX XX 1  8  XX | 14 | 1  1  3  XX XX 1  1  7 | 14 | 3  XX XX 2  XX 1  9  XX | 15 |
| 1  1  3  XX XX 1  8  XX | 14 | 3  XX XX 2  XX 1  1  7 | 14 | 1  2  XX 2  XX 1  9  XX | 15 |
| 3  XX XX 2  XX 1  8  XX | 14 | 1  2  XX 2  XX 1  1  7 | 14 | 2  XX 1  2  XX 1  9  XX | 15 |
| 1  2  XX 2  XX 1  8  XX | 14 | 2  XX 1  2  XX 1  1  7 | 14 | 1  1  1  2  XX 1  9  XX | 15 |
| 2  XX 1  2  XX 1  8  XX | 14 | 1  1  1  2  XX 1  1  7 | 14 | 4  XX XX XX 1  1  9  XX | 15 |
| 1  1  1  2  XX 1  8  XX | 14 | 4  XX XX XX 1  1  1  7 | 14 | 1  3  XX XX 1  1  9  XX | 15 |
| 4  XX XX XX 1  1  8  XX | 14 | 1  3  XX XX 1  1  1  7 | 14 | 2  XX 2  XX 1  1  9  XX | 15 |
| 1  3  XX XX 1  1  8  XX | 14 | 2  XX 2  XX 1  1  1  7 | 14 | 1  1  2  XX 1  1  9  XX | 15 |
| 2  XX 2  XX 1  1  8  XX | 14 | 1  1  2  XX 1  1  1  7 | 14 | 3  XX XX 1  1  1  9  XX | 15 |
| 1  1  2  XX 1  1  8  XX | 14 | 3  XX XX 1  1  1  1  7 | 14 | 1  2  XX 1  1  1  9  XX | 15 |
| 3  XX XX 1  1  1  8  XX | 14 | 1  2  XX 1  1  1  1  7 | 14 | 2  XX 1  1  1  1  9  XX | 15 |
| 1  2  XX 1  1  1  8  XX | 14 | 2  XX 1  1  1  1  1  7 | 14 | 1  1  1  1  1  1  9  XX | 15 |
| 2  XX 1  1  1  1  8  XX | 14 | 1  1  1  1  1  1  1  7 | 14 | 7  XX XX XX XX XX XX 8 | 15 |
| 1  1  1  1  1  1  8  XX | 14 | 15 XX XX XX XX XX XX XX | 15 | 1  6  XX XX XX XX XX 8 | 15 |
| 7  XX XX XX XX XX XX 7 | 14 | 1  14 XX XX XX XX XX XX | 15 | 2  XX 5  XX XX XX XX 8 | 15 |
| 1  6  XX XX XX XX XX 7 | 14 | 2  XX 13 XX XX XX XX XX | 15 | 1  1  5  XX XX XX XX 8 | 15 |
| 2  XX 5  XX XX XX XX 7 | 14 | 1  1  13 XX XX XX XX XX | 15 | 3  XX XX 4  XX XX XX 8 | 15 |
| 1  1  5  XX XX XX XX 7 | 14 | 3  XX XX 12 XX XX XX XX | 15 | 1  2  XX 4  XX XX XX 8 | 15 |
| 3  XX XX 4  XX XX XX 7 | 14 | 1  2  XX 12 XX XX XX XX | 15 | 2  XX 1  4  XX XX XX 8 | 15 |
| 1  2  XX 4  XX XX XX 7 | 14 | 2  XX 1  12 XX XX XX XX | 15 | 1  1  1  4  XX XX XX 8 | 15 |
| 2  XX 1  4  XX XX XX 7 | 14 | 1  1  1  12 XX XX XX XX | 15 | 4  XX XX XX 3  XX XX 8 | 15 |
| 1  1  1  4  XX XX XX 7 | 14 | 4  XX XX XX 11 XX XX XX | 15 | 1  3  XX XX 3  XX XX 8 | 15 |
| 4  XX XX XX 3  XX XX 7 | 14 | 1  3  XX XX 11 XX XX XX | 15 | 2  XX 2  XX 3  XX XX 8 | 15 |
| 1  3  XX XX 3  XX XX 7 | 14 | 2  XX 2  XX 11 XX XX XX | 15 | 1  1  2  XX 3  XX XX 8 | 15 |
| 2  XX 2  XX 3  XX XX 7 | 14 | 1  1  2  XX 11 XX XX XX | 15 | 3  XX XX 1  3  XX XX 8 | 15 |
| 1  2  XX 3  XX XX 7 | 14 | 3  XX XX 1  11 XX XX XX | 15 | 1  2  XX 1  3  XX XX 8 | 15 |
| 3  XX XX 1  3  XX XX 7 | 14 | 1  2  XX 1  11 XX XX XX | 15 | 2  XX 1  1  3  XX XX 8 | 15 |

| Inputs (from stagger position) 0 1 2 3 4 5 6 7 | Output |
|---|---|
| 1  1  1  3  XX XX XX 8 | 15 |
| 5  XX XX XX XX 2  XX 8 | 15 |
| 1  4  XX XX XX 2  XX 8 | 15 |
| 2  XX 3  XX XX 2  XX 8 | 15 |
| 1  1  3  XX XX 2  XX 8 | 15 |
| 3  XX XX 2  XX 2  XX 8 | 15 |
| 1  2  XX 2  XX 2  XX 8 | 15 |
| 2  XX 1  2  XX 2  XX 8 | 15 |
| 1  1  1  2  XX 2  XX 8 | 15 |
| 4  XX XX XX 1  2  XX 8 | 15 |
| 1  3  XX XX 1  2  XX 8 | 15 |
| 2  XX 2  XX 1  2  XX 8 | 15 |
| 1  1  2  XX 1  2  XX 8 | 15 |
| 3  XX XX 1  1  2  XX 8 | 15 |
| 1  2  XX 1  1  2  XX 8 | 15 |
| 2  XX 1  1  1  2  XX 8 | 15 |
| 1  1  1  1  1  2  XX 8 | 15 |
| 6  XX XX XX XX XX 1  8 | 15 |
| 1  5  XX XX XX XX 1  8 | 15 |
| 2  XX 4  XX XX XX 1  8 | 15 |
| 1  1  4  XX XX XX 1  8 | 15 |
| 3  XX XX 3  XX XX 1  8 | 15 |
| 1  2  XX 3  XX XX 1  8 | 15 |
| 2  XX 1  3  XX XX 1  8 | 15 |
| 1  1  1  3  XX XX 1  8 | 15 |
| 4  XX XX XX 2  XX 1  8 | 15 |
| 1  3  XX XX 2  XX 1  8 | 15 |
| 2  XX 2  XX 2  XX 1  8 | 15 |
| 1  1  2  XX 2  XX 1  8 | 15 |
| 3  XX XX 1  2  XX 1  8 | 15 |
| 1  2  XX 1  2  XX 1  8 | 15 |
| 2  XX 1  1  2  XX 1  8 | 15 |
| 1  1  1  1  2  XX 1  8 | 15 |
| 5  XX XX XX XX 1  1  8 | 15 |
| 1  4  XX XX XX 1  1  8 | 15 |
| 2  XX 3  XX XX 1  1  8 | 15 |
| 1  1  3  XX XX 1  1  8 | 15 |
| 3  XX XX 2  XX 1  1  8 | 15 |
| 1  2  XX 2  XX 1  1  8 | 15 |
| 2  XX 1  2  XX 1  1  8 | 15 |
| 1  1  1  2  XX 1  1  8 | 15 |
| 4  XX XX XX 1  1  1  8 | 15 |
| 1  3  XX XX 1  1  1  8 | 15 |
| 2  XX 2  XX 1  1  1  8 | 15 |
| 1  1  2  XX 1  1  1  8 | 15 |
| 3  XX XX 1  1  1  1  8 | 15 |
| 1  2  XX 1  1  1  1  8 | 15 |
| 2  XX 1  1  1  1  1  8 | 15 |
| 1  1  1  1  1  1  1  8 | 15 |
| 16 XX XX XX XX XX XX XX | 16 |
| 1  15 XX XX XX XX XX XX | 16 |
| 2  XX 14 XX XX XX XX XX | 16 |
| 1  1  14 XX XX XX XX XX | 16 |
| 3  XX XX 13 XX XX XX XX | 16 |
| 1  2  XX 13 XX XX XX XX | 16 |
| 2  XX 1  13 XX XX XX XX | 16 |
| 1  1  1  13 XX XX XX XX | 16 |
| 4  XX XX XX 12 XX XX XX | 16 |
| 1  3  XX XX 12 XX XX XX | 16 |
| 2  XX 2  XX 12 XX XX XX | 16 |
| 1  1  2  XX 12 XX XX XX | 16 |
| 3  XX XX 1  12 XX XX XX | 16 |
| 1  2  XX 1  12 XX XX XX | 16 |
| 2  XX 1  1  12 XX XX XX | 16 |
| 1  1  1  1  12 XX XX XX | 16 |

| Inputs (from stagger position) 0 1 2 3 4 5 6 7 | Output |
|---|---|
| 5  XX XX XX XX 11 XX XX | 16 |
| 1  4  XX XX XX 11 XX XX | 16 |
| 2  XX 3  XX XX 11 XX XX | 16 |
| 1  1  3  XX XX 11 XX XX | 16 |
| 3  XX XX 2  XX 11 XX XX | 16 |
| 1  2  XX 2  XX 11 XX XX | 16 |
| 2  XX 1  2  XX 11 XX XX | 16 |
| 1  1  1  2  XX 11 XX XX | 16 |
| 4  XX XX XX 1  11 XX XX | 16 |
| 1  3  XX XX 1  11 XX XX | 16 |
| 2  XX 2  XX 1  11 XX XX | 16 |
| 1  1  2  XX 1  11 XX XX | 16 |
| 3  XX XX 1  1  11 XX XX | 16 |
| 1  2  XX 1  1  11 XX XX | 16 |
| 2  XX 1  1  1  11 XX XX | 16 |
| 1  1  1  1  1  11 XX XX | 16 |
| 6  XX XX XX XX XX 10 XX | 16 |
| 1  5  XX XX XX XX 10 XX | 16 |
| 2  XX 4  XX XX XX 10 XX | 16 |
| 1  1  4  XX XX XX 10 XX | 16 |
| 3  XX XX 3  XX XX 10 XX | 16 |
| 1  2  XX 3  XX XX 10 XX | 16 |
| 2  XX 1  3  XX XX 10 XX | 16 |
| 1  1  1  3  XX XX 10 XX | 16 |
| 4  XX XX XX 2  XX 10 XX | 16 |
| 1  3  XX XX 2  XX 10 XX | 16 |
| 2  XX 2  XX 2  XX 10 XX | 16 |
| 1  1  2  XX 2  XX 10 XX | 16 |
| 3  XX XX 1  2  XX 10 XX | 16 |
| 1  2  XX 1  2  XX 10 XX | 16 |
| 2  XX 1  1  2  XX 10 XX | 16 |
| 1  1  1  1  2  XX 10 XX | 16 |
| 5  XX XX XX XX 1  10 XX | 16 |
| 1  4  XX XX XX 1  10 XX | 16 |
| 2  XX 3  XX XX 1  10 XX | 16 |
| 1  1  3  XX XX 1  10 XX | 16 |
| 3  XX XX 2  XX 1  10 XX | 16 |
| 1  2  XX 2  XX 1  10 XX | 16 |
| 2  XX 1  2  XX 1  10 XX | 16 |
| 1  1  1  2  XX 1  10 XX | 16 |
| 4  XX XX XX 1  1  10 XX | 16 |
| 1  3  XX XX 1  1  10 XX | 16 |
| 2  XX 2  XX 1  1  10 XX | 16 |
| 1  1  2  XX 1  1  10 XX | 16 |
| 3  XX XX 1  1  1  10 XX | 16 |
| 1  2  XX 1  1  1  10 XX | 16 |
| 2  XX 1  1  1  1  10 XX | 16 |
| 1  1  1  1  1  1  10 XX | 16 |
| 7  XX XX XX XX XX XX 9 | 16 |
| 1  6  XX XX XX XX XX 9 | 16 |
| 2  XX 5  XX XX XX XX 9 | 16 |
| 1  1  5  XX XX XX XX 9 | 16 |
| 3  XX XX 4  XX XX XX 9 | 16 |
| 1  2  XX 4  XX XX XX 9 | 16 |
| 2  XX 1  4  XX XX XX 9 | 16 |
| 1  1  1  4  XX XX XX 9 | 16 |
| 4  XX XX XX 3  XX XX 9 | 16 |
| 1  3  XX XX 3  XX XX 9 | 16 |
| 2  XX 2  XX 3  XX XX 9 | 16 |
| 1  1  2  XX 3  XX XX 9 | 16 |
| 3  XX XX 1  3  XX XX 9 | 16 |
| 1  2  XX 1  3  XX XX 9 | 16 |
| 2  XX 1  1  3  XX XX 9 | 16 |
| 1  1  1  1  3  XX XX 9 | 16 |
| 5  XX XX XX XX 2  XX 9 | 16 |

| Inputs (from stagger position) 0 1 2 3 4 5 6 7 | Output |
|---|---|
| 1  4  XX XX XX 2  XX 9 | 16 |
| 2  XX 3  XX XX 2  XX 9 | 16 |
| 1  1  3  XX XX 2  XX 9 | 16 |
| 3  XX XX 2  XX 2  XX 9 | 16 |
| 1  2  XX 2  XX 2  XX 9 | 16 |
| 2  XX 1  2  XX 2  XX 9 | 16 |
| 1  1  1  2  XX 2  XX 9 | 16 |
| 4  XX XX XX 1  2  XX 9 | 16 |
| 1  3  XX XX 1  2  XX 9 | 16 |
| 2  XX 2  XX 1  2  XX 9 | 16 |
| 1  1  2  XX 1  2  XX 9 | 16 |
| 3  XX XX 1  1  2  XX 9 | 16 |
| 1  2  XX 1  1  2  XX 9 | 16 |
| 2  XX 1  1  1  2  XX 9 | 16 |
| 1  1  1  1  1  2  XX 9 | 16 |
| 6  XX XX XX XX XX 1  9 | 16 |
| 1  5  XX XX XX XX 1  9 | 16 |
| 2  XX 4  XX XX XX 1  9 | 16 |
| 1  1  4  XX XX XX 1  9 | 16 |
| 3  XX XX 3  XX XX 1  9 | 16 |
| 1  2  XX 3  XX XX 1  9 | 16 |
| 2  XX 1  3  XX XX 1  9 | 16 |
| 1  1  1  3  XX XX 1  9 | 16 |
| 4  XX XX XX 2  XX 1  9 | 16 |
| 1  3  XX XX 2  XX 1  9 | 16 |
| 2  XX 2  XX 2  XX 1  9 | 16 |
| 1  1  2  XX 2  XX 1  9 | 16 |
| 3  XX XX 1  2  XX 1  9 | 16 |
| 1  2  XX 1  2  XX 1  9 | 16 |
| 2  XX 1  1  2  XX 1  9 | 16 |
| 1  1  1  1  2  XX 1  9 | 16 |
| 5  XX XX XX XX 1  1  9 | 16 |
| 1  4  XX XX XX 1  1  9 | 16 |
| 2  XX 3  XX XX 1  1  9 | 16 |
| 1  1  3  XX XX 1  1  9 | 16 |
| 3  XX XX 2  XX 1  1  9 | 16 |
| 1  2  XX 2  XX 1  1  9 | 16 |
| 2  XX 1  2  XX 1  1  9 | 16 |
| 1  1  1  2  XX 1  1  9 | 16 |
| 4  XX XX XX 1  1  1  9 | 16 |
| 1  3  XX XX 1  1  1  9 | 16 |
| 2  XX 2  XX 1  1  1  9 | 16 |
| 1  1  2  XX 1  1  1  9 | 16 |
| 3  XX XX 1  1  1  1  9 | 16 |
| 1  2  XX 1  1  1  1  9 | 16 |
| 2  XX 1  1  1  1  1  9 | 16 |
| 1  1  1  1  1  1  1  9 | 16 |
| 17 XX XX XX XX XX XX XX | 17 |
| 1  16 XX XX XX XX XX XX | 17 |
| 2  XX 15 XX XX XX XX XX | 17 |
| 1  1  15 XX XX XX XX XX | 17 |
| 3  XX XX 14 XX XX XX XX | 17 |
| 1  2  XX 14 XX XX XX XX | 17 |
| 2  XX 1  14 XX XX XX XX | 17 |
| 1  1  1  14 XX XX XX XX | 17 |
| 4  XX XX XX 13 XX XX XX | 17 |
| 1  3  XX XX 13 XX XX XX | 17 |
| 2  XX 2  XX 13 XX XX XX | 17 |
| 1  1  2  XX 13 XX XX XX | 17 |
| 3  XX XX 1  13 XX XX XX | 17 |
| 1  2  XX 1  13 XX XX XX | 17 |
| 2  XX 1  1  13 XX XX XX | 17 |
| 1  1  1  1  13 XX XX XX | 17 |
| 5  XX XX XX XX 12 XX XX | 17 |
| 1  4  XX XX XX 12 XX XX | 17 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 2  XX 3  XX XX 12 XX XX | 17 | 1  1  3  XX XX 2  XX 10 | 17 | 3  XX XX 2  XX 13 XX XX | 18 |
| 1  1  3  XX XX 12 XX XX | 17 | 3  XX XX 2  XX 2  XX 10 | 17 | 1  2  XX 2  XX 13 XX XX | 18 |
| 3  XX XX 2  XX 12 XX XX | 17 | 1  2  XX 2  XX 2  XX 10 | 17 | 2  XX 1  2  XX 13 XX XX | 18 |
| 1  2  XX 2  XX 12 XX XX | 17 | 2  XX 1  2  XX 2  XX 10 | 17 | 1  1  1  2  XX 13 XX XX | 18 |
| 2  XX 1  2  XX 12 XX XX | 17 | 1  1  1  2  XX 2  XX 10 | 17 | 4  XX XX XX 1  13 XX XX | 18 |
| 1  1  1  2  XX 12 XX XX | 17 | 4  XX XX XX 1  2  XX 10 | 17 | 1  3  XX XX 1  13 XX XX | 18 |
| 4  XX XX XX 1  12 XX XX | 17 | 1  3  XX XX 1  2  XX 10 | 17 | 2  XX 2  XX 1  13 XX XX | 18 |
| 1  3  XX XX 1  12 XX XX | 17 | 2  XX 2  XX 1  2  XX 10 | 17 | 1  1  2  XX 1  13 XX XX | 18 |
| 2  XX 2  XX 1  12 XX XX | 17 | 1  1  2  XX 1  2  XX 10 | 17 | 3  XX XX 1  1  13 XX XX | 18 |
| 1  1  2  XX 1  12 XX XX | 17 | 3  XX XX 1  1  2  XX 10 | 17 | 1  2  XX 1  1  13 XX XX | 18 |
| 3  XX XX 1  1  12 XX XX | 17 | 1  2  XX 1  1  2  XX 10 | 17 | 2  XX 1  1  1  13 XX XX | 18 |
| 1  2  XX 1  1  12 XX XX | 17 | 2  XX 1  1  1  2  XX 10 | 17 | 1  1  1  1  1  13 XX XX | 18 |
| 2  XX 1  1  1  12 XX XX | 17 | 1  1  1  1  1  2  XX 10 | 17 | 6  XX XX XX XX XX 12 XX | 18 |
| 1  1  1  1  1  12 XX XX | 17 | 6  XX XX XX XX XX 1  10 | 17 | 1  5  XX XX XX XX 12 XX | 18 |
| 6  XX XX XX XX XX 11 XX | 17 | 1  5  XX XX XX XX 1  10 | 17 | 2  XX 4  XX XX XX 12 XX | 18 |
| 1  5  XX XX XX XX 11 XX | 17 | 2  XX 4  XX XX XX 1  10 | 17 | 1  1  4  XX XX XX 12 XX | 18 |
| 2  XX 4  XX XX XX 11 XX | 17 | 1  1  4  XX XX XX 1  10 | 17 | 3  XX XX 3  XX XX 12 XX | 18 |
| 1  1  4  XX XX XX 11 XX | 17 | 3  XX XX 3  XX XX 1  10 | 17 | 1  2  XX 3  XX XX 12 XX | 18 |
| 3  XX XX 3  XX XX 11 XX | 17 | 1  2  XX 3  XX XX 1  10 | 17 | 2  XX 1  3  XX XX 12 XX | 18 |
| 1  2  XX 3  XX XX 11 XX | 17 | 2  XX 1  3  XX XX 1  10 | 17 | 1  1  1  3  XX XX 12 XX | 18 |
| 2  XX 1  3  XX XX 11 XX | 17 | 1  1  1  3  XX XX 1  10 | 17 | 4  XX XX XX 2  XX 12 XX | 18 |
| 1  1  1  3  XX XX 11 XX | 17 | 4  XX XX XX 2  XX 1  10 | 17 | 1  3  XX XX 2  XX 12 XX | 18 |
| 4  XX XX XX 2  XX 11 XX | 17 | 1  3  XX XX 2  XX 1  10 | 17 | 1  2  XX 2  XX 12 XX | 18 |
| 1  3  XX XX 2  XX 11 XX | 17 | 2  XX 2  XX 2  XX 1  10 | 17 | 1  1  2  XX 2  XX 12 XX | 18 |
| 2  XX 2  XX 2  XX 11 XX | 17 | 1  1  2  XX 2  XX 1  10 | 17 | 3  XX XX 1  2  XX 12 XX | 18 |
| 1  1  2  XX 2  XX 11 XX | 17 | 3  XX XX 1  2  XX 1  10 | 17 | 1  2  XX 1  2  XX 12 XX | 18 |
| 3  XX XX 1  2  XX 11 XX | 17 | 1  2  XX 1  2  XX 1  10 | 17 | 2  XX 1  1  2  XX 12 XX | 18 |
| 1  2  XX 1  2  XX 11 XX | 17 | 2  XX 1  1  2  XX 1  10 | 17 | 1  1  1  1  2  XX 12 XX | 18 |
| 2  XX 1  1  2  XX 11 XX | 17 | 1  1  1  1  2  XX 1  10 | 17 | 5  XX XX XX XX 1  12 XX | 18 |
| 1  1  1  1  2  XX 11 XX | 17 | 5  XX XX XX XX 1  1  10 | 17 | 1  4  XX XX XX 1  12 XX | 18 |
| 5  XX XX XX XX 1  11 XX | 17 | 1  4  XX XX XX 1  1  10 | 17 | 2  XX 3  XX XX 1  12 XX | 18 |
| 1  4  XX XX XX 1  11 XX | 17 | 2  XX 3  XX XX 1  1  10 | 17 | 1  1  3  XX XX 1  12 XX | 18 |
| 2  XX 3  XX XX 1  11 XX | 17 | 1  1  3  XX XX 1  1  10 | 17 | 3  XX XX 2  XX 1  12 XX | 18 |
| 1  1  3  XX XX 1  11 XX | 17 | 3  XX XX 2  XX 1  1  10 | 17 | 1  2  XX 2  XX 1  12 XX | 18 |
| 3  XX XX 2  XX 1  11 XX | 17 | 1  2  XX 2  XX 1  1  10 | 17 | 2  XX 1  2  XX 1  12 XX | 18 |
| 1  2  XX 2  XX 1  11 XX | 17 | 2  XX 1  2  XX 1  1  10 | 17 | 1  1  1  2  XX 1  12 XX | 18 |
| 2  XX 1  2  XX 1  11 XX | 17 | 1  1  1  2  XX 1  1  10 | 17 | 4  XX XX XX 1  1  12 XX | 18 |
| 1  1  1  2  XX 1  11 XX | 17 | 4  XX XX XX 1  1  1  10 | 17 | 1  3  XX XX 1  1  12 XX | 18 |
| 4  XX XX XX 1  1  11 XX | 17 | 1  3  XX XX 1  1  1  10 | 17 | 2  XX 2  XX 1  1  12 XX | 18 |
| 1  3  XX XX 1  1  11 XX | 17 | 2  XX 2  XX 1  1  1  10 | 17 | 1  1  2  XX 1  1  12 XX | 18 |
| 2  XX 2  XX 1  1  11 XX | 17 | 1  1  2  XX 1  1  1  10 | 17 | 3  XX XX 1  1  1  12 XX | 18 |
| 1  1  2  XX 1  1  11 XX | 17 | 3  XX XX 1  1  1  1  10 | 17 | 1  2  XX 1  1  1  12 XX | 18 |
| 3  XX XX 1  1  1  11 XX | 17 | 1  2  XX 1  1  1  1  10 | 17 | 2  XX 1  1  1  1  12 XX | 18 |
| 1  2  XX 1  1  1  11 XX | 17 | 2  XX 1  1  1  1  1  10 | 17 | 1  1  1  1  1  1  12 XX | 18 |
| 2  XX 1  1  1  1  11 XX | 17 | 1  1  1  1  1  1  1  10 | 17 | 7  XX XX XX XX XX XX 11 | 18 |
| 1  1  1  1  1  1  11 XX | 17 | 18 XX XX XX XX XX XX XX | 18 | 1  6  XX XX XX XX XX 11 | 18 |
| 7  XX XX XX XX XX XX 10 | 17 | 1  17 XX XX XX XX XX XX | 18 | 2  XX 5  XX XX XX XX 11 | 18 |
| 1  6  XX XX XX XX XX 10 | 17 | 2  XX 16 XX XX XX XX XX | 18 | 1  1  5  XX XX XX XX 11 | 18 |
| 2  XX 5  XX XX XX XX 10 | 17 | 1  1  16 XX XX XX XX XX | 18 | 3  XX XX 4  XX XX XX 11 | 18 |
| 1  1  5  XX XX XX XX 10 | 17 | 3  XX XX 15 XX XX XX XX | 18 | 1  2  XX 4  XX XX XX 11 | 18 |
| 3  XX XX 4  XX XX XX 10 | 17 | 1  2  XX 15 XX XX XX XX | 18 | 2  XX 1  4  XX XX XX 11 | 18 |
| 1  2  XX 4  XX XX XX 10 | 17 | 2  XX 1  15 XX XX XX XX | 18 | 1  1  1  4  XX XX XX 11 | 18 |
| 2  XX 1  4  XX XX XX 10 | 17 | 1  1  1  15 XX XX XX XX | 18 | 4  XX XX XX 3  XX XX 11 | 18 |
| 1  1  1  4  XX XX XX 10 | 17 | 4  XX XX XX 14 XX XX XX | 18 | 1  3  XX XX 3  XX XX 11 | 18 |
| 4  XX XX XX 3  XX XX 10 | 17 | 1  3  XX XX 14 XX XX XX | 18 | 2  XX 2  XX 3  XX XX 11 | 18 |
| 1  3  XX XX 3  XX XX 10 | 17 | 2  XX 2  XX 14 XX XX XX | 18 | 1  1  2  XX 3  XX XX 11 | 18 |
| 2  XX 2  XX 3  XX XX 10 | 17 | 1  1  2  XX 14 XX XX XX | 18 | 3  XX XX 1  3  XX XX 11 | 18 |
| 1  1  2  XX 3  XX XX 10 | 17 | 3  XX XX 1  14 XX XX XX | 18 | 1  2  XX 1  3  XX XX 11 | 18 |
| 3  XX XX 1  3  XX XX 10 | 17 | 1  2  XX 1  14 XX XX XX | 18 | 2  XX 1  1  3  XX XX 11 | 18 |
| 1  2  XX 1  3  XX XX 10 | 17 | 2  XX 1  1  14 XX XX XX | 18 | 1  1  1  1  3  XX XX 11 | 18 |
| 2  XX 1  1  3  XX XX 10 | 17 | 1  1  1  1  14 XX XX XX | 18 | 5  XX XX XX XX 2  XX 11 | 18 |
| 1  1  1  1  3  XX XX 10 | 17 | 5  XX XX XX XX 2  XX XX | 18 | 1  4  XX XX XX 2  XX 11 | 18 |
| 5  XX XX XX XX 2  XX 10 | 17 | 1  4  XX XX XX 2  XX XX | 18 | 2  XX 3  XX XX 2  XX 11 | 18 |
| 1  4  XX XX XX 2  XX 10 | 17 | 2  XX 3  XX XX 2  XX XX | 18 | 1  1  3  XX XX 2  XX 11 | 18 |
| 2  XX 3  XX XX 2  XX 10 | 17 | 1  1  3  XX XX 2  XX XX | 18 | 3  XX XX 2  XX 2  XX 11 | 18 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 1  2  XX 2  XX 2  XX 11 | 18 | 2  XX 1  2  XX 14 XX XX | 19 | 1  1  1  2  XX 2  XX 12 | 19 |
| 2  XX 1  2  XX 2  XX 11 | 18 | 1  1  1  2  XX 14 XX XX | 19 | 4  XX XX XX 1  2  XX 12 | 19 |
| 1  1  2  XX 2  XX 11 | 18 | 4  XX XX XX 1  14 XX XX | 19 | 1  3  XX XX 1  2  XX 12 | 19 |
| 4  XX XX XX 1  2  XX 11 | 18 | 1  3  XX XX 1  14 XX XX | 19 | 2  XX 2  XX 1  2  XX 12 | 19 |
| 1  3  XX XX 1  2  XX 11 | 18 | 2  XX 2  XX 1  14 XX XX | 19 | 1  1  2  XX 1  2  XX 12 | 19 |
| 2  XX 2  XX 1  2  XX 11 | 18 | 1  1  2  XX 1  14 XX XX | 19 | 3  XX XX 1  1  2  XX 12 | 19 |
| 1  1  2  XX 1  2  XX 11 | 18 | 3  XX XX 1  1  14 XX XX | 19 | 1  2  XX 1  1  2  XX 12 | 19 |
| 3  XX XX 1  1  2  XX 11 | 18 | 1  2  XX 1  1  14 XX XX | 19 | 2  XX 1  1  1  2  XX 12 | 19 |
| 1  2  XX 1  1  2  XX 11 | 18 | 2  XX 1  1  1  14 XX XX | 19 | 1  1  1  1  2  XX 12 | 19 |
| 2  XX 1  1  1  2  XX 11 | 18 | 1  1  1  1  1  14 XX XX | 19 | 6  XX XX XX XX XX 1  12 | 19 |
| 1  1  1  1  2  XX 11 | 18 | 6  XX XX XX XX XX 13 XX | 19 | 1  5  XX XX XX XX 1  12 | 19 |
| 6  XX XX XX XX XX 1  11 | 18 | 1  5  XX XX XX XX 13 XX | 19 | 2  XX 4  XX XX XX 1  12 | 19 |
| 1  5  XX XX XX XX 1  11 | 18 | 2  XX 4  XX XX XX 13 XX | 19 | 1  1  4  XX XX XX 1  12 | 19 |
| 2  XX 4  XX XX XX 1  11 | 18 | 1  1  4  XX XX XX 13 XX | 19 | 3  XX XX 3  XX XX 1  12 | 19 |
| 1  1  4  XX XX XX 1  11 | 18 | 3  XX XX 3  XX XX 13 XX | 19 | 1  2  XX 3  XX XX 1  12 | 19 |
| 3  XX XX 3  XX XX 1  11 | 18 | 1  2  XX 3  XX XX 13 XX | 19 | 2  XX 1  3  XX XX 1  12 | 19 |
| 1  2  XX 3  XX XX 1  11 | 18 | 2  XX 1  3  XX XX 13 XX | 19 | 1  1  1  3  XX XX 1  12 | 19 |
| 2  XX 1  3  XX XX 1  11 | 18 | 1  1  1  3  XX XX 13 XX | 19 | 4  XX XX XX 2  XX 1  12 | 19 |
| 1  1  1  3  XX XX 1  11 | 18 | 4  XX XX XX 2  XX 13 XX | 19 | 1  3  XX XX 2  XX 1  12 | 19 |
| 4  XX XX XX 2  XX 1  11 | 18 | 1  3  XX XX 2  XX 13 XX | 19 | 2  XX 2  XX 2  XX 1  12 | 19 |
| 1  3  XX XX 2  XX 1  11 | 18 | 2  XX 2  XX 2  XX 13 XX | 19 | 1  1  2  XX 2  XX 1  12 | 19 |
| 2  XX 2  XX 2  XX 1  11 | 18 | 1  1  2  XX 2  XX 13 XX | 19 | 3  XX XX 1  2  XX 1  12 | 19 |
| 1  1  2  XX 2  XX 1  11 | 18 | 3  XX XX 1  2  XX 13 XX | 19 | 1  2  XX 1  2  XX 1  12 | 19 |
| 3  XX XX 1  2  XX 1  11 | 18 | 1  2  XX 1  2  XX 13 XX | 19 | 2  XX 1  1  2  XX 1  12 | 19 |
| 1  2  XX 1  2  XX 1  11 | 18 | 2  XX 1  1  2  XX 13 XX | 19 | 1  1  1  1  2  XX 1  12 | 19 |
| 2  XX 1  1  2  XX 1  11 | 18 | 1  1  1  1  2  XX 13 XX | 19 | 5  XX XX XX XX 1  1  12 | 19 |
| 1  1  1  1  2  XX 1  11 | 18 | 5  XX XX XX XX 1  13 XX | 19 | 1  4  XX XX XX 1  1  12 | 19 |
| 5  XX XX XX XX 1  1  11 | 18 | 1  4  XX XX XX 1  13 XX | 19 | 2  XX 3  XX XX 1  1  12 | 19 |
| 1  4  XX XX XX 1  1  11 | 18 | 2  XX 3  XX XX 1  13 XX | 19 | 1  1  3  XX XX 1  1  12 | 19 |
| 2  XX 3  XX XX 1  1  11 | 18 | 1  1  3  XX XX 1  13 XX | 19 | 3  XX XX 2  XX 1  1  12 | 19 |
| 1  1  3  XX XX 1  1  11 | 18 | 3  XX XX 2  XX 1  13 XX | 19 | 1  2  XX 2  XX 1  1  12 | 19 |
| 3  XX XX 2  XX 1  1  11 | 18 | 1  2  XX 2  XX 1  13 XX | 19 | 2  XX 1  2  XX 1  1  12 | 19 |
| 1  2  XX 2  XX 1  1  11 | 18 | 2  XX 1  2  XX 1  13 XX | 19 | 1  1  1  2  XX 1  1  12 | 19 |
| 2  XX 1  2  XX 1  1  11 | 18 | 1  1  1  2  XX 1  13 XX | 19 | 4  XX XX XX 1  1  1  12 | 19 |
| 1  1  1  2  XX 1  1  11 | 18 | 4  XX XX XX 1  1  13 XX | 19 | 1  3  XX XX 1  1  1  12 | 19 |
| 4  XX XX XX 1  1  1  11 | 18 | 1  3  XX XX 1  1  13 XX | 19 | 2  XX 2  XX 1  1  1  12 | 19 |
| 1  3  XX XX 1  1  1  11 | 18 | 2  XX 2  XX 1  1  13 XX | 19 | 1  1  2  XX 1  1  1  12 | 19 |
| 2  XX 2  XX 1  1  1  11 | 18 | 1  1  2  XX 1  1  13 XX | 19 | 3  XX XX 1  1  1  1  12 | 19 |
| 1  2  XX 1  1  1  11 | 18 | 3  XX XX 1  1  1  13 XX | 19 | 1  2  XX 1  1  1  1  12 | 19 |
| 3  XX XX 1  1  1  1  11 | 18 | 1  2  XX 1  1  1  13 XX | 19 | 2  XX 1  1  1  1  1  12 | 19 |
| 1  2  XX 1  1  1  1  11 | 18 | 2  XX 1  1  1  1  13 XX | 19 | 1  1  1  1  1  1  12 | 19 |
| 2  XX 1  1  1  1  1  11 | 18 | 1  1  1  1  1  13 XX | 19 | 20 XX XX XX XX XX XX XX | 20 |
| 1  1  1  1  1  1  11 | 18 | 7  XX XX XX XX XX XX 12 | 19 | 1  19 XX XX XX XX XX XX | 20 |
| 19 XX XX XX XX XX XX XX | 19 | 1  6  XX XX XX XX XX 12 | 19 | 2  XX 18 XX XX XX XX XX | 20 |
| 1  18 XX XX XX XX XX XX | 19 | 2  XX 5  XX XX XX XX 12 | 19 | 1  1  18 XX XX XX XX XX | 20 |
| 2  XX 17 XX XX XX XX XX | 19 | 1  1  5  XX XX XX XX 12 | 19 | 3  XX XX 17 XX XX XX XX | 20 |
| 1  1  17 XX XX XX XX XX | 19 | 3  XX XX 4  XX XX XX 12 | 19 | 1  2  XX 17 XX XX XX XX | 20 |
| 3  XX XX 16 XX XX XX XX | 19 | 1  2  XX 4  XX XX XX 12 | 19 | 2  XX 1  17 XX XX XX XX | 20 |
| 1  2  XX 16 XX XX XX XX | 19 | 2  XX 1  4  XX XX XX 12 | 19 | 1  1  1  17 XX XX XX XX | 20 |
| 2  XX 1  16 XX XX XX XX | 19 | 1  1  1  4  XX XX XX 12 | 19 | 4  XX XX XX 16 XX XX XX | 20 |
| 1  1  1  16 XX XX XX XX | 19 | 4  XX XX XX 3  XX XX 12 | 19 | 1  3  XX XX 16 XX XX XX | 20 |
| 4  XX XX XX 15 XX XX XX | 19 | 1  3  XX XX 3  XX XX 12 | 19 | 2  XX 2  XX 16 XX XX XX | 20 |
| 1  3  XX XX 15 XX XX XX | 19 | 2  XX 2  XX 3  XX XX 12 | 19 | 1  1  2  XX 16 XX XX XX | 20 |
| 2  XX 2  XX 15 XX XX XX | 19 | 1  1  2  XX 3  XX XX 12 | 19 | 3  XX XX 1  16 XX XX XX | 20 |
| 1  1  2  XX 15 XX XX XX | 19 | 3  XX XX 1  3  XX XX 12 | 19 | 1  2  XX 1  16 XX XX XX | 20 |
| 3  XX XX 1  15 XX XX XX | 19 | 1  2  XX 1  3  XX XX 12 | 19 | 2  XX 1  1  16 XX XX XX | 20 |
| 1  2  XX 1  15 XX XX XX | 19 | 2  XX 1  1  3  XX XX 12 | 19 | 1  1  1  1  16 XX XX XX | 20 |
| 2  XX 1  1  15 XX XX XX | 19 | 1  1  1  1  3  XX XX 12 | 19 | 5  XX XX XX XX 15 XX XX | 20 |
| 1  1  1  1  15 XX XX XX | 19 | 5  XX XX XX XX 2  XX 12 | 19 | 1  4  XX XX XX 15 XX XX | 20 |
| 5  XX XX XX XX 14 XX XX | 19 | 1  4  XX XX XX 2  XX 12 | 19 | 2  XX 3  XX XX 15 XX XX | 20 |
| 1  4  XX XX XX 14 XX XX | 19 | 2  XX 3  XX XX 2  XX 12 | 19 | 1  1  3  XX XX 15 XX XX | 20 |
| 2  XX 3  XX XX 14 XX XX | 19 | 1  1  3  XX XX 2  XX 12 | 19 | 3  XX XX 2  XX 15 XX XX | 20 |
| 1  1  3  XX XX 14 XX XX | 19 | 3  XX XX 2  XX 2  XX 12 | 19 | 1  2  XX 2  XX 15 XX XX | 20 |
| 3  XX XX 2  XX 14 XX XX | 19 | 1  2  XX 2  XX 2  XX 12 | 19 | 2  XX 1  2  XX 15 XX XX | 20 |
| 1  2  XX 2  XX 14 XX XX | 19 | 2  XX 1  2  XX 2  XX 12 | 19 | 1  1  1  2  XX 15 XX XX | 20 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 4  XX XX XX 1  15 XX XX | 20 | 1  3  XX XX 1  2  XX 13 | 20 | 2  XX 2  XX 1  16 XX XX | 21 |
| 1  3  XX XX 1  15 XX XX | 20 | 2  XX 2  XX 1  2  XX 13 | 20 | 1  1  2  XX 1  16 XX XX | 21 |
| 2  XX 2  XX 1  15 XX XX | 20 | 1  1  2  XX 1  2  XX 13 | 20 | 3  XX XX 1  1  16 XX XX | 21 |
| 1  1  2  XX 1  15 XX XX | 20 | 3  XX XX 1  1  2  XX 13 | 20 | 1  2  XX 1  1  16 XX XX | 21 |
| 3  XX XX 1  1  15 XX XX | 20 | 1  2  XX 1  1  2  XX 13 | 20 | 2  XX 1  1  1  16 XX XX | 21 |
| 1  2  XX 1  1  15 XX XX | 20 | 2  XX 1  1  1  2  XX 13 | 20 | 1  1  1  1  1  16 XX XX | 21 |
| 2  XX 1  1  1  15 XX XX | 20 | 1  1  1  1  2  XX 13 | 20 | 6  XX XX XX XX XX 15 XX | 21 |
| 1  1  1  1  1  15 XX XX | 20 | 6  XX XX XX XX 1  13 | 20 | 1  5  XX XX XX XX 15 XX | 21 |
| 6  XX XX XX XX XX 14 XX | 20 | 1  5  XX XX XX XX 1  13 | 20 | 2  XX 4  XX XX XX 15 XX | 21 |
| 1  5  XX XX XX XX 14 XX | 20 | 2  XX 4  XX XX XX 1  13 | 20 | 1  1  4  XX XX XX 15 XX | 21 |
| 2  XX 4  XX XX XX 14 XX | 20 | 1  1  4  XX XX XX 1  13 | 20 | 3  XX XX 3  XX XX 15 XX | 21 |
| 1  1  4  XX XX XX 14 XX | 20 | 3  XX XX 3  XX XX 1  13 | 20 | 1  2  XX 3  XX XX 15 XX | 21 |
| 3  XX XX 3  XX XX 14 XX | 20 | 1  2  XX 3  XX XX 1  13 | 20 | 2  XX 1  3  XX XX 15 XX | 21 |
| 1  2  XX 3  XX XX 14 XX | 20 | 2  XX 1  3  XX XX 1  13 | 20 | 1  1  1  3  XX XX 15 XX | 21 |
| 2  XX 1  3  XX XX 14 XX | 20 | 1  1  1  3  XX XX 1  13 | 20 | 4  XX XX XX 2  XX 15 XX | 21 |
| 1  1  1  3  XX XX 14 XX | 20 | 4  XX XX XX 2  XX 1  13 | 20 | 1  3  XX XX 2  XX 15 XX | 21 |
| 4  XX XX XX 2  XX 14 XX | 20 | 1  3  XX XX 2  XX 1  13 | 20 | 2  XX 2  XX 2  XX 15 XX | 21 |
| 1  3  XX XX 2  XX 14 XX | 20 | 2  XX 2  XX 2  XX 1  13 | 20 | 1  1  2  XX 2  XX 15 XX | 21 |
| 2  XX 2  XX 2  XX 14 XX | 20 | 1  1  2  XX 2  XX 1  13 | 20 | 3  XX XX 1  2  XX 15 XX | 21 |
| 1  1  2  XX 2  XX 14 XX | 20 | 3  XX XX 1  2  XX 1  13 | 20 | 1  2  XX 1  2  XX 15 XX | 21 |
| 3  XX XX 1  2  XX 14 XX | 20 | 1  2  XX 1  2  XX 1  13 | 20 | 2  XX 1  1  2  XX 15 XX | 21 |
| 1  2  XX 1  2  XX 14 XX | 20 | 2  XX 1  1  2  XX 1  13 | 20 | 1  1  1  1  2  XX 15 XX | 21 |
| 2  XX 1  1  2  XX 14 XX | 20 | 1  1  1  1  2  XX 1  13 | 20 | 5  XX XX XX XX 1  15 XX | 21 |
| 1  1  1  1  2  XX 14 XX | 20 | 5  XX XX XX XX 1  1  13 | 20 | 1  4  XX XX XX 1  15 XX | 21 |
| 5  XX XX XX XX 1  14 XX | 20 | 1  4  XX XX XX 1  1  13 | 20 | 2  XX 3  XX XX 1  15 XX | 21 |
| 1  4  XX XX XX 1  14 XX | 20 | 2  XX 3  XX XX 1  1  13 | 20 | 1  1  3  XX XX 1  15 XX | 21 |
| 2  XX 3  XX XX 1  14 XX | 20 | 1  1  3  XX XX 1  1  13 | 20 | 3  XX XX 2  XX 1  15 XX | 21 |
| 1  1  3  XX XX 1  14 XX | 20 | 3  XX XX 2  XX 1  1  13 | 20 | 1  2  XX 2  XX 1  15 XX | 21 |
| 3  XX XX 2  XX 1  14 XX | 20 | 1  2  XX 2  XX 1  1  13 | 20 | 2  XX 1  2  XX 1  15 XX | 21 |
| 1  2  XX 2  XX 1  14 XX | 20 | 2  XX 1  2  XX 1  1  13 | 20 | 1  1  1  2  XX 1  15 XX | 21 |
| 2  XX 1  2  XX 1  14 XX | 20 | 1  1  1  2  XX 1  1  13 | 20 | 4  XX XX XX 1  1  15 XX | 21 |
| 1  1  1  2  XX 1  14 XX | 20 | 4  XX XX XX 1  1  1  13 | 20 | 1  3  XX XX 1  1  15 XX | 21 |
| 4  XX XX XX 1  1  14 XX | 20 | 1  3  XX XX 1  1  1  13 | 20 | 2  XX 2  XX 1  1  15 XX | 21 |
| 1  3  XX XX 1  1  14 XX | 20 | 2  XX 2  XX 1  1  1  13 | 20 | 1  1  2  XX 1  1  15 XX | 21 |
| 2  XX 2  XX 1  1  14 XX | 20 | 1  1  2  XX 1  1  1  13 | 20 | 3  XX XX 1  1  1  15 XX | 21 |
| 1  1  2  XX 1  1  14 XX | 20 | 3  XX XX 1  1  1  1  13 | 20 | 1  2  XX 1  1  1  15 XX | 21 |
| 3  XX XX 1  1  1  14 XX | 20 | 1  2  XX 1  1  1  1  13 | 20 | 2  XX 1  1  1  1  15 XX | 21 |
| 1  2  XX 1  1  1  14 XX | 20 | 2  XX 1  1  1  1  1  13 | 20 | 1  1  1  1  1  1  15 XX | 21 |
| 2  XX 1  1  1  1  14 XX | 20 | 1  1  1  1  1  1  13 | 20 | 7  XX XX XX XX XX XX 14 | 21 |
| 1  1  1  1  1  1  14 XX | 20 | 21 XX XX XX XX XX XX XX | 21 | 1  6  XX XX XX XX XX 14 | 21 |
| 7  XX XX XX XX XX XX 13 | 20 | 1  20 XX XX XX XX XX XX | 21 | 2  XX 5  XX XX XX XX 14 | 21 |
| 1  6  XX XX XX XX XX 13 | 20 | 2  XX 19 XX XX XX XX XX | 21 | 1  1  5  XX XX XX XX 14 | 21 |
| 2  XX 5  XX XX XX XX 13 | 20 | 1  1  19 XX XX XX XX XX | 21 | 3  XX XX 4  XX XX XX 14 | 21 |
| 1  1  5  XX XX XX XX 13 | 20 | 3  XX XX 18 XX XX XX XX | 21 | 1  2  XX 4  XX XX XX 14 | 21 |
| 3  XX XX 4  XX XX XX 13 | 20 | 1  2  XX 18 XX XX XX XX | 21 | 2  XX 1  4  XX XX XX 14 | 21 |
| 1  2  XX 4  XX XX XX 13 | 20 | 2  XX 1  18 XX XX XX XX | 21 | 1  1  1  4  XX XX XX 14 | 21 |
| 2  XX 1  4  XX XX XX 13 | 20 | 1  1  1  18 XX XX XX XX | 21 | 4  XX XX XX 3  XX XX 14 | 21 |
| 1  1  1  4  XX XX XX 13 | 20 | 4  XX XX XX 17 XX XX XX | 21 | 1  3  XX XX 3  XX XX 14 | 21 |
| 4  XX XX XX 3  XX XX 13 | 20 | 1  3  XX XX 17 XX XX XX | 21 | 2  XX 2  XX 3  XX XX 14 | 21 |
| 1  3  XX XX 3  XX XX 13 | 20 | 2  XX 2  XX 17 XX XX XX | 21 | 1  1  2  XX 3  XX XX 14 | 21 |
| 2  XX 2  XX 3  XX XX 13 | 20 | 1  1  2  XX 17 XX XX XX | 21 | 3  XX XX 1  3  XX XX 14 | 21 |
| 1  1  2  XX 3  XX XX 13 | 20 | 3  XX XX 1  17 XX XX XX | 21 | 1  2  XX 1  3  XX XX 14 | 21 |
| 3  XX XX 1  3  XX XX 13 | 20 | 1  2  XX 1  17 XX XX XX | 21 | 2  XX 1  1  3  XX XX 14 | 21 |
| 1  2  XX 1  3  XX XX 13 | 20 | 2  XX 1  1  17 XX XX XX | 21 | 1  1  1  1  3  XX XX 14 | 21 |
| 2  XX 1  1  3  XX XX 13 | 20 | 1  1  1  1  17 XX XX XX | 21 | 5  XX XX XX XX 2  XX 14 | 21 |
| 1  1  1  1  3  XX XX 13 | 20 | 5  XX XX XX XX 16 XX XX | 21 | 1  4  XX XX XX 2  XX 14 | 21 |
| 5  XX XX XX XX 2  XX 13 | 20 | 1  4  XX XX XX 16 XX XX | 21 | 2  XX 3  XX XX 2  XX 14 | 21 |
| 1  4  XX XX XX 2  XX 13 | 20 | 2  XX 3  XX XX 16 XX XX | 21 | 1  1  3  XX XX 2  XX 14 | 21 |
| 2  XX 3  XX XX 2  XX 13 | 20 | 1  1  3  XX XX 16 XX XX | 21 | 3  XX XX 2  XX 2  XX 14 | 21 |
| 1  1  3  XX XX 2  XX 13 | 20 | 3  XX XX 2  16 XX XX | 21 | 1  2  XX 2  XX 2  XX 14 | 21 |
| 3  XX XX 2  XX 2  XX 13 | 20 | 1  2  XX 2  16 XX XX | 21 | 2  XX 1  2  XX 2  XX 14 | 21 |
| 1  2  XX 2  XX 2  XX 13 | 20 | 2  XX 1  2  XX 16 XX XX | 21 | 1  1  1  2  XX 2  XX 14 | 21 |
| 2  XX 1  2  XX 2  XX 13 | 20 | 1  1  1  2  XX 16 XX XX | 21 | 4  XX XX XX 1  2  XX 14 | 21 |
| 1  1  1  2  XX 2  XX 13 | 20 | 4  XX XX XX 1  16 XX XX | 21 | 1  3  XX XX 1  2  XX 14 | 21 |
| 4  XX XX XX 1  2  XX 13 | 20 | 1  3  XX XX 1  16 XX XX | 21 | 2  XX 2  XX 1  2  XX 14 | 21 |

| Inputs (from stagger position) 0 1 2 3 4 5 6 7 | Output |
|---|---|
| 1  1  2  XX 1  2  XX 14 | 21 |
| 3  XX XX 1  1  2  XX 14 | 21 |
| 1  2  XX 1  1  2  XX 14 | 21 |
| 2  XX 1  1  1  2  XX 14 | 21 |
| 1  1  1  1  1  2  XX 14 | 21 |
| 6  XX XX XX XX XX 1  14 | 21 |
| 1  5  XX XX XX XX 1  14 | 21 |
| 2  XX 4  XX XX XX 1  14 | 21 |
| 1  1  4  XX XX XX 1  14 | 21 |
| 3  XX XX 3  XX XX 1  14 | 21 |
| 1  2  XX 3  XX XX 1  14 | 21 |
| 2  XX 1  3  XX XX 1  14 | 21 |
| 1  1  1  3  XX XX 1  14 | 21 |
| 4  XX XX XX 2  XX 1  14 | 21 |
| 1  3  XX XX 2  XX 1  14 | 21 |
| 2  XX 2  XX 2  XX 1  14 | 21 |
| 1  1  2  XX 2  XX 1  14 | 21 |
| 3  XX XX 1  2  XX 1  14 | 21 |
| 1  2  XX 1  2  XX 1  14 | 21 |
| 2  XX 1  1  2  XX 1  14 | 21 |
| 1  1  1  1  2  XX 1  14 | 21 |
| 5  XX XX XX XX 1  1  14 | 21 |
| 1  4  XX XX XX 1  1  14 | 21 |
| 2  XX 3  XX XX 1  1  14 | 21 |
| 1  1  3  XX XX 1  1  14 | 21 |
| 3  XX XX 2  XX 1  1  14 | 21 |
| 1  2  XX 2  XX 1  1  14 | 21 |
| 2  XX 1  2  XX 1  1  14 | 21 |
| 1  1  1  2  XX 1  1  14 | 21 |
| 4  XX XX XX 1  1  1  14 | 21 |
| 1  3  XX XX 1  1  1  14 | 21 |
| 2  XX 2  XX 1  1  1  14 | 21 |
| 1  1  2  XX 1  1  1  14 | 21 |
| 3  XX XX 1  1  1  1  14 | 21 |
| 1  2  XX 1  1  1  1  14 | 21 |
| 2  XX 1  1  1  1  1  14 | 21 |
| 1  1  1  1  1  1  1  14 | 21 |
| 22 XX XX XX XX XX XX XX | 22 |
| 1  21 XX XX XX XX XX XX | 22 |
| 2  XX 20 XX XX XX XX XX | 22 |
| 1  1  20 XX XX XX XX XX | 22 |
| 3  XX XX 19 XX XX XX XX | 22 |
| 1  2  XX 19 XX XX XX XX | 22 |
| 2  XX 1  19 XX XX XX XX | 22 |
| 1  1  1  19 XX XX XX XX | 22 |
| 4  XX XX XX 18 XX XX XX | 22 |
| 1  3  XX XX 18 XX XX XX | 22 |
| 2  XX 2  XX 18 XX XX XX | 22 |
| 1  1  2  XX 18 XX XX XX | 22 |
| 3  XX XX 1  18 XX XX XX | 22 |
| 1  2  XX 1  18 XX XX XX | 22 |
| 2  XX 1  1  18 XX XX XX | 22 |
| 1  1  1  1  18 XX XX XX | 22 |
| 5  XX XX XX XX 17 XX XX | 22 |
| 1  4  XX XX XX 17 XX XX | 22 |
| 2  XX 3  XX XX 17 XX XX | 22 |
| 1  1  3  XX XX 17 XX XX | 22 |
| 3  XX XX 2  XX 17 XX XX | 22 |
| 1  2  XX 2  XX 17 XX XX | 22 |
| 2  XX 1  2  XX 17 XX XX | 22 |
| 1  1  1  2  XX 17 XX XX | 22 |
| 4  XX XX XX 1  17 XX XX | 22 |
| 1  3  XX XX 1  17 XX XX | 22 |
| 2  XX 2  XX 1  17 XX XX | 22 |
| 1  1  2  XX 1  17 XX XX | 22 |

| Inputs (from stagger position) 0 1 2 3 4 5 6 7 | Output |
|---|---|
| 3  XX XX 1  1  17 XX XX | 22 |
| 1  2  XX 1  1  17 XX XX | 22 |
| 2  XX 1  1  1  17 XX XX | 22 |
| 1  1  1  1  1  17 XX XX | 22 |
| 6  XX XX XX XX XX 16 XX | 22 |
| 1  5  XX XX XX XX 16 XX | 22 |
| 2  XX 4  XX XX XX 16 XX | 22 |
| 1  1  4  XX XX XX 16 XX | 22 |
| 3  XX XX 3  XX XX 16 XX | 22 |
| 1  2  XX 3  XX XX 16 XX | 22 |
| 2  XX 1  3  XX XX 16 XX | 22 |
| 1  1  1  3  XX XX 16 XX | 22 |
| 4  XX XX XX 2  XX 16 XX | 22 |
| 1  3  XX XX 2  XX 16 XX | 22 |
| 2  XX 2  XX 2  XX 16 XX | 22 |
| 1  1  2  XX 2  XX 16 XX | 22 |
| 3  XX XX 1  2  XX 16 XX | 22 |
| 1  2  XX 1  2  XX 16 XX | 22 |
| 2  XX 1  1  2  XX 16 XX | 22 |
| 1  1  1  1  2  XX 16 XX | 22 |
| 5  XX XX XX XX 1  16 XX | 22 |
| 1  4  XX XX XX 1  16 XX | 22 |
| 2  XX 3  XX XX 1  16 XX | 22 |
| 1  1  3  XX XX 1  16 XX | 22 |
| 3  XX XX 2  XX 1  16 XX | 22 |
| 1  2  XX 2  XX 1  16 XX | 22 |
| 2  XX 1  2  XX 1  16 XX | 22 |
| 1  1  1  2  XX 1  16 XX | 22 |
| 4  XX XX XX 1  1  16 XX | 22 |
| 1  3  XX XX 1  1  16 XX | 22 |
| 2  XX 2  XX 1  1  16 XX | 22 |
| 1  1  2  XX 1  1  16 XX | 22 |
| 3  XX XX 1  1  1  16 XX | 22 |
| 1  2  XX 1  1  1  16 XX | 22 |
| 2  XX 1  1  1  1  16 XX | 22 |
| 1  1  1  1  1  1  16 XX | 22 |
| 7  XX XX XX XX XX XX 15 | 22 |
| 1  6  XX XX XX XX XX 15 | 22 |
| 2  XX 5  XX XX XX XX 15 | 22 |
| 1  1  5  XX XX XX XX 15 | 22 |
| 3  XX XX 4  XX XX XX 15 | 22 |
| 1  2  XX 4  XX XX XX 15 | 22 |
| 2  XX 1  4  XX XX XX 15 | 22 |
| 1  1  1  4  XX XX XX 15 | 22 |
| 4  XX XX XX 3  XX XX 15 | 22 |
| 1  3  XX XX 3  XX XX 15 | 22 |
| 2  XX 2  XX 3  XX XX 15 | 22 |
| 1  1  2  XX 3  XX XX 15 | 22 |
| 3  XX XX 1  3  XX XX 15 | 22 |
| 1  2  XX 1  3  XX XX 15 | 22 |
| 2  XX 1  1  3  XX XX 15 | 22 |
| 1  1  1  1  3  XX XX 15 | 22 |
| 5  XX XX XX XX 2  XX 15 | 22 |
| 1  4  XX XX XX 2  XX 15 | 22 |
| 2  XX 3  XX XX 2  XX 15 | 22 |
| 1  1  3  XX XX 2  XX 15 | 22 |
| 3  XX XX 2  XX 2  XX 15 | 22 |
| 1  2  XX 2  XX 2  XX 15 | 22 |
| 2  XX 1  2  XX 2  XX 15 | 22 |
| 1  1  1  2  XX 2  XX 15 | 22 |
| 4  XX XX XX 1  2  XX 15 | 22 |
| 1  3  XX XX 1  2  XX 15 | 22 |
| 2  XX 2  XX 1  2  XX 15 | 22 |
| 1  1  2  XX 1  2  XX 15 | 22 |
| 3  XX XX 1  1  2  XX 15 | 22 |

| Inputs (from stagger position) 0 1 2 3 4 5 6 7 | Output |
|---|---|
| 1  2  XX 1  1  2  XX 15 | 22 |
| 2  XX 1  1  1  2  XX 15 | 22 |
| 1  1  1  1  1  2  XX 15 | 22 |
| 6  XX XX XX XX XX 1  15 | 22 |
| 1  5  XX XX XX XX 1  15 | 22 |
| 2  XX 4  XX XX XX 1  15 | 22 |
| 1  1  4  XX XX XX 1  15 | 22 |
| 3  XX XX 3  XX XX 1  15 | 22 |
| 1  2  XX 3  XX XX 1  15 | 22 |
| 2  XX 1  3  XX XX 1  15 | 22 |
| 1  1  1  3  XX XX 1  15 | 22 |
| 4  XX XX XX 2  XX 1  15 | 22 |
| 1  3  XX XX 2  XX 1  15 | 22 |
| 2  XX 2  XX 2  XX 1  15 | 22 |
| 1  1  2  XX 2  XX 1  15 | 22 |
| 3  XX XX 1  2  XX 1  15 | 22 |
| 1  2  XX 1  2  XX 1  15 | 22 |
| 2  XX 1  1  2  XX 1  15 | 22 |
| 1  1  1  1  2  XX 1  15 | 22 |
| 5  XX XX XX XX 1  1  15 | 22 |
| 1  4  XX XX XX 1  1  15 | 22 |
| 2  XX 3  XX XX 1  1  15 | 22 |
| 1  1  3  XX XX 1  1  15 | 22 |
| 3  XX XX 2  XX 1  1  15 | 22 |
| 1  2  XX 2  XX 1  1  15 | 22 |
| 2  XX 1  2  XX 1  1  15 | 22 |
| 1  1  1  2  XX 1  1  15 | 22 |
| 4  XX XX XX 1  1  1  15 | 22 |
| 1  3  XX XX 1  1  1  15 | 22 |
| 2  XX 2  XX 1  1  1  15 | 22 |
| 1  1  2  XX 1  1  1  15 | 22 |
| 3  XX XX 1  1  1  1  15 | 22 |
| 1  2  XX 1  1  1  1  15 | 22 |
| 2  XX 1  1  1  1  1  15 | 22 |
| 1  1  1  1  1  1  1  15 | 22 |
| 23 XX XX XX XX XX XX XX | 23 |
| 1  22 XX XX XX XX XX XX | 23 |
| 2  XX 21 XX XX XX XX XX | 23 |
| 1  1  21 XX XX XX XX XX | 23 |
| 3  XX XX 20 XX XX XX XX | 23 |
| 1  2  XX 20 XX XX XX XX | 23 |
| 2  XX 1  20 XX XX XX XX | 23 |
| 1  1  1  20 XX XX XX XX | 23 |
| 4  XX XX XX 19 XX XX XX | 23 |
| 1  3  XX XX 19 XX XX XX | 23 |
| 2  XX 2  XX 19 XX XX XX | 23 |
| 1  1  2  XX 19 XX XX XX | 23 |
| 3  XX XX 1  19 XX XX XX | 23 |
| 1  2  XX 1  19 XX XX XX | 23 |
| 2  XX 1  1  19 XX XX XX | 23 |
| 1  1  1  1  19 XX XX XX | 23 |
| 5  XX XX XX XX 18 XX XX | 23 |
| 1  4  XX XX XX 18 XX XX | 23 |
| 2  XX 3  XX XX 18 XX XX | 23 |
| 1  1  3  XX XX 18 XX XX | 23 |
| 3  XX XX 2  XX 18 XX XX | 23 |
| 1  2  XX 2  XX 18 XX XX | 23 |
| 2  XX 1  2  XX 18 XX XX | 23 |
| 1  1  1  2  XX 18 XX XX | 23 |
| 4  XX XX XX 1  18 XX XX | 23 |
| 1  3  XX XX 1  18 XX XX | 23 |
| 2  XX 2  XX 1  18 XX XX | 23 |
| 1  1  2  XX 1  18 XX XX | 23 |
| 3  XX XX 1  1  18 XX XX | 23 |
| 1  2  XX 1  1  18 XX XX | 23 |

| Inputs (from stagger position) | | | | | | | | Output | Inputs (from stagger position) | | | | | | | | Output | Inputs (from stagger position) | | | | | | | | Output |
|---|---|---|---|---|---|---|---|---|---|---|---|---|---|---|---|---|---|---|---|---|---|---|---|---|---|---|
| 0 | 1 | 2 | 3 | 4 | 5 | 6 | 7 | | 0 | 1 | 2 | 3 | 4 | 5 | 6 | 7 | | 0 | 1 | 2 | 3 | 4 | 5 | 6 | 7 | |
| 2 | XX | 1 | 1 | 1 | 18 | XX | XX | 23 | 1 | 1 | 1 | 1 | 1 | 2 | XX | 16 | 23 | 6 | XX | XX | XX | XX | XX | 18 | XX | 24 |
| 1 | 1 | 1 | 1 | 1 | 18 | XX | XX | 23 | 6 | XX | XX | XX | XX | XX | 1 | 16 | 23 | 1 | 5 | XX | XX | XX | XX | 18 | XX | 24 |
| 6 | XX | XX | XX | XX | XX | 17 | XX | 23 | 1 | 5 | XX | XX | XX | XX | 1 | 16 | 23 | 2 | XX | 4 | XX | XX | XX | 18 | XX | 24 |
| 1 | 5 | XX | XX | XX | XX | 17 | XX | 23 | 2 | XX | 4 | XX | XX | XX | 1 | 16 | 23 | 1 | 1 | 4 | XX | XX | XX | 18 | XX | 24 |
| 2 | XX | 4 | XX | XX | XX | 17 | XX | 23 | 1 | 1 | 4 | XX | XX | XX | 1 | 16 | 23 | 3 | XX | XX | 3 | XX | XX | 18 | XX | 24 |
| 1 | 1 | 4 | XX | XX | XX | 17 | XX | 23 | 3 | XX | XX | 3 | XX | XX | 1 | 16 | 23 | 1 | 2 | XX | 3 | XX | XX | 18 | XX | 24 |
| 3 | XX | XX | 3 | XX | XX | 17 | XX | 23 | 1 | 2 | XX | 3 | XX | XX | 1 | 16 | 23 | 2 | XX | 1 | 3 | XX | XX | 18 | XX | 24 |
| 1 | 2 | XX | 3 | XX | XX | 17 | XX | 23 | 2 | XX | 1 | 3 | XX | XX | 1 | 16 | 23 | 1 | 1 | 1 | 3 | XX | XX | 18 | XX | 24 |
| 2 | XX | 1 | 3 | XX | XX | 17 | XX | 23 | 1 | 1 | 1 | 3 | XX | XX | 1 | 16 | 23 | 4 | XX | XX | XX | 2 | XX | 18 | XX | 24 |
| 1 | 1 | 1 | 3 | XX | XX | 17 | XX | 23 | 4 | XX | XX | XX | 2 | XX | 1 | 16 | 23 | 1 | 3 | XX | XX | 2 | XX | 18 | XX | 24 |
| 4 | XX | XX | XX | 2 | XX | 17 | XX | 23 | 1 | 3 | XX | XX | 2 | XX | 1 | 16 | 23 | 2 | XX | 2 | XX | 2 | XX | 18 | XX | 24 |
| 1 | 3 | XX | XX | 2 | XX | 17 | XX | 23 | 2 | XX | 2 | XX | 2 | XX | 1 | 16 | 23 | 1 | 1 | 2 | XX | 2 | XX | 18 | XX | 24 |
| 2 | XX | 2 | XX | 2 | XX | 17 | XX | 23 | 1 | 1 | 2 | XX | 2 | XX | 1 | 16 | 23 | 3 | XX | XX | 1 | 2 | XX | 18 | XX | 24 |
| 1 | 1 | 2 | XX | 2 | XX | 17 | XX | 23 | 3 | XX | XX | 1 | 2 | XX | 1 | 16 | 23 | 1 | 2 | XX | 1 | 2 | XX | 18 | XX | 24 |
| 3 | XX | XX | 1 | 2 | XX | 17 | XX | 23 | 1 | 2 | XX | 1 | 2 | XX | 1 | 16 | 23 | 2 | XX | 1 | 1 | 2 | XX | 18 | XX | 24 |
| 1 | 2 | XX | 1 | 2 | XX | 17 | XX | 23 | 2 | XX | 1 | 1 | 2 | XX | 1 | 16 | 23 | 1 | 1 | 1 | 1 | 2 | XX | 18 | XX | 24 |
| 2 | XX | 1 | 1 | 2 | XX | 17 | XX | 23 | 1 | 1 | 1 | 1 | 2 | XX | 1 | 16 | 23 | 5 | XX | XX | XX | XX | 1 | 18 | XX | 24 |
| 1 | 1 | 1 | 1 | 2 | XX | 17 | XX | 23 | 5 | XX | XX | XX | XX | 1 | 1 | 16 | 23 | 1 | 4 | XX | XX | XX | 1 | 18 | XX | 24 |
| 5 | XX | XX | XX | XX | 1 | 17 | XX | 23 | 1 | 4 | XX | XX | XX | 1 | 1 | 16 | 23 | 2 | XX | 3 | XX | XX | 1 | 18 | XX | 24 |
| 1 | 4 | XX | XX | XX | 1 | 17 | XX | 23 | 2 | XX | 3 | XX | XX | 1 | 1 | 16 | 23 | 1 | 1 | 3 | XX | XX | 1 | 18 | XX | 24 |
| 2 | XX | 3 | XX | XX | 1 | 17 | XX | 23 | 1 | 1 | 3 | XX | XX | 1 | 1 | 16 | 23 | 3 | XX | XX | 2 | XX | 1 | 18 | XX | 24 |
| 1 | 1 | 3 | XX | XX | 1 | 17 | XX | 23 | 3 | XX | XX | 2 | XX | 1 | 1 | 16 | 23 | 1 | 2 | XX | 2 | XX | 1 | 18 | XX | 24 |
| 3 | XX | XX | 2 | XX | 1 | 17 | XX | 23 | 1 | 2 | XX | 2 | XX | 1 | 1 | 16 | 23 | 2 | XX | 1 | 2 | XX | 1 | 18 | XX | 24 |
| 1 | 2 | XX | 2 | XX | 1 | 17 | XX | 23 | 2 | XX | 1 | 2 | XX | 1 | 1 | 16 | 23 | 1 | 1 | 1 | 2 | XX | 1 | 18 | XX | 24 |
| 2 | XX | 1 | 2 | XX | 1 | 17 | XX | 23 | 1 | 1 | 1 | 2 | XX | 1 | 1 | 16 | 23 | 4 | XX | XX | XX | 1 | 1 | 18 | XX | 24 |
| 1 | 1 | 1 | 2 | XX | 1 | 17 | XX | 23 | 4 | XX | XX | XX | 1 | 1 | 1 | 16 | 23 | 1 | 3 | XX | XX | 1 | 1 | 18 | XX | 24 |
| 4 | XX | XX | XX | 1 | 1 | 17 | XX | 23 | 1 | 3 | XX | XX | 1 | 1 | 1 | 16 | 23 | 2 | XX | 2 | XX | 1 | 1 | 18 | XX | 24 |
| 1 | 3 | XX | XX | 1 | 1 | 17 | XX | 23 | 2 | XX | 2 | XX | 1 | 1 | 1 | 16 | 23 | 1 | 1 | 2 | XX | 1 | 1 | 18 | XX | 24 |
| 2 | XX | 2 | XX | 1 | 1 | 17 | XX | 23 | 1 | 1 | 2 | XX | 1 | 1 | 1 | 16 | 23 | 3 | XX | XX | 1 | 1 | 1 | 18 | XX | 24 |
| 1 | 1 | 2 | XX | 1 | 1 | 17 | XX | 23 | 3 | XX | XX | 1 | 1 | 1 | 1 | 16 | 23 | 1 | 2 | XX | 1 | 1 | 1 | 18 | XX | 24 |
| 3 | XX | XX | 1 | 1 | 1 | 17 | XX | 23 | 1 | 2 | XX | 1 | 1 | 1 | 1 | 16 | 23 | 2 | XX | 1 | 1 | 1 | 1 | 18 | XX | 24 |
| 1 | 2 | XX | 1 | 1 | 1 | 17 | XX | 23 | 2 | XX | 1 | 1 | 1 | 1 | 1 | 16 | 23 | 1 | 1 | 1 | 1 | 1 | 1 | 18 | XX | 24 |
| 2 | XX | 1 | 1 | 1 | 1 | 17 | XX | 23 | 1 | 1 | 1 | 1 | 1 | 1 | 1 | 16 | 23 | 7 | XX | XX | XX | XX | XX | XX | 17 | 24 |
| 1 | 1 | 1 | 1 | 1 | 1 | 17 | XX | 23 | 24 | XX | XX | XX | XX | XX | XX | XX | 24 | 1 | 6 | XX | XX | XX | XX | XX | 17 | 24 |
| 7 | XX | XX | XX | XX | XX | XX | 16 | 23 | 1 | 23 | XX | XX | XX | XX | XX | XX | 24 | 2 | XX | 5 | XX | XX | XX | XX | 17 | 24 |
| 1 | 6 | XX | XX | XX | XX | XX | 16 | 23 | 2 | XX | 22 | XX | XX | XX | XX | XX | 24 | 1 | 1 | 5 | XX | XX | XX | XX | 17 | 24 |
| 2 | XX | 5 | XX | XX | XX | XX | 16 | 23 | 1 | 1 | 22 | XX | XX | XX | XX | XX | 24 | 3 | XX | XX | 4 | XX | XX | XX | 17 | 24 |
| 1 | 1 | 5 | XX | XX | XX | XX | 16 | 23 | 3 | XX | XX | 21 | XX | XX | XX | XX | 24 | 1 | 2 | XX | 4 | XX | XX | XX | 17 | 24 |
| 3 | XX | XX | 4 | XX | XX | XX | 16 | 23 | 1 | 2 | XX | 21 | XX | XX | XX | XX | 24 | 2 | XX | 1 | 4 | XX | XX | XX | 17 | 24 |
| 1 | 2 | XX | 4 | XX | XX | XX | 16 | 23 | 2 | XX | 1 | 21 | XX | XX | XX | XX | 24 | 1 | 1 | 1 | 4 | XX | XX | XX | 17 | 24 |
| 2 | XX | 1 | 4 | XX | XX | XX | 16 | 23 | 1 | 1 | 1 | 21 | XX | XX | XX | XX | 24 | 4 | XX | XX | XX | 3 | XX | XX | 17 | 24 |
| 1 | 1 | 1 | 4 | XX | XX | XX | 16 | 23 | 4 | XX | XX | XX | 20 | XX | XX | XX | 24 | 1 | 3 | XX | XX | 3 | XX | XX | 17 | 24 |
| 4 | XX | XX | XX | 3 | XX | XX | 16 | 23 | 1 | 3 | XX | XX | 20 | XX | XX | XX | 24 | 2 | XX | 2 | XX | 3 | XX | XX | 17 | 24 |
| 1 | 3 | XX | XX | 3 | XX | XX | 16 | 23 | 2 | XX | 2 | XX | 20 | XX | XX | XX | 24 | 1 | 1 | 2 | XX | 3 | XX | XX | 17 | 24 |
| 2 | XX | 2 | XX | 3 | XX | XX | 16 | 23 | 1 | 1 | 2 | XX | 20 | XX | XX | XX | 24 | 3 | XX | XX | 1 | 3 | XX | XX | 17 | 24 |
| 1 | 1 | 2 | XX | 3 | XX | XX | 16 | 23 | 3 | XX | XX | 1 | 20 | XX | XX | XX | 24 | 1 | 2 | XX | 1 | 3 | XX | XX | 17 | 24 |
| 3 | XX | XX | 1 | 3 | XX | XX | 16 | 23 | 1 | 2 | XX | 1 | 20 | XX | XX | XX | 24 | 2 | XX | 1 | 1 | 3 | XX | XX | 17 | 24 |
| 1 | 2 | XX | 1 | 3 | XX | XX | 16 | 23 | 2 | XX | 1 | 1 | 20 | XX | XX | XX | 24 | 1 | 1 | 1 | 1 | 3 | XX | XX | 17 | 24 |
| 2 | XX | 1 | 1 | 3 | XX | XX | 16 | 23 | 1 | 1 | 1 | 1 | 20 | XX | XX | XX | 24 | 5 | XX | XX | XX | XX | 2 | XX | 17 | 24 |
| 1 | 1 | 1 | 1 | 3 | XX | XX | 16 | 23 | 5 | XX | XX | XX | XX | 19 | XX | XX | 24 | 1 | 4 | XX | XX | XX | 2 | XX | 17 | 24 |
| 5 | XX | XX | XX | XX | 2 | XX | 16 | 23 | 1 | 4 | XX | XX | XX | 19 | XX | XX | 24 | 2 | XX | 3 | XX | XX | 2 | XX | 17 | 24 |
| 1 | 4 | XX | XX | XX | 2 | XX | 16 | 23 | 2 | XX | 3 | XX | XX | 19 | XX | XX | 24 | 1 | 1 | 3 | XX | XX | 2 | XX | 17 | 24 |
| 2 | XX | 3 | XX | XX | 2 | XX | 16 | 23 | 1 | 1 | 3 | XX | XX | 19 | XX | XX | 24 | 3 | XX | XX | 2 | XX | 2 | XX | 17 | 24 |
| 1 | 1 | 3 | XX | XX | 2 | XX | 16 | 23 | 3 | XX | XX | 2 | XX | 19 | XX | XX | 24 | 1 | 2 | XX | 2 | XX | 2 | XX | 17 | 24 |
| 3 | XX | XX | 2 | XX | 2 | XX | 16 | 23 | 1 | 2 | XX | 2 | XX | 19 | XX | XX | 24 | 2 | XX | 1 | 2 | XX | 2 | XX | 17 | 24 |
| 1 | 2 | XX | 2 | XX | 2 | XX | 16 | 23 | 2 | XX | 1 | 2 | XX | 19 | XX | XX | 24 | 1 | 1 | 1 | 2 | XX | 2 | XX | 17 | 24 |
| 2 | XX | 1 | 2 | XX | 2 | XX | 16 | 23 | 1 | 1 | 1 | 2 | XX | 19 | XX | XX | 24 | 4 | XX | XX | XX | 1 | 2 | XX | 17 | 24 |
| 1 | 1 | 1 | 2 | XX | 2 | XX | 16 | 23 | 4 | XX | XX | XX | 1 | 19 | XX | XX | 24 | 1 | 3 | XX | XX | 1 | 2 | XX | 17 | 24 |
| 4 | XX | XX | XX | 1 | 2 | XX | 16 | 23 | 1 | 3 | XX | XX | 1 | 19 | XX | XX | 24 | 2 | XX | 2 | XX | 1 | 2 | XX | 17 | 24 |
| 1 | 3 | XX | XX | 1 | 2 | XX | 16 | 23 | 2 | XX | 2 | XX | 1 | 19 | XX | XX | 24 | 1 | 1 | 2 | XX | 1 | 2 | XX | 17 | 24 |
| 2 | XX | 2 | XX | 1 | 2 | XX | 16 | 23 | 1 | 1 | 2 | XX | 1 | 19 | XX | XX | 24 | 3 | XX | XX | 1 | 1 | 2 | XX | 17 | 24 |
| 1 | 1 | 2 | XX | 1 | 2 | XX | 16 | 23 | 3 | XX | XX | 1 | 1 | 19 | XX | XX | 24 | 1 | 2 | XX | 1 | 1 | 2 | XX | 17 | 24 |
| 3 | XX | XX | 1 | 1 | 2 | XX | 16 | 23 | 1 | 2 | XX | 1 | 1 | 19 | XX | XX | 24 | 2 | XX | 1 | 1 | 1 | 2 | XX | 17 | 24 |
| 1 | 2 | XX | 1 | 1 | 2 | XX | 16 | 23 | 2 | XX | 1 | 1 | 1 | 19 | XX | XX | 24 | 1 | 1 | 1 | 1 | 1 | 2 | XX | 17 | 24 |
| 2 | XX | 1 | 1 | 1 | 2 | XX | 16 | 23 | 1 | 1 | 1 | 1 | 1 | 19 | XX | XX | 24 | 6 | XX | XX | XX | XX | XX | 1 | 17 | 24 |

| Inputs (from stagger position) | | | | | | | | Output | Inputs (from stagger position) | | | | | | | | Output | Inputs (from stagger position) | | | | | | | | Output |
|---|---|---|---|---|---|---|---|---|---|---|---|---|---|---|---|---|---|---|---|---|---|---|---|---|---|---|
| 0 | 1 | 2 | 3 | 4 | 5 | 6 | 7 | | 0 | 1 | 2 | 3 | 4 | 5 | 6 | 7 | | 0 | 1 | 2 | 3 | 4 | 5 | 6 | 7 | |
| 1 | 5 | XX | XX | XX | XX | 1 | 17 | 24 | 2 | XX | 4 | XX | XX | XX | 19 | XX | 25 | 1 | 1 | 4 | XX | XX | XX | 1 | 18 | 25 |
| 2 | XX | 4 | XX | XX | XX | 1 | 17 | 24 | 1 | 1 | 4 | XX | XX | XX | 19 | XX | 25 | 3 | XX | XX | 3 | XX | XX | 1 | 18 | 25 |
| 1 | 1 | 4 | XX | XX | XX | 1 | 17 | 24 | 3 | XX | XX | 3 | XX | XX | 19 | XX | 25 | 1 | 2 | XX | 3 | XX | XX | 1 | 18 | 25 |
| 3 | XX | XX | 3 | XX | XX | 1 | 17 | 24 | 1 | 2 | XX | 3 | XX | XX | 19 | XX | 25 | 2 | XX | 1 | 3 | XX | XX | 1 | 18 | 25 |
| 1 | 2 | XX | 3 | XX | XX | 1 | 17 | 24 | 2 | XX | 1 | 3 | XX | XX | 19 | XX | 25 | 1 | 1 | 1 | 3 | XX | XX | 1 | 18 | 25 |
| 2 | XX | 1 | 3 | XX | XX | 1 | 17 | 24 | 1 | 1 | 1 | 3 | XX | XX | 19 | XX | 25 | 4 | XX | XX | XX | 2 | XX | 1 | 18 | 25 |
| 1 | 1 | 1 | 3 | XX | XX | 1 | 17 | 24 | 4 | XX | XX | XX | 2 | XX | 19 | XX | 25 | 1 | 3 | XX | XX | 2 | XX | 1 | 18 | 25 |
| 4 | XX | XX | XX | 2 | XX | 1 | 17 | 24 | 1 | 3 | XX | XX | 2 | XX | 19 | XX | 25 | 2 | XX | 2 | XX | 2 | XX | 1 | 18 | 25 |
| 1 | 3 | XX | XX | 2 | XX | 1 | 17 | 24 | 2 | XX | 2 | XX | 2 | XX | 19 | XX | 25 | 1 | 1 | 2 | XX | 2 | XX | 1 | 18 | 25 |
| 2 | XX | 2 | XX | 2 | XX | 1 | 17 | 24 | 1 | 1 | 2 | XX | 2 | XX | 19 | XX | 25 | 3 | XX | XX | 1 | 2 | XX | 1 | 18 | 25 |
| 1 | 1 | 2 | XX | 2 | XX | 1 | 17 | 24 | 3 | XX | XX | 1 | 2 | XX | 19 | XX | 25 | 1 | 2 | XX | 1 | 2 | XX | 1 | 18 | 25 |
| 3 | XX | XX | 1 | 2 | XX | 1 | 17 | 24 | 1 | 2 | XX | 1 | 2 | XX | 19 | XX | 25 | 2 | XX | 1 | 1 | 2 | XX | 1 | 18 | 25 |
| 1 | 2 | XX | 1 | 2 | XX | 1 | 17 | 24 | 2 | XX | 1 | 1 | 2 | XX | 19 | XX | 25 | 1 | 1 | 1 | 1 | 2 | XX | 1 | 18 | 25 |
| 2 | XX | 1 | 1 | 2 | XX | 1 | 17 | 24 | 1 | 1 | 1 | 1 | 2 | XX | 19 | XX | 25 | 5 | XX | XX | XX | XX | 1 | 1 | 18 | 25 |
| 1 | 1 | 1 | 1 | 2 | XX | 1 | 17 | 24 | 5 | XX | XX | XX | XX | 1 | 19 | XX | 25 | 1 | 4 | XX | XX | XX | 1 | 1 | 18 | 25 |
| 5 | XX | XX | XX | XX | 1 | 1 | 17 | 24 | 1 | 4 | XX | XX | XX | 1 | 19 | XX | 25 | 2 | XX | 3 | XX | XX | 1 | 1 | 18 | 25 |
| 1 | 4 | XX | XX | XX | 1 | 1 | 17 | 24 | 2 | XX | 3 | XX | XX | 1 | 19 | XX | 25 | 1 | 1 | 3 | XX | XX | 1 | 1 | 18 | 25 |
| 2 | XX | 3 | XX | XX | 1 | 1 | 17 | 24 | 1 | 1 | 3 | XX | XX | 1 | 19 | XX | 25 | 3 | XX | XX | 2 | XX | 1 | 1 | 18 | 25 |
| 1 | 1 | 3 | XX | XX | 1 | 1 | 17 | 24 | 3 | XX | XX | 2 | XX | 1 | 19 | XX | 25 | 1 | 2 | XX | 2 | XX | 1 | 1 | 18 | 25 |
| 3 | XX | XX | 2 | XX | 1 | 1 | 17 | 24 | 1 | 2 | XX | 2 | XX | 1 | 19 | XX | 25 | 2 | XX | 1 | 2 | XX | 1 | 1 | 18 | 25 |
| 1 | 2 | XX | 2 | XX | 1 | 1 | 17 | 24 | 2 | XX | 1 | 2 | XX | 1 | 19 | XX | 25 | 1 | 1 | 1 | 2 | XX | 1 | 1 | 18 | 25 |
| 2 | XX | 1 | 2 | XX | 1 | 1 | 17 | 24 | 1 | 1 | 1 | 2 | XX | 1 | 19 | XX | 25 | 4 | XX | XX | XX | 1 | 1 | 1 | 18 | 25 |
| 1 | 1 | 1 | 2 | XX | 1 | 1 | 17 | 24 | 4 | XX | XX | XX | 1 | 1 | 19 | XX | 25 | 1 | 3 | XX | XX | 1 | 1 | 1 | 18 | 25 |
| 4 | XX | XX | XX | 1 | 1 | 1 | 17 | 24 | 1 | 3 | XX | XX | 1 | 1 | 19 | XX | 25 | 2 | XX | 2 | XX | 1 | 1 | 1 | 18 | 25 |
| 1 | 3 | XX | XX | 1 | 1 | 1 | 17 | 24 | 2 | XX | 2 | XX | 1 | 1 | 19 | XX | 25 | 1 | 1 | 2 | XX | 1 | 1 | 1 | 18 | 25 |
| 2 | XX | 2 | XX | 1 | 1 | 1 | 17 | 24 | 1 | 1 | 2 | XX | 1 | 1 | 19 | XX | 25 | 3 | XX | XX | 1 | 1 | 1 | 1 | 18 | 25 |
| 1 | 1 | 2 | XX | 1 | 1 | 1 | 17 | 24 | 3 | XX | XX | 1 | 1 | 1 | 19 | XX | 25 | 1 | 2 | XX | 1 | 1 | 1 | 1 | 18 | 25 |
| 3 | XX | XX | 1 | 1 | 1 | 1 | 17 | 24 | 1 | 2 | XX | 1 | 1 | 1 | 19 | XX | 25 | 2 | XX | 1 | 1 | 1 | 1 | 1 | 18 | 25 |
| 1 | 2 | XX | 1 | 1 | 1 | 1 | 17 | 24 | 2 | XX | 1 | 1 | 1 | 1 | 19 | XX | 25 | 1 | 1 | 1 | 1 | 1 | 1 | 1 | 18 | 25 |
| 2 | XX | 1 | 1 | 1 | 1 | 1 | 17 | 24 | 1 | 1 | 1 | 1 | 1 | 1 | 19 | XX | 25 | 26 | XX | XX | XX | XX | XX | XX | XX | 26 |
| 1 | 1 | 1 | 1 | 1 | 1 | 1 | 17 | 24 | 7 | XX | XX | XX | XX | XX | XX | 18 | 25 | 1 | 25 | XX | XX | XX | XX | XX | XX | 26 |
| 25 | XX | XX | XX | XX | XX | XX | XX | 25 | 1 | 6 | XX | XX | XX | XX | XX | 18 | 25 | 2 | XX | 24 | XX | XX | XX | XX | XX | 26 |
| 1 | 24 | XX | XX | XX | XX | XX | XX | 25 | 2 | XX | 5 | XX | XX | XX | XX | 18 | 25 | 1 | 1 | 24 | XX | XX | XX | XX | XX | 26 |
| 2 | XX | 23 | XX | XX | XX | XX | XX | 25 | 1 | 1 | 5 | XX | XX | XX | XX | 18 | 25 | 3 | XX | XX | 23 | XX | XX | XX | XX | 26 |
| 1 | 1 | 23 | XX | XX | XX | XX | XX | 25 | 3 | XX | XX | 4 | XX | XX | XX | 18 | 25 | 1 | 2 | XX | 23 | XX | XX | XX | XX | 26 |
| 3 | XX | XX | 22 | XX | XX | XX | XX | 25 | 1 | 2 | XX | 4 | XX | XX | XX | 18 | 25 | 2 | XX | 1 | 23 | XX | XX | XX | XX | 26 |
| 1 | 2 | XX | 22 | XX | XX | XX | XX | 25 | 2 | XX | 1 | 4 | XX | XX | XX | 18 | 25 | 1 | 1 | 1 | 23 | XX | XX | XX | XX | 26 |
| 2 | XX | 1 | 22 | XX | XX | XX | XX | 25 | 1 | 1 | 1 | 4 | XX | XX | XX | 18 | 25 | 4 | XX | XX | XX | 22 | XX | XX | XX | 26 |
| 1 | 1 | 1 | 22 | XX | XX | XX | XX | 25 | 4 | XX | XX | XX | 3 | XX | XX | 18 | 25 | 1 | 3 | XX | XX | 22 | XX | XX | XX | 26 |
| 4 | XX | XX | XX | 21 | XX | XX | XX | 25 | 1 | 3 | XX | XX | 3 | XX | XX | 18 | 25 | 2 | XX | 2 | XX | 22 | XX | XX | XX | 26 |
| 1 | 3 | XX | XX | 21 | XX | XX | XX | 25 | 2 | XX | 2 | XX | 3 | XX | XX | 18 | 25 | 1 | 1 | 2 | XX | 22 | XX | XX | XX | 26 |
| 2 | XX | 2 | XX | 21 | XX | XX | XX | 25 | 1 | 1 | 2 | XX | 3 | XX | XX | 18 | 25 | 3 | XX | XX | 1 | 22 | XX | XX | XX | 26 |
| 1 | 1 | 2 | XX | 21 | XX | XX | XX | 25 | 3 | XX | XX | 1 | 3 | XX | XX | 18 | 25 | 1 | 2 | XX | 1 | 22 | XX | XX | XX | 26 |
| 3 | XX | XX | 1 | 21 | XX | XX | XX | 25 | 1 | 2 | XX | 1 | 3 | XX | XX | 18 | 25 | 2 | XX | 1 | 1 | 22 | XX | XX | XX | 26 |
| 1 | 2 | XX | 1 | 21 | XX | XX | XX | 25 | 2 | XX | 1 | 1 | 3 | XX | XX | 18 | 25 | 1 | 1 | 1 | 1 | 22 | XX | XX | XX | 26 |
| 2 | XX | 1 | 1 | 21 | XX | XX | XX | 25 | 1 | 1 | 1 | 1 | 3 | XX | XX | 18 | 25 | 5 | XX | XX | XX | XX | 21 | XX | XX | 26 |
| 1 | 1 | 1 | 1 | 21 | XX | XX | XX | 25 | 5 | XX | XX | XX | XX | 2 | XX | 18 | 25 | 1 | 4 | XX | XX | XX | 21 | XX | XX | 26 |
| 5 | XX | XX | XX | XX | 20 | XX | XX | 25 | 1 | 4 | XX | XX | XX | 2 | XX | 18 | 25 | 2 | XX | 3 | XX | XX | 21 | XX | XX | 26 |
| 1 | 4 | XX | XX | XX | 20 | XX | XX | 25 | 2 | XX | 3 | XX | XX | 2 | XX | 18 | 25 | 1 | 1 | 3 | XX | XX | 21 | XX | XX | 26 |
| 2 | XX | 3 | XX | XX | 20 | XX | XX | 25 | 1 | 1 | 3 | XX | XX | 2 | XX | 18 | 25 | 3 | XX | XX | 2 | XX | 21 | XX | XX | 26 |
| 1 | 1 | 3 | XX | XX | 20 | XX | XX | 25 | 3 | XX | XX | 2 | XX | 2 | XX | 18 | 25 | 1 | 2 | XX | 2 | XX | 21 | XX | XX | 26 |
| 3 | XX | XX | 2 | XX | 20 | XX | XX | 25 | 1 | 2 | XX | 2 | XX | 2 | XX | 18 | 25 | 2 | XX | 1 | 2 | XX | 21 | XX | XX | 26 |
| 1 | 2 | XX | 2 | XX | 20 | XX | XX | 25 | 2 | XX | 1 | 2 | XX | 2 | XX | 18 | 25 | 1 | 1 | 1 | 2 | XX | 21 | XX | XX | 26 |
| 2 | XX | 1 | 2 | XX | 20 | XX | XX | 25 | 1 | 1 | 1 | 2 | XX | 2 | XX | 18 | 25 | 4 | XX | XX | XX | 1 | 21 | XX | XX | 26 |
| 1 | 1 | 1 | 2 | XX | 20 | XX | XX | 25 | 4 | XX | XX | XX | 1 | 2 | XX | 18 | 25 | 1 | 3 | XX | XX | 1 | 21 | XX | XX | 26 |
| 4 | XX | XX | XX | 1 | 20 | XX | XX | 25 | 1 | 3 | XX | XX | 1 | 2 | XX | 18 | 25 | 2 | XX | 2 | XX | 1 | 21 | XX | XX | 26 |
| 1 | 3 | XX | XX | 1 | 20 | XX | XX | 25 | 2 | XX | 2 | XX | 1 | 2 | XX | 18 | 25 | 1 | 1 | 2 | XX | 1 | 21 | XX | XX | 26 |
| 2 | XX | 2 | XX | 1 | 20 | XX | XX | 25 | 1 | 1 | 2 | XX | 1 | 2 | XX | 18 | 25 | 3 | XX | XX | 1 | 1 | 21 | XX | XX | 26 |
| 1 | 1 | 2 | XX | 1 | 20 | XX | XX | 25 | 3 | XX | XX | 1 | 1 | 2 | XX | 18 | 25 | 1 | 2 | XX | 1 | 1 | 21 | XX | XX | 26 |
| 3 | XX | XX | 1 | 1 | 20 | XX | XX | 25 | 1 | 2 | XX | 1 | 1 | 2 | XX | 18 | 25 | 2 | XX | 1 | 1 | 1 | 21 | XX | XX | 26 |
| 1 | 2 | XX | 1 | 1 | 20 | XX | XX | 25 | 2 | XX | 1 | 1 | 1 | 2 | XX | 18 | 25 | 1 | 1 | 1 | 1 | 1 | 21 | XX | XX | 26 |
| 2 | XX | 1 | 1 | 1 | 20 | XX | XX | 25 | 1 | 1 | 1 | 1 | 1 | 2 | XX | 18 | 25 | 6 | XX | XX | XX | XX | XX | 20 | XX | 26 |
| 1 | 1 | 1 | 1 | 1 | 20 | XX | XX | 25 | 6 | XX | XX | XX | XX | XX | 1 | 18 | 25 | 1 | 5 | XX | XX | XX | XX | 20 | XX | 26 |
| 6 | XX | XX | XX | XX | XX | 19 | XX | 25 | 1 | 5 | XX | XX | XX | XX | 1 | 18 | 25 | 2 | XX | 4 | XX | XX | XX | 20 | XX | 26 |
| 1 | 5 | XX | XX | XX | XX | 19 | XX | 25 | 2 | XX | 4 | XX | XX | XX | 1 | 18 | 25 | 1 | 1 | 4 | XX | XX | XX | 20 | XX | 26 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 3 XX XX 3 XX XX 20 XX | 26 | 1 2 XX 3 XX XX 1 19 | 26 | 2 XX 1 3 XX XX 21 XX | 27 |
| 1 2 XX 3 XX XX 20 XX | 26 | 2 XX 1 3 XX XX 1 19 | 26 | 1 1 1 3 XX XX 21 XX | 27 |
| 2 XX 1 3 XX XX 20 XX | 26 | 1 1 1 3 XX XX 1 19 | 26 | 4 XX XX XX 2 XX 21 XX | 27 |
| 1 1 1 3 XX XX 20 XX | 26 | 4 XX XX XX 2 XX 1 19 | 26 | 1 3 XX XX 2 XX 21 XX | 27 |
| 4 XX XX XX 2 XX 20 XX | 26 | 1 3 XX XX 2 XX 1 19 | 26 | 2 XX 2 XX 2 XX 21 XX | 27 |
| 1 3 XX XX 2 XX 20 XX | 26 | 2 XX 2 XX 2 XX 1 19 | 26 | 1 1 2 XX 2 XX 21 XX | 27 |
| 2 XX 2 XX 2 XX 20 XX | 26 | 1 1 2 XX 2 XX 1 19 | 26 | 3 XX XX 1 2 XX 21 XX | 27 |
| 1 1 2 XX 2 XX 20 XX | 26 | 3 XX XX 1 2 XX 1 19 | 26 | 1 2 XX 1 2 XX 21 XX | 27 |
| 3 XX XX 1 2 XX 20 XX | 26 | 1 2 XX 1 2 XX 1 19 | 26 | 2 XX 1 1 2 XX 21 XX | 27 |
| 1 2 XX 1 2 XX 20 XX | 26 | 2 XX 1 1 2 XX 1 19 | 26 | 1 1 1 1 2 XX 21 XX | 27 |
| 2 XX 1 1 2 XX 20 XX | 26 | 1 1 1 1 2 XX 1 19 | 26 | 5 XX XX XX XX 1 21 XX | 27 |
| 1 1 1 1 2 XX 20 XX | 26 | 5 XX XX XX XX 1 1 19 | 26 | 1 4 XX XX XX 1 21 XX | 27 |
| 5 XX XX XX XX 1 20 XX | 26 | 1 4 XX XX XX 1 1 19 | 26 | 2 XX 3 XX XX 1 21 XX | 27 |
| 1 4 XX XX XX 1 20 XX | 26 | 2 XX 3 XX XX 1 1 19 | 26 | 1 1 3 XX XX 1 21 XX | 27 |
| 2 XX 3 XX XX 1 20 XX | 26 | 1 1 3 XX XX 1 1 19 | 26 | 3 XX XX 2 XX 1 21 XX | 27 |
| 1 1 3 XX XX 1 20 XX | 26 | 3 XX XX 2 XX 1 1 19 | 26 | 1 2 XX 2 XX 1 21 XX | 27 |
| 3 XX XX 2 XX 1 20 XX | 26 | 1 2 XX 2 XX 1 1 19 | 26 | 2 XX 1 2 XX 1 21 XX | 27 |
| 1 2 XX 2 XX 1 20 XX | 26 | 2 XX 1 2 XX 1 1 19 | 26 | 1 1 1 2 XX 1 21 XX | 27 |
| 2 XX 1 2 XX 1 20 XX | 26 | 1 1 1 2 XX 1 1 19 | 26 | 4 XX XX XX 1 1 21 XX | 27 |
| 1 1 1 2 XX 1 20 XX | 26 | 4 XX XX XX 1 1 1 19 | 26 | 1 3 XX XX 1 1 21 XX | 27 |
| 4 XX XX XX 1 1 20 XX | 26 | 1 3 XX XX 1 1 1 19 | 26 | 2 XX 2 XX 1 1 21 XX | 27 |
| 1 3 XX XX 1 1 20 XX | 26 | 2 XX 2 XX 1 1 1 19 | 26 | 1 1 2 XX 1 1 21 XX | 27 |
| 2 XX 2 XX 1 1 20 XX | 26 | 1 1 2 XX 1 1 1 19 | 26 | 3 XX XX 1 1 1 21 XX | 27 |
| 1 1 2 XX 1 1 20 XX | 26 | 3 XX XX 1 1 1 1 19 | 26 | 1 2 XX 1 1 1 21 XX | 27 |
| 3 XX XX 1 1 1 20 XX | 26 | 1 2 XX 1 1 1 1 19 | 26 | 2 XX 1 1 1 1 21 XX | 27 |
| 1 2 XX 1 1 1 20 XX | 26 | 2 XX 1 1 1 1 1 19 | 26 | 1 1 1 1 1 1 21 XX | 27 |
| 2 XX 1 1 1 1 20 XX | 26 | 1 1 1 1 1 1 1 19 | 26 | 7 XX XX XX XX XX XX 20 | 27 |
| 1 1 1 1 1 1 20 XX | 26 | 27 XX XX XX XX XX XX XX | 27 | 1 6 XX XX XX XX XX 20 | 27 |
| 7 XX XX XX XX XX XX 19 | 26 | 1 26 XX XX XX XX XX XX | 27 | 2 XX 5 XX XX XX XX 20 | 27 |
| 1 6 XX XX XX XX XX 19 | 26 | 2 XX 25 XX XX XX XX XX | 27 | 1 1 5 XX XX XX XX 20 | 27 |
| 2 XX 5 XX XX XX XX 19 | 26 | 1 1 25 XX XX XX XX XX | 27 | 3 XX XX 4 XX XX XX 20 | 27 |
| 1 1 5 XX XX XX XX 19 | 26 | 3 XX XX 24 XX XX XX XX | 27 | 1 2 XX 4 XX XX XX 20 | 27 |
| 3 XX XX 4 XX XX XX 19 | 26 | 1 2 XX 24 XX XX XX XX | 27 | 2 XX 1 4 XX XX XX 20 | 27 |
| 1 2 XX 4 XX XX XX 19 | 26 | 2 XX 1 24 XX XX XX XX | 27 | 1 1 1 4 XX XX XX 20 | 27 |
| 2 XX 1 4 XX XX XX 19 | 26 | 1 1 1 24 XX XX XX XX | 27 | 4 XX XX XX 3 XX XX 20 | 27 |
| 1 1 1 4 XX XX XX 19 | 26 | 4 XX XX XX 23 XX XX XX | 27 | 1 3 XX XX 3 XX XX 20 | 27 |
| 4 XX XX XX 3 XX XX 19 | 26 | 1 3 XX XX 23 XX XX XX | 27 | 2 XX 2 XX 3 XX XX 20 | 27 |
| 1 3 XX XX 3 XX XX 19 | 26 | 2 XX 2 XX 23 XX XX XX | 27 | 1 1 2 XX 3 XX XX 20 | 27 |
| 2 XX 2 XX 3 XX XX 19 | 26 | 1 1 2 XX 23 XX XX XX | 27 | 3 XX XX 1 3 XX XX 20 | 27 |
| 1 1 2 XX 3 XX XX 19 | 26 | 3 XX XX 1 23 XX XX XX | 27 | 1 2 XX 1 3 XX XX 20 | 27 |
| 3 XX XX 1 3 XX XX 19 | 26 | 1 2 XX 1 23 XX XX XX | 27 | 2 XX 1 1 3 XX XX 20 | 27 |
| 1 2 XX 1 3 XX XX 19 | 26 | 2 XX 1 1 23 XX XX XX | 27 | 1 1 1 1 3 XX XX 20 | 27 |
| 2 XX 1 1 3 XX XX 19 | 26 | 1 1 1 1 23 XX XX XX | 27 | 5 XX XX XX XX 2 XX 20 | 27 |
| 1 1 1 1 3 XX XX 19 | 26 | 5 XX XX XX XX 22 XX XX | 27 | 1 4 XX XX XX 2 XX 20 | 27 |
| 5 XX XX XX XX 2 XX 19 | 26 | 1 4 XX XX XX 22 XX XX | 27 | 2 XX 3 XX XX 2 XX 20 | 27 |
| 1 4 XX XX XX 2 XX 19 | 26 | 2 XX 3 XX XX 22 XX XX | 27 | 1 1 3 XX XX 2 XX 20 | 27 |
| 2 XX 3 XX XX 2 XX 19 | 26 | 1 1 3 XX XX 22 XX XX | 27 | 3 XX XX 2 XX 2 XX 20 | 27 |
| 1 1 3 XX XX 2 XX 19 | 26 | 3 XX XX 2 XX 22 XX XX | 27 | 1 2 XX 2 XX 2 XX 20 | 27 |
| 3 XX XX 2 XX 2 XX 19 | 26 | 1 2 XX 2 XX 22 XX XX | 27 | 2 XX 1 2 XX 2 XX 20 | 27 |
| 1 2 XX 2 XX 2 XX 19 | 26 | 2 XX 1 2 XX 22 XX XX | 27 | 1 1 1 2 XX 2 XX 20 | 27 |
| 2 XX 1 2 XX 2 XX 19 | 26 | 1 1 1 2 XX 22 XX XX | 27 | 4 XX XX XX 1 2 XX 20 | 27 |
| 1 1 1 2 XX 2 XX 19 | 26 | 4 XX XX XX 1 22 XX XX | 27 | 1 3 XX XX 1 2 XX 20 | 27 |
| 4 XX XX XX 1 2 XX 19 | 26 | 1 3 XX XX 1 22 XX XX | 27 | 2 XX 2 XX 1 2 XX 20 | 27 |
| 1 3 XX XX 1 2 XX 19 | 26 | 2 XX 2 XX 1 22 XX XX | 27 | 1 1 2 XX 1 2 XX 20 | 27 |
| 2 XX 2 XX 1 2 XX 19 | 26 | 1 1 2 XX 1 22 XX XX | 27 | 3 XX XX 1 1 2 XX 20 | 27 |
| 1 1 2 XX 1 2 XX 19 | 26 | 3 XX XX 1 1 22 XX XX | 27 | 1 2 XX 1 1 2 XX 20 | 27 |
| 3 XX XX 1 1 2 XX 19 | 26 | 1 2 XX 1 1 22 XX XX | 27 | 2 XX 1 1 1 2 XX 20 | 27 |
| 1 2 XX 1 1 2 XX 19 | 26 | 2 XX 1 1 1 22 XX XX | 27 | 1 1 1 1 1 2 XX 20 | 27 |
| 2 XX 1 1 1 2 XX 19 | 26 | 1 1 1 1 1 22 XX XX | 27 | 6 XX XX XX XX XX 1 20 | 27 |
| 1 1 1 1 1 2 XX 19 | 26 | 6 XX XX XX XX XX 21 XX | 27 | 1 5 XX XX XX XX 1 20 | 27 |
| 6 XX XX XX XX XX 1 19 | 26 | 1 5 XX XX XX XX 21 XX | 27 | 2 XX 4 XX XX XX 1 20 | 27 |
| 1 5 XX XX XX XX 1 19 | 26 | 2 XX 4 XX XX XX 21 XX | 27 | 1 1 4 XX XX XX 1 20 | 27 |
| 2 XX 4 XX XX XX 1 19 | 26 | 1 1 4 XX XX XX 21 XX | 27 | 3 XX XX 3 XX XX 1 20 | 27 |
| 1 1 4 XX XX XX 1 19 | 26 | 3 XX XX 3 XX XX 21 XX | 27 | 1 2 XX 3 XX XX 1 20 | 27 |
| 3 XX XX 3 XX XX 1 19 | 26 | 1 2 XX 3 XX XX 21 XX | 27 | 2 XX 1 3 XX XX 1 20 | 27 |

| Inputs (from stagger position) 0 | 1 | 2 | 3 | 4 | 5 | 6 | 7 | Output |
|---|---|---|---|---|---|---|---|---|
| 1 | 1 | 1 | 3 | XX | XX | 1 | 20 | 27 |
| 4 | XX | XX | XX | 2 | XX | 1 | 20 | 27 |
| 1 | 3 | XX | XX | 2 | XX | 1 | 20 | 27 |
| 2 | XX | 2 | XX | 2 | XX | 1 | 20 | 27 |
| 1 | 1 | 2 | XX | 2 | XX | 1 | 20 | 27 |
| 3 | XX | XX | 1 | 2 | XX | 1 | 20 | 27 |
| 1 | 2 | XX | 1 | 2 | XX | 1 | 20 | 27 |
| 2 | XX | 1 | 1 | 2 | XX | 1 | 20 | 27 |
| 1 | 1 | 1 | 1 | 2 | XX | 1 | 20 | 27 |
| 5 | XX | XX | XX | XX | 1 | 1 | 20 | 27 |
| 1 | 4 | XX | XX | XX | 1 | 1 | 20 | 27 |
| 2 | XX | 3 | XX | XX | 1 | 1 | 20 | 27 |
| 1 | 1 | 3 | XX | XX | 1 | 1 | 20 | 27 |
| 3 | XX | XX | 2 | XX | 1 | 1 | 20 | 27 |
| 1 | 2 | XX | 2 | XX | 1 | 1 | 20 | 27 |
| 2 | XX | 1 | 2 | XX | 1 | 1 | 20 | 27 |
| 1 | 1 | 1 | 2 | XX | 1 | 1 | 20 | 27 |
| 4 | XX | XX | XX | 1 | 1 | 1 | 20 | 27 |
| 1 | 3 | XX | XX | 1 | 1 | 1 | 20 | 27 |
| 2 | XX | 2 | XX | 1 | 1 | 1 | 20 | 27 |
| 1 | 1 | 2 | XX | 1 | 1 | 1 | 20 | 27 |
| 3 | XX | XX | 1 | 1 | 1 | 1 | 20 | 27 |
| 1 | 2 | XX | 1 | 1 | 1 | 1 | 20 | 27 |
| 2 | XX | 1 | 1 | 1 | 1 | 1 | 20 | 27 |
| 1 | 1 | 1 | 1 | 1 | 1 | 1 | 20 | 27 |
| 1 | 27 | XX | XX | XX | XX | XX | XX | 28 |
| 2 | XX | 26 | XX | XX | XX | XX | XX | 28 |
| 1 | 1 | 26 | XX | XX | XX | XX | XX | 28 |
| 3 | XX | XX | 25 | XX | XX | XX | XX | 28 |
| 1 | 2 | XX | 25 | XX | XX | XX | XX | 28 |
| 2 | XX | 1 | 25 | XX | XX | XX | XX | 28 |
| 1 | 1 | 1 | 25 | XX | XX | XX | XX | 28 |
| 4 | XX | XX | XX | 24 | XX | XX | XX | 28 |
| 1 | 3 | XX | XX | 24 | XX | XX | XX | 28 |
| 2 | XX | 2 | XX | 24 | XX | XX | XX | 28 |
| 1 | 1 | 2 | XX | 24 | XX | XX | XX | 28 |
| 3 | XX | XX | 1 | 24 | XX | XX | XX | 28 |
| 1 | 2 | XX | 1 | 24 | XX | XX | XX | 28 |
| 2 | XX | 1 | 1 | 24 | XX | XX | XX | 28 |
| 1 | 1 | 1 | 1 | 24 | XX | XX | XX | 28 |
| 5 | XX | XX | XX | XX | 23 | XX | XX | 28 |
| 1 | 4 | XX | XX | XX | 23 | XX | XX | 28 |
| 2 | XX | 3 | XX | XX | 23 | XX | XX | 28 |
| 1 | 1 | 3 | XX | XX | 23 | XX | XX | 28 |
| 3 | XX | XX | 2 | XX | 23 | XX | XX | 28 |
| 1 | 2 | XX | 2 | XX | 23 | XX | XX | 28 |
| 2 | XX | 1 | 2 | XX | 23 | XX | XX | 28 |
| 1 | 1 | 1 | 2 | XX | 23 | XX | XX | 28 |
| 4 | XX | XX | XX | 1 | 23 | XX | XX | 28 |
| 1 | 3 | XX | XX | 1 | 23 | XX | XX | 28 |
| 2 | XX | 2 | XX | 1 | 23 | XX | XX | 28 |
| 1 | 1 | 2 | XX | 1 | 23 | XX | XX | 28 |
| 3 | XX | XX | 1 | 1 | 23 | XX | XX | 28 |
| 1 | 2 | XX | 1 | 1 | 23 | XX | XX | 28 |
| 2 | XX | 1 | 1 | 1 | 23 | XX | XX | 28 |
| 1 | 1 | 1 | 1 | 1 | 23 | XX | XX | 28 |
| 6 | XX | XX | XX | XX | XX | 22 | XX | 28 |
| 1 | 5 | XX | XX | XX | XX | 22 | XX | 28 |
| 2 | XX | 4 | XX | XX | XX | 22 | XX | 28 |
| 1 | 1 | 4 | XX | XX | XX | 22 | XX | 28 |
| 3 | XX | XX | 3 | XX | XX | 22 | XX | 28 |
| 1 | 2 | XX | 3 | XX | XX | 22 | XX | 28 |
| 2 | XX | 1 | 3 | XX | XX | 22 | XX | 28 |
| 1 | 1 | 1 | 3 | XX | XX | 22 | XX | 28 |
| 4 | XX | XX | XX | 2 | XX | 22 | XX | 28 |
| 1 | 3 | XX | XX | 2 | XX | 22 | XX | 28 |
| 2 | XX | 2 | XX | 2 | XX | 22 | XX | 28 |
| 1 | 1 | 2 | XX | 2 | XX | 22 | XX | 28 |
| 3 | XX | XX | 1 | 2 | XX | 22 | XX | 28 |
| 1 | 2 | XX | 1 | 2 | XX | 22 | XX | 28 |
| 2 | XX | 1 | 1 | 2 | XX | 22 | XX | 28 |
| 1 | 1 | 1 | 1 | 2 | XX | 22 | XX | 28 |
| 5 | XX | XX | XX | XX | 1 | 22 | XX | 28 |
| 1 | 4 | XX | XX | XX | 1 | 22 | XX | 28 |
| 2 | XX | 3 | XX | XX | 1 | 22 | XX | 28 |
| 1 | 1 | 3 | XX | XX | 1 | 22 | XX | 28 |
| 3 | XX | XX | 2 | XX | 1 | 22 | XX | 28 |
| 1 | 2 | XX | 2 | XX | 1 | 22 | XX | 28 |
| 2 | XX | 1 | 2 | XX | 1 | 22 | XX | 28 |
| 1 | 1 | 1 | 2 | XX | 1 | 22 | XX | 28 |
| 4 | XX | XX | XX | 1 | 1 | 22 | XX | 28 |
| 1 | 3 | XX | XX | 1 | 1 | 22 | XX | 28 |
| 2 | XX | 2 | XX | 1 | 1 | 22 | XX | 28 |
| 1 | 1 | 2 | XX | 1 | 1 | 22 | XX | 28 |
| 3 | XX | XX | 1 | 1 | 1 | 22 | XX | 28 |
| 1 | 2 | XX | 1 | 1 | 1 | 22 | XX | 28 |
| 2 | XX | 1 | 1 | 1 | 1 | 22 | XX | 28 |
| 1 | 1 | 1 | 1 | 1 | 1 | 22 | XX | 28 |
| 7 | XX | XX | XX | XX | XX | XX | 21 | 28 |
| 1 | 6 | XX | XX | XX | XX | XX | 21 | 28 |
| 2 | XX | 5 | XX | XX | XX | XX | 21 | 28 |
| 1 | 1 | 5 | XX | XX | XX | XX | 21 | 28 |
| 3 | XX | XX | 4 | XX | XX | XX | 21 | 28 |
| 1 | 2 | XX | 4 | XX | XX | XX | 21 | 28 |
| 2 | XX | 1 | 4 | XX | XX | XX | 21 | 28 |
| 1 | 1 | 1 | 4 | XX | XX | XX | 21 | 28 |
| 4 | XX | XX | XX | 3 | XX | XX | 21 | 28 |
| 1 | 3 | XX | XX | 3 | XX | XX | 21 | 28 |
| 2 | XX | 2 | XX | 3 | XX | XX | 21 | 28 |
| 1 | 1 | 2 | XX | 3 | XX | XX | 21 | 28 |
| 3 | XX | XX | 1 | 3 | XX | XX | 21 | 28 |
| 1 | 2 | XX | 1 | 3 | XX | XX | 21 | 28 |
| 2 | XX | 1 | 1 | 3 | XX | XX | 21 | 28 |
| 1 | 1 | 1 | 1 | 3 | XX | XX | 21 | 28 |
| 5 | XX | XX | XX | XX | 2 | XX | 21 | 28 |
| 1 | 4 | XX | XX | XX | 2 | XX | 21 | 28 |
| 2 | XX | 3 | XX | XX | 2 | XX | 21 | 28 |
| 1 | 1 | 3 | XX | XX | 2 | XX | 21 | 28 |
| 3 | XX | XX | 2 | XX | 2 | XX | 21 | 28 |
| 1 | 2 | XX | 2 | XX | 2 | XX | 21 | 28 |
| 2 | XX | 1 | 2 | XX | 2 | XX | 21 | 28 |
| 1 | 1 | 1 | 2 | XX | 2 | XX | 21 | 28 |
| 4 | XX | XX | XX | 1 | 2 | XX | 21 | 28 |
| 1 | 3 | XX | XX | 1 | 2 | XX | 21 | 28 |
| 2 | XX | 2 | XX | 1 | 2 | XX | 21 | 28 |
| 1 | 1 | 2 | XX | 1 | 2 | XX | 21 | 28 |
| 3 | XX | XX | 1 | 1 | 2 | XX | 21 | 28 |
| 1 | 2 | XX | 1 | 1 | 2 | XX | 21 | 28 |
| 2 | XX | 1 | 1 | 1 | 2 | XX | 21 | 28 |
| 1 | 1 | 1 | 1 | 1 | 2 | XX | 21 | 28 |
| 6 | XX | XX | XX | XX | XX | 1 | 21 | 28 |
| 1 | 5 | XX | XX | XX | XX | 1 | 21 | 28 |
| 2 | XX | 4 | XX | XX | XX | 1 | 21 | 28 |
| 1 | 1 | 4 | XX | XX | XX | 1 | 21 | 28 |
| 3 | XX | XX | 3 | XX | XX | 1 | 21 | 28 |
| 1 | 2 | XX | 3 | XX | XX | 1 | 21 | 28 |
| 2 | XX | 1 | 3 | XX | XX | 1 | 21 | 28 |
| 1 | 1 | 1 | 3 | XX | XX | 1 | 21 | 28 |
| 4 | XX | XX | XX | 2 | XX | 1 | 21 | 28 |
| 1 | 3 | XX | XX | 2 | XX | 1 | 21 | 28 |
| 2 | XX | 2 | XX | 2 | XX | 1 | 21 | 28 |
| 1 | 1 | 2 | XX | 2 | XX | 1 | 21 | 28 |
| 3 | XX | XX | 1 | 2 | XX | 1 | 21 | 28 |
| 1 | 2 | XX | 1 | 2 | XX | 1 | 21 | 28 |
| 2 | XX | 1 | 1 | 2 | XX | 1 | 21 | 28 |
| 1 | 1 | 1 | 1 | 2 | XX | 1 | 21 | 28 |
| 5 | XX | XX | XX | XX | 1 | 1 | 21 | 28 |
| 1 | 4 | XX | XX | XX | 1 | 1 | 21 | 28 |
| 2 | XX | 3 | XX | XX | 1 | 1 | 21 | 28 |
| 1 | 1 | 3 | XX | XX | 1 | 1 | 21 | 28 |
| 3 | XX | XX | 2 | XX | 1 | 1 | 21 | 28 |
| 1 | 2 | XX | 2 | XX | 1 | 1 | 21 | 28 |
| 2 | XX | 1 | 2 | XX | 1 | 1 | 21 | 28 |
| 1 | 1 | 1 | 2 | XX | 1 | 1 | 21 | 28 |
| 4 | XX | XX | XX | 1 | 1 | 1 | 21 | 28 |
| 1 | 3 | XX | XX | 1 | 1 | 1 | 21 | 28 |
| 2 | XX | 2 | XX | 1 | 1 | 1 | 21 | 28 |
| 1 | 1 | 2 | XX | 1 | 1 | 1 | 21 | 28 |
| 3 | XX | XX | 1 | 1 | 1 | 1 | 21 | 28 |
| 1 | 2 | XX | 1 | 1 | 1 | 1 | 21 | 28 |
| 2 | XX | 1 | 1 | 1 | 1 | 1 | 21 | 28 |
| 1 | 1 | 1 | 1 | 1 | 1 | 1 | 21 | 28 |
| 2 | XX | 27 | XX | XX | XX | XX | XX | 29 |
| 1 | 1 | 27 | XX | XX | XX | XX | XX | 29 |
| 3 | XX | XX | 26 | XX | XX | XX | XX | 29 |
| 1 | 2 | XX | 26 | XX | XX | XX | XX | 29 |
| 2 | XX | 1 | 26 | XX | XX | XX | XX | 29 |
| 1 | 1 | 1 | 26 | XX | XX | XX | XX | 29 |
| 4 | XX | XX | XX | 25 | XX | XX | XX | 29 |
| 1 | 3 | XX | XX | 25 | XX | XX | XX | 29 |
| 2 | XX | 2 | XX | 25 | XX | XX | XX | 29 |
| 1 | 1 | 2 | XX | 25 | XX | XX | XX | 29 |
| 3 | XX | XX | 1 | 25 | XX | XX | XX | 29 |
| 1 | 2 | XX | 1 | 25 | XX | XX | XX | 29 |
| 2 | XX | 1 | 1 | 25 | XX | XX | XX | 29 |
| 1 | 1 | 1 | 1 | 25 | XX | XX | XX | 29 |
| 5 | XX | XX | XX | XX | 24 | XX | XX | 29 |
| 1 | 4 | XX | XX | XX | 24 | XX | XX | 29 |
| 2 | XX | 3 | XX | XX | 24 | XX | XX | 29 |
| 1 | 1 | 3 | XX | XX | 24 | XX | XX | 29 |
| 3 | XX | XX | 2 | XX | 24 | XX | XX | 29 |
| 1 | 2 | XX | 2 | XX | 24 | XX | XX | 29 |
| 2 | XX | 1 | 2 | XX | 24 | XX | XX | 29 |
| 1 | 1 | 1 | 2 | XX | 24 | XX | XX | 29 |
| 4 | XX | XX | XX | 1 | 24 | XX | XX | 29 |
| 1 | 3 | XX | XX | 1 | 24 | XX | XX | 29 |
| 2 | XX | 2 | XX | 1 | 24 | XX | XX | 29 |
| 1 | 1 | 2 | XX | 1 | 24 | XX | XX | 29 |
| 3 | XX | XX | 1 | 1 | 24 | XX | XX | 29 |
| 1 | 2 | XX | 1 | 1 | 24 | XX | XX | 29 |
| 2 | XX | 1 | 1 | 1 | 24 | XX | XX | 29 |
| 1 | 1 | 1 | 1 | 1 | 24 | XX | XX | 29 |
| 6 | XX | XX | XX | XX | XX | 23 | XX | 29 |
| 1 | 5 | XX | XX | XX | XX | 23 | XX | 29 |
| 2 | XX | 4 | XX | XX | XX | 23 | XX | 29 |
| 1 | 1 | 4 | XX | XX | XX | 23 | XX | 29 |
| 3 | XX | XX | 3 | XX | XX | 23 | XX | 29 |
| 1 | 2 | XX | 3 | XX | XX | 23 | XX | 29 |
| 2 | XX | 1 | 3 | XX | XX | 23 | XX | 29 |
| 1 | 1 | 1 | 3 | XX | XX | 23 | XX | 29 |
| 4 | XX | XX | XX | 2 | XX | 23 | XX | 29 |
| 1 | 3 | XX | XX | 2 | XX | 23 | XX | 29 |
| 2 | XX | 2 | XX | 2 | XX | 23 | XX | 29 |
| 1 | 1 | 2 | XX | 2 | XX | 23 | XX | 29 |
| 3 | XX | XX | 1 | 2 | XX | 23 | XX | 29 |

| Inputs (from stagger position) 0 | 1 | 2 | 3 | 4 | 5 | 6 | 7 | Output | Inputs (from stagger position) 0 | 1 | 2 | 3 | 4 | 5 | 6 | 7 | Output | Inputs (from stagger position) 0 | 1 | 2 | 3 | 4 | 5 | 6 | 7 | Output |
|---|---|---|---|---|---|---|---|---|---|---|---|---|---|---|---|---|---|---|---|---|---|---|---|---|---|---|
| 1 | 2 | XX | 1 | 2 | XX | 23 | XX | 29 | 2 | XX | 1 | 1 | 2 | XX | 1 | 22 | 29 | 1 | 1 | 3 | XX | XX | 1 | 24 | XX | 30 |
| 2 | XX | 1 | 1 | 2 | XX | 23 | XX | 29 | 1 | 1 | 1 | 1 | 2 | XX | 1 | 22 | 29 | 3 | XX | XX | 2 | XX | 1 | 24 | XX | 30 |
| 1 | 1 | 1 | 1 | 2 | XX | 23 | XX | 29 | 5 | XX | XX | XX | XX | 1 | 1 | 22 | 29 | 1 | 2 | XX | 2 | XX | 1 | 24 | XX | 30 |
| 5 | XX | XX | XX | XX | 1 | 23 | XX | 29 | 1 | 4 | XX | XX | XX | 1 | 1 | 22 | 29 | 2 | XX | 1 | 2 | XX | 1 | 24 | XX | 30 |
| 1 | 4 | XX | XX | XX | 1 | 23 | XX | 29 | 2 | XX | 3 | XX | XX | 1 | 1 | 22 | 29 | 1 | 1 | 1 | 2 | XX | 1 | 24 | XX | 30 |
| 2 | XX | 3 | XX | XX | 1 | 23 | XX | 29 | 1 | 1 | 3 | XX | XX | 1 | 1 | 22 | 29 | 4 | XX | XX | XX | 1 | 1 | 24 | XX | 30 |
| 1 | 1 | 3 | XX | XX | 1 | 23 | XX | 29 | 3 | XX | XX | 2 | XX | 1 | 1 | 22 | 29 | 1 | 3 | XX | XX | 1 | 1 | 24 | XX | 30 |
| 3 | XX | XX | 2 | XX | 1 | 23 | XX | 29 | 1 | 2 | XX | 2 | XX | 1 | 1 | 22 | 29 | 2 | XX | 2 | XX | 1 | 1 | 24 | XX | 30 |
| 1 | 2 | XX | 2 | XX | 1 | 23 | XX | 29 | 2 | XX | 1 | 2 | XX | 1 | 1 | 22 | 29 | 1 | 1 | 2 | XX | 1 | 1 | 24 | XX | 30 |
| 2 | XX | 1 | 2 | XX | 1 | 23 | XX | 29 | 1 | 1 | 1 | 2 | XX | 1 | 1 | 22 | 29 | 3 | XX | XX | 1 | 1 | 1 | 24 | XX | 30 |
| 1 | 1 | 1 | 2 | XX | 1 | 23 | XX | 29 | 4 | XX | XX | XX | 1 | 1 | 1 | 22 | 29 | 1 | 2 | XX | 1 | 1 | 1 | 24 | XX | 30 |
| 4 | XX | XX | XX | 1 | 1 | 23 | XX | 29 | 1 | 3 | XX | XX | 1 | 1 | 1 | 22 | 29 | 2 | XX | 1 | 1 | 1 | 1 | 24 | XX | 30 |
| 1 | 3 | XX | XX | 1 | 1 | 23 | XX | 29 | 2 | XX | 2 | XX | 1 | 1 | 1 | 22 | 29 | 1 | 1 | 1 | 1 | 1 | 1 | 24 | XX | 30 |
| 2 | XX | 2 | XX | 1 | 1 | 23 | XX | 29 | 1 | 1 | 2 | XX | 1 | 1 | 1 | 22 | 29 | 7 | XX | XX | XX | XX | XX | XX | 23 | 30 |
| 1 | 1 | 2 | XX | 1 | 1 | 23 | XX | 29 | 3 | XX | XX | 1 | 1 | 1 | 1 | 22 | 29 | 1 | 6 | XX | XX | XX | XX | XX | 23 | 30 |
| 3 | XX | XX | 1 | 1 | 1 | 23 | XX | 29 | 1 | 2 | XX | 1 | 1 | 1 | 1 | 22 | 29 | 2 | XX | 5 | XX | XX | XX | XX | 23 | 30 |
| 1 | 2 | XX | 1 | 1 | 1 | 23 | XX | 29 | 2 | XX | 1 | 1 | 1 | 1 | 1 | 22 | 29 | 1 | 1 | 5 | XX | XX | XX | XX | 23 | 30 |
| 2 | XX | 1 | 1 | 1 | 1 | 23 | XX | 29 | 1 | 1 | 1 | 1 | 1 | 1 | 1 | 22 | 29 | 3 | XX | XX | 4 | XX | XX | XX | 23 | 30 |
| 1 | 1 | 1 | 1 | 1 | 1 | 23 | XX | 29 | 3 | XX | XX | 27 | XX | XX | XX | XX | 30 | 1 | 2 | XX | 4 | XX | XX | XX | 23 | 30 |
| 7 | XX | XX | XX | XX | XX | XX | 22 | 29 | 1 | 2 | XX | 27 | XX | XX | XX | XX | 30 | 2 | XX | 1 | 4 | XX | XX | XX | 23 | 30 |
| 1 | 6 | XX | XX | XX | XX | XX | 22 | 29 | 2 | XX | 1 | 27 | XX | XX | XX | XX | 30 | 1 | 1 | 1 | 4 | XX | XX | XX | 23 | 30 |
| 2 | XX | 5 | XX | XX | XX | XX | 22 | 29 | 1 | 1 | 1 | 27 | XX | XX | XX | XX | 30 | 4 | XX | XX | XX | 3 | XX | XX | 23 | 30 |
| 1 | 1 | 5 | XX | XX | XX | XX | 22 | 29 | 4 | XX | XX | XX | 26 | XX | XX | XX | 30 | 1 | 3 | XX | XX | 3 | XX | XX | 23 | 30 |
| 3 | XX | XX | 4 | XX | XX | XX | 22 | 29 | 1 | 3 | XX | XX | 26 | XX | XX | XX | 30 | 2 | XX | 2 | XX | 3 | XX | XX | 23 | 30 |
| 1 | 2 | XX | 4 | XX | XX | XX | 22 | 29 | 2 | XX | 2 | XX | 26 | XX | XX | XX | 30 | 1 | 1 | 2 | XX | 3 | XX | XX | 23 | 30 |
| 2 | XX | 1 | 4 | XX | XX | XX | 22 | 29 | 1 | 1 | 2 | XX | 26 | XX | XX | XX | 30 | 3 | XX | XX | 1 | 3 | XX | XX | 23 | 30 |
| 1 | 1 | 1 | 4 | XX | XX | XX | 22 | 29 | 3 | XX | XX | 1 | 26 | XX | XX | XX | 30 | 1 | 2 | XX | 1 | 3 | XX | XX | 23 | 30 |
| 4 | XX | XX | XX | 3 | XX | XX | 22 | 29 | 1 | 2 | XX | 1 | 26 | XX | XX | XX | 30 | 2 | XX | 1 | 1 | 3 | XX | XX | 23 | 30 |
| 1 | 3 | XX | XX | 3 | XX | XX | 22 | 29 | 2 | XX | 1 | 1 | 26 | XX | XX | XX | 30 | 1 | 1 | 1 | 1 | 3 | XX | XX | 23 | 30 |
| 2 | XX | 2 | XX | 3 | XX | XX | 22 | 29 | 1 | 1 | 1 | 1 | 26 | XX | XX | XX | 30 | 5 | XX | XX | XX | XX | 2 | XX | 23 | 30 |
| 1 | 1 | 2 | XX | 3 | XX | XX | 22 | 29 | 5 | XX | XX | XX | XX | 25 | XX | XX | 30 | 1 | 4 | XX | XX | XX | 2 | XX | 23 | 30 |
| 3 | XX | XX | 1 | 3 | XX | XX | 22 | 29 | 1 | 4 | XX | XX | XX | 25 | XX | XX | 30 | 2 | XX | 3 | XX | XX | 2 | XX | 23 | 30 |
| 1 | 2 | XX | 1 | 3 | XX | XX | 22 | 29 | 2 | XX | 3 | XX | XX | 25 | XX | XX | 30 | 1 | 1 | 3 | XX | XX | 2 | XX | 23 | 30 |
| 2 | XX | 1 | 1 | 3 | XX | XX | 22 | 29 | 1 | 1 | 3 | XX | XX | 25 | XX | XX | 30 | 3 | XX | XX | 2 | XX | 2 | XX | 23 | 30 |
| 1 | 1 | 1 | 1 | 3 | XX | XX | 22 | 29 | 3 | XX | XX | 2 | XX | 25 | XX | XX | 30 | 1 | 2 | XX | 2 | XX | 2 | XX | 23 | 30 |
| 5 | XX | XX | XX | XX | 2 | XX | 22 | 29 | 1 | 2 | XX | 2 | XX | 25 | XX | XX | 30 | 2 | XX | 1 | 2 | XX | 2 | XX | 23 | 30 |
| 1 | 4 | XX | XX | XX | 2 | XX | 22 | 29 | 2 | XX | 1 | 2 | XX | 25 | XX | XX | 30 | 1 | 1 | 1 | 2 | XX | 2 | XX | 23 | 30 |
| 2 | XX | 3 | XX | XX | 2 | XX | 22 | 29 | 1 | 1 | 1 | 2 | XX | 25 | XX | XX | 30 | 4 | XX | XX | XX | 1 | 2 | XX | 23 | 30 |
| 1 | 1 | 3 | XX | XX | 2 | XX | 22 | 29 | 4 | XX | XX | XX | 1 | 25 | XX | XX | 30 | 1 | 3 | XX | XX | 1 | 2 | XX | 23 | 30 |
| 3 | XX | XX | 2 | XX | 2 | XX | 22 | 29 | 1 | 3 | XX | XX | 1 | 25 | XX | XX | 30 | 2 | XX | 2 | XX | 1 | 2 | XX | 23 | 30 |
| 1 | 2 | XX | 2 | XX | 2 | XX | 22 | 29 | 2 | XX | 2 | XX | 1 | 25 | XX | XX | 30 | 1 | 1 | 2 | XX | 1 | 2 | XX | 23 | 30 |
| 2 | XX | 1 | 2 | XX | 2 | XX | 22 | 29 | 1 | 1 | 2 | XX | 1 | 25 | XX | XX | 30 | 3 | XX | XX | 1 | 1 | 2 | XX | 23 | 30 |
| 1 | 1 | 1 | 2 | XX | 2 | XX | 22 | 29 | 3 | XX | XX | 1 | 1 | 25 | XX | XX | 30 | 1 | 2 | XX | 1 | 1 | 2 | XX | 23 | 30 |
| 4 | XX | XX | XX | 1 | 2 | XX | 22 | 29 | 1 | 2 | XX | 1 | 1 | 25 | XX | XX | 30 | 2 | XX | 1 | 1 | 1 | 2 | XX | 23 | 30 |
| 1 | 3 | XX | XX | 1 | 2 | XX | 22 | 29 | 2 | XX | 1 | 1 | 1 | 25 | XX | XX | 30 | 1 | 1 | 1 | 1 | 1 | 2 | XX | 23 | 30 |
| 2 | XX | 2 | XX | 1 | 2 | XX | 22 | 29 | 1 | 1 | 1 | 1 | 1 | 25 | XX | XX | 30 | 6 | XX | XX | XX | XX | XX | 1 | 23 | 30 |
| 1 | 1 | 2 | XX | 1 | 2 | XX | 22 | 29 | 6 | XX | XX | XX | XX | XX | 24 | XX | 30 | 1 | 5 | XX | XX | XX | XX | 1 | 23 | 30 |
| 3 | XX | XX | 1 | 1 | 2 | XX | 22 | 29 | 1 | 5 | XX | XX | XX | XX | 24 | XX | 30 | 2 | XX | 4 | XX | XX | XX | 1 | 23 | 30 |
| 1 | 2 | XX | 1 | 1 | 2 | XX | 22 | 29 | 2 | XX | 4 | XX | XX | XX | 24 | XX | 30 | 1 | 1 | 4 | XX | XX | XX | 1 | 23 | 30 |
| 2 | XX | 1 | 1 | 1 | 2 | XX | 22 | 29 | 1 | 1 | 4 | XX | XX | XX | 24 | XX | 30 | 3 | XX | XX | 3 | XX | XX | 1 | 23 | 30 |
| 1 | 1 | 1 | 1 | 1 | 2 | XX | 22 | 29 | 3 | XX | XX | 3 | XX | XX | 24 | XX | 30 | 1 | 2 | XX | 3 | XX | XX | 1 | 23 | 30 |
| 6 | XX | XX | XX | XX | XX | 1 | 22 | 29 | 1 | 2 | XX | 3 | XX | XX | 24 | XX | 30 | 2 | XX | 1 | 3 | XX | XX | 1 | 23 | 30 |
| 1 | 5 | XX | XX | XX | XX | 1 | 22 | 29 | 2 | XX | 1 | 3 | XX | XX | 24 | XX | 30 | 1 | 1 | 1 | 3 | XX | XX | 1 | 23 | 30 |
| 2 | XX | 4 | XX | XX | XX | 1 | 22 | 29 | 1 | 1 | 1 | 3 | XX | XX | 24 | XX | 30 | 4 | XX | XX | XX | 2 | XX | 1 | 23 | 30 |
| 1 | 1 | 4 | XX | XX | XX | 1 | 22 | 29 | 4 | XX | XX | XX | 2 | XX | 24 | XX | 30 | 1 | 3 | XX | XX | 2 | XX | 1 | 23 | 30 |
| 3 | XX | XX | 3 | XX | XX | 1 | 22 | 29 | 1 | 3 | XX | XX | 2 | XX | 24 | XX | 30 | 2 | XX | 2 | XX | 2 | XX | 1 | 23 | 30 |
| 1 | 2 | XX | 3 | XX | XX | 1 | 22 | 29 | 2 | XX | 2 | XX | 2 | XX | 24 | XX | 30 | 1 | 1 | 2 | XX | 2 | XX | 1 | 23 | 30 |
| 2 | XX | 1 | 3 | XX | XX | 1 | 22 | 29 | 1 | 1 | 2 | XX | 2 | XX | 24 | XX | 30 | 3 | XX | XX | 1 | 2 | XX | 1 | 23 | 30 |
| 1 | 1 | 1 | 3 | XX | XX | 1 | 22 | 29 | 3 | XX | XX | 1 | 2 | XX | 24 | XX | 30 | 1 | 2 | XX | 1 | 2 | XX | 1 | 23 | 30 |
| 4 | XX | XX | XX | 2 | XX | 1 | 22 | 29 | 1 | 2 | XX | 1 | 2 | XX | 24 | XX | 30 | 2 | XX | 1 | 1 | 2 | XX | 1 | 23 | 30 |
| 1 | 3 | XX | XX | 2 | XX | 1 | 22 | 29 | 2 | XX | 1 | 1 | 2 | XX | 24 | XX | 30 | 1 | 1 | 1 | 1 | 2 | XX | 1 | 23 | 30 |
| 2 | XX | 2 | XX | 2 | XX | 1 | 22 | 29 | 1 | 1 | 1 | 1 | 2 | XX | 24 | XX | 30 | 5 | XX | XX | XX | XX | 1 | 1 | 23 | 30 |
| 1 | 1 | 2 | XX | 2 | XX | 1 | 22 | 29 | 5 | XX | XX | XX | XX | 1 | 24 | XX | 30 | 1 | 4 | XX | XX | XX | 1 | 1 | 23 | 30 |
| 3 | XX | XX | 1 | 2 | XX | 1 | 22 | 29 | 1 | 4 | XX | XX | XX | 1 | 24 | XX | 30 | 2 | XX | 3 | XX | XX | 1 | 1 | 23 | 30 |
| 1 | 2 | XX | 1 | 2 | XX | 1 | 22 | 29 | 2 | XX | 3 | XX | XX | 1 | 24 | XX | 30 | 1 | 1 | 3 | XX | XX | 1 | 1 | 23 | 30 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 3 XX XX 2 XX 1 1 23 | 30 | 1 2 XX 1 1 1 25 XX | 31 | 2 XX 1 1 1 1 1 24 | 31 |
| 1 2 XX 2 XX 1 1 23 | 30 | 2 XX 1 1 1 1 25 XX | 31 | 1 1 1 1 1 1 1 24 | 31 |
| 2 XX 1 2 XX 1 1 23 | 30 | 1 1 1 1 1 1 25 XX | 31 | 5 XX XX XX XX 27 XX XX | 32 |
| 1 1 1 2 XX 1 1 23 | 30 | 7 XX XX XX XX XX XX 24 | 31 | 1 4 XX XX XX 27 XX XX | 32 |
| 4 XX XX XX 1 1 1 23 | 30 | 1 6 XX XX XX XX XX 24 | 31 | 2 XX 3 XX XX 27 XX XX | 32 |
| 1 3 XX XX 1 1 1 23 | 30 | 2 XX 5 XX XX XX XX 24 | 31 | 1 1 3 XX XX 27 XX XX | 32 |
| 2 XX 2 XX 1 1 1 23 | 30 | 1 1 5 XX XX XX XX 24 | 31 | 3 XX XX 2 XX 27 XX XX | 32 |
| 1 1 2 XX 1 1 1 23 | 30 | 3 XX XX 4 XX XX XX 24 | 31 | 1 2 XX 2 XX 27 XX XX | 32 |
| 3 XX XX 1 1 1 1 23 | 30 | 1 2 XX 4 XX XX XX 24 | 31 | 2 XX 1 2 XX 27 XX XX | 32 |
| 1 2 XX 1 1 1 1 23 | 30 | 2 XX 1 4 XX XX XX 24 | 31 | 1 1 1 2 XX 27 XX XX | 32 |
| 2 XX 1 1 1 1 1 23 | 30 | 1 1 1 4 XX XX XX 24 | 31 | 4 XX XX XX 1 27 XX XX | 32 |
| 1 1 1 1 1 1 1 23 | 30 | 4 XX XX XX 3 XX XX 24 | 31 | 1 3 XX XX 1 27 XX XX | 32 |
| 4 XX XX XX 27 XX XX XX | 31 | 1 3 XX XX 3 XX XX 24 | 31 | 2 XX 2 XX 1 27 XX XX | 32 |
| 1 3 XX XX 27 XX XX XX | 31 | 2 XX 2 XX 3 XX XX 24 | 31 | 1 1 2 XX 1 27 XX XX | 32 |
| 2 XX 2 XX 27 XX XX XX | 31 | 1 1 2 XX 3 XX XX 24 | 31 | 3 XX XX 1 1 27 XX XX | 32 |
| 1 1 2 XX 27 XX XX XX | 31 | 3 XX XX 1 3 XX XX 24 | 31 | 1 2 XX 1 1 27 XX XX | 32 |
| 3 XX XX 1 27 XX XX XX | 31 | 1 2 XX 1 3 XX XX 24 | 31 | 2 XX 1 1 1 27 XX XX | 32 |
| 1 2 XX 1 27 XX XX XX | 31 | 2 XX 1 1 3 XX XX 24 | 31 | 1 1 1 1 1 27 XX XX | 32 |
| 2 XX 1 1 27 XX XX XX | 31 | 1 1 1 1 3 XX XX 24 | 31 | 6 XX XX XX XX XX 26 XX | 32 |
| 1 1 1 1 27 XX XX XX | 31 | 5 XX XX XX XX 2 XX 24 | 31 | 1 5 XX XX XX XX 26 XX | 32 |
| 5 XX XX XX XX 26 XX XX | 31 | 1 4 XX XX XX 2 XX 24 | 31 | 2 XX 4 XX XX XX 26 XX | 32 |
| 1 4 XX XX XX 26 XX XX | 31 | 2 XX 3 XX XX 2 XX 24 | 31 | 1 1 4 XX XX XX 26 XX | 32 |
| 2 XX 3 XX XX 26 XX XX | 31 | 1 1 3 XX XX 2 XX 24 | 31 | 3 XX XX 3 XX XX 26 XX | 32 |
| 1 1 3 XX XX 26 XX XX | 31 | 3 XX XX 2 XX 2 XX 24 | 31 | 1 2 XX 3 XX XX 26 XX | 32 |
| 3 XX XX 2 XX 26 XX XX | 31 | 1 2 XX 2 XX 2 XX 24 | 31 | 2 XX 1 3 XX XX 26 XX | 32 |
| 1 2 XX 2 XX 26 XX XX | 31 | 2 XX 1 2 XX 2 XX 24 | 31 | 1 1 1 3 XX XX 26 XX | 32 |
| 2 XX 1 2 XX 26 XX XX | 31 | 1 1 1 2 XX 2 XX 24 | 31 | 4 XX XX XX 2 XX 26 XX | 32 |
| 1 1 1 2 XX 26 XX XX | 31 | 4 XX XX XX 1 2 XX 24 | 31 | 1 3 XX XX 2 XX 26 XX | 32 |
| 4 XX XX XX 1 26 XX XX | 31 | 1 3 XX XX 1 2 XX 24 | 31 | 2 XX 2 XX 2 XX 26 XX | 32 |
| 1 3 XX XX 1 26 XX XX | 31 | 2 XX 2 XX 1 2 XX 24 | 31 | 1 1 2 XX 2 XX 26 XX | 32 |
| 2 XX 2 XX 1 26 XX XX | 31 | 1 1 2 XX 1 2 XX 24 | 31 | 3 XX XX 1 2 XX 26 XX | 32 |
| 1 1 2 XX 1 26 XX XX | 31 | 3 XX XX 1 1 2 XX 24 | 31 | 1 2 XX 1 2 XX 26 XX | 32 |
| 3 XX XX 1 1 26 XX XX | 31 | 1 2 XX 1 1 2 XX 24 | 31 | 2 XX 1 1 2 XX 26 XX | 32 |
| 1 2 XX 1 1 26 XX XX | 31 | 2 XX 1 1 1 2 XX 24 | 31 | 1 1 1 1 2 XX 26 XX | 32 |
| 2 XX 1 1 1 26 XX XX | 31 | 1 1 1 1 1 2 XX 24 | 31 | 5 XX XX XX XX 1 26 XX | 32 |
| 1 1 1 1 1 26 XX XX | 31 | 6 XX XX XX XX XX 1 24 | 31 | 1 4 XX XX XX 1 26 XX | 32 |
| 6 XX XX XX XX XX 25 XX | 31 | 1 5 XX XX XX XX 1 24 | 31 | 2 XX 3 XX XX 1 26 XX | 32 |
| 1 5 XX XX XX XX 25 XX | 31 | 2 XX 4 XX XX XX 1 24 | 31 | 1 1 3 XX XX 1 26 XX | 32 |
| 2 XX 4 XX XX XX 25 XX | 31 | 1 1 4 XX XX XX 1 24 | 31 | 3 XX XX 2 XX 1 26 XX | 32 |
| 1 1 4 XX XX XX 25 XX | 31 | 3 XX XX 3 XX XX 1 24 | 31 | 1 2 XX 2 XX 1 26 XX | 32 |
| 3 XX XX 3 XX XX 25 XX | 31 | 1 2 XX 3 XX XX 1 24 | 31 | 2 XX 1 2 XX 1 26 XX | 32 |
| 1 2 XX 3 XX XX 25 XX | 31 | 2 XX 1 3 XX XX 1 24 | 31 | 1 1 1 2 XX 1 26 XX | 32 |
| 2 XX 1 3 XX XX 25 XX | 31 | 1 1 1 3 XX XX 1 24 | 31 | 4 XX XX XX 1 1 26 XX | 32 |
| 1 1 1 3 XX XX 25 XX | 31 | 4 XX XX XX 2 XX 1 24 | 31 | 1 3 XX XX 1 1 26 XX | 32 |
| 4 XX XX XX 2 XX 25 XX | 31 | 1 3 XX XX 2 XX 1 24 | 31 | 2 XX 2 XX 1 1 26 XX | 32 |
| 1 3 XX XX 2 XX 25 XX | 31 | 2 XX 2 XX 2 XX 1 24 | 31 | 1 1 2 XX 1 1 26 XX | 32 |
| 2 XX 2 XX 2 XX 25 XX | 31 | 1 1 2 XX 2 XX 1 24 | 31 | 3 XX XX 1 1 1 26 XX | 32 |
| 1 1 2 XX 2 XX 25 XX | 31 | 3 XX XX 1 2 XX 1 24 | 31 | 1 2 XX 1 1 1 26 XX | 32 |
| 3 XX XX 1 2 XX 25 XX | 31 | 1 2 XX 1 2 XX 1 24 | 31 | 2 XX 1 1 1 1 26 XX | 32 |
| 1 2 XX 1 2 XX 25 XX | 31 | 2 XX 1 1 2 XX 1 24 | 31 | 1 1 1 1 1 1 26 XX | 32 |
| 2 XX 1 1 2 XX 25 XX | 31 | 1 1 1 1 2 XX 1 24 | 31 | 7 XX XX XX XX XX XX 25 | 32 |
| 1 1 1 1 2 XX 25 XX | 31 | 5 XX XX XX XX 1 1 24 | 31 | 1 6 XX XX XX XX XX 25 | 32 |
| 5 XX XX XX XX 1 25 XX | 31 | 1 4 XX XX XX 1 1 24 | 31 | 2 XX 5 XX XX XX XX 25 | 32 |
| 1 4 XX XX XX 1 25 XX | 31 | 2 XX 3 XX XX 1 1 24 | 31 | 1 1 5 XX XX XX XX 25 | 32 |
| 2 XX 3 XX XX 1 25 XX | 31 | 1 1 3 XX XX 1 1 24 | 31 | 3 XX XX 4 XX XX XX 25 | 32 |
| 1 1 3 XX XX 1 25 XX | 31 | 3 XX XX 2 XX 1 1 24 | 31 | 1 2 XX 4 XX XX XX 25 | 32 |
| 3 XX XX 2 XX 1 25 XX | 31 | 1 2 XX 2 XX 1 1 24 | 31 | 2 XX 1 4 XX XX XX 25 | 32 |
| 1 2 XX 2 XX 1 25 XX | 31 | 2 XX 1 2 XX 1 1 24 | 31 | 1 1 1 4 XX XX XX 25 | 32 |
| 2 XX 1 2 XX 1 25 XX | 31 | 1 1 1 2 XX 1 1 24 | 31 | 4 XX XX XX 3 XX XX 25 | 32 |
| 1 1 1 2 XX 1 25 XX | 31 | 4 XX XX XX 1 1 1 24 | 31 | 1 3 XX XX 3 XX XX 25 | 32 |
| 4 XX XX XX 1 1 25 XX | 31 | 1 3 XX XX 1 1 1 24 | 31 | 2 XX 2 XX 3 XX XX 25 | 32 |
| 1 3 XX XX 1 1 25 XX | 31 | 2 XX 2 XX 1 1 1 24 | 31 | 1 1 2 XX 3 XX XX 25 | 32 |
| 2 XX 2 XX 1 1 25 XX | 31 | 1 1 2 XX 1 1 1 24 | 31 | 3 XX XX 1 3 XX XX 25 | 32 |
| 1 1 2 XX 1 1 25 XX | 31 | 3 XX XX 1 1 1 1 24 | 31 | 1 2 XX 1 3 XX XX 25 | 32 |
| 3 XX XX 1 1 1 25 XX | 31 | 1 2 XX 1 1 1 1 24 | 31 | 2 XX 1 1 3 XX XX 25 | 32 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 1  1  1  1  3  XX XX 25 | 32 | 5  XX XX XX XX 1     27 XX | 33 | 1  4  XX XX XX 1  1  26 | 33 |
| 5  XX XX XX XX 2     XX 25 | 32 | 1  4  XX XX XX 1     27 XX | 33 | 2  XX 3  XX XX 1  1  26 | 33 |
| 1  4  XX XX XX 2     XX 25 | 32 | 2  XX 3  XX XX 1     27 XX | 33 | 1  1  3  XX XX 1  1  26 | 33 |
| 2  XX 3  XX XX 2     XX 25 | 32 | 1  1  3  XX XX 1     27 XX | 33 | 3  XX XX 2  XX 1  1  26 | 33 |
| 1  1  3  XX XX 2     XX 25 | 32 | 3  XX XX 2  XX 1     27 XX | 33 | 1  2  XX 2  XX 1  1  26 | 33 |
| 3  XX XX 2  XX 2     XX 25 | 32 | 1  2  XX 2  XX 1     27 XX | 33 | 2  XX 1  2  XX 1  1  26 | 33 |
| 1  2  XX 2  XX 2     XX 25 | 32 | 2  XX 1  2  XX 1     27 XX | 33 | 1  1  1  2  XX 1  1  26 | 33 |
| 2  XX 1  2  XX 2     XX 25 | 32 | 1  1  1  2  XX 1     27 XX | 33 | 4  XX XX XX 1  1  1  26 | 33 |
| 1  1  1  2  XX 2     XX 25 | 32 | 4  XX XX XX 1  1     27 XX | 33 | 1  3  XX XX 1  1  1  26 | 33 |
| 4  XX XX XX 1  2     XX 25 | 32 | 1  3  XX XX 1  1     27 XX | 33 | 2  XX 2  XX 1  1  1  26 | 33 |
| 1  3  XX XX 1  2     XX 25 | 32 | 2  XX 2  XX 1  1     27 XX | 33 | 1  1  2  XX 1  1  1  26 | 33 |
| 2  XX 2  XX 1  2     XX 25 | 32 | 1  1  2  XX 1  1     27 XX | 33 | 3  XX XX 1  1  1  1  26 | 33 |
| 1  1  2  XX 1  2     XX 25 | 32 | 3  XX XX 1  1  1     27 XX | 33 | 1  2  XX 1  1  1  1  26 | 33 |
| 3  XX XX 1  1  2     XX 25 | 32 | 1  2  XX 1  1  1     27 XX | 33 | 2  XX 1  1  1  1  1  26 | 33 |
| 1  2  XX 1  1  2     XX 25 | 32 | 2  XX 1  1  1  1     27 XX | 33 | 1  1  1  1  1  1  1  26 | 33 |
| 2  XX 1  1  1  2     XX 25 | 32 | 1  1  1  1  1  1     27 XX | 33 | 7  XX XX XX XX XX XX 27 | 34 |
| 1  1  1  1  1  2     XX 25 | 32 | 7  XX XX XX XX XX XX 26 | 33 | 1  6  XX XX XX XX XX 27 | 34 |
| 6  XX XX XX XX XX 1  25 | 32 | 1  6  XX XX XX XX XX 26 | 33 | 2  XX 5  XX XX XX XX 27 | 34 |
| 1  5  XX XX XX XX 1  25 | 32 | 2  XX 5  XX XX XX XX 26 | 33 | 1  1  5  XX XX XX XX 27 | 34 |
| 2  XX 4  XX XX XX 1  25 | 32 | 1  1  5  XX XX XX XX 26 | 33 | 3  XX XX 4  XX XX XX 27 | 34 |
| 1  1  4  XX XX XX 1  25 | 32 | 3  XX XX 4  XX XX XX 26 | 33 | 1  2  XX 4  XX XX XX 27 | 34 |
| 3  XX XX 3  XX XX 1  25 | 32 | 1  2  XX 4  XX XX XX 26 | 33 | 2  XX 1  4  XX XX XX 27 | 34 |
| 1  2  XX 3  XX XX 1  25 | 32 | 2  XX 1  4  XX XX XX 26 | 33 | 1  1  1  4  XX XX XX 27 | 34 |
| 2  XX 1  3  XX XX 1  25 | 32 | 1  1  1  4  XX XX XX 26 | 33 | 4  XX XX XX 3  XX XX 27 | 34 |
| 1  1  1  3  XX XX 1  25 | 32 | 4  XX XX XX 3  XX XX 26 | 33 | 1  3  XX XX 3  XX XX 27 | 34 |
| 4  XX XX XX 2  XX 1  25 | 32 | 1  3  XX XX 3  XX XX 26 | 33 | 2  XX 2  XX 3  XX XX 27 | 34 |
| 1  3  XX XX 2  XX 1  25 | 32 | 2  XX 2  XX 3  XX XX 26 | 33 | 1  1  2  XX 3  XX XX 27 | 34 |
| 2  XX 2  XX 2  XX 1  25 | 32 | 1  1  2  XX 3  XX XX 26 | 33 | 3  XX XX 1  3  XX XX 27 | 34 |
| 1  1  2  XX 2  XX 1  25 | 32 | 3  XX XX 1  3  XX XX 26 | 33 | 1  2  XX 1  3  XX XX 27 | 34 |
| 3  XX XX 1  2  XX 1  25 | 32 | 1  2  XX 1  3  XX XX 26 | 33 | 2  XX 1  1  3  XX XX 27 | 34 |
| 1  2  XX 1  2  XX 1  25 | 32 | 2  XX 1  1  3  XX XX 26 | 33 | 1  1  1  1  3  XX XX 27 | 34 |
| 2  XX 1  1  2  XX 1  25 | 32 | 1  1  1  1  3  XX XX 26 | 33 | 5  XX XX XX XX 2  XX 27 | 34 |
| 1  1  1  1  2  XX 1  25 | 32 | 5  XX XX XX XX 2  XX 26 | 33 | 1  4  XX XX XX 2  XX 27 | 34 |
| 5  XX XX XX XX 1  1  25 | 32 | 1  4  XX XX XX 2  XX 26 | 33 | 2  XX 3  XX XX 2  XX 27 | 34 |
| 1  4  XX XX XX 1  1  25 | 32 | 2  XX 3  XX XX 2  XX 26 | 33 | 1  1  3  XX XX 2  XX 27 | 34 |
| 2  XX 3  XX XX 1  1  25 | 32 | 1  1  3  XX XX 2  XX 26 | 33 | 3  XX XX 2  XX 2  XX 27 | 34 |
| 1  1  3  XX XX 1  1  25 | 32 | 3  XX XX 2  XX 2  XX 26 | 33 | 1  2  XX 2  XX 2  XX 27 | 34 |
| 3  XX XX 2  XX 1  1  25 | 32 | 1  2  XX 2  XX 2  XX 26 | 33 | 2  XX 1  2  XX 2  XX 27 | 34 |
| 1  2  XX 2  XX 1  1  25 | 32 | 2  XX 1  2  XX 2  XX 26 | 33 | 1  1  1  2  XX 2  XX 27 | 34 |
| 2  XX 1  2  XX 1  1  25 | 32 | 1  1  1  2  XX 2  XX 26 | 33 | 4  XX XX XX 1  2  XX 27 | 34 |
| 1  1  1  2  XX 1  1  25 | 32 | 4  XX XX XX 1  2  XX 26 | 33 | 1  3  XX XX 1  2  XX 27 | 34 |
| 4  XX XX XX 1  1  1  25 | 32 | 1  3  XX XX 1  2  XX 26 | 33 | 2  XX 2  XX 1  2  XX 27 | 34 |
| 1  3  XX XX 1  1  1  25 | 32 | 2  XX 2  XX 1  2  XX 26 | 33 | 1  1  2  XX 1  2  XX 27 | 34 |
| 2  XX 2  XX 1  1  1  25 | 32 | 1  1  2  XX 1  2  XX 26 | 33 | 3  XX XX 1  1  2  XX 27 | 34 |
| 1  1  2  XX 1  1  1  25 | 32 | 3  XX XX 1  1  2  XX 26 | 33 | 1  2  XX 1  1  2  XX 27 | 34 |
| 3  XX XX 1  1  1  1  25 | 32 | 1  2  XX 1  1  2  XX 26 | 33 | 2  XX 1  1  1  2  XX 27 | 34 |
| 1  2  XX 1  1  1  1  25 | 32 | 2  XX 1  1  1  2  XX 26 | 33 | 1  1  1  1  1  2  XX 27 | 34 |
| 2  XX 1  1  1  1  1  25 | 32 | 1  1  1  1  1  2  XX 26 | 33 | 6  XX XX XX XX XX 1  27 | 34 |
| 1  1  1  1  1  1  1  25 | 32 | 6  XX XX XX XX XX 1  26 | 33 | 1  5  XX XX XX XX 1  27 | 34 |
| 6  XX XX XX XX XX 27 XX | 33 | 1  5  XX XX XX XX 1  26 | 33 | 2  XX 4  XX XX XX 1  27 | 34 |
| 1  5  XX XX XX XX 27 XX | 33 | 2  XX 4  XX XX XX 1  26 | 33 | 1  1  4  XX XX XX 1  27 | 34 |
| 2  XX 4  XX XX XX 27 XX | 33 | 1  1  4  XX XX XX 1  26 | 33 | 3  XX XX 3  XX XX 1  27 | 34 |
| 1  1  4  XX XX XX 27 XX | 33 | 3  XX XX 3  XX XX 1  26 | 33 | 1  2  XX 3  XX XX 1  27 | 34 |
| 3  XX XX 3  XX XX 27 XX | 33 | 1  2  XX 3  XX XX 1  26 | 33 | 2  XX 1  3  XX XX 1  27 | 34 |
| 1  2  XX 3  XX XX 27 XX | 33 | 2  XX 1  3  XX XX 1  26 | 33 | 1  1  1  3  XX XX 1  27 | 34 |
| 2  XX 1  3  XX XX 27 XX | 33 | 1  1  1  3  XX XX 1  26 | 33 | 4  XX XX XX 2  XX 1  27 | 34 |
| 1  1  1  3  XX XX 27 XX | 33 | 4  XX XX XX 2  XX 1  26 | 33 | 1  3  XX XX 2  XX 1  27 | 34 |
| 4  XX XX XX 2  XX 27 XX | 33 | 1  3  XX XX 2  XX 1  26 | 33 | 2  XX 2  XX 2  XX 1  27 | 34 |
| 1  3  XX XX 2  XX 27 XX | 33 | 2  XX 2  XX 2  XX 1  26 | 33 | 1  1  2  XX 2  XX 1  27 | 34 |
| 2  XX 2  XX 2  XX 27 XX | 33 | 1  1  2  XX 2  XX 1  26 | 33 | 3  XX XX 1  2  XX 1  27 | 34 |
| 1  1  2  XX 2  XX 27 XX | 33 | 3  XX XX 1  2  XX 1  26 | 33 | 1  2  XX 1  2  XX 1  27 | 34 |
| 3  XX XX 1  2  XX 27 XX | 33 | 1  2  XX 1  2  XX 1  26 | 33 | 2  XX 1  1  2  XX 1  27 | 34 |
| 1  2  XX 1  2  XX 27 XX | 33 | 2  XX 1  1  2  XX 1  26 | 33 | 1  1  1  1  2  XX 1  27 | 34 |
| 2  XX 1  1  2  XX 27 XX | 33 | 1  1  1  1  2  XX 1  26 | 33 | 5  XX XX XX XX 1  1  27 | 34 |
| 1  1  1  1  2  XX 27 XX | 33 | 5  XX XX XX XX 1  1  26 | 33 | 1  4  XX XX XX 1  1  27 | 34 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 2  XX 3     XX XX 1  1  27 | 34 | | | | |
| 1  1  3     XX XX 1  1  27 | 34 | | | | |
| 3  XX XX 2     XX 1  1  27 | 34 | | | | |
| 1  2  XX 2     XX 1  1  27 | 34 | | | | |
| 2  XX 1  2     XX 1  1  27 | 34 | | | | |
| 1  1  1  2     XX 1  1  27 | 34 | | | | |
| 4  XX XX XX 1  1  1  27 | 34 | | | | |
| 1  3  -XX XX 1  1  1  27 | 34 | | | | |
| 2  XX 2     XX 1  1  1  27 | 34 | | | | |
| 1  1  2     XX 1  1  1  27 | 34 | | | | |
| 3  XX XX 1  1  1  1  27 | 34 | | | | |
| 1  2  XX 1  1  1  1  27 | 34 | | | | |
| 2  XX 1  1  1  1  1  27 | 34 | | | | |
| 1  1  1  1  1  1  1  27 | 34 | | | | |

APPENDIX B

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 8 XX XX XX XX XX XX XX | 8 | 1 7 XX XX XX XX XX 8 | 8 | 2 XX 9 XX XX XX XX XX | 9 |
| 1 8 XX XX XX XX XX XX | 8 | 2 XX 7 XX XX XX XX 8 | 8 | 1 2 9 XX XX XX XX XX | 9 |
| 2 XX 8 XX XX XX XX XX | 8 | 1 2 7 XX XX XX XX 8 | 8 | 3 XX XX 9 XX XX XX XX | 9 |
| 1 2 8 XX XX XX XX XX | 8 | 3 XX XX 7 XX XX XX 8 | 8 | 1 3 XX 9 XX XX XX XX | 9 |
| 3 XX XX 8 XX XX XX XX | 8 | 1 3 XX 7 XX XX XX 8 | 8 | 2 XX 3 9 XX XX XX XX | 9 |
| 1 3 XX 8 XX XX XX XX | 8 | 2 XX 3 7 XX XX XX 8 | 8 | 1 2 3 9 XX XX XX XX | 9 |
| 2 XX 3 8 XX XX XX XX | 8 | 1 2 3 7 XX XX XX 8 | 8 | 4 XX XX XX 9 XX XX XX | 9 |
| 1 2 3 8 XX XX XX XX | 8 | 4 XX XX XX 7 XX XX 8 | 8 | 1 4 XX XX 9 XX XX XX | 9 |
| 4 XX XX XX 8 XX XX XX | 8 | 1 4 XX XX 7 XX XX 8 | 8 | 2 XX 4 XX 9 XX XX XX | 9 |
| 1 4 XX XX 8 XX XX XX | 8 | 2 XX 4 XX 7 XX XX 8 | 8 | 1 2 4 XX 9 XX XX XX | 9 |
| 2 XX 4 XX 8 XX XX XX | 8 | 1 2 4 XX 7 XX XX 8 | 8 | 3 XX XX 4 9 XX XX XX | 9 |
| 1 2 4 XX 8 XX XX XX | 8 | 3 XX XX 4 7 XX XX 8 | 8 | 1 3 XX 4 9 XX XX XX | 9 |
| 3 XX XX 4 8 XX XX XX | 8 | 1 3 XX 4 7 XX XX 8 | 8 | 2 XX 3 4 9 XX XX XX | 9 |
| 1 3 XX 4 8 XX XX XX | 8 | 2 XX 3 4 7 XX XX 8 | 8 | 1 2 3 4 9 XX XX XX | 9 |
| 2 XX 3 4 8 XX XX XX | 8 | 1 2 3 4 7 XX XX 8 | 8 | 5 XX XX XX XX 9 XX XX | 9 |
| 1 2 3 4 8 XX XX XX | 8 | 5 XX XX XX XX 7 XX 8 | 8 | 1 5 XX XX XX 9 XX XX | 9 |
| 5 XX XX XX XX 8 XX XX | 8 | 1 5 XX XX XX 7 XX 8 | 8 | 2 XX 5 XX XX 9 XX XX | 9 |
| 1 5 XX XX XX 8 XX XX | 8 | 2 XX 5 XX XX 7 XX 8 | 8 | 1 2 5 XX XX 9 XX XX | 9 |
| 2 XX 5 XX XX 8 XX XX | 8 | 1 2 5 XX XX 7 XX 8 | 8 | 3 XX XX 5 XX 9 XX XX | 9 |
| 1 2 5 XX XX 8 XX XX | 8 | 3 XX XX 5 XX 7 XX 8 | 8 | 1 3 XX 5 XX 9 XX XX | 9 |
| 3 XX XX 5 XX 8 XX XX | 8 | 1 3 XX 5 XX 7 XX 8 | 8 | 2 XX 3 5 XX 9 XX XX | 9 |
| 1 3 XX 5 XX 8 XX XX | 8 | 2 XX 3 5 XX 7 XX 8 | 8 | 1 2 3 5 XX 9 XX XX | 9 |
| 2 XX 3 5 XX 8 XX XX | 8 | 1 2 3 5 XX 7 XX 8 | 8 | 4 XX XX XX 5 9 XX XX | 9 |
| 1 2 3 5 XX 8 XX XX | 8 | 4 XX XX XX 5 7 XX 8 | 8 | 1 4 XX XX 5 9 XX XX | 9 |
| 4 XX XX XX 5 8 XX XX | 8 | 1 4 XX XX 5 7 XX 8 | 8 | 2 XX 4 XX 5 9 XX XX | 9 |
| 1 4 XX XX 5 8 XX XX | 8 | 2 XX 4 XX 5 7 XX 8 | 8 | 1 2 4 XX 5 9 XX XX | 9 |
| 2 XX 4 XX 5 8 XX XX | 8 | 1 2 4 XX 5 7 XX 8 | 8 | 3 XX XX 4 5 9 XX XX | 9 |
| 1 2 4 XX 5 8 XX XX | 8 | 3 XX XX 4 5 7 XX 8 | 8 | 1 3 XX 4 5 9 XX XX | 9 |
| 3 XX XX 4 5 8 XX XX | 8 | 1 3 XX 4 5 7 XX 8 | 8 | 2 XX 3 4 5 9 XX XX | 9 |
| 1 3 XX 4 5 8 XX XX | 8 | 2 XX 3 4 5 7 XX 8 | 8 | 1 2 3 4 5 9 XX XX | 9 |
| 2 XX 3 4 5 8 XX XX | 8 | 1 2 3 4 5 7 XX 8 | 8 | 6 XX XX XX XX XX 9 XX | 9 |
| 1 2 3 4 5 8 XX XX | 8 | 6 XX XX XX XX XX 7 8 | 8 | 1 6 XX XX XX XX 9 XX | 9 |
| 6 XX XX XX XX XX 8 XX | 8 | 1 6 XX XX XX XX 7 8 | 8 | 2 XX 6 XX XX XX 9 XX | 9 |
| 1 6 XX XX XX XX 8 XX | 8 | 2 XX 6 XX XX XX 7 8 | 8 | 1 2 6 XX XX XX 9 XX | 9 |
| 2 XX 6 XX XX XX 8 XX | 8 | 1 2 6 XX XX XX 7 8 | 8 | 3 XX XX 6 XX XX 9 XX | 9 |
| 1 2 6 XX XX XX 8 XX | 8 | 3 XX XX 6 XX XX 7 8 | 8 | 1 3 XX 6 XX XX 9 XX | 9 |
| 3 XX XX 6 XX XX 8 XX | 8 | 1 3 XX 6 XX XX 7 8 | 8 | 2 XX 3 6 XX XX 9 XX | 9 |
| 1 3 XX 6 XX XX 8 XX | 8 | 2 XX 3 6 XX XX 7 8 | 8 | 1 2 3 6 XX XX 9 XX | 9 |
| 2 XX 3 6 XX XX 8 XX | 8 | 1 2 3 6 XX XX 7 8 | 8 | 4 XX XX XX 6 XX 9 XX | 9 |
| 1 2 3 6 XX XX 8 XX | 8 | 4 XX XX XX 6 XX 7 8 | 8 | 1 4 XX XX 6 XX 9 XX | 9 |
| 4 XX XX XX 6 XX 8 XX | 8 | 1 4 XX XX 6 XX 7 8 | 8 | 2 XX 4 XX 6 XX 9 XX | 9 |
| 1 4 XX XX 6 XX 8 XX | 8 | 2 XX 4 XX 6 XX 7 8 | 8 | 1 2 4 XX 6 XX 9 XX | 9 |
| 2 XX 4 XX 6 XX 8 XX | 8 | 1 2 4 XX 6 XX 7 8 | 8 | 3 XX XX 4 6 XX 9 XX | 9 |
| 1 2 4 XX 6 XX 8 XX | 8 | 3 XX XX 4 6 XX 7 8 | 8 | 1 3 XX 4 6 XX 9 XX | 9 |
| 3 XX XX 4 6 XX 8 XX | 8 | 1 3 XX 4 6 XX 7 8 | 8 | 2 XX 3 4 6 XX 9 XX | 9 |
| 1 3 XX 4 6 XX 8 XX | 8 | 2 XX 3 4 6 XX 7 8 | 8 | 1 2 3 4 6 XX 9 XX | 9 |
| 2 XX 3 4 6 XX 8 XX | 8 | 1 2 3 4 6 XX 7 8 | 8 | 5 XX XX XX XX 6 9 XX | 9 |
| 1 2 3 4 6 XX 8 XX | 8 | 5 XX XX XX XX 6 7 8 | 8 | 1 5 XX XX XX 6 9 XX | 9 |
| 5 XX XX XX XX 6 8 XX | 8 | 1 5 XX XX XX 6 7 8 | 8 | 2 XX 5 XX XX 6 9 XX | 9 |
| 1 5 XX XX XX 6 8 XX | 8 | 2 XX 5 XX XX 6 7 8 | 8 | 1 2 5 XX XX 6 9 XX | 9 |
| 2 XX 5 XX XX 6 8 XX | 8 | 1 2 5 XX XX 6 7 8 | 8 | 3 XX XX 5 XX 6 9 XX | 9 |
| 1 2 5 XX XX 6 8 XX | 8 | 3 XX XX 5 XX 6 7 8 | 8 | 1 3 XX 5 XX 6 9 XX | 9 |
| 3 XX XX 5 XX 6 8 XX | 8 | 1 3 XX 5 XX 6 7 8 | 8 | 2 XX 3 5 XX 6 9 XX | 9 |
| 1 3 XX 5 XX 6 8 XX | 8 | 2 XX 3 5 XX 6 7 8 | 8 | 1 2 3 5 XX 6 9 XX | 9 |
| 2 XX 3 5 XX 6 8 XX | 8 | 1 2 3 5 XX 6 7 8 | 8 | 4 XX XX XX 5 6 9 XX | 9 |
| 1 2 3 5 XX 6 8 XX | 8 | 4 XX XX XX 5 6 7 8 | 8 | 1 4 XX XX 5 6 9 XX | 9 |
| 4 XX XX XX 5 6 8 XX | 8 | 1 4 XX XX 5 6 7 8 | 8 | 2 XX 4 XX 5 6 9 XX | 9 |
| 1 4 XX XX 5 6 8 XX | 8 | 2 XX 4 XX 5 6 7 8 | 8 | 1 2 4 XX 5 6 9 XX | 9 |
| 2 XX 4 XX 5 6 8 XX | 8 | 1 2 4 XX 5 6 7 8 | 8 | 3 XX XX 4 5 6 9 XX | 9 |
| 1 2 4 XX 5 6 8 XX | 8 | 3 XX XX 4 5 6 7 8 | 8 | 1 3 XX 4 5 6 9 XX | 9 |
| 3 XX XX 4 5 6 8 XX | 8 | 1 3 XX 4 5 6 7 8 | 8 | 2 XX 3 4 5 6 9 XX | 9 |
| 1 3 XX 4 5 6 8 XX | 8 | 2 XX 3 4 5 6 7 8 | 8 | 1 2 3 4 5 6 9 XX | 9 |
| 2 XX 3 4 5 6 8 XX | 8 | 1 2 3 4 5 6 7 8 | 8 | 7 XX XX XX XX XX XX 9 | 9 |
| 1 2 3 4 5 6 8 XX | 8 | 9 XX XX XX XX XX XX XX | 9 | 1 7 XX XX XX XX XX 9 | 9 |
| 7 XX XX XX XX XX XX 8 | 8 | 1 9 XX XX XX XX XX XX | 9 | 2 XX 7 XX XX XX XX 9 | 9 |

| Inputs (from stagger position) | | | | | | | | Output | Inputs (from stagger position) | | | | | | | | Output | Inputs (from stagger position) | | | | | | | | Output |
|---|---|---|---|---|---|---|---|---|---|---|---|---|---|---|---|---|---|---|---|---|---|---|---|---|---|
| 0 | 1 | 2 | 3 | 4 | 5 | 6 | 7 | | 0 | 1 | 2 | 3 | 4 | 5 | 6 | 7 | | 0 | 1 | 2 | 3 | 4 | 5 | 6 | 7 | |
| 1 | 2 | 7 | XX | XX | XX | XX | 9 | 9 | 3 | XX | XX | 10 | XX | XX | XX | XX | 10 | 1 | 3 | XX | 7 | XX | XX | XX | 10 | 10 |
| 3 | XX | XX | 7 | XX | XX | XX | 9 | 9 | 1 | 3 | XX | 10 | XX | XX | XX | XX | 10 | 2 | XX | 3 | 7 | XX | XX | XX | 10 | 10 |
| 1 | 3 | XX | 7 | XX | XX | XX | 9 | 9 | 2 | XX | 3 | 10 | XX | XX | XX | XX | 10 | 1 | 2 | 3 | 7 | XX | XX | XX | 10 | 10 |
| 2 | XX | 3 | 7 | XX | XX | XX | 9 | 9 | 1 | 2 | 3 | 10 | XX | XX | XX | XX | 10 | 4 | XX | XX | XX | 7 | XX | XX | 10 | 10 |
| 1 | 2 | 3 | 7 | XX | XX | XX | 9 | 9 | 4 | XX | XX | XX | 10 | XX | XX | XX | 10 | 1 | 4 | XX | XX | 7 | XX | XX | 10 | 10 |
| 4 | XX | XX | XX | 7 | XX | XX | 9 | 9 | 1 | 4 | XX | XX | 10 | XX | XX | XX | 10 | 2 | XX | 4 | XX | 7 | XX | XX | 10 | 10 |
| 1 | 4 | XX | XX | 7 | XX | XX | 9 | 9 | 2 | XX | 4 | XX | 10 | XX | XX | XX | 10 | 1 | 2 | 4 | XX | 7 | XX | XX | 10 | 10 |
| 2 | XX | 4 | XX | 7 | XX | XX | 9 | 9 | 1 | 2 | 4 | XX | 10 | XX | XX | XX | 10 | 3 | XX | XX | 4 | 7 | XX | XX | 10 | 10 |
| 1 | 2 | 4 | XX | 7 | XX | XX | 9 | 9 | 3 | XX | XX | 4 | 10 | XX | XX | XX | 10 | 1 | 3 | XX | 4 | 7 | XX | XX | 10 | 10 |
| 3 | XX | XX | 4 | 7 | XX | XX | 9 | 9 | 1 | 3 | XX | 4 | 10 | XX | XX | XX | 10 | 2 | XX | 3 | 4 | 7 | XX | XX | 10 | 10 |
| 1 | 3 | XX | 4 | 7 | XX | XX | 9 | 9 | 2 | XX | 3 | 4 | 10 | XX | XX | XX | 10 | 1 | 2 | 3 | 4 | 7 | XX | XX | 10 | 10 |
| 2 | XX | 3 | 4 | 7 | XX | XX | 9 | 9 | 1 | 2 | 3 | 4 | 10 | XX | XX | XX | 10 | 5 | XX | XX | XX | XX | 7 | XX | 10 | 10 |
| 1 | 2 | 3 | 4 | 7 | XX | XX | 9 | 9 | 5 | XX | XX | XX | XX | 10 | XX | XX | 10 | 1 | 5 | XX | XX | XX | 7 | XX | 10 | 10 |
| 5 | XX | XX | XX | XX | 7 | XX | 9 | 9 | 1 | 5 | XX | XX | XX | 10 | XX | XX | 10 | 2 | XX | 5 | XX | XX | 7 | XX | 10 | 10 |
| 1 | 5 | XX | XX | XX | 7 | XX | 9 | 9 | 2 | XX | 5 | XX | XX | 10 | XX | XX | 10 | 1 | 2 | 5 | XX | XX | 7 | XX | 10 | 10 |
| 2 | XX | 5 | XX | XX | 7 | XX | 9 | 9 | 1 | 2 | 5 | XX | XX | 10 | XX | XX | 10 | 3 | XX | XX | 5 | XX | 7 | XX | 10 | 10 |
| 1 | 2 | 5 | XX | XX | 7 | XX | 9 | 9 | 3 | XX | XX | 5 | XX | 10 | XX | XX | 10 | 1 | 3 | XX | 5 | XX | 7 | XX | 10 | 10 |
| 3 | XX | XX | 5 | XX | 7 | XX | 9 | 9 | 1 | 3 | XX | 5 | XX | 10 | XX | XX | 10 | 2 | XX | 3 | 5 | XX | 7 | XX | 10 | 10 |
| 1 | 3 | XX | 5 | XX | 7 | XX | 9 | 9 | 2 | XX | 3 | 5 | XX | 10 | XX | XX | 10 | 1 | 2 | 3 | 5 | XX | 7 | XX | 10 | 10 |
| 2 | XX | 3 | 5 | XX | 7 | XX | 9 | 9 | 1 | 2 | 3 | 5 | XX | 10 | XX | XX | 10 | 4 | XX | XX | XX | 5 | 7 | XX | 10 | 10 |
| 1 | 2 | 3 | 5 | XX | 7 | XX | 9 | 9 | 4 | XX | XX | XX | 5 | 10 | XX | XX | 10 | 1 | 4 | XX | XX | 5 | 7 | XX | 10 | 10 |
| 4 | XX | XX | XX | 5 | 7 | XX | 9 | 9 | 1 | 4 | XX | XX | 5 | 10 | XX | XX | 10 | 2 | XX | 4 | XX | 5 | 7 | XX | 10 | 10 |
| 1 | 4 | XX | XX | 5 | 7 | XX | 9 | 9 | 2 | XX | 4 | XX | 5 | 10 | XX | XX | 10 | 1 | 2 | 4 | XX | 5 | 7 | XX | 10 | 10 |
| 2 | XX | 4 | XX | 5 | 7 | XX | 9 | 9 | 1 | 2 | 4 | XX | 5 | 10 | XX | XX | 10 | 3 | XX | XX | 4 | 5 | 7 | XX | 10 | 10 |
| 1 | 2 | 4 | XX | 5 | 7 | XX | 9 | 9 | 3 | XX | XX | 4 | 5 | 10 | XX | XX | 10 | 1 | 3 | XX | 4 | 5 | 7 | XX | 10 | 10 |
| 3 | XX | XX | 4 | 5 | 7 | XX | 9 | 9 | 1 | 3 | XX | 4 | 5 | 10 | XX | XX | 10 | 2 | XX | 3 | 4 | 5 | 7 | XX | 10 | 10 |
| 1 | 3 | XX | 4 | 5 | 7 | XX | 9 | 9 | 2 | XX | 3 | 4 | 5 | 10 | XX | XX | 10 | 1 | 2 | 3 | 4 | 5 | 7 | XX | 10 | 10 |
| 2 | XX | 3 | 4 | 5 | 7 | XX | 9 | 9 | 1 | 2 | 3 | 4 | 5 | 10 | XX | XX | 10 | 6 | XX | XX | XX | XX | XX | 7 | 10 | 10 |
| 1 | 2 | 3 | 4 | 5 | 7 | XX | 9 | 9 | 6 | XX | XX | XX | XX | XX | 10 | XX | 10 | 1 | 6 | XX | XX | XX | XX | 7 | 10 | 10 |
| 6 | XX | XX | XX | XX | XX | 7 | 9 | 9 | 1 | 6 | XX | XX | XX | XX | 10 | XX | 10 | 2 | XX | 6 | XX | XX | XX | 7 | 10 | 10 |
| 1 | 6 | XX | XX | XX | XX | 7 | 9 | 9 | 2 | XX | 6 | XX | XX | XX | 10 | XX | 10 | 1 | 2 | 6 | XX | XX | XX | 7 | 10 | 10 |
| 2 | XX | 6 | XX | XX | XX | 7 | 9 | 9 | 1 | 2 | 6 | XX | XX | XX | 10 | XX | 10 | 3 | XX | XX | 6 | XX | XX | 7 | 10 | 10 |
| 1 | 2 | 6 | XX | XX | XX | 7 | 9 | 9 | 3 | XX | XX | 6 | XX | XX | 10 | XX | 10 | 1 | 3 | XX | 6 | XX | XX | 7 | 10 | 10 |
| 3 | XX | XX | 6 | XX | XX | 7 | 9 | 9 | 1 | 3 | XX | 6 | XX | XX | 10 | XX | 10 | 2 | XX | 3 | 6 | XX | XX | 7 | 10 | 10 |
| 1 | 3 | XX | 6 | XX | XX | 7 | 9 | 9 | 2 | XX | 3 | 6 | XX | XX | 10 | XX | 10 | 1 | 2 | 3 | 6 | XX | XX | 7 | 10 | 10 |
| 2 | XX | 3 | 6 | XX | XX | 7 | 9 | 9 | 1 | 2 | 3 | 6 | XX | XX | 10 | XX | 10 | 4 | XX | XX | XX | 6 | XX | 7 | 10 | 10 |
| 1 | 2 | 3 | 6 | XX | XX | 7 | 9 | 9 | 4 | XX | XX | XX | 6 | XX | 10 | XX | 10 | 1 | 4 | XX | XX | 6 | XX | 7 | 10 | 10 |
| 4 | XX | XX | XX | 6 | XX | 7 | 9 | 9 | 1 | 4 | XX | XX | 6 | XX | 10 | XX | 10 | 2 | XX | 4 | XX | 6 | XX | 7 | 10 | 10 |
| 1 | 4 | XX | XX | 6 | XX | 7 | 9 | 9 | 2 | XX | 4 | XX | 6 | XX | 10 | XX | 10 | 1 | 2 | 4 | XX | 6 | XX | 7 | 10 | 10 |
| 2 | XX | 4 | XX | 6 | XX | 7 | 9 | 9 | 1 | 2 | 4 | XX | 6 | XX | 10 | XX | 10 | 3 | XX | XX | 4 | 6 | XX | 7 | 10 | 10 |
| 1 | 2 | 4 | XX | 6 | XX | 7 | 9 | 9 | 3 | XX | XX | 4 | 6 | XX | 10 | XX | 10 | 1 | 3 | XX | 4 | 6 | XX | 7 | 10 | 10 |
| 3 | XX | XX | 4 | 6 | XX | 7 | 9 | 9 | 1 | 3 | XX | 4 | 6 | XX | 10 | XX | 10 | 2 | XX | 3 | 4 | 6 | XX | 7 | 10 | 10 |
| 1 | 3 | XX | 4 | 6 | XX | 7 | 9 | 9 | 2 | XX | 3 | 4 | 6 | XX | 10 | XX | 10 | 1 | 2 | 3 | 4 | 6 | XX | 7 | 10 | 10 |
| 2 | XX | 3 | 4 | 6 | XX | 7 | 9 | 9 | 1 | 2 | 3 | 4 | 6 | XX | 10 | XX | 10 | 5 | XX | XX | XX | XX | 6 | 7 | 10 | 10 |
| 1 | 2 | 3 | 4 | 6 | XX | 7 | 9 | 9 | 5 | XX | XX | XX | XX | 6 | 10 | XX | 10 | 1 | 5 | XX | XX | XX | 6 | 7 | 10 | 10 |
| 5 | XX | XX | XX | XX | 6 | 7 | 9 | 9 | 1 | 5 | XX | XX | XX | 6 | 10 | XX | 10 | 2 | XX | 5 | XX | XX | 6 | 7 | 10 | 10 |
| 1 | 5 | XX | XX | XX | 6 | 7 | 9 | 9 | 2 | XX | 5 | XX | XX | 6 | 10 | XX | 10 | 1 | 2 | 5 | XX | XX | 6 | 7 | 10 | 10 |
| 2 | XX | 5 | XX | XX | 6 | 7 | 9 | 9 | 1 | 2 | 5 | XX | XX | 6 | 10 | XX | 10 | 3 | XX | XX | 5 | XX | 6 | 7 | 10 | 10 |
| 1 | 2 | 5 | XX | XX | 6 | 7 | 9 | 9 | 3 | XX | XX | 5 | XX | 6 | 10 | XX | 10 | 1 | 3 | XX | 5 | XX | 6 | 7 | 10 | 10 |
| 3 | XX | XX | 5 | XX | 6 | 7 | 9 | 9 | 1 | 3 | XX | 5 | XX | 6 | 10 | XX | 10 | 2 | XX | 3 | 5 | XX | 6 | 7 | 10 | 10 |
| 1 | 3 | XX | 5 | XX | 6 | 7 | 9 | 9 | 2 | XX | 3 | 5 | XX | 6 | 10 | XX | 10 | 1 | 2 | 3 | 5 | XX | 6 | 7 | 10 | 10 |
| 2 | XX | 3 | 5 | XX | 6 | 7 | 9 | 9 | 1 | 2 | 3 | 5 | XX | 6 | 10 | XX | 10 | 4 | XX | XX | XX | 5 | 6 | 7 | 10 | 10 |
| 1 | 2 | 3 | 5 | XX | 6 | 7 | 9 | 9 | 4 | XX | XX | XX | 5 | 6 | 10 | XX | 10 | 1 | 4 | XX | XX | 5 | 6 | 7 | 10 | 10 |
| 4 | XX | XX | XX | 5 | 6 | 7 | 9 | 9 | 1 | 4 | XX | XX | 5 | 6 | 10 | XX | 10 | 2 | XX | 4 | XX | 5 | 6 | 7 | 10 | 10 |
| 1 | 4 | XX | XX | 5 | 6 | 7 | 9 | 9 | 2 | XX | 4 | XX | 5 | 6 | 10 | XX | 10 | 1 | 2 | 4 | XX | 5 | 6 | 7 | 10 | 10 |
| 2 | XX | 4 | XX | 5 | 6 | 7 | 9 | 9 | 1 | 2 | 4 | XX | 5 | 6 | 10 | XX | 10 | 3 | XX | XX | 4 | 5 | 6 | 7 | 10 | 10 |
| 1 | 2 | 4 | XX | 5 | 6 | 7 | 9 | 9 | 3 | XX | XX | 4 | 5 | 6 | 10 | XX | 10 | 1 | 3 | XX | 4 | 5 | 6 | 7 | 10 | 10 |
| 3 | XX | XX | 4 | 5 | 6 | 7 | 9 | 9 | 1 | 3 | XX | 4 | 5 | 6 | 10 | XX | 10 | 2 | XX | 3 | 4 | 5 | 6 | 7 | 10 | 10 |
| 1 | 3 | XX | 4 | 5 | 6 | 7 | 9 | 9 | 2 | XX | 3 | 4 | 5 | 6 | 10 | XX | 10 | 1 | 2 | 3 | 4 | 5 | 6 | 7 | 10 | 10 |
| 2 | XX | 3 | 4 | 5 | 6 | 7 | 9 | 9 | 1 | 2 | 3 | 4 | 5 | 6 | 10 | XX | 10 | 11 | XX | XX | XX | XX | XX | XX | XX | 11 |
| 1 | 2 | 3 | 4 | 5 | 6 | 7 | 9 | 9 | 7 | XX | XX | XX | XX | XX | XX | 10 | 10 | 1 | 11 | XX | XX | XX | XX | XX | XX | 11 |
| 10 | XX | XX | XX | XX | XX | XX | XX | 10 | 1 | 7 | XX | XX | XX | XX | XX | 10 | 10 | 2 | XX | 11 | XX | XX | XX | XX | XX | 11 |
| 1 | 10 | XX | XX | XX | XX | XX | XX | 10 | 2 | XX | 7 | XX | XX | XX | XX | 10 | 10 | 1 | 2 | 11 | XX | XX | XX | XX | XX | 11 |
| 2 | XX | 10 | XX | XX | XX | XX | XX | 10 | 1 | 2 | 7 | XX | XX | XX | XX | 10 | 10 | 3 | XX | XX | 11 | XX | XX | XX | XX | 11 |
| 1 | 2 | 10 | XX | XX | XX | XX | XX | 10 | 3 | XX | XX | 7 | XX | XX | XX | 10 | 10 | 1 | 3 | XX | 11 | XX | XX | XX | XX | 11 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 2 XX 3 11 XX XX XX XX | 11 | 1 2 3 7 XX XX XX 11 | 11 | 4 XX XX XX 12 XX XX XX | 12 |
| 1 2 3 11 XX XX XX XX | 11 | 4 XX XX XX 7 XX XX 11 | 11 | 1 4 XX XX 12 XX XX XX | 12 |
| 4 XX XX XX 11 XX XX XX | 11 | 1 4 XX XX 7 XX XX 11 | 11 | 2 XX 4 XX 12 XX XX XX | 12 |
| 1 4 XX XX 11 XX XX XX | 11 | 2 XX 4 XX 7 XX XX 11 | 11 | 1 2 4 XX 12 XX XX XX | 12 |
| 2 XX 4 XX 11 XX XX XX | 11 | 1 2 4 XX 7 XX XX 11 | 11 | 3 XX XX 4 12 XX XX XX | 12 |
| 1 2 4 XX 11 XX XX XX | 11 | 3 XX XX 4 7 XX XX 11 | 11 | 1 3 XX 4 12 XX XX XX | 12 |
| 3 XX XX 4 11 XX XX XX | 11 | 1 3 XX 4 7 XX XX 11 | 11 | 2 XX 3 4 12 XX XX XX | 12 |
| 1 3 . XX 4 11 XX XX XX | 11 | 2 XX 3 4 7 XX XX 11 | 11 | 1 2 3 4 12 XX XX XX | 12 |
| 2 XX 3 4 11 XX XX XX | 11 | 1 2 3 4 7 XX XX 11 | 11 | 5 XX XX XX XX 12 XX XX | 12 |
| 1 2 3 4 11 XX XX XX | 11 | 5 XX XX XX XX 7 XX 11 | 11 | 1 5 XX XX XX 12 XX XX | 12 |
| 5 XX XX XX XX 11 XX XX | 11 | 1 5 XX XX XX 7 XX 11 | 11 | 2 XX 5 XX XX 12 XX XX | 12 |
| 1 5 XX XX XX 11 XX XX | 11 | 2 XX 5 XX XX 7 XX 11 | 11 | 1 2 5 XX XX 12 XX XX | 12 |
| 2 XX 5 XX XX 11 XX XX | 11 | 1 2 5 XX XX 7 XX 11 | 11 | 3 XX XX 5 XX 12 XX XX | 12 |
| 1 2 5 XX XX 11 XX XX | 11 | 3 XX XX 5 XX 7 XX 11 | 11 | 1 3 XX 5 XX 12 XX XX | 12 |
| 3 XX XX 5 XX 11 XX XX | 11 | 1 3 XX 5 XX 7 XX 11 | 11 | 2 XX 3 5 XX 12 XX XX | 12 |
| 1 3 XX 5 XX 11 XX XX | 11 | 2 XX 3 5 XX 7 XX 11 | 11 | 1 2 3 5 XX 12 XX XX | 12 |
| 2 XX 3 5 XX 11 XX XX | 11 | 1 2 3 5 XX 7 XX 11 | 11 | 4 XX XX XX 5 12 XX XX | 12 |
| 1 2 3 5 XX 11 XX XX | 11 | 4 XX XX XX 5 7 XX 11 | 11 | 1 4 XX XX 5 12 XX XX | 12 |
| 4 XX XX XX 5 11 XX XX | 11 | 1 4 XX XX 5 7 XX 11 | 11 | 2 XX 4 XX 5 12 XX XX | 12 |
| 1 4 XX XX 5 11 XX XX | 11 | 2 XX 4 XX 5 7 XX 11 | 11 | 1 2 4 XX 5 12 XX XX | 12 |
| 2 XX 4 XX 5 11 XX XX | 11 | 1 2 4 XX 5 7 XX 11 | 11 | 3 XX XX 4 5 12 XX XX | 12 |
| 1 2 4 XX 5 11 XX XX | 11 | 3 XX XX 4 5 7 XX 11 | 11 | 1 3 XX 4 5 12 XX XX | 12 |
| 3 XX XX 4 5 11 XX XX | 11 | 1 3 XX 4 5 7 XX 11 | 11 | 2 XX 3 4 5 12 XX XX | 12 |
| 1 3 XX 4 5 11 XX XX | 11 | 2 XX 3 4 5 7 XX 11 | 11 | 1 2 3 4 5 12 XX XX | 12 |
| 2 XX 3 4 5 11 XX XX | 11 | 1 2 3 4 5 7 XX 11 | 11 | 6 XX XX XX XX XX 12 XX | 12 |
| 1 2 3 4 5 11 XX XX | 11 | 6 XX XX XX XX XX 7 11 | 11 | 1 6 XX XX XX XX 12 XX | 12 |
| 6 XX XX XX XX XX 11 XX | 11 | 1 6 XX XX XX XX 7 11 | 11 | 2 XX 6 XX XX XX 12 XX | 12 |
| 1 6 XX XX XX XX 11 XX | 11 | 2 XX 6 XX XX XX 7 11 | 11 | 1 2 6 XX XX XX 12 XX | 12 |
| 2 XX 6 XX XX XX 11 XX | 11 | 1 2 6 XX XX XX 7 11 | 11 | 3 XX XX 6 XX XX 12 XX | 12 |
| 1 2 6 XX XX XX 11 XX | 11 | 3 XX XX 6 XX XX 7 11 | 11 | 1 3 XX 6 XX XX 12 XX | 12 |
| 3 XX XX 6 XX XX 11 XX | 11 | 1 3 XX 6 XX XX 7 11 | 11 | 2 XX 3 6 XX XX 12 XX | 12 |
| 1 3 XX 6 XX XX 11 XX | 11 | 2 XX 3 6 XX XX 7 11 | 11 | 1 2 3 6 XX XX 12 XX | 12 |
| 2 XX 3 6 XX XX 11 XX | 11 | 1 2 3 6 XX XX 7 11 | 11 | 4 XX XX XX 6 XX 12 XX | 12 |
| 1 2 3 6 XX XX 11 XX | 11 | 4 XX XX XX 6 XX 7 11 | 11 | 1 4 XX XX 6 XX 12 XX | 12 |
| 4 XX XX XX 6 XX 11 XX | 11 | 1 4 XX XX 6 XX 7 11 | 11 | 2 XX 4 XX 6 XX 12 XX | 12 |
| 1 4 XX XX 6 XX 11 XX | 11 | 2 XX 4 XX 6 XX 7 11 | 11 | 1 2 4 XX 6 XX 12 XX | 12 |
| 2 XX 4 XX 6 XX 11 XX | 11 | 1 2 4 XX 6 XX 7 11 | 11 | 3 XX XX 4 6 XX 12 XX | 12 |
| 1 2 4 XX 6 XX 11 XX | 11 | 3 XX XX 4 6 XX 7 11 | 11 | 1 3 XX 4 6 XX 12 XX | 12 |
| 3 XX XX 4 6 XX 11 XX | 11 | 1 3 XX 4 6 XX 7 11 | 11 | 2 XX 3 4 6 XX 12 XX | 12 |
| 1 3 XX 4 6 XX 11 XX | 11 | 2 XX 3 4 6 XX 7 11 | 11 | 1 2 3 4 6 XX 12 XX | 12 |
| 2 XX 3 4 6 XX 11 XX | 11 | 1 2 3 4 6 XX 7 11 | 11 | 5 XX XX XX XX 6 12 XX | 12 |
| 1 2 3 4 6 XX 11 XX | 11 | 5 XX XX XX XX 6 7 11 | 11 | 1 5 XX XX XX 6 12 XX | 12 |
| 5 XX XX XX XX 6 11 XX | 11 | 1 5 XX XX XX 6 7 11 | 11 | 2 XX 5 XX XX 6 12 XX | 12 |
| 1 5 XX XX XX 6 11 XX | 11 | 2 XX 5 XX XX 6 7 11 | 11 | 1 2 5 XX XX 6 12 XX | 12 |
| 2 XX 5 XX XX 6 11 XX | 11 | 1 2 5 XX XX 6 7 11 | 11 | 3 XX XX 5 XX 6 12 XX | 12 |
| 1 2 5 XX XX 6 11 XX | 11 | 3 XX XX 5 XX 6 7 11 | 11 | 1 3 XX 5 XX 6 12 XX | 12 |
| 3 XX XX 5 XX 6 11 XX | 11 | 1 3 XX 5 XX 6 7 11 | 11 | 2 XX 3 5 XX 6 12 XX | 12 |
| 1 3 XX 5 XX 6 11 XX | 11 | 2 XX 3 5 XX 6 7 11 | 11 | 1 2 3 5 XX 6 12 XX | 12 |
| 2 XX 3 5 XX 6 11 XX | 11 | 1 2 3 5 XX 6 7 11 | 11 | 4 XX XX XX 5 6 12 XX | 12 |
| 1 2 3 5 XX 6 11 XX | 11 | 4 XX XX XX 5 6 7 11 | 11 | 1 4 XX XX 5 6 12 XX | 12 |
| 4 XX XX XX 5 6 11 XX | 11 | 1 4 XX XX 5 6 7 11 | 11 | 2 XX 4 XX 5 6 12 XX | 12 |
| 1 4 XX XX 5 6 11 XX | 11 | 2 XX 4 XX 5 6 7 11 | 11 | 1 2 4 XX 5 6 12 XX | 12 |
| 2 XX 4 XX 5 6 11 XX | 11 | 1 2 4 XX 5 6 7 11 | 11 | 3 XX XX 4 5 6 12 XX | 12 |
| 1 2 4 XX 5 6 11 XX | 11 | 3 XX XX 4 5 6 7 11 | 11 | 1 3 XX 4 5 6 12 XX | 12 |
| 3 XX XX 4 5 6 11 XX | 11 | 1 3 XX 4 5 6 7 11 | 11 | 2 XX 3 4 5 6 12 XX | 12 |
| 1 3 XX 4 5 6 11 XX | 11 | 2 XX 3 4 5 6 7 11 | 11 | 1 2 3 4 5 6 12 XX | 12 |
| 2 XX 3 4 5 6 11 XX | 11 | 1 2 3 4 5 6 7 11 | 11 | 7 XX XX XX XX XX XX 12 | 12 |
| 1 2 3 4 5 6 11 XX | 11 | 12 XX XX XX XX XX XX XX | 12 | 1 7 XX XX XX XX XX 12 | 12 |
| 7 XX XX XX XX XX XX 11 | 11 | 1 12 XX XX XX XX XX XX | 12 | 2 XX 7 XX XX XX XX 12 | 12 |
| 1 7 XX XX XX XX XX 11 | 11 | 2 XX 12 XX XX XX XX XX | 12 | 1 2 7 XX XX XX XX 12 | 12 |
| 2 XX 7 XX XX XX XX 11 | 11 | 1 2 12 XX XX XX XX XX | 12 | 3 XX XX 7 XX XX XX 12 | 12 |
| 1 2 7 XX XX XX XX 11 | 11 | 3 XX XX 12 XX XX XX XX | 12 | 1 3 XX 7 XX XX XX 12 | 12 |
| 3 XX XX 7 XX XX XX 11 | 11 | 1 3 XX 12 XX XX XX XX | 12 | 2 XX 3 7 XX XX XX 12 | 12 |
| 1 3 XX 7 XX XX XX 11 | 11 | 2 XX 3 12 XX XX XX XX | 12 | 1 2 3 7 XX XX XX 12 | 12 |
| 2 XX 3 7 XX XX XX 11 | 11 | 1 2 3 12 XX XX XX XX | 12 | 4 XX XX XX 7 XX XX 12 | 12 |

| Inputs (from stagger position) | | | | | | | | Output |
|---|---|---|---|---|---|---|---|---|
| 0 | 1 | 2 | 3 | 4 | 5 | 6 | 7 | |
| 1 | 4 | XX | XX | 7 | XX | XX | 12 | 12 |
| 2 | XX | 4 | XX | 7 | XX | XX | 12 | 12 |
| 1 | 2 | 4 | XX | 7 | XX | XX | 12 | 12 |
| 3 | XX | XX | 4 | 7 | XX | XX | 12 | 12 |
| 1 | 3 | XX | 4 | 7 | XX | XX | 12 | 12 |
| 2 | XX | 3 | 4 | 7 | XX | XX | 12 | 12 |
| 1 | 2 | 3 | 4 | 7 | XX | XX | 12 | 12 |
| 5 | XX | XX | XX | XX | 7 | XX | 12 | 12 |
| 1 | 5 | XX | XX | XX | 7 | XX | 12 | 12 |
| 2 | XX | 5 | XX | XX | 7 | XX | 12 | 12 |
| 1 | 2 | 5 | XX | XX | 7 | XX | 12 | 12 |
| 3 | XX | XX | 5 | XX | 7 | XX | 12 | 12 |
| 1 | 3 | XX | 5 | XX | 7 | XX | 12 | 12 |
| 2 | XX | 3 | 5 | XX | 7 | XX | 12 | 12 |
| 1 | 2 | 3 | 5 | XX | 7 | XX | 12 | 12 |
| 4 | XX | XX | XX | 5 | 7 | XX | 12 | 12 |
| 1 | 4 | XX | XX | 5 | 7 | XX | 12 | 12 |
| 2 | XX | 4 | XX | 5 | 7 | XX | 12 | 12 |
| 1 | 2 | 4 | XX | 5 | 7 | XX | 12 | 12 |
| 3 | XX | XX | 4 | 5 | 7 | XX | 12 | 12 |
| 1 | 3 | XX | 4 | 5 | 7 | XX | 12 | 12 |
| 2 | XX | 3 | 4 | 5 | 7 | XX | 12 | 12 |
| 1 | 2 | 3 | 4 | 5 | 7 | XX | 12 | 12 |
| 6 | XX | XX | XX | XX | XX | 7 | 12 | 12 |
| 1 | 6 | XX | XX | XX | XX | 7 | 12 | 12 |
| 2 | XX | 6 | XX | XX | XX | 7 | 12 | 12 |
| 1 | 2 | 6 | XX | XX | XX | 7 | 12 | 12 |
| 3 | XX | XX | 6 | XX | XX | 7 | 12 | 12 |
| 1 | 3 | XX | 6 | XX | XX | 7 | 12 | 12 |
| 2 | XX | 3 | 6 | XX | XX | 7 | 12 | 12 |
| 1 | 2 | 3 | 6 | XX | XX | 7 | 12 | 12 |
| 4 | XX | XX | XX | 6 | XX | 7 | 12 | 12 |
| 1 | 4 | XX | XX | 6 | XX | 7 | 12 | 12 |
| 2 | XX | 4 | XX | 6 | XX | 7 | 12 | 12 |
| 1 | 2 | 4 | XX | 6 | XX | 7 | 12 | 12 |
| 3 | XX | XX | 4 | 6 | XX | 7 | 12 | 12 |
| 1 | 3 | XX | 4 | 6 | XX | 7 | 12 | 12 |
| 2 | XX | 3 | 4 | 6 | XX | 7 | 12 | 12 |
| 1 | 2 | 3 | 4 | 6 | XX | 7 | 12 | 12 |
| 5 | XX | XX | XX | XX | 6 | 7 | 12 | 12 |
| 1 | 5 | XX | XX | XX | 6 | 7 | 12 | 12 |
| 2 | XX | 5 | XX | XX | 6 | 7 | 12 | 12 |
| 1 | 2 | 5 | XX | XX | 6 | 7 | 12 | 12 |
| 3 | XX | XX | 5 | XX | 6 | 7 | 12 | 12 |
| 1 | 3 | XX | 5 | XX | 6 | 7 | 12 | 12 |
| 2 | XX | 3 | 5 | XX | 6 | 7 | 12 | 12 |
| 1 | 2 | 3 | 5 | XX | 6 | 7 | 12 | 12 |
| 4 | XX | XX | XX | 5 | 6 | 7 | 12 | 12 |
| 1 | 4 | XX | XX | 5 | 6 | 7 | 12 | 12 |
| 2 | XX | 4 | XX | 5 | 6 | 7 | 12 | 12 |
| 1 | 2 | 4 | XX | 5 | 6 | 7 | 12 | 12 |
| 3 | XX | XX | 4 | 5 | 6 | 7 | 12 | 12 |
| 1 | 3 | XX | 4 | 5 | 6 | 7 | 12 | 12 |
| 2 | XX | 3 | 4 | 5 | 6 | 7 | 12 | 12 |
| 1 | 2 | 3 | 4 | 5 | 6 | 7 | 12 | 12 |
| 13 | XX | XX | XX | XX | XX | XX | XX | 13 |
| 1 | 13 | XX | XX | XX | XX | XX | XX | 13 |
| 2 | XX | 13 | XX | XX | XX | XX | XX | 13 |
| 1 | 2 | 13 | XX | XX | XX | XX | XX | 13 |
| 3 | XX | XX | 13 | XX | XX | XX | XX | 13 |
| 1 | 3 | XX | 13 | XX | XX | XX | XX | 13 |
| 2 | XX | 3 | 13 | XX | XX | XX | XX | 13 |
| 1 | 2 | 3 | 13 | XX | XX | XX | XX | 13 |
| 4 | XX | XX | XX | 13 | XX | XX | XX | 13 |
| 1 | 4 | XX | XX | 13 | XX | XX | XX | 13 |
| 2 | XX | 4 | XX | 13 | XX | XX | XX | 13 |
| 1 | 2 | 4 | XX | 13 | XX | XX | XX | 13 |
| 3 | XX | XX | 4 | 13 | XX | XX | XX | 13 |
| 1 | 3 | XX | 4 | 13 | XX | XX | XX | 13 |
| 2 | XX | 3 | 4 | 13 | XX | XX | XX | 13 |
| 1 | 2 | 3 | 4 | 13 | XX | XX | XX | 13 |
| 5 | XX | XX | XX | XX | 13 | XX | XX | 13 |
| 1 | 5 | XX | XX | XX | 13 | XX | XX | 13 |
| 2 | XX | 5 | XX | XX | 13 | XX | XX | 13 |
| 1 | 2 | 5 | XX | XX | 13 | XX | XX | 13 |
| 3 | XX | XX | 5 | XX | 13 | XX | XX | 13 |
| 1 | 3 | XX | 5 | XX | 13 | XX | XX | 13 |
| 2 | XX | 3 | 5 | XX | 13 | XX | XX | 13 |
| 1 | 2 | 3 | 5 | XX | 13 | XX | XX | 13 |
| 4 | XX | XX | XX | 5 | 13 | XX | XX | 13 |
| 1 | 4 | XX | XX | 5 | 13 | XX | XX | 13 |
| 2 | XX | 4 | XX | 5 | 13 | XX | XX | 13 |
| 1 | 2 | 4 | XX | 5 | 13 | XX | XX | 13 |
| 3 | XX | XX | 4 | 5 | 13 | XX | XX | 13 |
| 1 | 3 | XX | 4 | 5 | 13 | XX | XX | 13 |
| 2 | XX | 3 | 4 | 5 | 13 | XX | XX | 13 |
| 1 | 2 | 3 | 4 | 5 | 13 | XX | XX | 13 |
| 6 | XX | XX | XX | XX | XX | 13 | XX | 13 |
| 1 | 6 | XX | XX | XX | XX | 13 | XX | 13 |
| 2 | XX | 6 | XX | XX | XX | 13 | XX | 13 |
| 1 | 2 | 6 | XX | XX | XX | 13 | XX | 13 |
| 3 | XX | XX | 6 | XX | XX | 13 | XX | 13 |
| 1 | 3 | XX | 6 | XX | XX | 13 | XX | 13 |
| 2 | XX | 3 | 6 | XX | XX | 13 | XX | 13 |
| 1 | 2 | 3 | 6 | XX | XX | 13 | XX | 13 |
| 4 | XX | XX | XX | 6 | XX | 13 | XX | 13 |
| 1 | 4 | XX | XX | 6 | XX | 13 | XX | 13 |
| 2 | XX | 4 | XX | 6 | XX | 13 | XX | 13 |
| 1 | 2 | 4 | XX | 6 | XX | 13 | XX | 13 |
| 3 | XX | XX | 4 | 6 | XX | 13 | XX | 13 |
| 1 | 3 | XX | 4 | 6 | XX | 13 | XX | 13 |
| 2 | XX | 3 | 4 | 6 | XX | 13 | XX | 13 |
| 1 | 2 | 3 | 4 | 6 | XX | 13 | XX | 13 |
| 5 | XX | XX | XX | XX | 6 | 13 | XX | 13 |
| 1 | 5 | XX | XX | XX | 6 | 13 | XX | 13 |
| 2 | XX | 5 | XX | XX | 6 | 13 | XX | 13 |
| 1 | 2 | 5 | XX | XX | 6 | 13 | XX | 13 |
| 3 | XX | XX | 5 | XX | 6 | 13 | XX | 13 |
| 1 | 3 | XX | 5 | XX | 6 | 13 | XX | 13 |
| 2 | XX | 3 | 5 | XX | 6 | 13 | XX | 13 |
| 1 | 2 | 3 | 5 | XX | 6 | 13 | XX | 13 |
| 4 | XX | XX | XX | 5 | 6 | 13 | XX | 13 |
| 1 | 4 | XX | XX | 5 | 6 | 13 | XX | 13 |
| 2 | XX | 4 | XX | 5 | 6 | 13 | XX | 13 |
| 1 | 2 | 4 | XX | 5 | 6 | 13 | XX | 13 |
| 3 | XX | XX | 4 | 5 | 6 | 13 | XX | 13 |
| 1 | 3 | XX | 4 | 5 | 6 | 13 | XX | 13 |
| 2 | XX | 3 | 4 | 5 | 6 | 13 | XX | 13 |
| 1 | 2 | 3 | 4 | 5 | 6 | 13 | XX | 13 |
| 7 | XX | XX | XX | XX | XX | XX | 13 | 13 |
| 1 | 7 | XX | XX | XX | XX | XX | 13 | 13 |
| 2 | XX | 7 | XX | XX | XX | XX | 13 | 13 |
| 1 | 2 | 7 | XX | XX | XX | XX | 13 | 13 |
| 3 | XX | XX | 7 | XX | XX | XX | 13 | 13 |
| 1 | 3 | XX | 7 | XX | XX | XX | 13 | 13 |
| 2 | XX | 3 | 7 | XX | XX | XX | 13 | 13 |
| 1 | 2 | 3 | 7 | XX | XX | XX | 13 | 13 |
| 4 | XX | XX | XX | 7 | XX | XX | 13 | 13 |
| 1 | 4 | XX | XX | 7 | XX | XX | 13 | 13 |
| 2 | XX | 4 | XX | 7 | XX | XX | 13 | 13 |
| 1 | 2 | 4 | XX | 7 | XX | XX | 13 | 13 |
| 3 | XX | XX | 4 | 7 | XX | XX | 13 | 13 |
| 1 | 3 | XX | 4 | 7 | XX | XX | 13 | 13 |
| 2 | XX | 3 | 4 | 7 | XX | XX | 13 | 13 |
| 1 | 2 | 3 | 4 | 7 | XX | XX | 13 | 13 |
| 5 | XX | XX | XX | XX | 7 | XX | 13 | 13 |
| 1 | 5 | XX | XX | XX | 7 | XX | 13 | 13 |
| 2 | XX | 5 | XX | XX | 7 | XX | 13 | 13 |
| 1 | 2 | 5 | XX | XX | 7 | XX | 13 | 13 |
| 3 | XX | XX | 5 | XX | 7 | XX | 13 | 13 |
| 1 | 3 | XX | 5 | XX | 7 | XX | 13 | 13 |
| 2 | XX | 3 | 5 | XX | 7 | XX | 13 | 13 |
| 1 | 2 | 3 | 5 | XX | 7 | XX | 13 | 13 |
| 4 | XX | XX | XX | 5 | 7 | XX | 13 | 13 |
| 1 | 4 | XX | XX | 5 | 7 | XX | 13 | 13 |
| 2 | XX | 4 | XX | 5 | 7 | XX | 13 | 13 |
| 1 | 2 | 4 | XX | 5 | 7 | XX | 13 | 13 |
| 3 | XX | XX | 4 | 5 | 7 | XX | 13 | 13 |
| 1 | 3 | XX | 4 | 5 | 7 | XX | 13 | 13 |
| 2 | XX | 3 | 4 | 5 | 7 | XX | 13 | 13 |
| 1 | 2 | 3 | 4 | 5 | 7 | XX | 13 | 13 |
| 6 | XX | XX | XX | XX | XX | 7 | 13 | 13 |
| 1 | 6 | XX | XX | XX | XX | 7 | 13 | 13 |
| 2 | XX | 6 | XX | XX | XX | 7 | 13 | 13 |
| 1 | 2 | 6 | XX | XX | XX | 7 | 13 | 13 |
| 3 | XX | XX | 6 | XX | XX | 7 | 13 | 13 |
| 1 | 3 | XX | 6 | XX | XX | 7 | 13 | 13 |
| 2 | XX | 3 | 6 | XX | XX | 7 | 13 | 13 |
| 1 | 2 | 3 | 6 | XX | XX | 7 | 13 | 13 |
| 4 | XX | XX | XX | 6 | XX | 7 | 13 | 13 |
| 1 | 4 | XX | XX | 6 | XX | 7 | 13 | 13 |
| 2 | XX | 4 | XX | 6 | XX | 7 | 13 | 13 |
| 1 | 2 | 4 | XX | 6 | XX | 7 | 13 | 13 |
| 3 | XX | XX | 4 | 6 | XX | 7 | 13 | 13 |
| 1 | 3 | XX | 4 | 6 | XX | 7 | 13 | 13 |
| 2 | XX | 3 | 4 | 6 | XX | 7 | 13 | 13 |
| 1 | 2 | 3 | 4 | 6 | XX | 7 | 13 | 13 |
| 5 | XX | XX | XX | XX | 6 | 7 | 13 | 13 |
| 1 | 5 | XX | XX | XX | 6 | 7 | 13 | 13 |
| 2 | XX | 5 | XX | XX | 6 | 7 | 13 | 13 |
| 1 | 2 | 5 | XX | XX | 6 | 7 | 13 | 13 |
| 3 | XX | XX | 5 | XX | 6 | 7 | 13 | 13 |
| 1 | 3 | XX | 5 | XX | 6 | 7 | 13 | 13 |
| 2 | XX | 3 | 5 | XX | 6 | 7 | 13 | 13 |
| 1 | 2 | 3 | 5 | XX | 6 | 7 | 13 | 13 |
| 4 | XX | XX | XX | 5 | 6 | 7 | 13 | 13 |
| 1 | 4 | XX | XX | 5 | 6 | 7 | 13 | 13 |
| 2 | XX | 4 | XX | 5 | 6 | 7 | 13 | 13 |
| 1 | 2 | 4 | XX | 5 | 6 | 7 | 13 | 13 |
| 3 | XX | XX | 4 | 5 | 6 | 7 | 13 | 13 |
| 1 | 3 | XX | 4 | 5 | 6 | 7 | 13 | 13 |
| 2 | XX | 3 | 4 | 5 | 6 | 7 | 13 | 13 |
| 1 | 2 | 3 | 4 | 5 | 6 | 7 | 13 | 13 |
| 14 | XX | XX | XX | XX | XX | XX | XX | 14 |
| 1 | 14 | XX | XX | XX | XX | XX | XX | 14 |
| 2 | XX | 14 | XX | XX | XX | XX | XX | 14 |
| 1 | 2 | 14 | XX | XX | XX | XX | XX | 14 |
| 3 | XX | XX | 14 | XX | XX | XX | XX | 14 |
| 1 | 3 | XX | 14 | XX | XX | XX | XX | 14 |
| 2 | XX | 3 | 14 | XX | XX | XX | XX | 14 |
| 1 | 2 | 3 | 14 | XX | XX | XX | XX | 14 |
| 4 | XX | XX | XX | 14 | XX | XX | XX | 14 |
| 1 | 4 | XX | XX | 14 | XX | XX | XX | 14 |
| 2 | XX | 4 | XX | 14 | XX | XX | XX | 14 |
| 1 | 2 | 4 | XX | 14 | XX | XX | XX | 14 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 3 XX XX 4 14 XX XX XX | 14 | 1 3 XX 4 7 XX XX 14 | 14 | 2 XX 3 4 15 XX XX XX | 15 |
| 1 3 XX 4 14 XX XX XX | 14 | 2 XX 3 4 7 XX XX 14 | 14 | 1 2 3 4 15 XX XX XX | 15 |
| 2 XX 3 4 14 XX XX XX | 14 | 1 2 3 4 7 XX XX 14 | 14 | 5 XX XX XX XX 15 XX XX | 15 |
| 1 2 3 4 14 XX XX XX | 14 | 5 XX XX XX XX 7 XX 14 | 14 | 1 5 XX XX XX 15 XX XX | 15 |
| 5 XX XX XX XX 14 XX XX | 14 | 1 5 XX XX XX 7 XX 14 | 14 | 2 XX 5 XX XX 15 XX XX | 15 |
| 1 5 XX XX XX 14 XX XX | 14 | 2 XX 5 XX XX 7 XX 14 | 14 | 1 2 5 XX XX 15 XX XX | 15 |
| 2 XX 5 XX XX 14 XX XX | 14 | 1 2 5 XX XX 7 XX 14 | 14 | 3 XX XX 5 XX 15 XX XX | 15 |
| 1 2 5 XX XX 14 XX XX | 14 | 3 XX XX 5 XX 7 XX 14 | 14 | 1 3 XX 5 XX 15 XX XX | 15 |
| 3 XX XX 5 XX 14 XX XX | 14 | 1 3 XX 5 XX 7 XX 14 | 14 | 2 XX 3 5 XX 15 XX XX | 15 |
| 1 3 XX 5 XX 14 XX XX | 14 | 2 XX 3 5 XX 7 XX 14 | 14 | 1 2 3 5 XX 15 XX XX | 15 |
| 2 XX 3 5 XX 14 XX XX | 14 | 1 2 3 5 XX 7 XX 14 | 14 | 4 XX XX XX 5 15 XX XX | 15 |
| 1 2 3 5 XX 14 XX XX | 14 | 4 XX XX XX 5 7 XX 14 | 14 | 1 4 XX XX 5 15 XX XX | 15 |
| 4 XX XX XX 5 14 XX XX | 14 | 1 4 XX XX 5 7 XX 14 | 14 | 2 XX 4 XX 5 15 XX XX | 15 |
| 1 4 XX XX 5 14 XX XX | 14 | 2 XX 4 XX 5 7 XX 14 | 14 | 1 2 4 XX 5 15 XX XX | 15 |
| 2 XX 4 XX 5 14 XX XX | 14 | 1 2 4 XX 5 7 XX 14 | 14 | 3 XX XX 4 5 15 XX XX | 15 |
| 1 2 4 XX 5 14 XX XX | 14 | 3 XX XX 4 5 7 XX 14 | 14 | 1 3 XX 4 5 15 XX XX | 15 |
| 3 XX XX 4 5 14 XX XX | 14 | 1 3 XX 4 5 7 XX 14 | 14 | 2 XX 3 4 5 15 XX XX | 15 |
| 1 3 XX 4 5 14 XX XX | 14 | 2 XX 3 4 5 7 XX 14 | 14 | 1 2 3 4 5 15 XX XX | 15 |
| 2 XX 3 4 5 14 XX XX | 14 | 1 2 3 4 5 7 XX 14 | 14 | 6 XX XX XX XX XX 15 XX | 15 |
| 1 2 3 4 5 14 XX XX | 14 | 6 XX XX XX XX XX 7 14 | 14 | 1 6 XX XX XX XX 15 XX | 15 |
| 6 XX XX XX XX XX 14 XX | 14 | 1 6 XX XX XX XX 7 14 | 14 | 2 XX 6 XX XX XX 15 XX | 15 |
| 1 6 XX XX XX XX 14 XX | 14 | 2 XX 6 XX XX XX 7 14 | 14 | 1 2 6 XX XX XX 15 XX | 15 |
| 2 XX 6 XX XX XX 14 XX | 14 | 1 2 6 XX XX XX 7 14 | 14 | 3 XX XX 6 XX XX 15 XX | 15 |
| 1 2 6 XX XX XX 14 XX | 14 | 3 XX XX 6 XX XX 7 14 | 14 | 1 3 XX 6 XX XX 15 XX | 15 |
| 3 XX XX 6 XX XX 14 XX | 14 | 1 3 XX 6 XX XX 7 14 | 14 | 2 XX 3 6 XX XX 15 XX | 15 |
| 1 3 XX 6 XX XX 14 XX | 14 | 2 XX 3 6 XX XX 7 14 | 14 | 1 2 3 6 XX XX 15 XX | 15 |
| 2 XX 3 6 XX XX 14 XX | 14 | 1 2 3 6 XX XX 7 14 | 14 | 4 XX XX XX 6 XX 15 XX | 15 |
| 1 2 3 6 XX XX 14 XX | 14 | 4 XX XX XX 6 XX 7 14 | 14 | 1 4 XX XX 6 XX 15 XX | 15 |
| 4 XX XX XX 6 XX 14 XX | 14 | 1 4 XX XX 6 XX 7 14 | 14 | 2 XX 4 XX 6 XX 15 XX | 15 |
| 1 4 XX XX 6 XX 14 XX | 14 | 2 XX 4 XX 6 XX 7 14 | 14 | 1 2 4 XX 6 XX 15 XX | 15 |
| 2 XX 4 XX 6 XX 14 XX | 14 | 1 2 4 XX 6 XX 7 14 | 14 | 3 XX XX 4 6 XX 15 XX | 15 |
| 1 2 4 XX 6 XX 14 XX | 14 | 3 XX XX 4 6 XX 7 14 | 14 | 1 3 XX 4 6 XX 15 XX | 15 |
| 3 XX XX 4 6 XX 14 XX | 14 | 1 3 XX 4 6 XX 7 14 | 14 | 2 XX 3 4 6 XX 15 XX | 15 |
| 1 3 XX 4 6 XX 14 XX | 14 | 2 XX 3 4 6 XX 7 14 | 14 | 1 2 3 4 6 XX 15 XX | 15 |
| 2 XX 3 4 6 XX 14 XX | 14 | 1 2 3 4 6 XX 7 14 | 14 | 5 XX XX XX XX 6 15 XX | 15 |
| 1 2 3 4 6 XX 14 XX | 14 | 5 XX XX XX XX 6 7 14 | 14 | 1 5 XX XX XX 6 15 XX | 15 |
| 5 XX XX XX XX 6 14 XX | 14 | 1 5 XX XX XX 6 7 14 | 14 | 2 XX 5 XX XX 6 15 XX | 15 |
| 1 5 XX XX XX 6 14 XX | 14 | 2 XX 5 XX XX 6 7 14 | 14 | 1 2 5 XX XX 6 15 XX | 15 |
| 2 XX 5 XX XX 6 14 XX | 14 | 1 2 5 XX XX 6 7 14 | 14 | 3 XX XX 5 XX 6 15 XX | 15 |
| 1 2 5 XX XX 6 14 XX | 14 | 3 XX XX 5 XX 6 7 14 | 14 | 1 3 XX 5 XX 6 15 XX | 15 |
| 3 XX XX 5 XX 6 14 XX | 14 | 1 3 XX 5 XX 6 7 14 | 14 | 2 XX 3 5 XX 6 15 XX | 15 |
| 1 3 XX 5 XX 6 14 XX | 14 | 2 XX 3 5 XX 6 7 14 | 14 | 1 2 3 5 XX 6 15 XX | 15 |
| 2 XX 3 5 XX 6 14 XX | 14 | 1 2 3 5 XX 6 7 14 | 14 | 4 XX XX XX 5 6 15 XX | 15 |
| 1 2 3 5 XX 6 14 XX | 14 | 4 XX XX XX 5 6 7 14 | 14 | 1 4 XX XX 5 6 15 XX | 15 |
| 4 XX XX XX 5 6 14 XX | 14 | 1 4 XX XX 5 6 7 14 | 14 | 2 XX 4 XX 5 6 15 XX | 15 |
| 1 4 XX XX 5 6 14 XX | 14 | 2 XX 4 XX 5 6 7 14 | 14 | 1 2 4 XX 5 6 15 XX | 15 |
| 2 XX 4 XX 5 6 14 XX | 14 | 1 2 4 XX 5 6 7 14 | 14 | 3 XX XX 4 5 6 15 XX | 15 |
| 1 2 4 XX 5 6 14 XX | 14 | 3 XX XX 4 5 6 7 14 | 14 | 1 3 XX 4 5 6 15 XX | 15 |
| 3 XX XX 4 5 6 14 XX | 14 | 1 3 XX 4 5 6 7 14 | 14 | 2 XX 3 4 5 6 15 XX | 15 |
| 1 3 XX 4 5 6 14 XX | 14 | 2 XX 3 4 5 6 7 14 | 14 | 1 2 3 4 5 6 15 XX | 15 |
| 2 XX 3 4 5 6 14 XX | 14 | 1 2 3 4 5 6 7 14 | 14 | 7 XX XX XX XX XX XX 15 | 15 |
| 1 2 3 4 5 6 14 XX | 14 | 15 XX XX XX XX XX XX XX | 15 | 1 7 XX XX XX XX XX 15 | 15 |
| 7 XX XX XX XX XX XX 14 | 14 | 1 15 XX XX XX XX XX XX | 15 | 2 XX 7 XX XX XX XX 15 | 15 |
| 1 7 XX XX XX XX XX 14 | 14 | 2 XX 15 XX XX XX XX XX | 15 | 1 2 7 XX XX XX XX 15 | 15 |
| 2 XX 7 XX XX XX XX 14 | 14 | 1 2 15 XX XX XX XX XX | 15 | 3 XX XX 7 XX XX XX 15 | 15 |
| 1 2 7 XX XX XX XX 14 | 14 | 3 XX XX 15 XX XX XX XX | 15 | 1 3 XX 7 XX XX XX 15 | 15 |
| 3 XX XX 7 XX XX XX 14 | 14 | 1 3 XX 15 XX XX XX XX | 15 | 2 XX 3 7 XX XX XX 15 | 15 |
| 1 3 XX 7 XX XX XX 14 | 14 | 2 XX 3 15 XX XX XX XX | 15 | 1 2 3 7 XX XX XX 15 | 15 |
| 2 XX 3 7 XX XX XX 14 | 14 | 1 2 3 15 XX XX XX XX | 15 | 4 XX XX XX 7 XX XX 15 | 15 |
| 1 2 3 7 XX XX XX 14 | 14 | 4 XX XX XX 15 XX XX XX | 15 | 1 4 XX XX 7 XX XX 15 | 15 |
| 4 XX XX XX 7 XX XX 14 | 14 | 1 4 XX XX 15 XX XX XX | 15 | 2 XX 4 XX 7 XX XX 15 | 15 |
| 1 4 XX XX 7 XX XX 14 | 14 | 2 XX 4 XX 15 XX XX XX | 15 | 1 2 4 XX 7 XX XX 15 | 15 |
| 2 XX 4 XX 7 XX XX 14 | 14 | 1 2 4 XX 15 XX XX XX | 15 | 3 XX XX 4 7 XX XX 15 | 15 |
| 1 2 4 XX 7 XX XX 14 | 14 | 3 XX XX 4 15 XX XX XX | 15 | 1 3 XX 4 7 XX XX 15 | 15 |
| 3 XX XX 4 7 XX XX 14 | 14 | 1 3 XX 4 15 XX XX XX | 15 | 2 XX 3 4 7 XX XX 15 | 15 |

| Inputs (from stagger position) 0 | 1 | 2 | 3 | 4 | 5 | 6 | 7 | Output |
|---|---|---|---|---|---|---|---|---|
| 1 | 2 | 3 | 4 | 7 | XX | XX | 15 | 15 |
| 5 | XX | XX | XX | XX | 7 | XX | 15 | 15 |
| 1 | 5 | XX | XX | XX | 7 | XX | 15 | 15 |
| 2 | XX | 5 | XX | XX | 7 | XX | 15 | 15 |
| 1 | 2 | 5 | XX | XX | 7 | XX | 15 | 15 |
| 3 | XX | XX | 5 | XX | 7 | XX | 15 | 15 |
| 1 | 3 | XX | 5 | XX | 7 | XX | 15 | 15 |
| 2 | XX | 3 | 5 | XX | 7 | XX | 15 | 15 |
| 1 | 2 | 3 | 5 | XX | 7 | XX | 15 | 15 |
| 4 | XX | XX | XX | 5 | 7 | XX | 15 | 15 |
| 1 | 4 | XX | XX | 5 | 7 | XX | 15 | 15 |
| 2 | XX | 4 | XX | 5 | 7 | XX | 15 | 15 |
| 1 | 2 | 4 | XX | 5 | 7 | XX | 15 | 15 |
| 3 | XX | XX | 4 | 5 | 7 | XX | 15 | 15 |
| 1 | 3 | XX | 4 | 5 | 7 | XX | 15 | 15 |
| 2 | XX | 3 | 4 | 5 | 7 | XX | 15 | 15 |
| 1 | 2 | 3 | 4 | 5 | 7 | XX | 15 | 15 |
| 6 | XX | XX | XX | XX | XX | 7 | 15 | 15 |
| 1 | 6 | XX | XX | XX | XX | 7 | 15 | 15 |
| 2 | XX | 6 | XX | XX | XX | 7 | 15 | 15 |
| 1 | 2 | 6 | XX | XX | XX | 7 | 15 | 15 |
| 3 | XX | XX | 6 | XX | XX | 7 | 15 | 15 |
| 1 | 3 | XX | 6 | XX | XX | 7 | 15 | 15 |
| 2 | XX | 3 | 6 | XX | XX | 7 | 15 | 15 |
| 1 | 2 | 3 | 6 | XX | XX | 7 | 15 | 15 |
| 4 | XX | XX | XX | 6 | XX | 7 | 15 | 15 |
| 1 | 4 | XX | XX | 6 | XX | 7 | 15 | 15 |
| 2 | XX | 4 | XX | 6 | XX | 7 | 15 | 15 |
| 1 | 2 | 4 | XX | 6 | XX | 7 | 15 | 15 |
| 3 | XX | XX | 4 | 6 | XX | 7 | 15 | 15 |
| 1 | 3 | XX | 4 | 6 | XX | 7 | 15 | 15 |
| 2 | XX | 3 | 4 | 6 | XX | 7 | 15 | 15 |
| 1 | 2 | 3 | 4 | 6 | XX | 7 | 15 | 15 |
| 5 | XX | XX | XX | XX | 6 | 7 | 15 | 15 |
| 1 | 5 | XX | XX | XX | 6 | 7 | 15 | 15 |
| 2 | XX | 5 | XX | XX | 6 | 7 | 15 | 15 |
| 1 | 2 | 5 | XX | XX | 6 | 7 | 15 | 15 |
| 3 | XX | XX | 5 | XX | 6 | 7 | 15 | 15 |
| 1 | 3 | XX | 5 | XX | 6 | 7 | 15 | 15 |
| 2 | XX | 3 | 5 | XX | 6 | 7 | 15 | 15 |
| 1 | 2 | 3 | 5 | XX | 6 | 7 | 15 | 15 |
| 4 | XX | XX | XX | 5 | 6 | 7 | 15 | 15 |
| 1 | 4 | XX | XX | 5 | 6 | 7 | 15 | 15 |
| 2 | XX | 4 | XX | 5 | 6 | 7 | 15 | 15 |
| 1 | 2 | 4 | XX | 5 | 6 | 7 | 15 | 15 |
| 3 | XX | XX | 4 | 5 | 6 | 7 | 15 | 15 |
| 1 | 3 | XX | 4 | 5 | 6 | 7 | 15 | 15 |
| 2 | XX | 3 | 4 | 5 | 6 | 7 | 15 | 15 |
| 1 | 2 | 3 | 4 | 5 | 6 | 7 | 15 | 15 |
| 16 | XX | XX | XX | XX | XX | XX | XX | 16 |
| 1 | 16 | XX | XX | XX | XX | XX | XX | 16 |
| 2 | XX | 16 | XX | XX | XX | XX | XX | 16 |
| 1 | 2 | 16 | XX | XX | XX | XX | XX | 16 |
| 3 | XX | XX | 16 | XX | XX | XX | XX | 16 |
| 1 | 3 | XX | 16 | XX | XX | XX | XX | 16 |
| 2 | XX | 3 | 16 | XX | XX | XX | XX | 16 |
| 1 | 2 | 3 | 16 | XX | XX | XX | XX | 16 |
| 4 | XX | XX | XX | 16 | XX | XX | XX | 16 |
| 1 | 4 | XX | XX | 16 | XX | XX | XX | 16 |
| 2 | XX | 4 | XX | 16 | XX | XX | XX | 16 |
| 1 | 2 | 4 | XX | 16 | XX | XX | XX | 16 |
| 3 | XX | XX | 4 | 16 | XX | XX | XX | 16 |
| 1 | 3 | XX | 4 | 16 | XX | XX | XX | 16 |
| 2 | XX | 3 | 4 | 16 | XX | XX | XX | 16 |
| 1 | 2 | 3 | 4 | 16 | XX | XX | XX | 16 |
| 5 | XX | XX | XX | XX | 16 | XX | XX | 16 |
| 1 | 5 | XX | XX | XX | 16 | XX | XX | 16 |
| 2 | XX | 5 | XX | XX | 16 | XX | XX | 16 |
| 1 | 2 | 5 | XX | XX | 16 | XX | XX | 16 |
| 3 | XX | XX | 5 | XX | 16 | XX | XX | 16 |
| 1 | 3 | XX | 5 | XX | 16 | XX | XX | 16 |
| 2 | XX | 3 | 5 | XX | 16 | XX | XX | 16 |
| 1 | 2 | 3 | 5 | XX | 16 | XX | XX | 16 |
| 4 | XX | XX | XX | 5 | 16 | XX | XX | 16 |
| 1 | 4 | XX | XX | 5 | 16 | XX | XX | 16 |
| 2 | XX | 4 | XX | 5 | 16 | XX | XX | 16 |
| 1 | 2 | 4 | XX | 5 | 16 | XX | XX | 16 |
| 3 | XX | XX | 4 | 5 | 16 | XX | XX | 16 |
| 1 | 3 | XX | 4 | 5 | 16 | XX | XX | 16 |
| 2 | XX | 3 | 4 | 5 | 16 | XX | XX | 16 |
| 1 | 2 | 3 | 4 | 5 | 16 | XX | XX | 16 |
| 6 | XX | XX | XX | XX | XX | 16 | XX | 16 |
| 1 | 6 | XX | XX | XX | XX | 16 | XX | 16 |
| 2 | XX | 6 | XX | XX | XX | 16 | XX | 16 |
| 1 | 2 | 6 | XX | XX | XX | 16 | XX | 16 |
| 3 | XX | XX | 6 | XX | XX | 16 | XX | 16 |
| 1 | 3 | XX | 6 | XX | XX | 16 | XX | 16 |
| 2 | XX | 3 | 6 | XX | XX | 16 | XX | 16 |
| 1 | 2 | 3 | 6 | XX | XX | 16 | XX | 16 |
| 4 | XX | XX | XX | 6 | XX | 16 | XX | 16 |
| 1 | 4 | XX | XX | 6 | XX | 16 | XX | 16 |
| 2 | XX | 4 | XX | 6 | XX | 16 | XX | 16 |
| 1 | 2 | 4 | XX | 6 | XX | 16 | XX | 16 |
| 3 | XX | XX | 4 | 6 | XX | 16 | XX | 16 |
| 1 | 3 | XX | 4 | 6 | XX | 16 | XX | 16 |
| 2 | XX | 3 | 4 | 6 | XX | 16 | XX | 16 |
| 1 | 2 | 3 | 4 | 6 | XX | 16 | XX | 16 |
| 5 | XX | XX | XX | XX | 6 | 16 | XX | 16 |
| 1 | 5 | XX | XX | XX | 6 | 16 | XX | 16 |
| 2 | XX | 5 | XX | XX | 6 | 16 | XX | 16 |
| 1 | 2 | 5 | XX | XX | 6 | 16 | XX | 16 |
| 3 | XX | XX | 5 | XX | 6 | 16 | XX | 16 |
| 1 | 3 | XX | 5 | XX | 6 | 16 | XX | 16 |
| 2 | XX | 3 | 5 | XX | 6 | 16 | XX | 16 |
| 1 | 2 | 3 | 5 | XX | 6 | 16 | XX | 16 |
| 4 | XX | XX | XX | 5 | 6 | 16 | XX | 16 |
| 1 | 4 | XX | XX | 5 | 6 | 16 | XX | 16 |
| 2 | XX | 4 | XX | 5 | 6 | 16 | XX | 16 |
| 1 | 2 | 4 | XX | 5 | 6 | 16 | XX | 16 |
| 3 | XX | XX | 4 | 5 | 6 | 16 | XX | 16 |
| 1 | 3 | XX | 4 | 5 | 6 | 16 | XX | 16 |
| 2 | XX | 3 | 4 | 5 | 6 | 16 | XX | 16 |
| 1 | 2 | 3 | 4 | 5 | 6 | 16 | XX | 16 |
| 7 | XX | XX | XX | XX | XX | XX | 16 | 16 |
| 1 | 7 | XX | XX | XX | XX | XX | 16 | 16 |
| 2 | XX | 7 | XX | XX | XX | XX | 16 | 16 |
| 1 | 2 | 7 | XX | XX | XX | XX | 16 | 16 |
| 3 | XX | XX | 7 | XX | XX | XX | 16 | 16 |
| 1 | 3 | XX | 7 | XX | XX | XX | 16 | 16 |
| 2 | XX | 3 | 7 | XX | XX | XX | 16 | 16 |
| 1 | 2 | 3 | 7 | XX | XX | XX | 16 | 16 |
| 4 | XX | XX | XX | 7 | XX | XX | 16 | 16 |
| 1 | 4 | XX | XX | 7 | XX | XX | 16 | 16 |
| 2 | XX | 4 | XX | 7 | XX | XX | 16 | 16 |
| 1 | 2 | 4 | XX | 7 | XX | XX | 16 | 16 |
| 3 | XX | XX | 4 | 7 | XX | XX | 16 | 16 |
| 1 | 3 | XX | 4 | 7 | XX | XX | 16 | 16 |
| 2 | XX | 3 | 4 | 7 | XX | XX | 16 | 16 |
| 1 | 2 | 3 | 4 | 7 | XX | XX | 16 | 16 |
| 5 | XX | XX | XX | XX | 7 | XX | 16 | 16 |
| 1 | 5 | XX | XX | XX | 7 | XX | 16 | 16 |
| 2 | XX | 5 | XX | XX | 7 | XX | 16 | 16 |
| 1 | 2 | 5 | XX | XX | 7 | XX | 16 | 16 |
| 3 | XX | XX | 5 | XX | 7 | XX | 16 | 16 |
| 1 | 3 | XX | 5 | XX | 7 | XX | 16 | 16 |
| 2 | XX | 3 | 5 | XX | 7 | XX | 16 | 16 |
| 1 | 2 | 3 | 5 | XX | 7 | XX | 16 | 16 |
| 4 | XX | XX | XX | 5 | 7 | XX | 16 | 16 |
| 1 | 4 | XX | XX | 5 | 7 | XX | 16 | 16 |
| 2 | XX | 4 | XX | 5 | 7 | XX | 16 | 16 |
| 1 | 2 | 4 | XX | 5 | 7 | XX | 16 | 16 |
| 3 | XX | XX | 4 | 5 | 7 | XX | 16 | 16 |
| 1 | 3 | XX | 4 | 5 | 7 | XX | 16 | 16 |
| 2 | XX | 3 | 4 | 5 | 7 | XX | 16 | 16 |
| 1 | 2 | 3 | 4 | 5 | 7 | XX | 16 | 16 |
| 6 | XX | XX | XX | XX | XX | 7 | 16 | 16 |
| 1 | 6 | XX | XX | XX | XX | 7 | 16 | 16 |
| 2 | XX | 6 | XX | XX | XX | 7 | 16 | 16 |
| 1 | 2 | 6 | XX | XX | XX | 7 | 16 | 16 |
| 3 | XX | XX | 6 | XX | XX | 7 | 16 | 16 |
| 1 | 3 | XX | 6 | XX | XX | 7 | 16 | 16 |
| 2 | XX | 3 | 6 | XX | XX | 7 | 16 | 16 |
| 1 | 2 | 3 | 6 | XX | XX | 7 | 16 | 16 |
| 4 | XX | XX | XX | 6 | XX | 7 | 16 | 16 |
| 1 | 4 | XX | XX | 6 | XX | 7 | 16 | 16 |
| 2 | XX | 4 | XX | 6 | XX | 7 | 16 | 16 |
| 1 | 2 | 4 | XX | 6 | XX | 7 | 16 | 16 |
| 3 | XX | XX | 4 | 6 | XX | 7 | 16 | 16 |
| 1 | 3 | XX | 4 | 6 | XX | 7 | 16 | 16 |
| 2 | XX | 3 | 4 | 6 | XX | 7 | 16 | 16 |
| 1 | 2 | 3 | 4 | 6 | XX | 7 | 16 | 16 |
| 5 | XX | XX | XX | XX | 6 | 7 | 16 | 16 |
| 1 | 5 | XX | XX | XX | 6 | 7 | 16 | 16 |
| 2 | XX | 5 | XX | XX | 6 | 7 | 16 | 16 |
| 1 | 2 | 5 | XX | XX | 6 | 7 | 16 | 16 |
| 3 | XX | XX | 5 | XX | 6 | 7 | 16 | 16 |
| 1 | 3 | XX | 5 | XX | 6 | 7 | 16 | 16 |
| 2 | XX | 3 | 5 | XX | 6 | 7 | 16 | 16 |
| 1 | 2 | 3 | 5 | XX | 6 | 7 | 16 | 16 |
| 4 | XX | XX | XX | 5 | 6 | 7 | 16 | 16 |
| 1 | 4 | XX | XX | 5 | 6 | 7 | 16 | 16 |
| 2 | XX | 4 | XX | 5 | 6 | 7 | 16 | 16 |
| 1 | 2 | 4 | XX | 5 | 6 | 7 | 16 | 16 |
| 3 | XX | XX | 4 | 5 | 6 | 7 | 16 | 16 |
| 1 | 3 | XX | 4 | 5 | 6 | 7 | 16 | 16 |
| 2 | XX | 3 | 4 | 5 | 6 | 7 | 16 | 16 |
| 1 | 2 | 3 | 4 | 5 | 6 | 7 | 16 | 16 |
| 17 | XX | XX | XX | XX | XX | XX | XX | 17 |
| 1 | 17 | XX | XX | XX | XX | XX | XX | 17 |
| 2 | XX | 17 | XX | XX | XX | XX | XX | 17 |
| 1 | 2 | 17 | XX | XX | XX | XX | XX | 17 |
| 3 | XX | XX | 17 | XX | XX | XX | XX | 17 |
| 1 | 3 | XX | 17 | XX | XX | XX | XX | 17 |
| 2 | XX | 3 | 17 | XX | XX | XX | XX | 17 |
| 1 | 2 | 3 | 17 | XX | XX | XX | XX | 17 |
| 4 | XX | XX | XX | 17 | XX | XX | XX | 17 |
| 1 | 4 | XX | XX | 17 | XX | XX | XX | 17 |
| 2 | XX | 4 | XX | 17 | XX | XX | XX | 17 |
| 1 | 2 | 4 | XX | 17 | XX | XX | XX | 17 |
| 3 | XX | XX | 4 | 17 | XX | XX | XX | 17 |
| 1 | 3 | XX | 4 | 17 | XX | XX | XX | 17 |
| 2 | XX | 3 | 4 | 17 | XX | XX | XX | 17 |
| 1 | 2 | 3 | 4 | 17 | XX | XX | XX | 17 |
| 5 | XX | XX | XX | XX | 17 | XX | XX | 17 |
| 1 | 5 | XX | XX | XX | 17 | XX | XX | 17 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 2  XX 5  XX XX 17 XX XX | 17 | 1  2  5  XX XX 7  XX 17 | 17 | 3  XX XX 5  XX 18 XX XX | 18 |
| 1  2  5  XX XX 17 XX XX | 17 | 3  XX XX 5  XX 7  XX 17 | 17 | 1  3  XX 5  XX 18 XX XX | 18 |
| 3  XX XX 5  XX 17 XX XX | 17 | 1  3  XX 5  XX 7  XX 17 | 17 | 2  XX 3  5  XX 18 XX XX | 18 |
| 1  3  XX 5  XX 17 XX XX | 17 | 2  XX 3  5  XX 7  XX 17 | 17 | 1  2  3  5  XX 18 XX XX | 18 |
| 2  XX 3  5  XX 17 XX XX | 17 | 1  2  3  5  XX 7  XX 17 | 17 | 4  XX XX XX 5  18 XX XX | 18 |
| 1  2  3  5  XX 17 XX XX | 17 | 4  XX XX XX 5  7  XX 17 | 17 | 1  4  XX XX 5  18 XX XX | 18 |
| 4  XX XX XX 5  17 XX XX | 17 | 1  4  XX XX 5  7  XX 17 | 17 | 2  XX 4  XX 5  18 XX XX | 18 |
| 1  4  XX XX 5  17 XX XX | 17 | 2  XX 4  XX 5  7  XX 17 | 17 | 1  2  4  XX 5  18 XX XX | 18 |
| 2  XX 4  XX 5  17 XX XX | 17 | 1  2  4  XX 5  7  XX 17 | 17 | 3  XX XX 4  5  18 XX XX | 18 |
| 1  2  4  XX 5  17 XX XX | 17 | 3  XX XX 4  5  7  XX 17 | 17 | 1  3  XX 4  5  18 XX XX | 18 |
| 3  XX XX 4  5  17 XX XX | 17 | 1  3  XX 4  5  7  XX 17 | 17 | 2  XX 3  4  5  18 XX XX | 18 |
| 1  3  XX 4  5  17 XX XX | 17 | 2  XX 3  4  5  7  XX 17 | 17 | 1  2  3  4  5  18 XX XX | 18 |
| 2  XX 3  4  5  17 XX XX | 17 | 1  2  3  4  5  7  XX 17 | 17 | 6  XX XX XX XX XX 18 XX | 18 |
| 1  2  3  4  5  17 XX XX | 17 | 6  XX XX XX XX XX 7  17 | 17 | 1  6  XX XX XX XX 18 XX | 18 |
| 6  XX XX XX XX 17 XX XX | 17 | 1  6  XX XX XX XX 7  17 | 17 | 2  XX 6  XX XX XX 18 XX | 18 |
| 1  6  XX XX XX 17 XX XX | 17 | 2  XX 6  XX XX XX 7  17 | 17 | 1  2  6  XX XX XX 18 XX | 18 |
| 2  XX 6  XX XX 17 XX XX | 17 | 1  2  6  XX XX XX 7  17 | 17 | 3  XX XX 6  XX XX 18 XX | 18 |
| 1  2  6  XX XX 17 XX XX | 17 | 3  XX XX 6  XX XX 7  17 | 17 | 1  3  XX 6  XX XX 18 XX | 18 |
| 3  XX XX 6  XX 17 XX XX | 17 | 1  3  XX 6  XX XX 7  17 | 17 | 2  XX 3  6  XX XX 18 XX | 18 |
| 1  3  XX 6  XX 17 XX XX | 17 | 2  XX 3  6  XX XX 7  17 | 17 | 1  2  3  6  XX XX 18 XX | 18 |
| 2  XX 3  6  XX 17 XX XX | 17 | 1  2  3  6  XX XX 7  17 | 17 | 4  XX XX XX 6  XX 18 XX | 18 |
| 1  2  3  6  XX 17 XX XX | 17 | 4  XX XX XX 6  XX 7  17 | 17 | 1  4  XX XX 6  XX 18 XX | 18 |
| 4  XX XX XX 6  17 XX XX | 17 | 1  4  XX XX 6  XX 7  17 | 17 | 2  XX 4  XX 6  XX 18 XX | 18 |
| 1  4  XX XX 6  17 XX XX | 17 | 2  XX 4  XX 6  XX 7  17 | 17 | 1  2  4  XX 6  XX 18 XX | 18 |
| 2  XX 4  XX 6  17 XX XX | 17 | 1  2  4  XX 6  XX 7  17 | 17 | 3  XX XX 4  6  XX 18 XX | 18 |
| 1  2  4  XX 6  17 XX XX | 17 | 3  XX XX 4  6  XX 7  17 | 17 | 1  3  XX 4  6  XX 18 XX | 18 |
| 3  XX XX 4  6  17 XX XX | 17 | 1  3  XX 4  6  XX 7  17 | 17 | 2  XX 3  4  6  XX 18 XX | 18 |
| 1  3  XX 4  6  17 XX XX | 17 | 2  XX 3  4  6  XX 7  17 | 17 | 1  2  3  4  6  XX 18 XX | 18 |
| 2  XX 3  4  6  17 XX XX | 17 | 1  2  3  4  6  XX 7  17 | 17 | 5  XX XX XX XX 6  18 XX | 18 |
| 1  2  3  4  6  17 XX XX | 17 | 5  XX XX XX XX 6  7  17 | 17 | 1  5  XX XX XX 6  18 XX | 18 |
| 5  XX XX XX XX 6  17 XX | 17 | 1  5  XX XX XX 6  7  17 | 17 | 2  XX 5  XX XX 6  18 XX | 18 |
| 1  5  XX XX XX 6  17 XX | 17 | 2  XX 5  XX XX 6  7  17 | 17 | 1  2  5  XX XX 6  18 XX | 18 |
| 2  XX 5  XX XX 6  17 XX | 17 | 1  2  5  XX XX 6  7  17 | 17 | 3  XX XX 5  XX 6  18 XX | 18 |
| 1  2  5  XX XX 6  17 XX | 17 | 3  XX XX 5  XX 6  7  17 | 17 | 1  3  XX 5  XX 6  18 XX | 18 |
| 3  XX XX 5  XX 6  17 XX | 17 | 1  3  XX 5  XX 6  7  17 | 17 | 2  XX 3  5  XX 6  18 XX | 18 |
| 1  3  XX 5  XX 6  17 XX | 17 | 2  XX 3  5  XX 6  7  17 | 17 | 1  2  3  5  XX 6  18 XX | 18 |
| 2  XX 3  5  XX 6  17 XX | 17 | 1  2  3  5  XX 6  7  17 | 17 | 4  XX XX XX 5  6  18 XX | 18 |
| 1  2  3  5  XX 6  17 XX | 17 | 4  XX XX XX 5  6  7  17 | 17 | 1  4  XX XX 5  6  18 XX | 18 |
| 4  XX XX XX 5  6  17 XX | 17 | 1  4  XX XX 5  6  7  17 | 17 | 2  XX 4  XX 5  6  18 XX | 18 |
| 1  4  XX XX 5  6  17 XX | 17 | 2  XX 4  XX 5  6  7  17 | 17 | 1  2  4  XX 5  6  18 XX | 18 |
| 2  XX 4  XX 5  6  17 XX | 17 | 1  2  4  XX 5  6  7  17 | 17 | 3  XX XX 4  5  6  18 XX | 18 |
| 1  2  4  XX 5  6  17 XX | 17 | 3  XX XX 4  5  6  7  17 | 17 | 1  3  XX 4  5  6  18 XX | 18 |
| 3  XX XX 4  5  6  17 XX | 17 | 1  3  XX 4  5  6  7  17 | 17 | 2  XX 3  4  5  6  18 XX | 18 |
| 1  3  XX 4  5  6  17 XX | 17 | 2  XX 3  4  5  6  7  17 | 17 | 1  2  3  4  5  6  18 XX | 18 |
| 2  XX 3  4  5  6  17 XX | 17 | 1  2  3  4  5  6  7  17 | 17 | 7  XX XX XX XX XX XX 18 | 18 |
| 1  2  3  4  5  6  17 XX | 17 | 18 XX XX XX XX XX XX XX | 18 | 1  7  XX XX XX XX XX 18 | 18 |
| 7  XX XX XX XX XX XX 17 | 17 | 1  18 XX XX XX XX XX XX | 18 | 2  XX 7  XX XX XX XX 18 | 18 |
| 1  7  XX XX XX XX XX 17 | 17 | 2  XX 18 XX XX XX XX XX | 18 | 1  2  7  XX XX XX XX 18 | 18 |
| 2  XX 7  XX XX XX XX 17 | 17 | 1  2  18 XX XX XX XX XX | 18 | 3  XX XX 7  XX XX XX 18 | 18 |
| 1  2  7  XX XX XX XX 17 | 17 | 3  XX XX 18 XX XX XX XX | 18 | 1  3  XX 7  XX XX XX 18 | 18 |
| 3  XX XX 7  XX XX XX 17 | 17 | 1  3  XX 18 XX XX XX XX | 18 | 2  XX 3  7  XX XX XX 18 | 18 |
| 1  3  XX 7  XX XX XX 17 | 17 | 2  XX 3  18 XX XX XX XX | 18 | 1  2  3  7  XX XX XX 18 | 18 |
| 2  XX 3  7  XX XX XX 17 | 17 | 1  2  3  18 XX XX XX XX | 18 | 4  XX XX XX 7  XX XX 18 | 18 |
| 1  2  3  7  XX XX XX 17 | 17 | 4  XX XX XX 18 XX XX XX | 18 | 1  4  XX XX 7  XX XX 18 | 18 |
| 4  XX XX XX 7  XX XX 17 | 17 | 1  4  XX XX 18 XX XX XX | 18 | 2  XX 4  XX 7  XX XX 18 | 18 |
| 1  4  XX XX 7  XX XX 17 | 17 | 2  XX 4  XX 18 XX XX XX | 18 | 1  2  4  XX 7  XX XX 18 | 18 |
| 2  XX 4  XX 7  XX XX 17 | 17 | 1  2  4  XX 18 XX XX XX | 18 | 3  XX XX 4  7  XX XX 18 | 18 |
| 1  2  4  XX 7  XX XX 17 | 17 | 3  XX XX 4  18 XX XX XX | 18 | 1  3  XX 4  7  XX XX 18 | 18 |
| 3  XX XX 4  7  XX XX 17 | 17 | 1  3  XX 4  18 XX XX XX | 18 | 2  XX 3  4  7  XX XX 18 | 18 |
| 1  3  XX 4  7  XX XX 17 | 17 | 2  XX 3  4  18 XX XX XX | 18 | 1  2  3  4  7  XX XX 18 | 18 |
| 2  XX 3  4  7  XX XX 17 | 17 | 1  2  3  4  18 XX XX XX | 18 | 5  XX XX XX XX 7  XX 18 | 18 |
| 1  2  3  4  7  XX XX 17 | 17 | 5  XX XX XX XX 18 XX XX | 18 | 1  5  XX XX XX 7  XX 18 | 18 |
| 5  XX XX XX XX 7  XX 17 | 17 | 1  5  XX XX XX 18 XX XX | 18 | 2  XX 5  XX XX 7  XX 18 | 18 |
| 1  5  XX XX XX 7  XX 17 | 17 | 2  XX 5  XX XX 18 XX XX | 18 | 1  2  5  XX XX 7  XX 18 | 18 |
| 2  XX 5  XX XX 7  XX 17 | 17 | 1  2  5  XX XX 18 XX XX | 18 | 3  XX XX 5  XX 7  XX 18 | 18 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 1  3  XX 5  XX 7  XX 18 | 18 | 2  XX 3  5  XX 19 XX XX | 19 | 1  2  3  5  XX 7  XX 19 | 19 |
| 2  XX 3  5  XX 7  XX 18 | 18 | 1  2  3  5  XX 19 XX XX | 19 | 4  XX XX XX 5  7  XX 19 | 19 |
| 1  2  3  5  XX 7  XX 18 | 18 | 4  XX XX XX 5  19 XX XX | 19 | 1  4  XX XX 5  7  XX 19 | 19 |
| 4  XX XX XX 5  7  XX 18 | 18 | 1  4  XX XX 5  19 XX XX | 19 | 2  XX 4  XX 5  7  XX 19 | 19 |
| 1  4  XX XX 5  7  XX 18 | 18 | 2  XX 4  XX 5  19 XX XX | 19 | 1  2  4  XX 5  7  XX 19 | 19 |
| 2  XX 4  XX 5  7  XX 18 | 18 | 1  2  4  XX 5  19 XX XX | 19 | 3  XX XX 4  5  7  XX 19 | 19 |
| 1  2  4  XX 5  7  XX 18 | 18 | 3  XX XX 4  5  19 XX XX | 19 | 1  3  XX 4  5  7  XX 19 | 19 |
| 3  XX XX 4  5  7  XX 18 | 18 | 1  3  XX 4  5  19 XX XX | 19 | 2  XX 3  4  5  7  XX 19 | 19 |
| 1  3  XX 4  5  7  XX 18 | 18 | 2  XX 3  4  5  19 XX XX | 19 | 1  2  3  4  5  7  XX 19 | 19 |
| 2  XX 3  4  5  7  XX 18 | 18 | 1  2  3  4  5  19 XX XX | 19 | 6  XX XX XX XX XX 7  19 | 19 |
| 1  2  3  4  5  7  XX 18 | 18 | 6  XX XX XX XX XX 19 XX | 19 | 1  6  XX XX XX XX 7  19 | 19 |
| 6  XX XX XX XX XX 7  18 | 18 | 1  6  XX XX XX XX 19 XX | 19 | 2  XX 6  XX XX XX 7  19 | 19 |
| 1  6  XX XX XX XX 7  18 | 18 | 2  XX 6  XX XX XX 19 XX | 19 | 1  2  6  XX XX XX 7  19 | 19 |
| 2  XX 6  XX XX XX 7  18 | 18 | 1  2  6  XX XX XX 19 XX | 19 | 3  XX XX 6  XX XX 7  19 | 19 |
| 1  2  6  XX XX XX 7  18 | 18 | 3  XX XX 6  XX XX 19 XX | 19 | 1  3  XX 6  XX XX 7  19 | 19 |
| 3  XX XX 6  XX XX 7  18 | 18 | 1  3  XX 6  XX XX 19 XX | 19 | 2  XX 3  6  XX XX 7  19 | 19 |
| 1  3  XX 6  XX XX 7  18 | 18 | 2  XX 3  6  XX XX 19 XX | 19 | 1  2  3  6  XX XX 7  19 | 19 |
| 2  XX 3  6  XX XX 7  18 | 18 | 1  2  3  6  XX XX 19 XX | 19 | 4  XX XX XX 6  XX 7  19 | 19 |
| 1  2  3  6  XX XX 7  18 | 18 | 4  XX XX XX 6  XX 19 XX | 19 | 1  4  XX XX 6  XX 7  19 | 19 |
| 4  XX XX XX 6  XX 7  18 | 18 | 1  4  XX XX 6  XX 19 XX | 19 | 2  XX 4  XX 6  XX 7  19 | 19 |
| 1  4  XX XX 6  XX 7  18 | 18 | 2  XX 4  XX 6  XX 19 XX | 19 | 1  2  4  XX 6  XX 7  19 | 19 |
| 2  XX 4  XX 6  XX 7  18 | 18 | 1  2  4  XX 6  XX 19 XX | 19 | 3  XX XX 4  6  XX 7  19 | 19 |
| 1  2  4  XX 6  XX 7  18 | 18 | 3  XX XX 4  6  XX 19 XX | 19 | 1  3  XX 4  6  XX 7  19 | 19 |
| 3  XX XX 4  6  XX 7  18 | 18 | 1  3  XX 4  6  XX 19 XX | 19 | 2  XX 3  4  6  XX 7  19 | 19 |
| 1  3  XX 4  6  XX 7  18 | 18 | 2  XX 3  4  6  XX 19 XX | 19 | 1  2  3  4  6  XX 7  19 | 19 |
| 2  XX 3  4  6  XX 7  18 | 18 | 1  2  3  4  6  XX 19 XX | 19 | 5  XX XX XX XX 6  7  19 | 19 |
| 1  2  3  4  6  XX 7  18 | 18 | 5  XX XX XX XX 6  19 XX | 19 | 1  5  XX XX XX 6  7  19 | 19 |
| 5  XX XX XX XX 6  7  18 | 18 | 1  5  XX XX XX 6  19 XX | 19 | 2  XX 5  XX XX 6  7  19 | 19 |
| 1  5  XX XX XX 6  7  18 | 18 | 2  XX 5  XX XX 6  19 XX | 19 | 1  2  5  XX XX 6  7  19 | 19 |
| 2  XX 5  XX XX 6  7  18 | 18 | 1  2  5  XX XX 6  19 XX | 19 | 3  XX XX 5  XX 6  7  19 | 19 |
| 1  2  5  XX XX 6  7  18 | 18 | 3  XX XX 5  XX 6  19 XX | 19 | 1  3  XX 5  XX 6  7  19 | 19 |
| 3  XX XX 5  XX 6  7  18 | 18 | 1  3  XX 5  XX 6  19 XX | 19 | 2  XX 3  5  XX 6  7  19 | 19 |
| 1  3  XX 5  XX 6  7  18 | 18 | 2  XX 3  5  XX 6  19 XX | 19 | 1  2  3  5  XX 6  7  19 | 19 |
| 2  XX 3  5  XX 6  7  18 | 18 | 1  2  3  5  XX 6  19 XX | 19 | 4  XX XX XX 5  6  7  19 | 19 |
| 1  2  3  5  XX 6  7  18 | 18 | 4  XX XX XX 5  6  19 XX | 19 | 1  4  XX XX 5  6  7  19 | 19 |
| 4  XX XX XX 5  6  7  18 | 18 | 1  4  XX XX 5  6  19 XX | 19 | 2  XX 4  XX 5  6  7  19 | 19 |
| 1  4  XX XX 5  6  7  18 | 18 | 2  XX 4  XX 5  6  19 XX | 19 | 1  2  4  XX 5  6  7  19 | 19 |
| 2  XX 4  XX 5  6  7  18 | 18 | 1  2  4  XX 5  6  19 XX | 19 | 3  XX XX 4  5  6  7  19 | 19 |
| 1  2  4  XX 5  6  7  18 | 18 | 3  XX XX 4  5  6  19 XX | 19 | 1  3  XX 4  5  6  7  19 | 19 |
| 3  XX XX 4  5  6  7  18 | 18 | 1  3  XX 4  5  6  19 XX | 19 | 2  XX 3  4  5  6  7  19 | 19 |
| 1  3  XX 4  5  6  7  18 | 18 | 2  XX 3  4  5  6  19 XX | 19 | 1  2  3  4  5  6  7  19 | 19 |
| 2  XX 3  4  5  6  7  18 | 18 | 1  2  3  4  5  6  19 XX | 19 | 20 XX XX XX XX XX XX XX | 20 |
| 1  2  3  4  5  6  7  18 | 18 | 7  XX XX XX XX XX XX 19 | 19 | 1  20 XX XX XX XX XX XX | 20 |
| 19 XX XX XX XX XX XX XX | 19 | 1  7  XX XX XX XX XX 19 | 19 | 2  XX 20 XX XX XX XX XX | 20 |
| 1  19 XX XX XX XX XX XX | 19 | 2  XX 7  XX XX XX XX 19 | 19 | 1  2  20 XX XX XX XX XX | 20 |
| 2  XX 19 XX XX XX XX XX | 19 | 1  2  7  XX XX XX XX 19 | 19 | 3  XX XX 20 XX XX XX XX | 20 |
| 1  2  19 XX XX XX XX XX | 19 | 3  XX XX 7  XX XX XX 19 | 19 | 1  3  XX 20 XX XX XX XX | 20 |
| 3  XX XX 19 XX XX XX XX | 19 | 1  3  XX 7  XX XX XX 19 | 19 | 2  XX 3  20 XX XX XX XX | 20 |
| 1  3  XX 19 XX XX XX XX | 19 | 2  XX 3  7  XX XX XX 19 | 19 | 1  2  3  20 XX XX XX XX | 20 |
| 2  XX 3  19 XX XX XX XX | 19 | 1  2  3  7  XX XX XX 19 | 19 | 4  XX XX XX 20 XX XX XX | 20 |
| 1  2  3  19 XX XX XX XX | 19 | 4  XX XX XX 7  XX XX 19 | 19 | 1  4  XX XX 20 XX XX XX | 20 |
| 4  XX XX XX 19 XX XX XX | 19 | 1  4  XX XX 7  XX XX 19 | 19 | 2  XX 4  XX 20 XX XX XX | 20 |
| 1  4  XX XX 19 XX XX XX | 19 | 2  XX 4  XX 7  XX XX 19 | 19 | 1  2  4  XX 20 XX XX XX | 20 |
| 2  XX 4  XX 19 XX XX XX | 19 | 1  2  4  XX 7  XX XX 19 | 19 | 3  XX XX 4  20 XX XX XX | 20 |
| 1  2  4  XX 19 XX XX XX | 19 | 3  XX XX 4  7  XX XX 19 | 19 | 1  3  XX 4  20 XX XX XX | 20 |
| 3  XX XX 4  19 XX XX XX | 19 | 1  3  XX 4  7  XX XX 19 | 19 | 2  XX 3  4  20 XX XX XX | 20 |
| 1  3  XX 4  19 XX XX XX | 19 | 2  XX 3  4  7  XX XX 19 | 19 | 1  2  3  4  20 XX XX XX | 20 |
| 2  XX 3  4  19 XX XX XX | 19 | 1  2  3  4  7  XX XX 19 | 19 | 5  XX XX XX XX 20 XX XX | 20 |
| 1  2  3  4  19 XX XX XX | 19 | 5  XX XX XX XX 7  XX 19 | 19 | 1  5  XX XX XX 20 XX XX | 20 |
| 5  XX XX XX XX 19 XX XX | 19 | 1  5  XX XX XX 7  XX 19 | 19 | 2  XX 5  XX XX 20 XX XX | 20 |
| 1  5  XX XX XX 19 XX XX | 19 | 2  XX 5  XX XX 7  XX 19 | 19 | 1  2  5  XX XX 20 XX XX | 20 |
| 2  XX 5  XX XX 19 XX XX | 19 | 1  2  5  XX XX 7  XX 19 | 19 | 3  XX XX 5  XX 20 XX XX | 20 |
| 1  2  5  XX XX 19 XX XX | 19 | 3  XX XX 5  XX 7  XX 19 | 19 | 1  3  XX 5  XX 20 XX XX | 20 |
| 3  XX XX 5  XX 19 XX XX | 19 | 1  3  XX 5  XX 7  XX 19 | 19 | 2  XX 3  5  XX 20 XX XX | 20 |
| 1  3  XX 5  XX 19 XX XX | 19 | 2  XX 3  5  XX 7  XX 19 | 19 | 1  2  3  5  XX 20 XX XX | 20 |

| Inputs (from stagger position) | | | | | | | | Output | Inputs (from stagger position) | | | | | | | | Output | Inputs (from stagger position) | | | | | | | | Output |
|---|---|---|---|---|---|---|---|---|---|---|---|---|---|---|---|---|---|---|---|---|---|---|---|---|---|
| 0 | 1 | 2 | 3 | 4 | 5 | 6 | 7 | | 0 | 1 | 2 | 3 | 4 | 5 | 6 | 7 | | 0 | 1 | 2 | 3 | 4 | 5 | 6 | 7 | |
| 4 | XX | XX | XX | 5 | 20 | XX | XX | 20 | 1 | 4 | XX | XX | 5 | 7 | XX | 20 | 20 | 2 | XX | 4 | XX | 5 | 21 | XX | XX | 21 |
| 1 | 4 | XX | XX | 5 | 20 | XX | XX | 20 | 2 | XX | 4 | XX | 5 | 7 | XX | 20 | 20 | 1 | 2 | 4 | XX | 5 | 21 | XX | XX | 21 |
| 2 | XX | 4 | XX | 5 | 20 | XX | XX | 20 | 1 | 2 | 4 | XX | 5 | 7 | XX | 20 | 20 | 3 | XX | XX | 4 | 5 | 21 | XX | XX | 21 |
| 1 | 2 | 4 | XX | 5 | 20 | XX | XX | 20 | 3 | XX | XX | 4 | 5 | 7 | XX | 20 | 20 | 1 | 3 | XX | 4 | 5 | 21 | XX | XX | 21 |
| 3 | XX | XX | 4 | 5 | 20 | XX | XX | 20 | 1 | 3 | XX | 4 | 5 | 7 | XX | 20 | 20 | 2 | XX | 3 | 4 | 5 | 21 | XX | XX | 21 |
| 1 | 3 | XX | 4 | 5 | 20 | XX | XX | 20 | 2 | XX | 3 | 4 | 5 | 7 | XX | 20 | 20 | 1 | 2 | 3 | 4 | 5 | 21 | XX | XX | 21 |
| 2 | XX | 3 | 4 | 5 | 20 | XX | XX | 20 | 1 | 2 | 3 | 4 | 5 | 7 | XX | 20 | 20 | 6 | XX | XX | XX | XX | XX | 21 | XX | 21 |
| 1 | 2 | 3 | 4 | 5 | 20 | XX | XX | 20 | 6 | XX | XX | XX | XX | XX | 7 | 20 | 20 | 1 | 6 | XX | XX | XX | XX | 21 | XX | 21 |
| 6 | XX | XX | XX | XX | XX | 20 | XX | 20 | 1 | 6 | XX | XX | XX | XX | 7 | 20 | 20 | 2 | XX | 6 | XX | XX | XX | 21 | XX | 21 |
| 1 | 6 | XX | XX | XX | XX | 20 | XX | 20 | 2 | XX | 6 | XX | XX | XX | 7 | 20 | 20 | 1 | 2 | 6 | XX | XX | XX | 21 | XX | 21 |
| 2 | XX | 6 | XX | XX | XX | 20 | XX | 20 | 1 | 2 | 6 | XX | XX | XX | 7 | 20 | 20 | 3 | XX | XX | 6 | XX | XX | 21 | XX | 21 |
| 1 | 2 | 6 | XX | XX | XX | 20 | XX | 20 | 3 | XX | XX | 6 | XX | XX | 7 | 20 | 20 | 1 | 3 | XX | 6 | XX | XX | 21 | XX | 21 |
| 3 | XX | XX | 6 | XX | XX | 20 | XX | 20 | 1 | 3 | XX | 6 | XX | XX | 7 | 20 | 20 | 2 | XX | 3 | 6 | XX | XX | 21 | XX | 21 |
| 1 | 3 | XX | 6 | XX | XX | 20 | XX | 20 | 2 | XX | 3 | 6 | XX | XX | 7 | 20 | 20 | 1 | 2 | 3 | 6 | XX | XX | 21 | XX | 21 |
| 2 | XX | 3 | 6 | XX | XX | 20 | XX | 20 | 1 | 2 | 3 | 6 | XX | XX | 7 | 20 | 20 | 4 | XX | XX | XX | 6 | XX | 21 | XX | 21 |
| 1 | 2 | 3 | 6 | XX | XX | 20 | XX | 20 | 4 | XX | XX | XX | 6 | XX | 7 | 20 | 20 | 1 | 4 | XX | XX | 6 | XX | 21 | XX | 21 |
| 4 | XX | XX | XX | 6 | XX | 20 | XX | 20 | 1 | 4 | XX | XX | 6 | XX | 7 | 20 | 20 | 2 | XX | 4 | XX | 6 | XX | 21 | XX | 21 |
| 1 | 4 | XX | XX | 6 | XX | 20 | XX | 20 | 2 | XX | 4 | XX | 6 | XX | 7 | 20 | 20 | 1 | 2 | 4 | XX | 6 | XX | 21 | XX | 21 |
| 2 | XX | 4 | XX | 6 | XX | 20 | XX | 20 | 1 | 2 | 4 | XX | 6 | XX | 7 | 20 | 20 | 3 | XX | XX | 4 | 6 | XX | 21 | XX | 21 |
| 1 | 2 | 4 | XX | 6 | XX | 20 | XX | 20 | 3 | XX | XX | 4 | 6 | XX | 7 | 20 | 20 | 1 | 3 | XX | 4 | 6 | XX | 21 | XX | 21 |
| 3 | XX | XX | 4 | 6 | XX | 20 | XX | 20 | 1 | 3 | XX | 4 | 6 | XX | 7 | 20 | 20 | 2 | XX | 3 | 4 | 6 | XX | 21 | XX | 21 |
| 1 | 3 | XX | 4 | 6 | XX | 20 | XX | 20 | 2 | XX | 3 | 4 | 6 | XX | 7 | 20 | 20 | 1 | 2 | 3 | 4 | 6 | XX | 21 | XX | 21 |
| 2 | XX | 3 | 4 | 6 | XX | 20 | XX | 20 | 1 | 2 | 3 | 4 | 6 | XX | 7 | 20 | 20 | 5 | XX | XX | XX | XX | 6 | 21 | XX | 21 |
| 1 | 2 | 3 | 4 | 6 | XX | 20 | XX | 20 | 5 | XX | XX | XX | XX | 6 | 7 | 20 | 20 | 1 | 5 | XX | XX | XX | 6 | 21 | XX | 21 |
| 5 | XX | XX | XX | XX | 6 | 20 | XX | 20 | 1 | 5 | XX | XX | XX | 6 | 7 | 20 | 20 | 2 | XX | 5 | XX | XX | 6 | 21 | XX | 21 |
| 1 | 5 | XX | XX | XX | 6 | 20 | XX | 20 | 2 | XX | 5 | XX | XX | 6 | 7 | 20 | 20 | 1 | 2 | 5 | XX | XX | 6 | 21 | XX | 21 |
| 2 | XX | 5 | XX | XX | 6 | 20 | XX | 20 | 1 | 2 | 5 | XX | XX | 6 | 7 | 20 | 20 | 3 | XX | XX | 5 | XX | 6 | 21 | XX | 21 |
| 1 | 2 | 5 | XX | XX | 6 | 20 | XX | 20 | 3 | XX | XX | 5 | XX | 6 | 7 | 20 | 20 | 1 | 3 | XX | 5 | XX | 6 | 21 | XX | 21 |
| 3 | XX | XX | 5 | XX | 6 | 20 | XX | 20 | 1 | 3 | XX | 5 | XX | 6 | 7 | 20 | 20 | 2 | XX | 3 | 5 | XX | 6 | 21 | XX | 21 |
| 1 | 3 | XX | 5 | XX | 6 | 20 | XX | 20 | 2 | XX | 3 | 5 | XX | 6 | 7 | 20 | 20 | 1 | 2 | 3 | 5 | XX | 6 | 21 | XX | 21 |
| 2 | XX | 3 | 5 | XX | 6 | 20 | XX | 20 | 1 | 2 | 3 | 5 | XX | 6 | 7 | 20 | 20 | 4 | XX | XX | XX | 5 | 6 | 21 | XX | 21 |
| 1 | 2 | 3 | 5 | XX | 6 | 20 | XX | 20 | 4 | XX | XX | XX | 5 | 6 | 7 | 20 | 20 | 1 | 4 | XX | XX | 5 | 6 | 21 | XX | 21 |
| 4 | XX | XX | XX | 5 | 6 | 20 | XX | 20 | 1 | 4 | XX | XX | 5 | 6 | 7 | 20 | 20 | 2 | XX | 4 | XX | 5 | 6 | 21 | XX | 21 |
| 1 | 4 | XX | XX | 5 | 6 | 20 | XX | 20 | 2 | XX | 4 | XX | 5 | 6 | 7 | 20 | 20 | 1 | 2 | 4 | XX | 5 | 6 | 21 | XX | 21 |
| 2 | XX | 4 | XX | 5 | 6 | 20 | XX | 20 | 1 | 2 | 4 | XX | 5 | 6 | 7 | 20 | 20 | 3 | XX | XX | 4 | 5 | 6 | 21 | XX | 21 |
| 1 | 2 | 4 | XX | 5 | 6 | 20 | XX | 20 | 3 | XX | XX | 4 | 5 | 6 | 7 | 20 | 20 | 1 | 3 | XX | 4 | 5 | 6 | 21 | XX | 21 |
| 3 | XX | XX | 4 | 5 | 6 | 20 | XX | 20 | 1 | 3 | XX | 4 | 5 | 6 | 7 | 20 | 20 | 2 | XX | 3 | 4 | 5 | 6 | 21 | XX | 21 |
| 1 | 3 | XX | 4 | 5 | 6 | 20 | XX | 20 | 2 | XX | 3 | 4 | 5 | 6 | 7 | 20 | 20 | 1 | 2 | 3 | 4 | 5 | 6 | 21 | XX | 21 |
| 2 | XX | 3 | 4 | 5 | 6 | 20 | XX | 20 | 1 | 2 | 3 | 4 | 5 | 6 | 7 | 20 | 20 | 7 | XX | XX | XX | XX | XX | XX | 21 | 21 |
| 1 | 2 | 3 | 4 | 5 | 6 | 20 | XX | 20 | 21 | XX | XX | XX | XX | XX | XX | XX | 21 | 1 | 7 | XX | XX | XX | XX | XX | 21 | 21 |
| 7 | XX | XX | XX | XX | XX | XX | 20 | 20 | 1 | 21 | XX | XX | XX | XX | XX | XX | 21 | 2 | XX | 7 | XX | XX | XX | XX | 21 | 21 |
| 1 | 7 | XX | XX | XX | XX | XX | 20 | 20 | 2 | XX | 21 | XX | XX | XX | XX | XX | 21 | 1 | 2 | 7 | XX | XX | XX | XX | 21 | 21 |
| 2 | XX | 7 | XX | XX | XX | XX | 20 | 20 | 1 | 2 | 21 | XX | XX | XX | XX | XX | 21 | 3 | XX | XX | 7 | XX | XX | XX | 21 | 21 |
| 1 | 2 | 7 | XX | XX | XX | XX | 20 | 20 | 3 | XX | XX | 21 | XX | XX | XX | XX | 21 | 1 | 3 | XX | 7 | XX | XX | XX | 21 | 21 |
| 3 | XX | XX | 7 | XX | XX | XX | 20 | 20 | 1 | 3 | XX | 21 | XX | XX | XX | XX | 21 | 2 | XX | 3 | 7 | XX | XX | XX | 21 | 21 |
| 1 | 3 | XX | 7 | XX | XX | XX | 20 | 20 | 2 | XX | 3 | 21 | XX | XX | XX | XX | 21 | 1 | 2 | 3 | 7 | XX | XX | XX | 21 | 21 |
| 2 | XX | 3 | 7 | XX | XX | XX | 20 | 20 | 1 | 2 | 3 | 21 | XX | XX | XX | XX | 21 | 4 | XX | XX | XX | 7 | XX | XX | 21 | 21 |
| 1 | 2 | 3 | 7 | XX | XX | XX | 20 | 20 | 4 | XX | XX | XX | 21 | XX | XX | XX | 21 | 1 | 4 | XX | XX | 7 | XX | XX | 21 | 21 |
| 4 | XX | XX | XX | 7 | XX | XX | 20 | 20 | 1 | 4 | XX | XX | 21 | XX | XX | XX | 21 | 2 | XX | 4 | XX | 7 | XX | XX | 21 | 21 |
| 1 | 4 | XX | XX | 7 | XX | XX | 20 | 20 | 2 | XX | 4 | XX | 21 | XX | XX | XX | 21 | 1 | 2 | 4 | XX | 7 | XX | XX | 21 | 21 |
| 2 | XX | 4 | XX | 7 | XX | XX | 20 | 20 | 1 | 2 | 4 | XX | 21 | XX | XX | XX | 21 | 3 | XX | XX | 4 | 7 | XX | XX | 21 | 21 |
| 1 | 2 | 4 | XX | 7 | XX | XX | 20 | 20 | 3 | XX | XX | 4 | 21 | XX | XX | XX | 21 | 1 | 3 | XX | 4 | 7 | XX | XX | 21 | 21 |
| 3 | XX | XX | 4 | 7 | XX | XX | 20 | 20 | 1 | 3 | XX | 4 | 21 | XX | XX | XX | 21 | 2 | XX | 3 | 4 | 7 | XX | XX | 21 | 21 |
| 1 | 3 | XX | 4 | 7 | XX | XX | 20 | 20 | 2 | XX | 3 | 4 | 21 | XX | XX | XX | 21 | 1 | 2 | 3 | 4 | 7 | XX | XX | 21 | 21 |
| 2 | XX | 3 | 4 | 7 | XX | XX | 20 | 20 | 1 | 2 | 3 | 4 | 21 | XX | XX | XX | 21 | 5 | XX | XX | XX | XX | 7 | XX | 21 | 21 |
| 1 | 2 | 3 | 4 | 7 | XX | XX | 20 | 20 | 5 | XX | XX | XX | XX | 21 | XX | XX | 21 | 1 | 5 | XX | XX | XX | 7 | XX | 21 | 21 |
| 5 | XX | XX | XX | XX | 7 | XX | 20 | 20 | 1 | 5 | XX | XX | XX | 21 | XX | XX | 21 | 2 | XX | 5 | XX | XX | 7 | XX | 21 | 21 |
| 1 | 5 | XX | XX | XX | 7 | XX | 20 | 20 | 2 | XX | 5 | XX | XX | 21 | XX | XX | 21 | 1 | 2 | 5 | XX | XX | 7 | XX | 21 | 21 |
| 2 | XX | 5 | XX | XX | 7 | XX | 20 | 20 | 1 | 2 | 5 | XX | XX | 21 | XX | XX | 21 | 3 | XX | XX | 5 | XX | 7 | XX | 21 | 21 |
| 1 | 2 | 5 | XX | XX | 7 | XX | 20 | 20 | 3 | XX | XX | 5 | XX | 21 | XX | XX | 21 | 1 | 3 | XX | 5 | XX | 7 | XX | 21 | 21 |
| 3 | XX | XX | 5 | XX | 7 | XX | 20 | 20 | 1 | 3 | XX | 5 | XX | 21 | XX | XX | 21 | 2 | XX | 3 | 5 | XX | 7 | XX | 21 | 21 |
| 1 | 3 | XX | 5 | XX | 7 | XX | 20 | 20 | 2 | XX | 3 | 5 | XX | 21 | XX | XX | 21 | 1 | 2 | 3 | 5 | XX | 7 | XX | 21 | 21 |
| 2 | XX | 3 | 5 | XX | 7 | XX | 20 | 20 | 1 | 2 | 3 | 5 | XX | 21 | XX | XX | 21 | 4 | XX | XX | XX | 5 | 7 | XX | 21 | 21 |
| 1 | 2 | 3 | 5 | XX | 7 | XX | 20 | 20 | 4 | XX | XX | XX | 5 | 21 | XX | XX | 21 | 1 | 4 | XX | XX | 5 | 7 | XX | 21 | 21 |
| 4 | XX | XX | XX | 5 | 7 | XX | 20 | 20 | 1 | 4 | XX | XX | 5 | 21 | XX | XX | 21 | 2 | XX | 4 | XX | 5 | 7 | XX | 21 | 21 |

| Inputs (from stagger position) | | | | | | | | Output |
|---|---|---|---|---|---|---|---|---|
| 0 | 1 | 2 | 3 | 4 | 5 | 6 | 7 | |
| 1 | 2 | 4 | XX | 5 | 7 | XX | 21 | 21 |
| 3 | XX | XX | 4 | 5 | 7 | XX | 21 | 21 |
| 1 | 3 | XX | 4 | 5 | 7 | XX | 21 | 21 |
| 2 | XX | 3 | 4 | 5 | 7 | XX | 21 | 21 |
| 1 | 2 | 3 | 4 | 5 | 7 | XX | 21 | 21 |
| 6 | XX | XX | XX | XX | XX | 7 | 21 | 21 |
| 1 | 6 | XX | XX | XX | XX | 7 | 21 | 21 |
| 2 | XX | 6 | XX | XX | XX | 7 | 21 | 21 |
| 1 | 2 | 6 | XX | XX | XX | 7 | 21 | 21 |
| 3 | XX | XX | 6 | XX | XX | 7 | 21 | 21 |
| 1 | 3 | XX | 6 | XX | XX | 7 | 21 | 21 |
| 2 | XX | 3 | 6 | XX | XX | 7 | 21 | 21 |
| 1 | 2 | 3 | 6 | XX | XX | 7 | 21 | 21 |
| 4 | XX | XX | XX | 6 | XX | 7 | 21 | 21 |
| 1 | 4 | XX | XX | 6 | XX | 7 | 21 | 21 |
| 2 | XX | 4 | XX | 6 | XX | 7 | 21 | 21 |
| 1 | 2 | 4 | XX | 6 | XX | 7 | 21 | 21 |
| 3 | XX | XX | 4 | 6 | XX | 7 | 21 | 21 |
| 1 | 3 | XX | 4 | 6 | XX | 7 | 21 | 21 |
| 2 | XX | 3 | 4 | 6 | XX | 7 | 21 | 21 |
| 1 | 2 | 3 | 4 | 6 | XX | 7 | 21 | 21 |
| 5 | XX | XX | XX | XX | 6 | 7 | 21 | 21 |
| 1 | 5 | XX | XX | XX | 6 | 7 | 21 | 21 |
| 2 | XX | 5 | XX | XX | 6 | 7 | 21 | 21 |
| 1 | 2 | 5 | XX | XX | 6 | 7 | 21 | 21 |
| 3 | XX | XX | 5 | XX | 6 | 7 | 21 | 21 |
| 1 | 3 | XX | 5 | XX | 6 | 7 | 21 | 21 |
| 2 | XX | 3 | 5 | XX | 6 | 7 | 21 | 21 |
| 1 | 2 | 3 | 5 | XX | 6 | 7 | 21 | 21 |
| 4 | XX | XX | XX | 5 | 6 | 7 | 21 | 21 |
| 1 | 4 | XX | XX | 5 | 6 | 7 | 21 | 21 |
| 2 | XX | 4 | XX | 5 | 6 | 7 | 21 | 21 |
| 1 | 2 | 4 | XX | 5 | 6 | 7 | 21 | 21 |
| 3 | XX | XX | 4 | 5 | 6 | 7 | 21 | 21 |
| 1 | 3 | XX | 4 | 5 | 6 | 7 | 21 | 21 |
| 2 | XX | 3 | 4 | 5 | 6 | 7 | 21 | 21 |
| 1 | 2 | 3 | 4 | 5 | 6 | 7 | 21 | 21 |
| 22 | XX | XX | XX | XX | XX | XX | XX | 22 |
| 1 | 22 | XX | XX | XX | XX | XX | XX | 22 |
| 2 | XX | 22 | XX | XX | XX | XX | XX | 22 |
| 1 | 2 | 22 | XX | XX | XX | XX | XX | 22 |
| 3 | XX | XX | 22 | XX | XX | XX | XX | 22 |
| 1 | 3 | XX | 22 | XX | XX | XX | XX | 22 |
| 2 | XX | 3 | 22 | XX | XX | XX | XX | 22 |
| 1 | 2 | 3 | 22 | XX | XX | XX | XX | 22 |
| 4 | XX | XX | XX | 22 | XX | XX | XX | 22 |
| 1 | 4 | XX | XX | 22 | XX | XX | XX | 22 |
| 2 | XX | 4 | XX | 22 | XX | XX | XX | 22 |
| 1 | 2 | 4 | XX | 22 | XX | XX | XX | 22 |
| 3 | XX | XX | 4 | 22 | XX | XX | XX | 22 |
| 1 | 3 | XX | 4 | 22 | XX | XX | XX | 22 |
| 2 | XX | 3 | 4 | 22 | XX | XX | XX | 22 |
| 1 | 2 | 3 | 4 | 22 | XX | XX | XX | 22 |
| 5 | XX | XX | XX | XX | 22 | XX | XX | 22 |
| 1 | 5 | XX | XX | XX | 22 | XX | XX | 22 |
| 2 | XX | 5 | XX | XX | 22 | XX | XX | 22 |
| 1 | 2 | 5 | XX | XX | 22 | XX | XX | 22 |
| 3 | XX | XX | 5 | XX | 22 | XX | XX | 22 |
| 1 | 3 | XX | 5 | XX | 22 | XX | XX | 22 |
| 2 | XX | 3 | 5 | XX | 22 | XX | XX | 22 |
| 1 | 2 | 3 | 5 | XX | 22 | XX | XX | 22 |
| 4 | XX | XX | XX | 5 | 22 | XX | XX | 22 |
| 1 | 4 | XX | XX | 5 | 22 | XX | XX | 22 |
| 2 | XX | 4 | XX | 5 | 22 | XX | XX | 22 |
| 1 | 2 | 4 | XX | 5 | 22 | XX | XX | 22 |
| 3 | XX | XX | 4 | 5 | 22 | XX | XX | 22 |
| 1 | 3 | XX | 4 | 5 | 22 | XX | XX | 22 |
| 2 | XX | 3 | 4 | 5 | 22 | XX | XX | 22 |
| 1 | 2 | 3 | 4 | 5 | 22 | XX | XX | 22 |
| 6 | XX | XX | XX | XX | XX | 22 | XX | 22 |
| 1 | 6 | XX | XX | XX | XX | 22 | XX | 22 |
| 2 | XX | 6 | XX | XX | XX | 22 | XX | 22 |
| 1 | 2 | 6 | XX | XX | XX | 22 | XX | 22 |
| 3 | XX | XX | 6 | XX | XX | 22 | XX | 22 |
| 1 | 3 | XX | 6 | XX | XX | 22 | XX | 22 |
| 2 | XX | 3 | 6 | XX | XX | 22 | XX | 22 |
| 1 | 2 | 3 | 6 | XX | XX | 22 | XX | 22 |
| 4 | XX | XX | XX | 6 | XX | 22 | XX | 22 |
| 1 | 4 | XX | XX | 6 | XX | 22 | XX | 22 |
| 2 | XX | 4 | XX | 6 | XX | 22 | XX | 22 |
| 1 | 2 | 4 | XX | 6 | XX | 22 | XX | 22 |
| 3 | XX | XX | 4 | 6 | XX | 22 | XX | 22 |
| 1 | 3 | XX | 4 | 6 | XX | 22 | XX | 22 |
| 2 | XX | 3 | 4 | 6 | XX | 22 | XX | 22 |
| 1 | 2 | 3 | 4 | 6 | XX | 22 | XX | 22 |
| 5 | XX | XX | XX | XX | 6 | 22 | XX | 22 |
| 1 | 5 | XX | XX | XX | 6 | 22 | XX | 22 |
| 2 | XX | 5 | XX | XX | 6 | 22 | XX | 22 |
| 1 | 2 | 5 | XX | XX | 6 | 22 | XX | 22 |
| 3 | XX | XX | 5 | XX | 6 | 22 | XX | 22 |
| 1 | 3 | XX | 5 | XX | 6 | 22 | XX | 22 |
| 2 | XX | 3 | 5 | XX | 6 | 22 | XX | 22 |
| 1 | 2 | 3 | 5 | XX | 6 | 22 | XX | 22 |
| 4 | XX | XX | XX | 5 | 6 | 22 | XX | 22 |
| 1 | 4 | XX | XX | 5 | 6 | 22 | XX | 22 |
| 2 | XX | 4 | XX | 5 | 6 | 22 | XX | 22 |
| 1 | 2 | 4 | XX | 5 | 6 | 22 | XX | 22 |
| 3 | XX | XX | 4 | 5 | 6 | 22 | XX | 22 |
| 1 | 3 | XX | 4 | 5 | 6 | 22 | XX | 22 |
| 2 | XX | 3 | 4 | 5 | 6 | 22 | XX | 22 |
| 1 | 2 | 3 | 4 | 5 | 6 | 22 | XX | 22 |
| 7 | XX | XX | XX | XX | XX | XX | 22 | 22 |
| 1 | 7 | XX | XX | XX | XX | XX | 22 | 22 |
| 2 | XX | 7 | XX | XX | XX | XX | 22 | 22 |
| 1 | 2 | 7 | XX | XX | XX | XX | 22 | 22 |
| 3 | XX | XX | 7 | XX | XX | XX | 22 | 22 |
| 1 | 3 | XX | 7 | XX | XX | XX | 22 | 22 |
| 2 | XX | 3 | 7 | XX | XX | XX | 22 | 22 |
| 1 | 2 | 3 | 7 | XX | XX | XX | 22 | 22 |
| 4 | XX | XX | XX | 7 | XX | XX | 22 | 22 |
| 1 | 4 | XX | XX | 7 | XX | XX | 22 | 22 |
| 2 | XX | 4 | XX | 7 | XX | XX | 22 | 22 |
| 1 | 2 | 4 | XX | 7 | XX | XX | 22 | 22 |
| 3 | XX | XX | 4 | 7 | XX | XX | 22 | 22 |
| 1 | 3 | XX | 4 | 7 | XX | XX | 22 | 22 |
| 2 | XX | 3 | 4 | 7 | XX | XX | 22 | 22 |
| 1 | 2 | 3 | 4 | 7 | XX | XX | 22 | 22 |
| 5 | XX | XX | XX | XX | 7 | XX | 22 | 22 |
| 1 | 5 | XX | XX | XX | 7 | XX | 22 | 22 |
| 2 | XX | 5 | XX | XX | 7 | XX | 22 | 22 |
| 1 | 2 | 5 | XX | XX | 7 | XX | 22 | 22 |
| 3 | XX | XX | 5 | XX | 7 | XX | 22 | 22 |
| 1 | 3 | XX | 5 | XX | 7 | XX | 22 | 22 |
| 2 | XX | 3 | 5 | XX | 7 | XX | 22 | 22 |
| 1 | 2 | 3 | 5 | XX | 7 | XX | 22 | 22 |
| 4 | XX | XX | XX | 5 | 7 | XX | 22 | 22 |
| 1 | 4 | XX | XX | 5 | 7 | XX | 22 | 22 |
| 2 | XX | 4 | XX | 5 | 7 | XX | 22 | 22 |
| 1 | 2 | 4 | XX | 5 | 7 | XX | 22 | 22 |
| 3 | XX | XX | 4 | 5 | 7 | XX | 22 | 22 |
| 1 | 3 | XX | 4 | 5 | 7 | XX | 22 | 22 |
| 2 | XX | 3 | 4 | 5 | 7 | XX | 22 | 22 |
| 1 | 2 | 3 | 4 | 5 | 7 | XX | 22 | 22 |
| 6 | XX | XX | XX | XX | XX | 7 | 22 | 22 |
| 1 | 6 | XX | XX | XX | XX | 7 | 22 | 22 |
| 2 | XX | 6 | XX | XX | XX | 7 | 22 | 22 |
| 1 | 2 | 6 | XX | XX | XX | 7 | 22 | 22 |
| 3 | XX | XX | 6 | XX | XX | 7 | 22 | 22 |
| 1 | 3 | XX | 6 | XX | XX | 7 | 22 | 22 |
| 2 | XX | 3 | 6 | XX | XX | 7 | 22 | 22 |
| 1 | 2 | 3 | 6 | XX | XX | 7 | 22 | 22 |
| 4 | XX | XX | XX | 6 | XX | 7 | 22 | 22 |
| 1 | 4 | XX | XX | 6 | XX | 7 | 22 | 22 |
| 2 | XX | 4 | XX | 6 | XX | 7 | 22 | 22 |
| 1 | 2 | 4 | XX | 6 | XX | 7 | 22 | 22 |
| 3 | XX | XX | 4 | 6 | XX | 7 | 22 | 22 |
| 1 | 3 | XX | 4 | 6 | XX | 7 | 22 | 22 |
| 2 | XX | 3 | 4 | 6 | XX | 7 | 22 | 22 |
| 1 | 2 | 3 | 4 | 6 | XX | 7 | 22 | 22 |
| 5 | XX | XX | XX | XX | 6 | 7 | 22 | 22 |
| 1 | 5 | XX | XX | XX | 6 | 7 | 22 | 22 |
| 2 | XX | 5 | XX | XX | 6 | 7 | 22 | 22 |
| 1 | 2 | 5 | XX | XX | 6 | 7 | 22 | 22 |
| 3 | XX | XX | 5 | XX | 6 | 7 | 22 | 22 |
| 1 | 3 | XX | 5 | XX | 6 | 7 | 22 | 22 |
| 2 | XX | 3 | 5 | XX | 6 | 7 | 22 | 22 |
| 1 | 2 | 3 | 5 | XX | 6 | 7 | 22 | 22 |
| 4 | XX | XX | XX | 5 | 6 | 7 | 22 | 22 |
| 1 | 4 | XX | XX | 5 | 6 | 7 | 22 | 22 |
| 2 | XX | 4 | XX | 5 | 6 | 7 | 22 | 22 |
| 1 | 2 | 4 | XX | 5 | 6 | 7 | 22 | 22 |
| 3 | XX | XX | 4 | 5 | 6 | 7 | 22 | 22 |
| 1 | 3 | XX | 4 | 5 | 6 | 7 | 22 | 22 |
| 2 | XX | 3 | 4 | 5 | 6 | 7 | 22 | 22 |
| 1 | 2 | 3 | 4 | 5 | 6 | 7 | 22 | 22 |
| 23 | XX | XX | XX | XX | XX | XX | XX | 23 |
| 1 | 23 | XX | XX | XX | XX | XX | XX | 23 |
| 2 | XX | 23 | XX | XX | XX | XX | XX | 23 |
| 1 | 2 | 23 | XX | XX | XX | XX | XX | 23 |
| 3 | XX | XX | 23 | XX | XX | XX | XX | 23 |
| 1 | 3 | XX | 23 | XX | XX | XX | XX | 23 |
| 2 | XX | 3 | 23 | XX | XX | XX | XX | 23 |
| 1 | 2 | 3 | 23 | XX | XX | XX | XX | 23 |
| 4 | XX | XX | XX | 23 | XX | XX | XX | 23 |
| 1 | 4 | XX | XX | 23 | XX | XX | XX | 23 |
| 2 | XX | 4 | XX | 23 | XX | XX | XX | 23 |
| 1 | 2 | 4 | XX | 23 | XX | XX | XX | 23 |
| 3 | XX | XX | 4 | 23 | XX | XX | XX | 23 |
| 1 | 3 | XX | 4 | 23 | XX | XX | XX | 23 |
| 2 | XX | 3 | 4 | 23 | XX | XX | XX | 23 |
| 1 | 2 | 3 | 4 | 23 | XX | XX | XX | 23 |
| 5 | XX | XX | XX | XX | 23 | XX | XX | 23 |
| 1 | 5 | XX | XX | XX | 23 | XX | XX | 23 |
| 2 | XX | 5 | XX | XX | 23 | XX | XX | 23 |
| 1 | 2 | 5 | XX | XX | 23 | XX | XX | 23 |
| 3 | XX | XX | 5 | XX | 23 | XX | XX | 23 |
| 1 | 3 | XX | 5 | XX | 23 | XX | XX | 23 |
| 2 | XX | 3 | 5 | XX | 23 | XX | XX | 23 |
| 1 | 2 | 3 | 5 | XX | 23 | XX | XX | 23 |
| 4 | XX | XX | XX | 5 | 23 | XX | XX | 23 |
| 1 | 4 | XX | XX | 5 | 23 | XX | XX | 23 |
| 2 | XX | 4 | XX | 5 | 23 | XX | XX | 23 |
| 1 | 2 | 4 | XX | 5 | 23 | XX | XX | 23 |
| 3 | XX | XX | 4 | 5 | 23 | XX | XX | 23 |
| 1 | 3 | XX | 4 | 5 | 23 | XX | XX | 23 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 2  XX 3  4  5  23 XX XX | 23 | 1  2  3  4  5  7  XX 23 | 23 | 6  XX XX XX XX XX 24 XX | 24 |
| 1  2  3  4  5  23 XX XX | 23 | 6  XX XX XX XX XX XX 23 | 23 | 1  6  XX XX XX XX 24 XX | 24 |
| 6  XX XX XX XX XX 23 XX | 23 | 1  6  XX XX XX XX XX 7  23 | 23 | 2  XX 6  XX XX XX 24 XX | 24 |
| 1  6  XX XX XX XX 23 XX | 23 | 2  XX 6  XX XX XX XX 7  23 | 23 | 1  2  6  XX XX XX 24 XX | 24 |
| 2  XX 6  XX XX XX 23 XX | 23 | 1  2  6  XX XX XX 7  23 | 23 | 3  XX XX 6  XX XX 24 XX | 24 |
| 1  2  6  XX XX XX 23 XX | 23 | 3  XX XX 6  XX XX 7  23 | 23 | 1  3  XX 6  XX XX 24 XX | 24 |
| 3  XX XX 6  XX XX 23 XX | 23 | 1  3  XX 6  XX XX 7  23 | 23 | 2  XX 3  6  XX XX 24 XX | 24 |
| 1  3  XX 6  XX XX 23 XX | 23 | 2  XX 3  6  XX XX 7  23 | 23 | 1  2  3  6  XX XX 24 XX | 24 |
| 2  XX 3  6  XX XX 23 XX | 23 | 1  2  3  6  XX XX 7  23 | 23 | 4  XX XX XX 6  XX 24 XX | 24 |
| 1  2  3  6  XX XX 23 XX | 23 | 4  XX XX XX 6  XX 7  23 | 23 | 1  4  XX XX 6  XX 24 XX | 24 |
| 4  XX XX XX 6  XX 23 XX | 23 | 1  4  XX XX 6  XX 7  23 | 23 | 2  XX 4  XX 6  XX 24 XX | 24 |
| 1  4  XX XX 6  XX 23 XX | 23 | 2  XX 4  XX 6  XX 7  23 | 23 | 1  2  4  XX 6  XX 24 XX | 24 |
| 2  XX 4  XX 6  XX 23 XX | 23 | 1  2  4  XX 6  XX 7  23 | 23 | 3  XX XX 4  6  XX 24 XX | 24 |
| 1  2  4  XX 6  XX 23 XX | 23 | 3  XX XX 4  6  XX 7  23 | 23 | 1  3  XX 4  6  XX 24 XX | 24 |
| 3  XX XX 4  6  XX 23 XX | 23 | 1  3  XX 4  6  XX 7  23 | 23 | 2  XX 3  4  6  XX 24 XX | 24 |
| 1  3  XX 4  6  XX 23 XX | 23 | 2  XX 3  4  6  XX 7  23 | 23 | 1  2  3  4  6  XX 24 XX | 24 |
| 2  XX 3  4  6  XX 23 XX | 23 | 1  2  3  4  6  XX 7  23 | 23 | 5  XX XX XX XX 6  24 XX | 24 |
| 1  2  3  4  6  XX 23 XX | 23 | 5  XX XX XX XX 6  7  23 | 23 | 1  5  XX XX XX 6  24 XX | 24 |
| 5  XX XX XX XX 6  23 XX | 23 | 1  5  XX XX XX 6  7  23 | 23 | 2  XX 5  XX XX 6  24 XX | 24 |
| 1  5  XX XX XX 6  23 XX | 23 | 2  XX 5  XX XX 6  7  23 | 23 | 1  2  5  XX XX 6  24 XX | 24 |
| 2  XX 5  XX XX 6  23 XX | 23 | 1  2  5  XX XX 6  7  23 | 23 | 3  XX XX 5  XX 6  24 XX | 24 |
| 1  2  5  XX XX 6  23 XX | 23 | 3  XX XX 5  XX 6  7  23 | 23 | 1  3  XX 5  XX 6  24 XX | 24 |
| 3  XX XX 5  XX 6  23 XX | 23 | 1  3  XX 5  XX 6  7  23 | 23 | 2  XX 3  5  XX 6  24 XX | 24 |
| 1  3  XX 5  XX 6  23 XX | 23 | 2  XX 3  5  XX 6  7  23 | 23 | 1  2  3  5  XX 6  24 XX | 24 |
| 2  XX 3  5  XX 6  23 XX | 23 | 1  2  3  5  XX 6  7  23 | 23 | 4  XX XX XX 5  6  24 XX | 24 |
| 1  2  3  5  XX 6  23 XX | 23 | 4  XX XX XX 5  6  7  23 | 23 | 1  4  XX XX 5  6  24 XX | 24 |
| 4  XX XX XX 5  6  23 XX | 23 | 1  4  XX XX 5  6  7  23 | 23 | 2  XX 4  XX 5  6  24 XX | 24 |
| 1  4  XX XX 5  6  23 XX | 23 | 2  XX 4  XX 5  6  7  23 | 23 | 1  2  4  XX 5  6  24 XX | 24 |
| 2  XX 4  XX 5  6  23 XX | 23 | 1  2  4  XX 5  6  7  23 | 23 | 3  XX XX 4  5  6  24 XX | 24 |
| 1  2  4  XX 5  6  23 XX | 23 | 3  XX XX 4  5  6  7  23 | 23 | 1  3  XX 4  5  6  24 XX | 24 |
| 3  XX XX 4  5  6  23 XX | 23 | 1  3  XX 4  5  6  7  23 | 23 | 2  XX 3  4  5  6  24 XX | 24 |
| 1  3  XX 4  5  6  23 XX | 23 | 2  XX 3  4  5  6  7  23 | 23 | 1  2  3  4  5  6  24 XX | 24 |
| 2  XX 3  4  5  6  23 XX | 23 | 1  2  3  4  5  6  7  23 | 23 | 7  XX XX XX XX XX XX 24 | 24 |
| 1  2  3  4  5  6  23 XX | 23 | 24 XX XX XX XX XX XX XX | 24 | 1  7  XX XX XX XX XX 24 | 24 |
| 7  XX XX XX XX XX XX 23 | 23 | 1  24 XX XX XX XX XX XX | 24 | 2  XX 7  XX XX XX XX 24 | 24 |
| 1  7  XX XX XX XX XX 23 | 23 | 2  XX 24 XX XX XX XX XX | 24 | 1  2  7  XX XX XX XX 24 | 24 |
| 2  XX 7  XX XX XX XX 23 | 23 | 1  2  24 XX XX XX XX XX | 24 | 3  XX XX 7  XX XX XX 24 | 24 |
| 1  2  7  XX XX XX XX 23 | 23 | 3  XX XX 24 XX XX XX XX | 24 | 1  3  XX 7  XX XX XX 24 | 24 |
| 3  XX XX 7  XX XX XX 23 | 23 | 1  3  XX 24 XX XX XX XX | 24 | 2  XX 3  7  XX XX XX 24 | 24 |
| 1  3  XX 7  XX XX XX 23 | 23 | 2  XX 3  24 XX XX XX XX | 24 | 1  2  3  7  XX XX XX 24 | 24 |
| 2  XX 3  7  XX XX XX 23 | 23 | 1  2  3  24 XX XX XX XX | 24 | 4  XX XX XX 7  XX XX 24 | 24 |
| 1  2  3  7  XX XX XX 23 | 23 | 4  XX XX XX 24 XX XX XX | 24 | 1  4  XX XX 7  XX XX 24 | 24 |
| 4  XX XX XX 7  XX XX 23 | 23 | 1  4  XX XX 24 XX XX XX | 24 | 2  XX 4  XX 7  XX XX 24 | 24 |
| 1  4  XX XX 7  XX XX 23 | 23 | 2  XX 4  XX 24 XX XX XX | 24 | 1  2  4  XX 7  XX XX 24 | 24 |
| 2  XX 4  XX 7  XX XX 23 | 23 | 1  2  4  XX 24 XX XX XX | 24 | 3  XX XX 4  7  XX XX 24 | 24 |
| 1  2  4  XX 7  XX XX 23 | 23 | 3  XX XX 4  24 XX XX XX | 24 | 1  3  XX 4  7  XX XX 24 | 24 |
| 3  XX XX 4  7  XX XX 23 | 23 | 1  3  XX 4  24 XX XX XX | 24 | 2  XX 3  4  7  XX XX 24 | 24 |
| 1  3  XX 4  7  XX XX 23 | 23 | 2  XX 3  4  24 XX XX XX | 24 | 1  2  3  4  7  XX XX 24 | 24 |
| 2  XX 3  4  7  XX XX 23 | 23 | 1  2  3  4  24 XX XX XX | 24 | 5  XX XX XX XX 7  XX 24 | 24 |
| 1  2  3  4  7  XX XX 23 | 23 | 5  XX XX XX XX 24 XX XX | 24 | 1  5  XX XX XX 7  XX 24 | 24 |
| 5  XX XX XX XX 7  XX 23 | 23 | 1  5  XX XX XX 24 XX XX | 24 | 2  XX 5  XX XX 7  XX 24 | 24 |
| 1  5  XX XX XX 7  XX 23 | 23 | 2  XX 5  XX XX 24 XX XX | 24 | 1  2  5  XX XX 7  XX 24 | 24 |
| 2  XX 5  XX XX 7  XX 23 | 23 | 1  2  5  XX XX 24 XX XX | 24 | 3  XX XX 5  XX 7  XX 24 | 24 |
| 1  2  5  XX XX 7  XX 23 | 23 | 3  XX XX 5  XX 24 XX XX | 24 | 1  3  XX 5  XX 7  XX 24 | 24 |
| 3  XX XX 5  XX 7  XX 23 | 23 | 1  3  XX 5  XX 24 XX XX | 24 | 2  XX 3  5  XX 7  XX 24 | 24 |
| 1  3  XX 5  XX 7  XX 23 | 23 | 2  XX 3  5  XX 24 XX XX | 24 | 1  2  3  5  XX 7  XX 24 | 24 |
| 2  XX 3  5  XX 7  XX 23 | 23 | 1  2  3  5  XX 24 XX XX | 24 | 4  XX XX XX 5  7  XX 24 | 24 |
| 1  2  3  5  XX 7  XX 23 | 23 | 4  XX XX XX 5  24 XX XX | 24 | 1  4  XX XX 5  7  XX 24 | 24 |
| 4  XX XX XX 5  7  XX 23 | 23 | 1  4  XX XX 5  24 XX XX | 24 | 2  XX 4  XX 5  7  XX 24 | 24 |
| 1  4  XX XX 5  7  XX 23 | 23 | 2  XX 4  XX 5  24 XX XX | 24 | 1  2  4  XX 5  7  XX 24 | 24 |
| 2  XX 4  XX 5  7  XX 23 | 23 | 1  2  4  XX 5  24 XX XX | 24 | 3  XX XX 4  5  7  XX 24 | 24 |
| 1  2  4  XX 5  7  XX 23 | 23 | 3  XX XX 4  5  24 XX XX | 24 | 1  3  XX 4  5  7  XX 24 | 24 |
| 3  XX XX 4  5  7  XX 23 | 23 | 1  3  XX 4  5  24 XX XX | 24 | 2  XX 3  4  5  7  XX 24 | 24 |
| 1  3  XX 4  5  7  XX 23 | 23 | 2  XX 3  4  5  24 XX XX | 24 | 1  2  3  4  5  7  XX 24 | 24 |
| 2  XX 3  4  5  7  XX 23 | 23 | 1  2  3  4  5  24 XX XX | 24 | 6  XX XX XX XX XX 7  24 | 24 |

| 0 | 1 | 2 | 3 | 4 | 5 | 6 | 7 | Output |
|---|---|---|---|---|---|---|---|---|
| 1 | 6 | XX | XX | XX | XX | XX | 7 | 24 |
| 2 | XX | 6 | XX | XX | XX | XX | 7 | 24 |
| 1 | 2 | 6 | XX | XX | XX | XX | 7 | 24 |
| 3 | XX | XX | 6 | XX | XX | XX | 7 | 24 |
| 1 | 3 | XX | 6 | XX | XX | XX | 7 | 24 |
| 2 | XX | 3 | 6 | XX | XX | XX | 7 | 24 |
| 1 | 2 | 3 | 6 | XX | XX | XX | 7 | 24 |
| 4 | XX | XX | XX | 6 | XX | XX | 7 | 24 |
| 1 | 4 | XX | XX | 6 | XX | XX | 7 | 24 |
| 2 | XX | 4 | XX | 6 | XX | XX | 7 | 24 |
| 1 | 2 | 4 | XX | 6 | XX | XX | 7 | 24 |
| 3 | XX | XX | 4 | 6 | XX | XX | 7 | 24 |
| 1 | 3 | XX | 4 | 6 | XX | XX | 7 | 24 |
| 2 | XX | 3 | 4 | 6 | XX | XX | 7 | 24 |
| 1 | 2 | 3 | 4 | 6 | XX | XX | 7 | 24 |
| 5 | XX | XX | XX | XX | 6 | XX | 7 | 24 |
| 1 | 5 | XX | XX | XX | 6 | XX | 7 | 24 |
| 2 | XX | 5 | XX | XX | 6 | XX | 7 | 24 |
| 1 | 2 | 5 | XX | XX | 6 | XX | 7 | 24 |
| 3 | XX | XX | 5 | XX | 6 | XX | 7 | 24 |
| 1 | 3 | XX | 5 | XX | 6 | XX | 7 | 24 |
| 2 | XX | 3 | 5 | XX | 6 | XX | 7 | 24 |
| 1 | 2 | 3 | 5 | XX | 6 | XX | 7 | 24 |
| 4 | XX | XX | XX | 5 | 6 | XX | 7 | 24 |
| 1 | 4 | XX | XX | 5 | 6 | XX | 7 | 24 |
| 2 | XX | 4 | XX | 5 | 6 | XX | 7 | 24 |
| 1 | 2 | 4 | XX | 5 | 6 | XX | 7 | 24 |
| 3 | XX | XX | 4 | 5 | 6 | XX | 7 | 24 |
| 1 | 3 | XX | 4 | 5 | 6 | XX | 7 | 24 |
| 2 | XX | 3 | 4 | 5 | 6 | XX | 7 | 24 |
| 1 | 2 | 3 | 4 | 5 | 6 | XX | 7 | 24 |
| 25 | XX | XX | XX | XX | XX | XX | XX | 25 |
| 1 | 25 | XX | XX | XX | XX | XX | XX | 25 |
| 2 | XX | 25 | XX | XX | XX | XX | XX | 25 |
| 1 | 2 | 25 | XX | XX | XX | XX | XX | 25 |
| 3 | XX | XX | 25 | XX | XX | XX | XX | 25 |
| 1 | 3 | XX | 25 | XX | XX | XX | XX | 25 |
| 2 | XX | 3 | 25 | XX | XX | XX | XX | 25 |
| 1 | 2 | 3 | 25 | XX | XX | XX | XX | 25 |
| 4 | XX | XX | XX | 25 | XX | XX | XX | 25 |
| 1 | 4 | XX | XX | 25 | XX | XX | XX | 25 |
| 2 | XX | 4 | XX | 25 | XX | XX | XX | 25 |
| 1 | 2 | 4 | XX | 25 | XX | XX | XX | 25 |
| 3 | XX | XX | 4 | 25 | XX | XX | XX | 25 |
| 1 | 3 | XX | 4 | 25 | XX | XX | XX | 25 |
| 2 | XX | 3 | 4 | 25 | XX | XX | XX | 25 |
| 1 | 2 | 3 | 4 | 25 | XX | XX | XX | 25 |
| 5 | XX | XX | XX | XX | 25 | XX | XX | 25 |
| 1 | 5 | XX | XX | XX | 25 | XX | XX | 25 |
| 2 | XX | 5 | XX | XX | 25 | XX | XX | 25 |
| 1 | 2 | 5 | XX | XX | 25 | XX | XX | 25 |
| 3 | XX | XX | 5 | XX | 25 | XX | XX | 25 |
| 1 | 3 | XX | 5 | XX | 25 | XX | XX | 25 |
| 2 | XX | 3 | 5 | XX | 25 | XX | XX | 25 |
| 1 | 2 | 3 | 5 | XX | 25 | XX | XX | 25 |
| 4 | XX | XX | XX | 5 | 25 | XX | XX | 25 |
| 1 | 4 | XX | XX | 5 | 25 | XX | XX | 25 |
| 2 | XX | 4 | XX | 5 | 25 | XX | XX | 25 |
| 1 | 2 | 4 | XX | 5 | 25 | XX | XX | 25 |
| 3 | XX | XX | 4 | 5 | 25 | XX | XX | 25 |
| 1 | 3 | XX | 4 | 5 | 25 | XX | XX | 25 |
| 2 | XX | 3 | 4 | 5 | 25 | XX | XX | 25 |
| 1 | 2 | 3 | 4 | 5 | 25 | XX | XX | 25 |
| 6 | XX | XX | XX | XX | XX | 25 | XX | 25 |
| 1 | 6 | XX | XX | XX | XX | 25 | XX | 25 |
| 2 | XX | 6 | XX | XX | XX | 25 | XX | 25 |
| 1 | 2 | 6 | XX | XX | XX | 25 | XX | 25 |
| 3 | XX | XX | 6 | XX | XX | 25 | XX | 25 |
| 1 | 3 | XX | 6 | XX | XX | 25 | XX | 25 |
| 2 | XX | 3 | 6 | XX | XX | 25 | XX | 25 |
| 1 | 2 | 3 | 6 | XX | XX | 25 | XX | 25 |
| 4 | XX | XX | XX | 6 | XX | 25 | XX | 25 |
| 1 | 4 | XX | XX | 6 | XX | 25 | XX | 25 |
| 2 | XX | 4 | XX | 6 | XX | 25 | XX | 25 |
| 1 | 2 | 4 | XX | 6 | XX | 25 | XX | 25 |
| 3 | XX | XX | 4 | 6 | XX | 25 | XX | 25 |
| 1 | 3 | XX | 4 | 6 | XX | 25 | XX | 25 |
| 2 | XX | 3 | 4 | 6 | XX | 25 | XX | 25 |
| 1 | 2 | 3 | 4 | 6 | XX | 25 | XX | 25 |
| 5 | XX | XX | XX | XX | 6 | 25 | XX | 25 |
| 1 | 5 | XX | XX | XX | 6 | 25 | XX | 25 |
| 2 | XX | 5 | XX | XX | 6 | 25 | XX | 25 |
| 1 | 2 | 5 | XX | XX | 6 | 25 | XX | 25 |
| 3 | XX | XX | 5 | XX | 6 | 25 | XX | 25 |
| 1 | 3 | XX | 5 | XX | 6 | 25 | XX | 25 |
| 2 | XX | 3 | 5 | XX | 6 | 25 | XX | 25 |
| 1 | 2 | 3 | 5 | XX | 6 | 25 | XX | 25 |
| 4 | XX | XX | XX | 5 | 6 | 25 | XX | 25 |
| 1 | 4 | XX | XX | 5 | 6 | 25 | XX | 25 |
| 2 | XX | 4 | XX | 5 | 6 | 25 | XX | 25 |
| 1 | 2 | 4 | XX | 5 | 6 | 25 | XX | 25 |
| 3 | XX | XX | 4 | 5 | 6 | 25 | XX | 25 |
| 1 | 3 | XX | 4 | 5 | 6 | 25 | XX | 25 |
| 2 | XX | 3 | 4 | 5 | 6 | 25 | XX | 25 |
| 1 | 2 | 3 | 4 | 5 | 6 | 25 | XX | 25 |
| 7 | XX | XX | XX | XX | XX | XX | 25 | 25 |
| 1 | 7 | XX | XX | XX | XX | XX | 25 | 25 |
| 2 | XX | 7 | XX | XX | XX | XX | 25 | 25 |
| 1 | 2 | 7 | XX | XX | XX | XX | 25 | 25 |
| 3 | XX | XX | 7 | XX | XX | XX | 25 | 25 |
| 1 | 3 | XX | 7 | XX | XX | XX | 25 | 25 |
| 2 | XX | 3 | 7 | XX | XX | XX | 25 | 25 |
| 1 | 2 | 3 | 7 | XX | XX | XX | 25 | 25 |
| 4 | XX | XX | XX | 7 | XX | XX | 25 | 25 |
| 1 | 4 | XX | XX | 7 | XX | XX | 25 | 25 |
| 2 | XX | 4 | XX | 7 | XX | XX | 25 | 25 |
| 1 | 2 | 4 | XX | 7 | XX | XX | 25 | 25 |
| 3 | XX | XX | 4 | 7 | XX | XX | 25 | 25 |
| 1 | 3 | XX | 4 | 7 | XX | XX | 25 | 25 |
| 2 | XX | 3 | 4 | 7 | XX | XX | 25 | 25 |
| 1 | 2 | 3 | 4 | 7 | XX | XX | 25 | 25 |
| 5 | XX | XX | XX | XX | 7 | XX | 25 | 25 |
| 1 | 5 | XX | XX | XX | 7 | XX | 25 | 25 |
| 2 | XX | 5 | XX | XX | 7 | XX | 25 | 25 |
| 1 | 2 | 5 | XX | XX | 7 | XX | 25 | 25 |
| 3 | XX | XX | 5 | XX | 7 | XX | 25 | 25 |
| 1 | 3 | XX | 5 | XX | 7 | XX | 25 | 25 |
| 2 | XX | 3 | 5 | XX | 7 | XX | 25 | 25 |
| 1 | 2 | 3 | 5 | XX | 7 | XX | 25 | 25 |
| 4 | XX | XX | XX | 5 | 7 | XX | 25 | 25 |
| 1 | 4 | XX | XX | 5 | 7 | XX | 25 | 25 |
| 2 | XX | 4 | XX | 5 | 7 | XX | 25 | 25 |
| 1 | 2 | 4 | XX | 5 | 7 | XX | 25 | 25 |
| 3 | XX | XX | 4 | 5 | 7 | XX | 25 | 25 |
| 1 | 3 | XX | 4 | 5 | 7 | XX | 25 | 25 |
| 2 | XX | 3 | 4 | 5 | 7 | XX | 25 | 25 |
| 1 | 2 | 3 | 4 | 5 | 7 | XX | 25 | 25 |
| 6 | XX | XX | XX | XX | XX | 7 | 25 | 25 |
| 1 | 6 | XX | XX | XX | XX | 7 | 25 | 25 |
| 2 | XX | 6 | XX | XX | XX | 7 | 25 | 25 |
| 1 | 2 | 6 | XX | XX | XX | 7 | 25 | 25 |
| 3 | XX | XX | 6 | XX | XX | 7 | 25 | 25 |
| 1 | 3 | XX | 6 | XX | XX | 7 | 25 | 25 |
| 2 | XX | 3 | 6 | XX | XX | 7 | 25 | 25 |
| 1 | 2 | 3 | 6 | XX | XX | 7 | 25 | 25 |
| 4 | XX | XX | XX | 6 | XX | 7 | 25 | 25 |
| 1 | 4 | XX | XX | 6 | XX | 7 | 25 | 25 |
| 2 | XX | 4 | XX | 6 | XX | 7 | 25 | 25 |
| 1 | 2 | 4 | XX | 6 | XX | 7 | 25 | 25 |
| 3 | XX | XX | 4 | 6 | XX | 7 | 25 | 25 |
| 1 | 3 | XX | 4 | 6 | XX | 7 | 25 | 25 |
| 2 | XX | 3 | 4 | 6 | XX | 7 | 25 | 25 |
| 1 | 2 | 3 | 4 | 6 | XX | 7 | 25 | 25 |
| 5 | XX | XX | XX | XX | 6 | 7 | 25 | 25 |
| 1 | 5 | XX | XX | XX | 6 | 7 | 25 | 25 |
| 2 | XX | 5 | XX | XX | 6 | 7 | 25 | 25 |
| 1 | 2 | 5 | XX | XX | 6 | 7 | 25 | 25 |
| 3 | XX | XX | 5 | XX | 6 | 7 | 25 | 25 |
| 1 | 3 | XX | 5 | XX | 6 | 7 | 25 | 25 |
| 2 | XX | 3 | 5 | XX | 6 | 7 | 25 | 25 |
| 1 | 2 | 3 | 5 | XX | 6 | 7 | 25 | 25 |
| 4 | XX | XX | XX | 5 | 6 | 7 | 25 | 25 |
| 1 | 4 | XX | XX | 5 | 6 | 7 | 25 | 25 |
| 2 | XX | 4 | XX | 5 | 6 | 7 | 25 | 25 |
| 1 | 2 | 4 | XX | 5 | 6 | 7 | 25 | 25 |
| 3 | XX | XX | 4 | 5 | 6 | 7 | 25 | 25 |
| 1 | 3 | XX | 4 | 5 | 6 | 7 | 25 | 25 |
| 2 | XX | 3 | 4 | 5 | 6 | 7 | 25 | 25 |
| 1 | 2 | 3 | 4 | 5 | 6 | 7 | 25 | 25 |
| 26 | XX | XX | XX | XX | XX | XX | XX | 26 |
| 1 | 26 | XX | XX | XX | XX | XX | XX | 26 |
| 2 | XX | 26 | XX | XX | XX | XX | XX | 26 |
| 1 | 2 | 26 | XX | XX | XX | XX | XX | 26 |
| 3 | XX | XX | 26 | XX | XX | XX | XX | 26 |
| 1 | 3 | XX | 26 | XX | XX | XX | XX | 26 |
| 2 | XX | 3 | 26 | XX | XX | XX | XX | 26 |
| 1 | 2 | 3 | 26 | XX | XX | XX | XX | 26 |
| 4 | XX | XX | XX | 26 | XX | XX | XX | 26 |
| 1 | 4 | XX | XX | 26 | XX | XX | XX | 26 |
| 2 | XX | 4 | XX | 26 | XX | XX | XX | 26 |
| 1 | 2 | 4 | XX | 26 | XX | XX | XX | 26 |
| 3 | XX | XX | 4 | 26 | XX | XX | XX | 26 |
| 1 | 3 | XX | 4 | 26 | XX | XX | XX | 26 |
| 2 | XX | 3 | 4 | 26 | XX | XX | XX | 26 |
| 1 | 2 | 3 | 4 | 26 | XX | XX | XX | 26 |
| 5 | XX | XX | XX | XX | 26 | XX | XX | 26 |
| 1 | 5 | XX | XX | XX | 26 | XX | XX | 26 |
| 2 | XX | 5 | XX | XX | 26 | XX | XX | 26 |
| 1 | 2 | 5 | XX | XX | 26 | XX | XX | 26 |
| 3 | XX | XX | 5 | XX | 26 | XX | XX | 26 |
| 1 | 3 | XX | 5 | XX | 26 | XX | XX | 26 |
| 2 | XX | 3 | 5 | XX | 26 | XX | XX | 26 |
| 1 | 2 | 3 | 5 | XX | 26 | XX | XX | 26 |
| 4 | XX | XX | XX | 5 | 26 | XX | XX | 26 |
| 1 | 4 | XX | XX | 5 | 26 | XX | XX | 26 |
| 2 | XX | 4 | XX | 5 | 26 | XX | XX | 26 |
| 1 | 2 | 4 | XX | 5 | 26 | XX | XX | 26 |
| 3 | XX | XX | 4 | 5 | 26 | XX | XX | 26 |
| 1 | 3 | XX | 4 | 5 | 26 | XX | XX | 26 |
| 2 | XX | 3 | 4 | 5 | 26 | XX | XX | 26 |
| 1 | 2 | 3 | 4 | 5 | 26 | XX | XX | 26 |
| 6 | XX | XX | XX | XX | XX | 26 | XX | 26 |
| 1 | 6 | XX | XX | XX | XX | 26 | XX | 26 |
| 2 | XX | 6 | XX | XX | XX | 26 | XX | 26 |
| 1 | 2 | 6 | XX | XX | XX | 26 | XX | 26 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 3   XX XX 6   XX XX 26 XX | 26 | 1   3   XX 6   XX XX 7   26 | 26 | 2   XX 3   6   XX XX 27 XX | 27 |
| 1   3   XX 6   XX XX 26 XX | 26 | 2   XX 3   6   XX XX 7   26 | 26 | 1   2   3   6   XX XX 27 XX | 27 |
| 2   XX 3   6   XX XX 26 XX | 26 | 1   2   3   6   XX XX 7   26 | 26 | 4   XX XX XX 6   XX 27 XX | 27 |
| 1   2   3   6   XX XX 26 XX | 26 | 4   XX XX XX 6   XX 7   26 | 26 | 1   4   XX XX 6   XX 27 XX | 27 |
| 4   XX XX XX 6   XX 26 XX | 26 | 1   4   XX XX 6   XX 7   26 | 26 | 2   XX 4   XX 6   XX 27 XX | 27 |
| 1   4   XX XX 6   XX 26 XX | 26 | 2   XX 4   XX 6   XX 7   26 | 26 | 1   2   4   XX 6   XX 27 XX | 27 |
| 2   XX 4   XX 6   XX 26 XX | 26 | 1   2   4   XX 6   XX 7   26 | 26 | 3   XX XX 4   6   XX 27 XX | 27 |
| 1   2   4   XX 6   XX 26 XX | 26 | 3   XX XX 4   6   XX 7   26 | 26 | 1   3   XX 4   6   XX 27 XX | 27 |
| 3   XX XX 4   6   XX 26 XX | 26 | 1   3   XX 4   6   XX 7   26 | 26 | 2   XX 3   4   6   XX 27 XX | 27 |
| 1   3   XX 4   6   XX 26 XX | 26 | 2   XX 3   4   6   XX 7   26 | 26 | 1   2   3   4   6   XX 27 XX | 27 |
| 2   XX 3   4   6   XX 26 XX | 26 | 1   2   3   4   6   XX 7   26 | 26 | 5   XX XX XX XX 6   27 XX | 27 |
| 1   2   3   4   6   XX 26 XX | 26 | 5   XX XX XX XX 6   7   26 | 26 | 1   5   XX XX XX 6   27 XX | 27 |
| 5   XX XX XX XX 6   26 XX | 26 | 1   5   XX XX XX 6   7   26 | 26 | 2   XX 5   XX XX 6   27 XX | 27 |
| 1   5   XX XX XX 6   26 XX | 26 | 2   XX 5   XX XX 6   7   26 | 26 | 1   2   5   XX XX 6   27 XX | 27 |
| 2   XX 5   XX XX 6   26 XX | 26 | 1   2   5   XX XX 6   7   26 | 26 | 3   XX XX 5   XX 6   27 XX | 27 |
| 1   2   5   XX XX 6   26 XX | 26 | 3   XX XX 5   XX 6   7   26 | 26 | 1   3   XX 5   XX 6   27 XX | 27 |
| 3   XX XX 5   XX 6   26 XX | 26 | 1   3   XX 5   XX 6   7   26 | 26 | 2   XX 3   5   XX 6   27 XX | 27 |
| 1   3   XX 5   XX 6   26 XX | 26 | 2   XX 3   5   XX 6   7   26 | 26 | 1   2   3   5   XX 6   27 XX | 27 |
| 2   XX 3   5   XX 6   26 XX | 26 | 1   2   3   5   XX 6   7   26 | 26 | 4   XX XX XX 5   6   27 XX | 27 |
| 1   2   3   5   XX 6   26 XX | 26 | 4   XX XX XX 5   6   7   26 | 26 | 1   4   XX XX 5   6   27 XX | 27 |
| 4   XX XX XX 5   6   26 XX | 26 | 1   4   XX XX 5   6   7   26 | 26 | 2   XX 4   XX 5   6   27 XX | 27 |
| 1   4   XX XX 5   6   26 XX | 26 | 2   XX 4   XX 5   6   7   26 | 26 | 1   2   4   XX 5   6   27 XX | 27 |
| 2   XX 4   XX 5   6   26 XX | 26 | 1   2   4   XX 5   6   7   26 | 26 | 3   XX XX 4   5   6   27 XX | 27 |
| 1   2   4   XX 5   6   26 XX | 26 | 3   XX XX 4   5   6   7   26 | 26 | 1   3   XX 4   5   6   27 XX | 27 |
| 3   XX XX 4   5   6   26 XX | 26 | 1   3   XX 4   5   6   7   26 | 26 | 2   XX 3   4   5   6   27 XX | 27 |
| 1   3   XX 4   5   6   26 XX | 26 | 2   XX 3   4   5   6   7   26 | 26 | 1   2   3   4   5   6   27 XX | 27 |
| 2   XX 3   4   5   6   26 XX | 26 | 1   2   3   4   5   6   7   26 | 26 | 7   XX XX XX XX XX XX 27 | 27 |
| 1   2   3   4   5   6   26 XX | 26 | 27 XX XX XX XX XX XX XX | 27 | 1   7   XX XX XX XX XX 27 | 27 |
| 7   XX XX XX XX XX XX 26 | 26 | 1   27 XX XX XX XX XX XX | 27 | 2   XX 7   XX XX XX XX 27 | 27 |
| 1   7   XX XX XX XX XX 26 | 26 | 2   XX 27 XX XX XX XX XX | 27 | 1   2   7   XX XX XX XX 27 | 27 |
| 2   XX 7   XX XX XX XX 26 | 26 | 1   2   27 XX XX XX XX XX | 27 | 3   XX XX 7   XX XX XX 27 | 27 |
| 1   2   7   XX XX XX XX 26 | 26 | 3   XX XX 27 XX XX XX XX | 27 | 1   3   XX 7   XX XX XX 27 | 27 |
| 3   XX XX 7   XX XX XX 26 | 26 | 1   3   XX 27 XX XX XX XX | 27 | 2   XX 3   7   XX XX XX 27 | 27 |
| 1   3   XX 7   XX XX XX 26 | 26 | 2   XX 3   27 XX XX XX XX | 27 | 1   2   3   7   XX XX XX 27 | 27 |
| 2   XX 3   7   XX XX XX 26 | 26 | 1   2   3   27 XX XX XX XX | 27 | 4   XX XX XX 7   XX XX 27 | 27 |
| 1   2   3   7   XX XX XX 26 | 26 | 4   XX XX XX 27 XX XX XX | 27 | 1   4   XX XX 7   XX XX 27 | 27 |
| 4   XX XX XX 7   XX XX 26 | 26 | 1   4   XX XX 27 XX XX XX | 27 | 2   XX 4   XX 7   XX XX 27 | 27 |
| 1   4   XX XX 7   XX XX 26 | 26 | 2   XX 4   XX 27 XX XX XX | 27 | 1   2   4   XX 7   XX XX 27 | 27 |
| 2   XX 4   XX 7   XX XX 26 | 26 | 1   2   4   XX 27 XX XX XX | 27 | 3   XX XX 4   7   XX XX 27 | 27 |
| 1   2   4   XX 7   XX XX 26 | 26 | 3   XX XX 4   27 XX XX XX | 27 | 1   3   XX 4   7   XX XX 27 | 27 |
| 3   XX XX 4   7   XX XX 26 | 26 | 1   3   XX 4   27 XX XX XX | 27 | 2   XX 3   4   7   XX XX 27 | 27 |
| 1   3   XX 4   7   XX XX 26 | 26 | 2   XX 3   4   27 XX XX XX | 27 | 1   2   3   4   7   XX XX 27 | 27 |
| 2   XX 3   4   7   XX XX 26 | 26 | 1   2   3   4   27 XX XX XX | 27 | 5   XX XX XX XX 7   XX 27 | 27 |
| 1   2   3   4   7   XX XX 26 | 26 | 5   XX XX XX XX 27 XX XX | 27 | 1   5   XX XX XX 7   XX 27 | 27 |
| 5   XX XX XX XX 7   XX 26 | 26 | 1   5   XX XX XX 27 XX XX | 27 | 2   XX 5   XX XX 7   XX 27 | 27 |
| 1   5   XX XX XX 7   XX 26 | 26 | 2   XX 5   XX XX 27 XX XX | 27 | 1   2   5   XX XX 7   XX 27 | 27 |
| 2   XX 5   XX XX 7   XX 26 | 26 | 1   2   5   XX XX 27 XX XX | 27 | 3   XX XX 5   XX 7   XX 27 | 27 |
| 1   2   5   XX XX 7   XX 26 | 26 | 3   XX XX 5   XX 27 XX XX | 27 | 1   3   XX 5   XX 7   XX 27 | 27 |
| 3   XX XX 5   XX 7   XX 26 | 26 | 1   3   XX 5   XX 27 XX XX | 27 | 2   XX 3   5   XX 7   XX 27 | 27 |
| 1   3   XX 5   XX 7   XX 26 | 26 | 2   XX 3   5   XX 27 XX XX | 27 | 1   2   3   5   XX 7   XX 27 | 27 |
| 2   XX 3   5   XX 7   XX 26 | 26 | 1   2   3   5   XX 27 XX XX | 27 | 4   XX XX XX 5   7   XX 27 | 27 |
| 1   2   3   5   XX 7   XX 26 | 26 | 4   XX XX XX 5   27 XX XX | 27 | 1   4   XX XX 5   7   XX 27 | 27 |
| 4   XX XX XX 5   7   XX 26 | 26 | 1   4   XX XX 5   27 XX XX | 27 | 2   XX 4   XX 5   7   XX 27 | 27 |
| 1   4   XX XX 5   7   XX 26 | 26 | 2   XX 4   XX 5   27 XX XX | 27 | 1   2   4   XX 5   7   XX 27 | 27 |
| 2   XX 4   XX 5   7   XX 26 | 26 | 1   2   4   XX 5   27 XX XX | 27 | 3   XX XX 4   5   7   XX 27 | 27 |
| 1   2   4   XX 5   7   XX 26 | 26 | 3   XX XX 4   5   27 XX XX | 27 | 1   3   XX 4   5   7   XX 27 | 27 |
| 3   XX XX 4   5   7   XX 26 | 26 | 1   3   XX 4   5   27 XX XX | 27 | 2   XX 3   4   5   7   XX 27 | 27 |
| 1   3   XX 4   5   7   XX 26 | 26 | 2   XX 3   4   5   27 XX XX | 27 | 1   2   3   4   5   7   XX 27 | 27 |
| 2   XX 3   4   5   7   XX 26 | 26 | 1   2   3   4   5   27 XX XX | 27 | 6   XX XX XX XX XX 7   27 | 27 |
| 1   2   3   4   5   7   XX 26 | 26 | 6   XX XX XX XX XX 27 XX | 27 | 1   6   XX XX XX XX 7   27 | 27 |
| 6   XX XX XX XX XX 7   26 | 26 | 1   6   XX XX XX XX 27 XX | 27 | 2   XX 6   XX XX XX 7   27 | 27 |
| 1   6   XX XX XX XX 7   26 | 26 | 2   XX 6   XX XX XX 27 XX | 27 | 1   2   6   XX XX XX 7   27 | 27 |
| 2   XX 6   XX XX XX 7   26 | 26 | 1   2   6   XX XX XX 27 XX | 27 | 3   XX XX 6   XX XX 7   27 | 27 |
| 1   2   6   XX XX XX 7   26 | 26 | 3   XX XX 6   XX XX 27 XX | 27 | 1   3   XX 6   XX XX 7   27 | 27 |
| 3   XX XX 6   XX XX 7   26 | 26 | 1   3   XX 6   XX XX 27 XX | 27 | 2   XX 3   6   XX XX 7   27 | 27 |

| Inputs (from stagger position) 0 1 2 3 4 5 6 7 | Output |
|---|---|
| 1 2 3 6 XX XX 7 27 | 27 |
| 4 XX XX XX 6 XX 7 27 | 27 |
| 1 4 XX XX 6 XX 7 27 | 27 |
| 2 XX 4 XX 6 XX 7 27 | 27 |
| 1 2 4 XX 6 XX 7 27 | 27 |
| 3 XX XX 4 6 XX 7 27 | 27 |
| 1 3 XX 4 6 XX 7 27 | 27 |
| 2 XX 3 4 6 XX 7 27 | 27 |
| 1 2 3 4 6 XX 7 27 | 27 |
| 5 XX XX XX XX 6 7 27 | 27 |
| 1 5 XX XX XX 6 7 27 | 27 |
| 2 XX 5 XX XX 6 7 27 | 27 |
| 1 2 5 XX XX 6 7 27 | 27 |
| 3 XX XX 5 XX 6 7 27 | 27 |
| 1 3 XX 5 XX 6 7 27 | 27 |
| 2 XX 3 5 XX 6 7 27 | 27 |
| 1 2 3 5 XX 6 7 27 | 27 |
| 4 XX XX XX 5 6 7 27 | 27 |
| 1 4 XX XX 5 6 7 27 | 27 |
| 2 XX 4 XX 5 6 7 27 | 27 |
| 1 2 4 XX 5 6 7 27 | 27 |
| 3 XX XX 4 5 6 7 27 | 27 |
| 1 3 XX 4 5 6 7 27 | 27 |
| 2 XX 3 4 5 6 7 27 | 27 |
| 1 2 3 4 5 6 7 27 | 27 |
| 1 28 XX XX XX XX XX XX | 28 |
| 2 XX 28 XX XX XX XX XX | 28 |
| 1 2 28 XX XX XX XX XX | 28 |
| 3 XX XX 28 XX XX XX XX | 28 |
| 1 3 XX 28 XX XX XX XX | 28 |
| 2 XX 3 28 XX XX XX XX | 28 |
| 1 2 3 28 XX XX XX XX | 28 |
| 4 XX XX XX 28 XX XX XX | 28 |
| 1 4 XX XX 28 XX XX XX | 28 |
| 2 XX 4 XX 28 XX XX XX | 28 |
| 1 2 4 XX 28 XX XX XX | 28 |
| 3 XX XX 4 28 XX XX XX | 28 |
| 1 3 XX 4 28 XX XX XX | 28 |
| 2 XX 3 4 28 XX XX XX | 28 |
| 1 2 3 4 28 XX XX XX | 28 |
| 5 XX XX XX XX 28 XX XX | 28 |
| 1 5 XX XX XX 28 XX XX | 28 |
| 2 XX 5 XX XX 28 XX XX | 28 |
| 1 2 5 XX XX 28 XX XX | 28 |
| 3 XX XX 5 XX 28 XX XX | 28 |
| 1 3 XX 5 XX 28 XX XX | 28 |
| 2 XX 3 5 XX 28 XX XX | 28 |
| 1 2 3 5 XX 28 XX XX | 28 |
| 4 XX XX XX 5 28 XX XX | 28 |
| 1 4 XX XX 5 28 XX XX | 28 |
| 2 XX 4 XX 5 28 XX XX | 28 |
| 1 2 4 XX 5 28 XX XX | 28 |
| 3 XX XX 4 5 28 XX XX | 28 |
| 1 3 XX 4 5 28 XX XX | 28 |
| 2 XX 3 4 5 28 XX XX | 28 |
| 1 2 3 4 5 28 XX XX | 28 |
| 6 XX XX XX XX XX 28 XX | 28 |
| 1 6 XX XX XX XX 28 XX | 28 |
| 2 XX 6 XX XX XX 28 XX | 28 |
| 1 2 6 XX XX XX 28 XX | 28 |
| 3 XX XX 6 XX XX 28 XX | 28 |
| 1 3 XX 6 XX XX 28 XX | 28 |
| 2 XX 3 6 XX XX 28 XX | 28 |
| 1 2 3 6 XX XX 28 XX | 28 |
| 4 XX XX XX 6 XX 28 XX | 28 |
| 1 4 XX XX 6 XX 28 XX | 28 |
| 2 XX 4 XX 6 XX 28 XX | 28 |
| 1 2 4 XX 6 XX 28 XX | 28 |
| 3 XX XX 4 6 XX 28 XX | 28 |
| 1 3 XX 4 6 XX 28 XX | 28 |
| 2 XX 3 4 6 XX 28 XX | 28 |
| 1 2 3 4 6 XX 28 XX | 28 |
| 5 XX XX XX XX 6 28 XX | 28 |
| 1 5 XX XX XX 6 28 XX | 28 |
| 2 XX 5 XX XX 6 28 XX | 28 |
| 1 2 5 XX XX 6 28 XX | 28 |
| 3 XX XX 5 XX 6 28 XX | 28 |
| 1 3 XX 5 XX 6 28 XX | 28 |
| 2 XX 3 5 XX 6 28 XX | 28 |
| 1 2 3 5 XX 6 28 XX | 28 |
| 4 XX XX XX 5 6 28 XX | 28 |
| 1 4 XX XX 5 6 28 XX | 28 |
| 2 XX 4 XX 5 6 28 XX | 28 |
| 1 2 4 XX 5 6 28 XX | 28 |
| 3 XX XX 4 5 6 28 XX | 28 |
| 1 3 XX 4 5 6 28 XX | 28 |
| 2 XX 3 4 5 6 28 XX | 28 |
| 1 2 3 4 5 6 28 XX | 28 |
| 7 XX XX XX XX XX XX 28 | 28 |
| 1 7 XX XX XX XX XX 28 | 28 |
| 2 XX 7 XX XX XX XX 28 | 28 |
| 1 2 7 XX XX XX XX 28 | 28 |
| 3 XX XX 7 XX XX XX 28 | 28 |
| 1 3 XX 7 XX XX XX 28 | 28 |
| 2 XX 3 7 XX XX XX 28 | 28 |
| 1 2 3 7 XX XX XX 28 | 28 |
| 4 XX XX XX 7 XX XX 28 | 28 |
| 1 4 XX XX 7 XX XX 28 | 28 |
| 2 XX 4 XX 7 XX XX 28 | 28 |
| 1 2 4 XX 7 XX XX 28 | 28 |
| 3 XX XX 4 7 XX XX 28 | 28 |
| 1 3 XX 4 7 XX XX 28 | 28 |
| 2 XX 3 4 7 XX XX 28 | 28 |
| 1 2 3 4 7 XX XX 28 | 28 |
| 5 XX XX XX XX 7 XX 28 | 28 |
| 1 5 XX XX XX 7 XX 28 | 28 |
| 2 XX 5 XX XX 7 XX 28 | 28 |
| 1 2 5 XX XX 7 XX 28 | 28 |
| 3 XX XX 5 XX 7 XX 28 | 28 |
| 1 3 XX 5 XX 7 XX 28 | 28 |
| 2 XX 3 5 XX 7 XX 28 | 28 |
| 1 2 3 5 XX 7 XX 28 | 28 |
| 4 XX XX XX 5 7 XX 28 | 28 |
| 1 4 XX XX 5 7 XX 28 | 28 |
| 2 XX 4 XX 5 7 XX 28 | 28 |
| 1 2 4 XX 5 7 XX 28 | 28 |
| 3 XX XX 4 5 7 XX 28 | 28 |
| 1 3 XX 4 5 7 XX 28 | 28 |
| 2 XX 3 4 5 7 XX 28 | 28 |
| 1 2 3 4 5 7 XX 28 | 28 |
| 6 XX XX XX XX XX 7 28 | 28 |
| 1 6 XX XX XX XX 7 28 | 28 |
| 2 XX 6 XX XX XX 7 28 | 28 |
| 1 2 6 XX XX XX 7 28 | 28 |
| 3 XX XX 6 XX XX 7 28 | 28 |
| 1 3 XX 6 XX XX 7 28 | 28 |
| 2 XX 3 6 XX XX 7 28 | 28 |
| 1 2 3 6 XX XX 7 28 | 28 |
| 4 XX XX XX 6 XX 7 28 | 28 |
| 1 4 XX XX 6 XX 7 28 | 28 |
| 2 XX 4 XX 6 XX 7 28 | 28 |
| 1 2 4 XX 6 XX 7 28 | 28 |
| 3 XX XX 4 6 XX 7 28 | 28 |
| 1 3 XX 4 6 XX 7 28 | 28 |
| 2 XX 3 4 6 XX 7 28 | 28 |
| 1 2 3 4 6 XX 7 28 | 28 |
| 5 XX XX XX XX 6 7 28 | 28 |
| 1 5 XX XX XX 6 7 28 | 28 |
| 2 XX 5 XX XX 6 7 28 | 28 |
| 1 2 5 XX XX 6 7 28 | 28 |
| 3 XX XX 5 XX 6 7 28 | 28 |
| 1 3 XX 5 XX 6 7 28 | 28 |
| 2 XX 3 5 XX 6 7 28 | 28 |
| 1 2 3 5 XX 6 7 28 | 28 |
| 4 XX XX XX 5 6 7 28 | 28 |
| 1 4 XX XX 5 6 7 28 | 28 |
| 2 XX 4 XX 5 6 7 28 | 28 |
| 1 2 4 XX 5 6 7 28 | 28 |
| 3 XX XX 4 5 6 7 28 | 28 |
| 1 3 XX 4 5 6 7 28 | 28 |
| 2 XX 3 4 5 6 7 28 | 28 |
| 1 2 3 4 5 6 7 28 | 28 |
| 2 XX 29 XX XX XX XX XX | 29 |
| 1 2 29 XX XX XX XX XX | 29 |
| 3 XX XX 29 XX XX XX XX | 29 |
| 1 3 XX 29 XX XX XX XX | 29 |
| 2 XX 3 29 XX XX XX XX | 29 |
| 1 2 3 29 XX XX XX XX | 29 |
| 4 XX XX XX 29 XX XX XX | 29 |
| 1 4 XX XX 29 XX XX XX | 29 |
| 2 XX 4 XX 29 XX XX XX | 29 |
| 1 2 4 XX 29 XX XX XX | 29 |
| 3 XX XX 4 29 XX XX XX | 29 |
| 1 3 XX 4 29 XX XX XX | 29 |
| 2 XX 3 4 29 XX XX XX | 29 |
| 1 2 3 4 29 XX XX XX | 29 |
| 5 XX XX XX XX 29 XX XX | 29 |
| 1 5 XX XX XX 29 XX XX | 29 |
| 2 XX 5 XX XX 29 XX XX | 29 |
| 1 2 5 XX XX 29 XX XX | 29 |
| 3 XX XX 5 XX 29 XX XX | 29 |
| 1 3 XX 5 XX 29 XX XX | 29 |
| 2 XX 3 5 XX 29 XX XX | 29 |
| 1 2 3 5 XX 29 XX XX | 29 |
| 4 XX XX XX 5 29 XX XX | 29 |
| 1 4 XX XX 5 29 XX XX | 29 |
| 2 XX 4 XX 5 29 XX XX | 29 |
| 1 2 4 XX 5 29 XX XX | 29 |
| 3 XX XX 4 5 29 XX XX | 29 |
| 1 3 XX 4 5 29 XX XX | 29 |
| 2 XX 3 4 5 29 XX XX | 29 |
| 1 2 3 4 5 29 XX XX | 29 |
| 6 XX XX XX XX XX 29 XX | 29 |
| 1 6 XX XX XX XX 29 XX | 29 |
| 2 XX 6 XX XX XX 29 XX | 29 |
| 1 2 6 XX XX XX 29 XX | 29 |
| 3 XX XX 6 XX XX 29 XX | 29 |
| 1 3 XX 6 XX XX 29 XX | 29 |
| 2 XX 3 6 XX XX 29 XX | 29 |
| 1 2 3 6 XX XX 29 XX | 29 |
| 4 XX XX XX 6 XX 29 XX | 29 |
| 1 4 XX XX 6 XX 29 XX | 29 |
| 2 XX 4 XX 6 XX 29 XX | 29 |
| 1 2 4 XX 6 XX 29 XX | 29 |
| 3 XX XX 4 6 XX 29 XX | 29 |

| Inputs (from stagger position) 0 | 1 | 2 | 3 | 4 | 5 | 6 | 7 | Output |
|---|---|---|---|---|---|---|---|---|
| 1 | 3 | XX | 4 | 6 | XX | 29 | XX | 29 |
| 2 | XX | 3 | 4 | 6 | XX | 29 | XX | 29 |
| 1 | 2 | 3 | 4 | 6 | XX | 29 | XX | 29 |
| 5 | XX | XX | XX | XX | 6 | 29 | XX | 29 |
| 1 | 5 | XX | XX | XX | 6 | 29 | XX | 29 |
| 2 | XX | 5 | XX | XX | 6 | 29 | XX | 29 |
| 1 | 2 | 5 | XX | XX | 6 | 29 | XX | 29 |
| 3 | XX | XX | 5 | XX | 6 | 29 | XX | 29 |
| 1 | 3 | XX | 5 | XX | 6 | 29 | XX | 29 |
| 2 | XX | 3 | 5 | XX | 6 | 29 | XX | 29 |
| 1 | 2 | 3 | 5 | XX | 6 | 29 | XX | 29 |
| 4 | XX | XX | XX | 5 | 6 | 29 | XX | 29 |
| 1 | 4 | XX | XX | 5 | 6 | 29 | XX | 29 |
| 2 | XX | 4 | XX | 5 | 6 | 29 | XX | 29 |
| 1 | 2 | 4 | XX | 5 | 6 | 29 | XX | 29 |
| 3 | XX | XX | 4 | 5 | 6 | 29 | XX | 29 |
| 1 | 3 | XX | 4 | 5 | 6 | 29 | XX | 29 |
| 2 | XX | 3 | 4 | 5 | 6 | 29 | XX | 29 |
| 1 | 2 | 3 | 4 | 5 | 6 | 29 | XX | 29 |
| 7 | XX | XX | XX | XX | XX | XX | 29 | 29 |
| 1 | 7 | XX | XX | XX | XX | XX | 29 | 29 |
| 2 | XX | 7 | XX | XX | XX | XX | 29 | 29 |
| 1 | 2 | 7 | XX | XX | XX | XX | 29 | 29 |
| 3 | XX | XX | 7 | XX | XX | XX | 29 | 29 |
| 1 | 3 | XX | 7 | XX | XX | XX | 29 | 29 |
| 2 | XX | 3 | 7 | XX | XX | XX | 29 | 29 |
| 1 | 2 | 3 | 7 | XX | XX | XX | 29 | 29 |
| 4 | XX | XX | XX | 7 | XX | XX | 29 | 29 |
| 1 | 4 | XX | XX | 7 | XX | XX | 29 | 29 |
| 2 | XX | 4 | XX | 7 | XX | XX | 29 | 29 |
| 1 | 2 | 4 | XX | 7 | XX | XX | 29 | 29 |
| 3 | XX | XX | 4 | 7 | XX | XX | 29 | 29 |
| 1 | 3 | XX | 4 | 7 | XX | XX | 29 | 29 |
| 2 | XX | 3 | 4 | 7 | XX | XX | 29 | 29 |
| 1 | 2 | 3 | 4 | 7 | XX | XX | 29 | 29 |
| 5 | XX | XX | XX | XX | 7 | XX | 29 | 29 |
| 1 | 5 | XX | XX | XX | 7 | XX | 29 | 29 |
| 2 | XX | 5 | XX | XX | 7 | XX | 29 | 29 |
| 1 | 2 | 5 | XX | XX | 7 | XX | 29 | 29 |
| 3 | XX | XX | 5 | XX | 7 | XX | 29 | 29 |
| 1 | 3 | XX | 5 | XX | 7 | XX | 29 | 29 |
| 2 | XX | 3 | 5 | XX | 7 | XX | 29 | 29 |
| 1 | 2 | 3 | 5 | XX | 7 | XX | 29 | 29 |
| 4 | XX | XX | XX | 5 | 7 | XX | 29 | 29 |
| 1 | 4 | XX | XX | 5 | 7 | XX | 29 | 29 |
| 2 | XX | 4 | XX | 5 | 7 | XX | 29 | 29 |
| 1 | 2 | 4 | XX | 5 | 7 | XX | 29 | 29 |
| 3 | XX | XX | 4 | 5 | 7 | XX | 29 | 29 |
| 1 | 3 | XX | 4 | 5 | 7 | XX | 29 | 29 |
| 2 | XX | 3 | 4 | 5 | 7 | XX | 29 | 29 |
| 1 | 2 | 3 | 4 | 5 | 7 | XX | 29 | 29 |
| 6 | XX | XX | XX | XX | XX | 7 | 29 | 29 |
| 1 | 6 | XX | XX | XX | XX | 7 | 29 | 29 |
| 2 | XX | 6 | XX | XX | XX | 7 | 29 | 29 |
| 1 | 2 | 6 | XX | XX | XX | 7 | 29 | 29 |
| 3 | XX | XX | 6 | XX | XX | 7 | 29 | 29 |
| 1 | 3 | XX | 6 | XX | XX | 7 | 29 | 29 |
| 2 | XX | 3 | 6 | XX | XX | 7 | 29 | 29 |
| 1 | 2 | 3 | 6 | XX | XX | 7 | 29 | 29 |
| 4 | XX | XX | XX | 6 | XX | 7 | 29 | 29 |
| 1 | 4 | XX | XX | 6 | XX | 7 | 29 | 29 |
| 2 | XX | 4 | XX | 6 | XX | 7 | 29 | 29 |
| 1 | 2 | 4 | XX | 6 | XX | 7 | 29 | 29 |
| 3 | XX | XX | 4 | 6 | XX | 7 | 29 | 29 |
| 1 | 3 | XX | 4 | 6 | XX | 7 | 29 | 29 |
| 2 | XX | 3 | 4 | 6 | XX | 7 | 29 | 29 |
| 1 | 2 | 3 | 4 | 6 | XX | 7 | 29 | 29 |
| 5 | XX | XX | XX | XX | 6 | 7 | 29 | 29 |
| 1 | 5 | XX | XX | XX | 6 | 7 | 29 | 29 |
| 2 | XX | 5 | XX | XX | 6 | 7 | 29 | 29 |
| 1 | 2 | 5 | XX | XX | 6 | 7 | 29 | 29 |
| 3 | XX | XX | 5 | XX | 6 | 7 | 29 | 29 |
| 1 | 3 | XX | 5 | XX | 6 | 7 | 29 | 29 |
| 2 | XX | 3 | 5 | XX | 6 | 7 | 29 | 29 |
| 1 | 2 | 3 | 5 | XX | 6 | 7 | 29 | 29 |
| 4 | XX | XX | XX | 5 | 6 | 7 | 29 | 29 |
| 1 | 4 | XX | XX | 5 | 6 | 7 | 29 | 29 |
| 2 | XX | 4 | XX | 5 | 6 | 7 | 29 | 29 |
| 1 | 2 | 4 | XX | 5 | 6 | 7 | 29 | 29 |
| 3 | XX | XX | 4 | 5 | 6 | 7 | 29 | 29 |
| 1 | 3 | XX | 4 | 5 | 6 | 7 | 29 | 29 |
| 2 | XX | 3 | 4 | 5 | 6 | 7 | 29 | 29 |
| 1 | 2 | 3 | 4 | 5 | 6 | 7 | 29 | 29 |
| 3 | XX | XX | 30 | XX | XX | XX | XX | 30 |
| 1 | 3 | XX | 30 | XX | XX | XX | XX | 30 |
| 2 | XX | 3 | 30 | XX | XX | XX | XX | 30 |
| 1 | 2 | 3 | 30 | XX | XX | XX | XX | 30 |
| 4 | XX | XX | XX | 30 | XX | XX | XX | 30 |
| 1 | 4 | XX | XX | 30 | XX | XX | XX | 30 |
| 2 | XX | 4 | XX | 30 | XX | XX | XX | 30 |
| 1 | 2 | 4 | XX | 30 | XX | XX | XX | 30 |
| 3 | XX | XX | 4 | 30 | XX | XX | XX | 30 |
| 1 | 3 | XX | 4 | 30 | XX | XX | XX | 30 |
| 2 | XX | 3 | 4 | 30 | XX | XX | XX | 30 |
| 1 | 2 | 3 | 4 | 30 | XX | XX | XX | 30 |
| 5 | XX | XX | XX | XX | 30 | XX | XX | 30 |
| 1 | 5 | XX | XX | XX | 30 | XX | XX | 30 |
| 2 | XX | 5 | XX | XX | 30 | XX | XX | 30 |
| 1 | 2 | 5 | XX | XX | 30 | XX | XX | 30 |
| 3 | XX | XX | 5 | XX | 30 | XX | XX | 30 |
| 1 | 3 | XX | 5 | XX | 30 | XX | XX | 30 |
| 2 | XX | 3 | 5 | XX | 30 | XX | XX | 30 |
| 1 | 2 | 3 | 5 | XX | 30 | XX | XX | 30 |
| 4 | XX | XX | XX | 5 | 30 | XX | XX | 30 |
| 1 | 4 | XX | XX | 5 | 30 | XX | XX | 30 |
| 2 | XX | 4 | XX | 5 | 30 | XX | XX | 30 |
| 1 | 2 | 4 | XX | 5 | 30 | XX | XX | 30 |
| 3 | XX | XX | 4 | 5 | 30 | XX | XX | 30 |
| 1 | 3 | XX | 4 | 5 | 30 | XX | XX | 30 |
| 2 | XX | 3 | 4 | 5 | 30 | XX | XX | 30 |
| 1 | 2 | 3 | 4 | 5 | 30 | XX | XX | 30 |
| 6 | XX | XX | XX | XX | XX | 30 | XX | 30 |
| 1 | 6 | XX | XX | XX | XX | 30 | XX | 30 |
| 2 | XX | 6 | XX | XX | XX | 30 | XX | 30 |
| 1 | 2 | 6 | XX | XX | XX | 30 | XX | 30 |
| 3 | XX | XX | 6 | XX | XX | 30 | XX | 30 |
| 1 | 3 | XX | 6 | XX | XX | 30 | XX | 30 |
| 2 | XX | 3 | 6 | XX | XX | 30 | XX | 30 |
| 1 | 2 | 3 | 6 | XX | XX | 30 | XX | 30 |
| 4 | XX | XX | XX | 6 | XX | 30 | XX | 30 |
| 1 | 4 | XX | XX | 6 | XX | 30 | XX | 30 |
| 2 | XX | 4 | XX | 6 | XX | 30 | XX | 30 |
| 1 | 2 | 4 | XX | 6 | XX | 30 | XX | 30 |
| 3 | XX | XX | 4 | 6 | XX | 30 | XX | 30 |
| 1 | 3 | XX | 4 | 6 | XX | 30 | XX | 30 |
| 2 | XX | 3 | 4 | 6 | XX | 30 | XX | 30 |
| 1 | 2 | 3 | 4 | 6 | XX | 30 | XX | 30 |
| 5 | XX | XX | XX | XX | 6 | 30 | XX | 30 |
| 1 | 5 | XX | XX | XX | 6 | 30 | XX | 30 |
| 2 | XX | 5 | XX | XX | 6 | 30 | XX | 30 |
| 1 | 2 | 5 | XX | XX | 6 | 30 | XX | 30 |
| 3 | XX | XX | 5 | XX | 6 | 30 | XX | 30 |
| 1 | 3 | XX | 5 | XX | 6 | 30 | XX | 30 |
| 2 | XX | 3 | 5 | XX | 6 | 30 | XX | 30 |
| 1 | 2 | 3 | 5 | XX | 6 | 30 | XX | 30 |
| 4 | XX | XX | XX | 5 | 6 | 30 | XX | 30 |
| 1 | 4 | XX | XX | 5 | 6 | 30 | XX | 30 |
| 2 | XX | 4 | XX | 5 | 6 | 30 | XX | 30 |
| 1 | 2 | 4 | XX | 5 | 6 | 30 | XX | 30 |
| 3 | XX | XX | 4 | 5 | 6 | 30 | XX | 30 |
| 1 | 3 | XX | 4 | 5 | 6 | 30 | XX | 30 |
| 2 | XX | 3 | 4 | 5 | 6 | 30 | XX | 30 |
| 1 | 2 | 3 | 4 | 5 | 6 | 30 | XX | 30 |
| 7 | XX | XX | XX | XX | XX | XX | 30 | 30 |
| 1 | 7 | XX | XX | XX | XX | XX | 30 | 30 |
| 2 | XX | 7 | XX | XX | XX | XX | 30 | 30 |
| 1 | 2 | 7 | XX | XX | XX | XX | 30 | 30 |
| 3 | XX | XX | 7 | XX | XX | XX | 30 | 30 |
| 1 | 3 | XX | 7 | XX | XX | XX | 30 | 30 |
| 2 | XX | 3 | 7 | XX | XX | XX | 30 | 30 |
| 1 | 2 | 3 | 7 | XX | XX | XX | 30 | 30 |
| 4 | XX | XX | XX | 7 | XX | XX | 30 | 30 |
| 1 | 4 | XX | XX | 7 | XX | XX | 30 | 30 |
| 2 | XX | 4 | XX | 7 | XX | XX | 30 | 30 |
| 1 | 2 | 4 | XX | 7 | XX | XX | 30 | 30 |
| 3 | XX | XX | 4 | 7 | XX | XX | 30 | 30 |
| 1 | 3 | XX | 4 | 7 | XX | XX | 30 | 30 |
| 2 | XX | 3 | 4 | 7 | XX | XX | 30 | 30 |
| 1 | 2 | 3 | 4 | 7 | XX | XX | 30 | 30 |
| 5 | XX | XX | XX | XX | 7 | XX | 30 | 30 |
| 1 | 5 | XX | XX | XX | 7 | XX | 30 | 30 |
| 2 | XX | 5 | XX | XX | 7 | XX | 30 | 30 |
| 1 | 2 | 5 | XX | XX | 7 | XX | 30 | 30 |
| 3 | XX | XX | 5 | XX | 7 | XX | 30 | 30 |
| 1 | 3 | XX | 5 | XX | 7 | XX | 30 | 30 |
| 2 | XX | 3 | 5 | XX | 7 | XX | 30 | 30 |
| 1 | 2 | 3 | 5 | XX | 7 | XX | 30 | 30 |
| 4 | XX | XX | XX | 5 | 7 | XX | 30 | 30 |
| 1 | 4 | XX | XX | 5 | 7 | XX | 30 | 30 |
| 2 | XX | 4 | XX | 5 | 7 | XX | 30 | 30 |
| 1 | 2 | 4 | XX | 5 | 7 | XX | 30 | 30 |
| 3 | XX | XX | 4 | 5 | 7 | XX | 30 | 30 |
| 1 | 3 | XX | 4 | 5 | 7 | XX | 30 | 30 |
| 2 | XX | 3 | 4 | 5 | 7 | XX | 30 | 30 |
| 1 | 2 | 3 | 4 | 5 | 7 | XX | 30 | 30 |
| 6 | XX | XX | XX | XX | XX | 7 | 30 | 30 |
| 1 | 6 | XX | XX | XX | XX | 7 | 30 | 30 |
| 2 | XX | 6 | XX | XX | XX | 7 | 30 | 30 |
| 1 | 2 | 6 | XX | XX | XX | 7 | 30 | 30 |
| 3 | XX | XX | 6 | XX | XX | 7 | 30 | 30 |
| 1 | 3 | XX | 6 | XX | XX | 7 | 30 | 30 |
| 2 | XX | 3 | 6 | XX | XX | 7 | 30 | 30 |
| 1 | 2 | 3 | 6 | XX | XX | 7 | 30 | 30 |
| 4 | XX | XX | XX | 6 | XX | 7 | 30 | 30 |
| 1 | 4 | XX | XX | 6 | XX | 7 | 30 | 30 |
| 2 | XX | 4 | XX | 6 | XX | 7 | 30 | 30 |
| 1 | 2 | 4 | XX | 6 | XX | 7 | 30 | 30 |
| 3 | XX | XX | 4 | 6 | XX | 7 | 30 | 30 |
| 1 | 3 | XX | 4 | 6 | XX | 7 | 30 | 30 |
| 2 | XX | 3 | 4 | 6 | XX | 7 | 30 | 30 |
| 1 | 2 | 3 | 4 | 6 | XX | 7 | 30 | 30 |
| 5 | XX | XX | XX | XX | 6 | 7 | 30 | 30 |
| 1 | 5 | XX | XX | XX | 6 | 7 | 30 | 30 |
| 2 | XX | 5 | XX | XX | 6 | 7 | 30 | 30 |
| 1 | 2 | 5 | XX | XX | 6 | 7 | 30 | 30 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 3  XX XX 5  XX 6  7  30 | 30 | 1  3  XX 4  5  6  31 XX | 31 | 2  XX 3  4  5  6  7  31 | 31 |
| 1  3  XX 5  XX 6  7  30 | 30 | 2  XX 3  4  5  6  31 XX | 31 | 1  2  3  4  5  6  7  31 | 31 |
| 2  XX 3  5  XX 6  7  30 | 30 | 1  2  3  4  5  6  31 XX | 31 | 5  XX XX XX XX 32 XX XX | 32 |
| 1  2  3  5  XX 6  7  30 | 30 | 7  XX XX XX XX XX XX 31 | 31 | 1  5  XX XX XX 32 XX XX | 32 |
| 4  XX XX XX 5  6  7  30 | 30 | 1  7  XX XX XX XX XX 31 | 31 | 2  XX 5  XX XX 32 XX XX | 32 |
| 1  4  XX XX 5  6  7  30 | 30 | 2  XX 7  XX XX XX XX 31 | 31 | 1  2  5  XX XX 32 XX XX | 32 |
| 2  XX 4  XX 5  6  7  30 | 30 | 1  2  7  XX XX XX XX 31 | 31 | 3  XX XX 5  XX 32 XX XX | 32 |
| 1  2  4  XX 5  6  7  30 | 30 | 3  XX XX 7  XX XX XX 31 | 31 | 1  3  XX 5  XX 32 XX XX | 32 |
| 3  XX XX 4  5  6  7  30 | 30 | 1  3  XX 7  XX XX XX 31 | 31 | 2  XX 3  5  XX 32 XX XX | 32 |
| 1  3  XX 4  5  6  7  30 | 30 | 2  XX 3  7  XX XX XX 31 | 31 | 1  2  3  5  XX 32 XX XX | 32 |
| 2  XX 3  4  5  6  7  30 | 30 | 1  2  3  7  XX XX XX 31 | 31 | 4  XX XX XX 5  32 XX XX | 32 |
| 1  2  3  4  5  6  7  30 | 30 | 4  XX XX XX 7  XX XX 31 | 31 | 1  4  XX XX 5  32 XX XX | 32 |
| 4  XX XX XX 31 XX XX XX | 31 | 1  4  XX XX 7  XX XX 31 | 31 | 2  XX 4  XX 5  32 XX XX | 32 |
| 1  4  XX XX 31 XX XX XX | 31 | 2  XX 4  XX 7  XX XX 31 | 31 | 1  2  4  XX 5  32 XX XX | 32 |
| 2  XX 4  XX 31 XX XX XX | 31 | 1  2  4  XX 7  XX XX 31 | 31 | 3  XX XX 4  5  32 XX XX | 32 |
| 1  2  4  XX 31 XX XX XX | 31 | 3  XX XX 4  7  XX XX 31 | 31 | 1  3  XX 4  5  32 XX XX | 32 |
| 3  XX XX 4  31 XX XX XX | 31 | 1  3  XX 4  7  XX XX 31 | 31 | 2  XX 3  4  5  32 XX XX | 32 |
| 1  3  XX 4  31 XX XX XX | 31 | 2  XX 3  4  7  XX XX 31 | 31 | 1  2  3  4  5  32 XX XX | 32 |
| 2  XX 3  4  31 XX XX XX | 31 | 1  2  3  4  7  XX XX 31 | 31 | 6  XX XX XX XX XX 32 XX | 32 |
| 1  2  3  4  31 XX XX XX | 31 | 5  XX XX XX XX 7  XX 31 | 31 | 1  6  XX XX XX XX 32 XX | 32 |
| 5  XX XX XX XX 31 XX XX | 31 | 1  5  XX XX XX 7  XX 31 | 31 | 2  XX 6  XX XX XX 32 XX | 32 |
| 1  5  XX XX XX 31 XX XX | 31 | 2  XX 5  XX XX 7  XX 31 | 31 | 1  2  6  XX XX XX 32 XX | 32 |
| 2  XX 5  XX XX 31 XX XX | 31 | 1  2  5  XX XX 7  XX 31 | 31 | 3  XX XX 6  XX XX 32 XX | 32 |
| 1  2  5  XX XX 31 XX XX | 31 | 3  XX XX 5  XX 7  XX 31 | 31 | 1  3  XX 6  XX XX 32 XX | 32 |
| 3  XX XX 5  XX 31 XX XX | 31 | 1  3  XX 5  XX 7  XX 31 | 31 | 2  XX 3  6  XX XX 32 XX | 32 |
| 1  3  XX 5  XX 31 XX XX | 31 | 2  XX 3  5  XX 7  XX 31 | 31 | 1  2  3  6  XX XX 32 XX | 32 |
| 2  XX 3  5  XX 31 XX XX | 31 | 1  2  3  5  XX 7  XX 31 | 31 | 4  XX XX XX 6  XX 32 XX | 32 |
| 1  2  3  5  XX 31 XX XX | 31 | 4  XX XX XX 5  7  XX 31 | 31 | 1  4  XX XX 6  XX 32 XX | 32 |
| 4  XX XX XX 5  31 XX XX | 31 | 1  4  XX XX 5  7  XX 31 | 31 | 2  XX 4  XX 6  XX 32 XX | 32 |
| 1  4  XX XX 5  31 XX XX | 31 | 2  XX 4  XX 5  7  XX 31 | 31 | 1  2  4  XX 6  XX 32 XX | 32 |
| 2  XX 4  XX 5  31 XX XX | 31 | 1  2  4  XX 5  7  XX 31 | 31 | 3  XX XX 4  6  XX 32 XX | 32 |
| 1  2  4  XX 5  31 XX XX | 31 | 3  XX XX 4  5  7  XX 31 | 31 | 1  3  XX 4  6  XX 32 XX | 32 |
| 3  XX XX 4  5  31 XX XX | 31 | 1  3  XX 4  5  7  XX 31 | 31 | 2  XX 3  4  6  XX 32 XX | 32 |
| 1  3  XX 4  5  31 XX XX | 31 | 2  XX 3  4  5  7  XX 31 | 31 | 1  2  3  4  6  XX 32 XX | 32 |
| 2  XX 3  4  5  31 XX XX | 31 | 1  2  3  4  5  7  XX 31 | 31 | 5  XX XX XX XX 6  32 XX | 32 |
| 1  2  3  4  5  31 XX XX | 31 | 6  XX XX XX XX XX 7  31 | 31 | 1  5  XX XX XX 6  32 XX | 32 |
| 6  XX XX XX XX XX 31 XX | 31 | 1  6  XX XX XX XX 7  31 | 31 | 2  XX 5  XX XX 6  32 XX | 32 |
| 1  6  XX XX XX XX 31 XX | 31 | 2  XX 6  XX XX XX 7  31 | 31 | 1  2  5  XX XX 6  32 XX | 32 |
| 2  XX 6  XX XX XX 31 XX | 31 | 1  2  6  XX XX XX 7  31 | 31 | 3  XX XX 5  XX 6  32 XX | 32 |
| 1  2  6  XX XX XX 31 XX | 31 | 3  XX XX 6  XX XX 7  31 | 31 | 1  3  XX 5  XX 6  32 XX | 32 |
| 3  XX XX 6  XX XX 31 XX | 31 | 1  3  XX 6  XX XX 7  31 | 31 | 2  XX 3  5  XX 6  32 XX | 32 |
| 1  3  XX 6  XX XX 31 XX | 31 | 2  XX 3  6  XX XX 7  31 | 31 | 1  2  3  5  XX 6  32 XX | 32 |
| 2  XX 3  6  XX XX 31 XX | 31 | 1  2  3  6  XX XX 7  31 | 31 | 4  XX XX XX 5  6  32 XX | 32 |
| 1  2  3  6  XX XX 31 XX | 31 | 4  XX XX XX 6  XX 7  31 | 31 | 1  4  XX XX 5  6  32 XX | 32 |
| 4  XX XX XX 6  XX 31 XX | 31 | 1  4  XX XX 6  XX 7  31 | 31 | 2  XX 4  XX 5  6  32 XX | 32 |
| 1  4  XX XX 6  XX 31 XX | 31 | 2  XX 4  XX 6  XX 7  31 | 31 | 1  2  4  XX 5  6  32 XX | 32 |
| 2  XX 4  XX 6  XX 31 XX | 31 | 1  2  4  XX 6  XX 7  31 | 31 | 3  XX XX 4  5  6  32 XX | 32 |
| 1  2  4  XX 6  XX 31 XX | 31 | 3  XX XX 4  6  XX 7  31 | 31 | 1  3  XX 4  5  6  32 XX | 32 |
| 3  XX XX 4  6  XX 31 XX | 31 | 1  3  XX 4  6  XX 7  31 | 31 | 2  XX 3  4  5  6  32 XX | 32 |
| 1  3  XX 4  6  XX 31 XX | 31 | 2  XX 3  4  6  XX 7  31 | 31 | 1  2  3  4  5  6  32 XX | 32 |
| 2  XX 3  4  6  XX 31 XX | 31 | 1  2  3  4  6  XX 7  31 | 31 | 7  XX XX XX XX XX XX 32 | 32 |
| 1  2  3  4  6  XX 31 XX | 31 | 5  XX XX XX XX 6  7  31 | 31 | 1  7  XX XX XX XX XX 32 | 32 |
| 5  XX XX XX XX 6  31 XX | 31 | 1  5  XX XX XX 6  7  31 | 31 | 2  XX 7  XX XX XX XX 32 | 32 |
| 1  5  XX XX XX 6  31 XX | 31 | 2  XX 5  XX XX 6  7  31 | 31 | 1  2  7  XX XX XX XX 32 | 32 |
| 2  XX 5  XX XX 6  31 XX | 31 | 1  2  5  XX XX 6  7  31 | 31 | 3  XX XX 7  XX XX XX 32 | 32 |
| 1  2  5  XX XX 6  31 XX | 31 | 3  XX XX 5  XX 6  7  31 | 31 | 1  3  XX 7  XX XX XX 32 | 32 |
| 3  XX XX 5  XX 6  31 XX | 31 | 1  3  XX 5  XX 6  7  31 | 31 | 2  XX 3  7  XX XX XX 32 | 32 |
| 1  3  XX 5  XX 6  31 XX | 31 | 2  XX 3  5  XX 6  7  31 | 31 | 1  2  3  7  XX XX XX 32 | 32 |
| 2  XX 3  5  XX 6  31 XX | 31 | 1  2  3  5  XX 6  7  31 | 31 | 4  XX XX XX 7  XX XX 32 | 32 |
| 1  2  3  5  XX 6  31 XX | 31 | 4  XX XX XX 5  6  7  31 | 31 | 1  4  XX XX 7  XX XX 32 | 32 |
| 4  XX XX XX 5  6  31 XX | 31 | 1  4  XX XX 5  6  7  31 | 31 | 2  XX 4  XX 7  XX XX 32 | 32 |
| 1  4  XX XX 5  6  31 XX | 31 | 2  XX 4  XX 5  6  7  31 | 31 | 1  2  4  XX 7  XX XX 32 | 32 |
| 2  XX 4  XX 5  6  31 XX | 31 | 1  2  4  XX 5  6  7  31 | 31 | 3  XX XX 4  7  XX XX 32 | 32 |
| 1  2  4  XX 5  6  31 XX | 31 | 3  XX XX 4  5  6  7  31 | 31 | 1  3  XX 4  7  XX XX 32 | 32 |
| 3  XX XX 4  5  6  31 XX | 31 | 1  3  XX 4  5  6  7  31 | 31 | 2  XX 3  4  7  XX XX 32 | 32 |

| Inputs (from stagger position) 0 1 2 3 4 5 6 7 | Output | Inputs (from stagger position) 0 1 2 3 4 5 6 7 | Output | Inputs (from stagger position) 0 1 2 3 4 5 6 7 | Output |
|---|---|---|---|---|---|
| 1 2 3 4 7 XX XX 32 | 32 | 5 XX XX XX XX 6 33 XX | 33 | 1 5 XX XX XX 6 7 33 | 33 |
| 5 XX XX XX XX 7 XX 32 | 32 | 1 5 XX XX XX 6 33 XX | 33 | 2 XX 5 XX XX 6 7 33 | 33 |
| 1 5 XX XX XX 7 XX 32 | 32 | 2 XX 5 XX XX 6 33 XX | 33 | 1 2 5 XX XX 6 7 33 | 33 |
| 2 XX 5 XX XX 7 XX 32 | 32 | 1 2 5 XX XX 6 33 XX | 33 | 3 XX XX 5 XX 6 7 33 | 33 |
| 1 2 5 XX XX 7 XX 32 | 32 | 3 XX XX 5 XX 6 33 XX | 33 | 1 3 XX 5 XX 6 7 33 | 33 |
| 3 XX XX 5 XX 7 XX 32 | 32 | 1 3 XX 5 XX 6 33 XX | 33 | 2 XX 3 5 XX 6 7 33 | 33 |
| 1 3 XX 5 XX 7 XX 32 | 32 | 2 XX 3 5 XX 6 33 XX | 33 | 1 2 3 5 XX 6 7 33 | 33 |
| 2 XX 3 5 XX 7 XX 32 | 32 | 1 2 3 5 XX 6 33 XX | 33 | 4 XX XX XX 5 6 7 33 | 33 |
| 1 2 3 5 XX 7 XX 32 | 32 | 4 XX XX XX 5 6 33 XX | 33 | 1 4 XX XX 5 6 7 33 | 33 |
| 4 XX XX XX 5 7 XX 32 | 32 | 1 4 XX XX 5 6 33 XX | 33 | 2 XX 4 XX 5 6 7 33 | 33 |
| 1 4 XX XX 5 7 XX 32 | 32 | 2 XX 4 XX 5 6 33 XX | 33 | 1 2 4 XX 5 6 7 33 | 33 |
| 2 XX 4 XX 5 7 XX 32 | 32 | 1 2 4 XX 5 6 33 XX | 33 | 3 XX XX 4 5 6 7 33 | 33 |
| 1 2 4 XX 5 7 XX 32 | 32 | 3 XX XX 4 5 6 33 XX | 33 | 1 3 XX 4 5 6 7 33 | 33 |
| 3 XX XX 4 5 7 XX 32 | 32 | 1 3 XX 4 5 6 33 XX | 33 | 2 XX 3 4 5 6 7 33 | 33 |
| 1 3 XX 4 5 7 XX 32 | 32 | 2 XX 3 4 5 6 33 XX | 33 | 1 2 3 4 5 6 7 33 | 33 |
| 2 XX 3 4 5 7 XX 32 | 32 | 1 2 3 4 5 6 33 XX | 33 | 7 XX XX XX XX XX XX 34 | 34 |
| 1 2 3 4 5 7 XX 32 | 32 | 7 XX XX XX XX XX 33 | 33 | 1 7 XX XX XX XX XX 34 | 34 |
| 6 XX XX XX XX XX 7 32 | 32 | 1 7 XX XX XX XX 33 | 33 | 2 XX 7 XX XX XX XX 34 | 34 |
| 1 6 XX XX XX XX 7 32 | 32 | 2 XX 7 XX XX XX 33 | 33 | 1 2 7 XX XX XX XX 34 | 34 |
| 2 XX 6 XX XX XX 7 32 | 32 | 1 2 7 XX XX XX 33 | 33 | 3 XX XX 7 XX XX XX 34 | 34 |
| 1 2 6 XX XX XX 7 32 | 32 | 3 XX XX 7 XX XX 33 | 33 | 1 3 XX 7 XX XX XX 34 | 34 |
| 3 XX XX 6 XX XX 7 32 | 32 | 1 3 XX 7 XX XX 33 | 33 | 2 XX 3 7 XX XX XX 34 | 34 |
| 1 3 XX 6 XX XX 7 32 | 32 | 2 XX 3 7 XX XX 33 | 33 | 1 2 3 7 XX XX XX 34 | 34 |
| 2 XX 3 6 XX XX 7 32 | 32 | 1 2 3 7 XX XX 33 | 33 | 4 XX XX XX 7 XX XX 34 | 34 |
| 1 2 3 6 XX XX 7 32 | 32 | 4 XX XX XX 7 XX 33 | 33 | 1 4 XX XX 7 XX XX 34 | 34 |
| 4 XX XX XX 6 XX 7 32 | 32 | 1 4 XX XX 7 XX 33 | 33 | 2 XX 4 XX 7 XX XX 34 | 34 |
| 1 4 XX XX 6 XX 7 32 | 32 | 2 XX 4 XX 7 XX 33 | 33 | 1 2 4 XX 7 XX XX 34 | 34 |
| 2 XX 4 XX 6 XX 7 32 | 32 | 1 2 4 XX 7 XX 33 | 33 | 3 XX XX 4 7 XX XX 34 | 34 |
| 1 2 4 XX 6 XX 7 32 | 32 | 3 XX XX 4 7 XX 33 | 33 | 1 3 XX 4 7 XX XX 34 | 34 |
| 3 XX XX 4 6 XX 7 32 | 32 | 1 3 XX 4 7 XX 33 | 33 | 2 XX 3 4 7 XX XX 34 | 34 |
| 1 3 XX 4 6 XX 7 32 | 32 | 2 XX 3 4 7 XX 33 | 33 | 1 2 3 4 7 XX XX 34 | 34 |
| 2 XX 3 4 6 XX 7 32 | 32 | 1 2 3 4 7 XX 33 | 33 | 5 XX XX XX XX 7 XX 34 | 34 |
| 1 2 3 4 6 XX 7 32 | 32 | 5 XX XX XX XX 7 33 | 33 | 1 5 XX XX XX 7 XX 34 | 34 |
| 5 XX XX XX XX 6 7 32 | 32 | 1 5 XX XX XX 7 33 | 33 | 2 XX 5 XX XX 7 XX 34 | 34 |
| 1 5 XX XX XX 6 7 32 | 32 | 2 XX 5 XX XX 7 33 | 33 | 1 2 5 XX XX 7 XX 34 | 34 |
| 2 XX 5 XX XX 6 7 32 | 32 | 1 2 5 XX XX 7 33 | 33 | 3 XX XX 5 XX 7 XX 34 | 34 |
| 1 2 5 XX XX 6 7 32 | 32 | 3 XX XX 5 XX 7 33 | 33 | 1 3 XX 5 XX 7 XX 34 | 34 |
| 3 XX XX 5 XX 6 7 32 | 32 | 1 3 XX 5 XX 7 33 | 33 | 2 XX 3 5 XX 7 XX 34 | 34 |
| 1 3 XX 5 XX 6 7 32 | 32 | 2 XX 3 5 XX 7 33 | 33 | 1 2 3 5 XX 7 XX 34 | 34 |
| 2 XX 3 5 XX 6 7 32 | 32 | 1 2 3 5 XX 7 33 | 33 | 4 XX XX XX 5 7 XX 34 | 34 |
| 1 2 3 5 XX 6 7 32 | 32 | 4 XX XX XX 5 7 33 | 33 | 1 4 XX XX 5 7 XX 34 | 34 |
| 4 XX XX XX 5 6 7 32 | 32 | 1 4 XX XX 5 7 33 | 33 | 2 XX 4 XX 5 7 XX 34 | 34 |
| 1 4 XX XX 5 6 7 32 | 32 | 2 XX 4 XX 5 7 33 | 33 | 1 2 4 XX 5 7 XX 34 | 34 |
| 2 XX 4 XX 5 6 7 32 | 32 | 1 2 4 XX 5 7 33 | 33 | 3 XX XX 4 5 7 XX 34 | 34 |
| 1 2 4 XX 5 6 7 32 | 32 | 3 XX XX 4 5 7 33 | 33 | 1 3 XX 4 5 7 XX 34 | 34 |
| 3 XX XX 4 5 6 7 32 | 32 | 1 3 XX 4 5 7 33 | 33 | 2 XX 3 4 5 7 XX 34 | 34 |
| 1 3 XX 4 5 6 7 32 | 32 | 2 XX 3 4 5 7 33 | 33 | 1 2 3 4 5 7 XX 34 | 34 |
| 2 XX 3 4 5 6 7 32 | 32 | 1 2 3 4 5 7 33 | 33 | 6 XX XX XX XX XX 7 34 | 34 |
| 1 2 3 4 5 6 7 32 | 32 | 6 XX XX XX XX XX 7 33 | 33 | 1 6 XX XX XX XX 7 34 | 34 |
| 6 XX XX XX XX XX 33 XX | 33 | 1 6 XX XX XX XX 7 33 | 33 | 2 XX 6 XX XX XX 7 34 | 34 |
| 1 6 XX XX XX XX 33 XX | 33 | 2 XX 6 XX XX XX 7 33 | 33 | 1 2 6 XX XX XX 7 34 | 34 |
| 2 XX 6 XX XX XX 33 XX | 33 | 1 2 6 XX XX XX 7 33 | 33 | 3 XX XX 6 XX XX 7 34 | 34 |
| 1 2 6 XX XX XX 33 XX | 33 | 3 XX XX 6 XX XX 7 33 | 33 | 1 3 XX 6 XX XX 7 34 | 34 |
| 3 XX XX 6 XX XX 33 XX | 33 | 1 3 XX 6 XX XX 7 33 | 33 | 2 XX 3 6 XX XX 7 34 | 34 |
| 1 3 XX 6 XX XX 33 XX | 33 | 2 XX 3 6 XX XX 7 33 | 33 | 1 2 3 6 XX XX 7 34 | 34 |
| 2 XX 3 6 XX XX 33 XX | 33 | 1 2 3 6 XX XX 7 33 | 33 | 4 XX XX XX 6 XX 7 34 | 34 |
| 1 2 3 6 XX XX 33 XX | 33 | 4 XX XX XX 6 XX 7 33 | 33 | 1 4 XX XX 6 XX 7 34 | 34 |
| 4 XX XX XX 6 XX 33 XX | 33 | 1 4 XX XX 6 XX 7 33 | 33 | 2 XX 4 XX 6 XX 7 34 | 34 |
| 1 4 XX XX 6 XX 33 XX | 33 | 2 XX 4 XX 6 XX 7 33 | 33 | 1 2 4 XX 6 XX 7 34 | 34 |
| 2 XX 4 XX 6 XX 33 XX | 33 | 1 2 4 XX 6 XX 7 33 | 33 | 3 XX XX 4 6 XX 7 34 | 34 |
| 1 2 4 XX 6 XX 33 XX | 33 | 3 XX XX 4 6 XX 7 33 | 33 | 1 3 XX 4 6 XX 7 34 | 34 |
| 3 XX XX 4 6 XX 33 XX | 33 | 1 3 XX 4 6 XX 7 33 | 33 | 2 XX 3 4 6 XX 7 34 | 34 |
| 1 3 XX 4 6 XX 33 XX | 33 | 2 XX 3 4 6 XX 7 33 | 33 | 1 2 3 4 6 XX 7 34 | 34 |
| 2 XX 3 4 6 XX 33 XX | 33 | 1 2 3 4 6 XX 7 33 | 33 | 5 XX XX XX XX 6 7 34 | 34 |
| 1 2 3 4 6 XX 33 XX | 33 | 5 XX XX XX XX 6 7 33 | 33 | 1 5 XX XX XX 6 7 34 | 34 |

| Inputs (from stagger position) | | | | | | | | Output | Inputs (from stagger position) | | | | | | | | Output | Inputs (from stagger position) | | | | | | | | Output |
|---|---|---|---|---|---|---|---|---|---|---|---|---|---|---|---|---|---|---|---|---|---|---|---|---|---|
| 0 | 1 | 2 | 3 | 4 | 5 | 6 | 7 | | 0 | 1 | 2 | 3 | 4 | 5 | 6 | 7 | | 0 | 1 | 2 | 3 | 4 | 5 | 6 | 7 | |
| 2 | XX | 5 | XX | XX | 6 | 7 | 34 | 34 | | | | | | | | | | | | | | | | | | |
| 1 | 2 | 5 | XX | XX | 6 | 7 | 34 | 34 | | | | | | | | | | | | | | | | | | |
| 3 | XX | XX | 5 | XX | 6 | 7 | 34 | 34 | | | | | | | | | | | | | | | | | | |
| 1 | 3 | XX | 5 | XX | 6 | 7 | 34 | 34 | | | | | | | | | | | | | | | | | | |
| 2 | XX | 3 | 5 | XX | 6 | 7 | 34 | 34 | | | | | | | | | | | | | | | | | | |
| 1 | 2· | 3 | 5 | XX | 6 | 7 | 34 | 34 | | | | | | | | | | | | | | | | | | |
| 4 | XX | XX | XX | 5 | 6 | 7 | 34 | 34 | | | | | | | | | | | | | | | | | | |
| 1 | 4 | XX | XX | 5 | 6 | 7 | 34 | 34 | | | | | | | | | | | | | | | | | | |
| 2 | XX | 4 | XX | 5 | 6 | 7 | 34 | 34 | | | | | | | | | | | | | | | | | | |
| 1 | 2 | 4 | XX | 5 | 6 | 7 | 34 | 34 | | | | | | | | | | | | | | | | | | |
| 3 | XX | XX | 4 | 5 | 6 | 7 | 34 | 34 | | | | | | | | | | | | | | | | | | |
| 1 | 3 | XX | 4 | 5 | 6 | 7 | 34 | 34 | | | | | | | | | | | | | | | | | | |
| 2 | XX | 3 | 4 | 5 | 6 | 7 | 34 | 34 | | | | | | | | | | | | | | | | | | |
| 1 | 2 | 3 | 4 | 5 | 6 | 7 | 34 | 34 | | | | | | | | | | | | | | | | | | |

81

82

We claim:

1. A method, performed in a digital processor, for building a text compression engine based on a predetermined encoding regime using n-bit code digits, comprising the steps of:

receiving a text string corresponding to a text database;

parsing the text string into a sequence of substring tokens; producing a rank-order list of token types based on the relative frequency of occurrence of the tokens in the database, so parsed;

constructing an ordered set of N word-number mappers (WNMs), each WNM being characterized by an ordinal WNM number i in the range of 1 to N and a WNM size S(i), the WNM size being a nondecreasing function of the WNM number, the function being determined by a predetermined encoding regime; and assigning each token type to a particular WNM and assigning each token type a unique number in that token type's assigned WNM so that each token type has an associated pair of numbers, the first number corresponding to the WNM number of the assigned WNM, and the second number corresponding to the assigned number in the assigned WNM;

wherein a token whose token type is characterized by the first and second number j and k, when encoded according to the predetermined encoding regime, comprises the number j of n-bit code digits with (a) a dedicated bit in each code digit being reserved to provide information permitting a determination of the number of code digits in a given encoded token by testing the dedicated bit in each of a string of code digits containing the given encoded token, and (b) the remaining (n−1)*j bits of the j code digits providing a binary representation of the number k.

2. The method of claim 1 wherein:

the S(1) most frequently occurring token types are assigned to the first WNM; and the S(2) next most frequently occurring token types are assigned to the second WNM.

3. The method of claim 1 wherein the maximum size of the WNM having ordinal number i is $2^{(n-1)*i}$.

4. A method, performed in a digital processor, for compressing an input text string used n-bit code digits comprising the steps of:

providing an ordered set of N word-number mappers (WNMs), each WNM being characterized by an ordinal WNM number i in the range of 1 to N and a WNM size S(i), the maximum size of the WNM having ordinal number i being $2^{(n-1)*i}$;

the set of WNMs providing a unique number pair for each of a set of token types, the first number corresponding to a WNM number, and the second number corresponding to a number in the WNM;

parsing the unput text string into a sequence of sub-string tokens;

for each token, so parsed, determining the number pair, designated j and k, for that token's token type; and for each token, so parsed, for which the number pair can be determined, encoding that token according to the number pair, so determined, so that the encoded token comprises the number j of n-bit code digits with (a) a dedicated bit in each code digit being reserved to provide information permitting a determination of the number of code digits in a given encoded token by testing the dedicated bit in each of a string of code digits containing the given encoded token, and (b) the remaining (n−1)*j bits of the j code digits providing a binary representation of the number k.

5. The method of claim 4 wherein:

the WNMs are constructed from a text database;

the S(1) most frequently occurring token types in the text database are assigned to the first WNM; and the S(2) next most frequently occurring token types in the text database are assigned to the second WNM.

6. The method of claim 4 wherein:

the reserved bit for each particular n-bit code digit in an encoded token is used to signify whether the particular code digit is the final code digit in the encoded token; and the maximum size of the WNM having ordinal number i is $2^{(n-1)*i}$.

7. The method of claim 4 wherein at least one of the WNMs includes a set of sub-word tokens for encoding, as a series of encoded sub-word tokens, a token having a token type that is not present in any of the WNMs.

8. The method of claim 7 wherein the set of sub-word tokens includes individual characters.

9. The method of claim 4 wherein at least one of the WNMs includes a set of sub-word tokens, and further comprising the steps, carried out before said encoding step only if a token is encountered whose number pair cannot be determined, of:

breaking the token into a series of sub-word tokens; and subjecting each sub-word token in the series to said determining and encoding steps.

10. A method, performed in a digital processor, for compressing an input text string comprising the steps of:

providing an ordered set of N word-number mappers (WNMs), each WNM being characterized by an ordinal WNM number i in the range of 1 to N and a WNM size S(i), the WNM size being a nondecreasing function of the WNM number, the function being determined by a predetermined encoding regime;

the set of WNMs providing a unique number pair for each of a set of token types including a set of sub-word token types, the first number corresponding to a WNM number, and the second number corresponding to a number in the WNM;

parsing the input text string into a sequence of sub-string tokens;

for each token, so parsed, determining the number pair, designated j and k, for that token's token type; and for each token, so parsed, for which the number pair can be determined, encoding that token according to the number pair, so determined, so that the encoded token comprises the number j of n-bit code digits with (a) a dedicated bit in each code digit being reserved to provide information permitting a determination of the number of code digits in a given encoded token by testing the dedicated bit in each of a string of code digits containing the given encoded token, and (b) the remaining (n−1)*j bits of the j code digits providing a binary representation of the number k; and for each token, so parsed, for which the number pair cannot be determined, breaking the token into a series of sub-word tokens, and subjecting each sub-word token to said determining and encoding steps.

11. The method of claim 1 wherein:

the WNMs are constructed from a text database;

the S(1) most frequently occurring token types in the text database are assigned to the first WNM; and the S(2) next most frequently occurring token types in the text database are assigned to the second WNM.

12. The method of claim 10 wherein the maximum size of the WNM having ordinal number i is $2^{(n-1)*i}$.

13. The method of claim 10 wherein:

the reserved bit for each particular n-bit code digit in an encoded token is used to signify whether the particular code digit is the final code digit in the encoded token; and the maximum size of the WNM having ordinal number i is $2^{(n-1)*i}$.

14. The method of claim 10 wherein the set of sub-word tokens includes individual characters.

15. A method, performed in a digital processor, for providing a compressed text database comprising the steps of:

receiving a text string corresponding to the text database;

parsing the text string into a sequence of substring tokens;

producing a rank-order list of token types based on the relative frequency of occurrence of the tokens in the database, so parsed;

construct an ordered set of N word-number mappers (WNMs), each WNM being characterized by an ordinal WNM number i in the range of 1 to N and a WNM size S(i), the WNM size being a nondecreasing function of the WNM number, the function being determined by a predetermined encoding regime; and assigning each token type to a particular WNM and assigning each token a unique number in that token's assigned WNM so that each token type has an associated pair of numbers, the first number corresponding to the WNM number of the assigned WNM, and the second number corresponding to the assigned number in the assigned WNM;

for each token in the text database, determining the number pair, designated j and k, for that token's token type; and for each token, encoding that token comprises the token's number pair so that the encoded token according to that number j of n-bit code digits with (a) a dedicated bit in each code digit being reserved to provide information permitting a determination of the number of code digits in a given encoded token by testing the dedicated bit in each of a string of code digits containing the given encoded token, and (b) the remaining $(n-1)*j$ bits of the j code digits providing a binary representation of the number k;

concatenating the tokens, so encoded, to define the compressed text database.

16. The method of claim 15 wherein:
the S(1) most frequently occurring tokens are assigned to the first WNM; and
the S(2) next most frequently occurring tokens are assigned to the second WNM.

17. The method of claim 15 wherein the maximum size of the WNM having ordinal number i is $2^{(n-1)*i}$.

18. The method of claim 15 wherein:
the reserved bit for each particular n-bit code digit in an encoded token is used to signify whether the particular code digit is the final code digit in the encoded token; and
the maximum size of the WNM having ordinal number i is $2^{(n-1)*i}$.

19. The method of claim 1 wherein:
the reserved bit for each particular n-bit code digit in an encoded token is used to signify whether the particular code digit is the final code digit in the encoded token; and
the maximum size of the WNM having ordinal number i is $2^{(n-1)*i}$.

20. The method of claim 1, and further including the steps of:
defining a number of sub-word tokens for encoding, as a series of encoded sub-word tokens, a token having a token type that is not present in any of the WNMs; and
assigning the set of sub-word tokens to at least one of the WNMs.

21. The method of claim 20 wherein the set of sub-word tokens includes individual characters.

* * * * *

UNITED STATES PATENT AND TRADEMARK OFFICE
CERTIFICATE OF CORRECTION

PATENT NO. : 5,325,091

DATED : June 28, 1994

INVENTOR(S) : Ronald M. Kaplan, et al

It is certified that error appears in the above-identified patent and that said Letters Patent is hereby corrected as shown below:

The appendices which begin at Columns 11-12 should be deleted and substituted with the appendices A and B therefor, as shown on the attached pages.

Signed and Sealed this

Third Day of January, 1995

*Attest:*

BRUCE LEHMAN

*Attesting Officer*   Commissioner of Patents and Trademarks

First list of 8 words

_. ↑
_, '
(, -
↑, -
the -
and
of
in

Second list of 64 words

_, the
_, and
_, ↑
_ ' -
_ .
_. ↑ in
_. ↑ it
_. ↑ he
_. ↑ the
_ ) -
_ ). ↑
_ ),
_ }
_ ;
_ | ↑ _
_ , -
_ ' s -
a
an
and the
after
also
are
at
as
be
became
by
by the
but
century
city
first
from
for
his
has
he
in the it
its
is
new
of the
or
on
states
see
that
they
to
to the
which
war
was
with
were
{ ↑
↑ ↑ ‾
( _
,
us Third list of 512 words 0
000
1
1945
1980
19th
18th
10
15
12
_-), ↑ ↑
_ - -
_ - ↑ ‾
_, he ‾
_ '  "
_. ↑ his
_. ↑ a
_. ↑
_. |\\ ↑ ‾
_. | ↑ ‾
_. | ↑ ‾
_." ↑ ‾
_. (_
_. '
_) and
_), ↑
_); ↑ ↑
_);

_);
_)| ↑ _
_).↑
_),↑
_'s ↑
_"
_" (_
_† ↑ _
_@ _
_@ ↑
_: s _
_: ↑
_,↑
_%
about
against
agricultural
agriculture
age
although
along
all
among
ancient
another
any
approx
architecture
area
areas
around
army
art
as a
act
air
ad
b
base
based
battle
back
bay
because
between
before
began
best
been
being
black
blood
blue book
body
both
brought
brown
built
c
catholic
caused
capital
called
came
can
centuries
central
center
chief
china
chemical
chemicals
church
civil
cities
co
college
color
commercial
communist
common
congress
constitution
considered
control
country
court
coast
d
de
developed
development
defeated
death
discovered
disease
divided
died
dynasty
during
day
e
earth
early
each
east economic
economy
education
elected
elements
emperor
empire
energy
end
especially
established
events
f
family
famous
father
federal
field
fish
five
flowers
flows
foreign
form
formed
forms
force
forces
found
founded
four
food
french
free
fromthe
general
generally
government
governor
gold
god
great
green
group
groups
have
had
he was
head
height
held
her
high
highest history
him
however
house
human
i
important
inc
include
included
includes
including
income
industrial
industries
industry
independence
independent
indian
influence
influenced
international
into
island
islands
it is
iron
if
joined
king
kingdom
known
km
language
land
large
largest
late
later
labor
law
laws
lake
last
leader
leaves
length
legs
led
literature
life
light
line
major man
many
mass
made
main
may
member
members
mi
middle
minister
military
mountain
modern
movement
more
most
music
much
n
natural
nation
national
nations
native
name
named
no
north
northern
not
noted
now
number
near
ocean
off
official
of a
often
on the
only
one
order
own
out
other
old
oil
over
parliament
part
parts
party painter
per
period
people
peace
philosophy
poet
poetry
pop
popular
population
political
point
power
port
president
principal
prize
prime
product
products
produced
processing
published
public
plant
plants
r
region
religion
religious
republic
revolution
red
rights
river
rivers
rule
ruled
s
science
school
se
second
served
series
set
settled
senate
several
sea
seat
shaped
shall short
she
since
site
small
so
society
social
source
south
soviet
some
son
study
strong
steel
style
state
supreme
surface
sugar
such
system
species
same
sq
technology
territory
term
textiles
their
theory
there
these
then
them
through
throughout
three
those
than
this
took
town
trade
trading
treaty
tree
tropical
time
times
two
tail
university united
union
until
under
usually
use
used
up
v
various
west
western
weight
well
where
when
while
white
who
whose
william
with the
within
world
work
works
would
won
wrote
water
yellow
year
years
France
Roman
Rome
RAnge
Russia
Russian
Canada
Charles
Christian
Chinese
Louis
LOng
Pacific
Paris
Mexico
NW
Ne
Africa
African
America
American Atlantic
Asia
India
Indians
Italian
Italy
II
III
German
Germany
George
Greek
Spanish
Spain
SW
St
Britain
British
B C
Thomas
Egypt
England
English
Europe
European
Japan
Japanese
James
John
York
@ ↑ _
¨f
¨g
{
U͞SSR
↑ _
He͞nry
. ↑
( ↑ _
" ↑ _
" ↑ _
W⁻
8
2
20
3
30
x
6
5
4
7

*File created:* 16-Aug-92 21:54:25 NIL

*Read Table:* INTERLISP

*Package:* INTERLISP

```
;;
   Copyright (c) 1992 by Xerox Corporation.  All rights reserved.

(RPAQQ FULLTEXTCOMS
       ([VARS (ALPHANUMERICS (APPEND (FOR I FROM (CHARCODE A)
                                         TO
                                         (CHARCODE Z)
                                         COLLECT I)
                                    (FOR I FROM (CHARCODE a)
                                         TO
                                         (CHARCODE z)
                                         COLLECT I)
                                    (FOR I FROM (CHARCODE 0)
                                         TO
                                         (CHARCODE 9)
                                         COLLECT I]
        (FNS COMPRESS-TEXT)
        (FNS TOKENIZE MAKECHARTABLE READUNTILCHARTABLE)
        (FNS RANKLIST)
        (FNS MAKE-WNMAPPERS)
        (FNS ENCODE-TEXT ENCODE-STRING WRITE-STRING-ENCODING)
        (FNS DECOMPRESS-TEXT PRINT-STRING READ-TOKEN)
        (FNS SEARCHTEXT)
        (MACROS BOUTBITSCONTEXT BOUTBITS)
        (MACROS BINBITSCONTEXT BINBITS GETBINBITSSTATE SETBINBITSSTATE)))

(RPAQ ALPHANUMERICS
      (APPEND (FOR I FROM (CHARCODE A)
                   TO
                   (CHARCODE Z)
                   COLLECT I)
              (FOR I FROM (CHARCODE a)
                   TO
                   (CHARCODE z)
                   COLLECT I)
              (FOR I FROM (CHARCODE 0)
                   TO
                   (CHARCODE 9)
                   COLLECT I)))
(DEFINEQ (COMPRESS-TEXT
  [LAMBDA (TEXTFILE MAPPERFILENAME COMPRESSEDFILENAME DIGITSPEC)
    (CL:UNLESS DIGITSPEC
        (SETQ DIGITSPEC '(4 4 4 4 4 4)))
    (RESETLST
       (LET (WNMAPPERFILE (DEFAULTSEPR '% )
             (CANCELDEFAULTSEPRCHAR '-)
             (CASESHIFT '-)
             (WORDCHARTABLE (MAKECHARTABLE ALPHANUMERICS 1)))
            (SETQ WNMAPPERFILE (MAKE-WNMAPPERS TEXTFILE MAPPERFILENAME DIGITSPEC DEFAULTSEPR
                                     CANCELDEFAULTSEPRCHAR CASESHIFT WORDCHARTABLE))
            (ENCODE-TEXT TEXTFILE WNMAPPERFILE COMPRESSEDFILENAME DIGITSPEC DEFAULTSEPR
                   CANCELDEFAULTSEPRCHAR CASESHIFT WORDCHARTABLE)))])
)

(DEFINEQ
```

{DSK}<project>dict>enc>FULLTEXT.NODATE;3

(TOKENIZE
  [LAMBDA (TEXTFILE DEFAULTSEPR WORDCHARTABLE CANCELSEPRCHAR CASESHIFT OUTPUTFN)

:: TEXT is divided into an alternative sequence of word (as defined in WORDBITTABLE) and punctua
    :: strings, with punctuation strings beginning with CANCELSEPRCHAR if they are not preceded by a
    :: DEFAULTSEPR and ending with CANCELSEPRCHAR if they are not followed by a DEFAULTSEPR. CASESH
    :: is used to indicate initial-caps and all upper-casing. OUTPUTFN is applied to resulting toke
    :: strings. WORDCHARTABLE is an array indexed by character codes whose values are 1 for every
    :: alphanumeric word character and 0 for punctuation and other non-word characters.

(RESETLST
      (BIND WORDSTRING PUNCTSTRING TEXTSTREAM UCASE (DEFAULTSEPRLENGTH ← (NCHARS DEFAULTSEPR))
        FIRST [RESETSAVE (SETQ TEXTSTREAM (OPENSTREAM TEXTFILE 'INPUT))
                        '(PROGN (CLOSEF OLDVALUE]
        DO (SETQ PUNCTSTRING (READUNTILCHARTABLE TEXTSTREAM WORDCHARTABLE 1))
           (SETQ WORDSTRING (READUNTILCHARTABLE TEXTSTREAM WORDCHARTABLE 0))
           (IF (AND (EQ 0 (NCHARS PUNCTSTRING))
                    (EQ 0 (NCHARS WORDSTRING)))
               THEN                                     ; End of file
                    (RETURN))                           ; UCASE records case shift string
           (SETQ UCASE (IF (U-CASEP WORDSTRING)
                           THEN (SETQ WORDSTRING (L-CASE WORDSTRING))
                                (CONCAT CASESHIFT CASESHIFT)
                           ELSEIF (AND (U-CASEP (NTHCHAR WORDSTRING 1))
                                       (L-CASEP (SUBSTRING WORDSTRING 2 -1)))
                               THEN (SETQ WORDSTRING (L-CASE WORDSTRING))
                                    CASESHIFT
                           ELSE ""))
           (SETQ PUNCTSTRING (IF (STRPOS DEFAULTSEPR PUNCTSTRING 1 NIL T)
                                 THEN
                                      :: Punct begins with sepr. strip it off
                                      (OR (SUBSTRING PUNCTSTRING (ADD1 DEFAULTSEPRLENGTH)
                                                     -1)
                                          "")
                                 ELSE (CONCAT CANCELSEPRCHAR PUNCTSTRING)))
           (SETQ PUNCTSTRING (IF (EQ 0 (NCHARS PUNCTSTRING))
                                 THEN (IF (NEQ 0 (NCHARS UCASE))
                                          THEN           ; Punct was originally just a sepr
                                               (CONCAT UCASE CANCELSEPRCHAR)
                                          ELSE "")
                                 ELSEIF (STRPOS DEFAULTSEPR PUNCTSTRING NIL NIL NIL NIL NIL T)
                                 THEN                    ; Punct followed by defaultsepr
                                      (CONCAT (OR (SUBSTRING PUNCTSTRING DEFAULTSEPRLENGTH
                                                             (- -1 DEFAULTSEPRLENGTH))
                                                  "")
                                              UCASE)
                                 ELSE (CONCAT PUNCTSTRING UCASE CANCELSEPRCHAR)))
           (IF (NEQ 0 (NCHARS PUNCTSTRING))
               THEN (APPLY* OUTPUTFN PUNCTSTRING))
           (APPLY* OUTPUTFN WORDSTRING)))])

(MAKECHARTABLE
  [LAMBDA (CHARS VAL)

:: Makes an array with values corresponding to characters in CHARS set to VAL. all others elemer
    :: set to 0

(LET ((ARRAY (CL:MAKE-ARRAY 256 :INITIAL-ELEMENT 0)))
         (FOR C IN CHARS DO (CL:SETF (CL:SVREF ARRAY (IF (LITATOM C)
                                                         THEN (CHCON1 C)
                                                         ELSE C))
                                     VAL))
         ARRAY])

(READUNTILCHARTABLE
  [LAMBDA (FILE CHARTABLE VAL)

:: Read characters from file until either the end of file is reached (PEEKC returns NIL) or until
    :: element in CHARTABLE corresponding to the next character is equal to VAL. The characters rea
    :: (not including the one with VAL) are assembled into the returned string.

(CONCATLIST (BIND CHAR WHILE (SETQ CHAR (PEEKCCODE FILE T)) UNTIL (EQ VAL (CL:SVREF CHARTABLE CHA
                COLLECT
                       :: Re-read CHAR as a character, not a code, for concatlist
                       (READC FILE])

{DSK}<project>dict>enc>FULLTEXT.NODATE:3

(DEFINEQ (RANKLIST
  [LAMBDA (TEXTFILE DEFAULTSEPR WORDCHARTABLE CANCELSEPRCHAR CASESHIFT)
    :: Returns a list in decreasing frequency order of all the token-types found in TEXTFILE. Value is a
    :: list of (string . frequency) pairs.
    (LET ((RANKARRAY (CL:MAKE-ARRAY 256 :INITIAL-ELEMENT NIL)))
                                                           ; Build an alist of (string freq) pairs in
                                                           ; arrays indexed by first 2 characters. Could
                                                           ; index by 3 or more characters for increased
                                                           ; speed at cost of more space.
      (DECLARE (SPECVARS RANKARRAY))
      [TOKENIZE TEXTFILE DEFAULTSEPR WORDCHARTABLE CANCELSEPRCHAR CASESHIFT
                (FUNCTION (LAMBDA (STRING)
                          (LET* ((FIRSTCHAR (NTHCHARCODE STRING 1))
                                 (SECONDCHAR (NTHCHARCODE STRING 2))
                                 SECELT)
                            :: SECELTs are of the form (ARRAY FREQ) where FREQ is the frequency of
                            :: the singleton FIRSTCHAR
                            [SETQ SECELT (OR (CL:SVREF RANKARRAY FIRSTCHAR)
                                             (CL:SETF (CL:SVREF RANKARRAY FIRSTCHAR)
                                                      (CONS (CL:MAKE-ARRAY 256 :INITIAL-ELEMENT NIL)
                                                            0]
                            (IF SECONDCHAR
                                THEN                    ; Build up alist in second-array cell
                                    (ADD [CDR (OR (SASSOC STRING (CL:SVREF (CAR SECELT)
                                                                        SECONDCHAR))
                                                 (CAR (CL:PUSH (CONS STRING 0)
                                                               (CL:SVREF (CAR SECELT)
                                                                         SECONDCHAR]
                                          1)
                                ELSE                    ; FIRSTCHAR singleton
                                    (ADD (CDR SECELT)
                                         1]
      :: Pull the results out of the array and arrange them in decreasing frequency order. Make sure
      :: that the DEFAULTSEPR is included, so that it eventually gets assigned a number.
      (SORT [CONS (CONS DEFAULTSEPR 0)
                  (FOR FIRSTCHAR SECELT FROM 0 TO 255 WHEN (SETQ SECELT (CL:SVREF RANKARRAY
                                                                                 FIRSTCHAR))
                       JOIN (NCONC [IF (NEQ 0 (CDR SECELT))
                                     THEN (CONS (CONS (MKSTRING (CHARACTER FIRSTCHAR))
                                                      (CDR SECELT]
                                 (FOR SECONDCHAR FROM 0 TO 255 JOIN (CL:SVREF (CAR SECELT)
                                                                          SECONDCHAR]
            (FUNCTION (LAMBDA (A B)
                      (IGEQ (CDR A)
                            (CDR B])
)

(DEFINEQ (MAKE-WNMAPPERS
  [LAMBDA (TEXTFILE MAPPERFILENAME DIGITSPEC DEFAULTSEPR CANCELDEFAULTSEPRCHAR CASESHIFT WORDCHARTABLE)
    :: TEXTFILE is the textfile to be compressed. MAPPERFILENAME is the name of the word-number mapper
    :: file to be produced. DIGITSPEC is a list of the digit sizes to be used for the encoding (e.g. (4
    :: 4 4), (8 8 8), (4 8 8) etc.
    (DECLARE (GLOBALVARS ALPHANUMERICS))
    (LET [FSMS RANKS (DEFAULTSEPR '% )
          (CANCELDEFAULTSEPRCHAR '-)
          (CASESHIFT '↑)
          (WORDCHARTABLE (MAKECHARTABLE ALPHANUMERICS 1))
          (WNMSIZE (FOR SPEC (SHIFT ← 0) IN DIGITSPEC COLLECT
                                                           :: SUB1 because one bit is for
                                                           :: continuation
                                                           (LLSH 1 (SETQ SHIFT (IPLUS SHIFT
                                                                                       (SUB1 SPEC]
          (SETQ RANKS (RANKLIST TEXTFILE DEFAULTSEPR WORDCHARTABLE CANCELDEFAULTSEPRCHAR CASESHIFT))

{DSK}<project>dict>enc>FULLTEXT.NODATE:3   (MAKE-WNMAPPERS cont.)

```
        ;; Now partition the strings in RANKS into subsets of the appropriate size for the different
        ;; word-number mappers.
        [SETQ FSMS (FOR SPEC IN WNMSIZE WHILE RANKS
                        COLLECT (FOR I (FSM ← (NULLFSM)) FROM 1 TO SPEC WHILE RANKS
                                    DO (ADDSTRINGTOFSM (CAR (POP RANKS))
                                                        FSM)
                                    FINALLY (RETURN FSM]
        ;; Convert the fsms to compact word-number mappers stored on MAPPERFILENAME for future use.
        (WRITE-WORDNUMBER-MAPPERS FSMS MAPPERFILENAME])
)

(DEFINEQ (ENCODE-TEXT
  [LAMBDA (TEXTFILE MAPPERFILENAME COMPRESSEDFILENAME DIGITSPEC DEFAULTSEPR CANCELSEPRCHAR CASESHIFT
                WORDCHARTABLE)
    (DECLARE (SPECVARS DIGITSPEC))
    (RESETLST
        (LET (COMPRESSEDSTREAM (WNMAPPERS (READ-WORDNUMBER-MAPPERS MAPPERFILENAME)))
            (DECLARE (SPECVARS COMPRESSEDSTREAM WORDMAPPERS))
            ;; Truncate digit spec to the actual maximum needed
            (SETQ DIGITSPEC (FOR D IN DIGITSPEC AS I IN WNMAPPERS COLLECT D))
            [RESETSAVE [SETQ COMPRESSEDSTREAM (OPENSTREAM COMPRESSEDFILENAME 'OUTPUT 'NEW
                                                            '((TYPE BINARY]
                        '(PROGN (CLOSEF? OLDVALUE)
                                (AND RESETSTATE (DELFILE OLDVALUE]
            ;; BOUTBITSCONTEXT keeps track of stream state so that partial bytes are properly written
            ;; (via BOUTBITS in WRITE-STRING-ENCODING)
            (BOUTBITSCONTEXT COMPRESSEDSTREAM (TOKENIZE TEXTFILE DEFAULTSEPR WORDCHARTABLE
                                                        CANCELSEPRCHAR CASESHIFT (FUNCTION
                                                                                    WRITE-STRING-ENCODING))
                              (FULLNAME COMPRESSEDSTREAM)))])

(ENCODE-STRING
  [LAMBDA (STRING DIGITSPEC WNMAPPERS)
    ;; Returns the encoding of string as a list of pairs of the form (digitval digitwidth), where
    ;; digitval has the continuation bit orred in and is supposed to occupy a field of digitwidth bits.
    (LET [(WNPAIR (FOR W NUM IN WNMAPPERS AS I FROM 0 WHEN (SETQ NUM (GetNumberForWord STRING W))
                       DO (RETURN (LIST NUM I]
        (IF WNPAIR
            THEN (FOR D CONTIN (NUM ← (CAR WNPAIR))
                        (LEFTPOS ← (FOR I FROM 0 TO (CADR WNPAIR) AS D IN DIGITSPEC
                                      SUM (SUB1 D)))
                        IN DIGITSPEC AS I FROM 0 TO (CADR WNPAIR)
                        COLLECT (SETQ CONTIN (IF (EQ I (CADR WNPAIR))
                                                THEN 0
                                                ELSE 1))
                                (SETQ LEFTPOS (- LEFTPOS (SUB1 D)))
                                (LIST (LOGOR (LLSH CONTIN (SUB1 D))
                                              (LOGAND (MASK.1'S 0 (SUB1 D))
                                                      (LRSH NUM LEFTPOS)))
                                      D])

(WRITE-STRING-ENCODING
  [LAMBDA (STRING)
    (DECLARE (USEDFREE DIGITSPEC WNMAPPERS COMPRESSEDSTREAM))
    (FOR E IN (ENCODE-STRING STRING DIGITSPEC WNMAPPERS) DO (BOUTBITS COMPRESSEDSTREAM (CAR E)
                                                                        (CADR E])
)

(DEFINEQ
```

{DSK}<project>dict>enc>FULLTEXT.NODATE:3  (BOUTBITS cont.)

```
                            BITS))
)

(DECLARE%: EVAL@COMPILE (PUTPROPS BINBITSCONTEXT MACRO ((FIRST . REST)
                                (LET ((UNREADBITSINBYTE 0)
                                      (BITSFROMBYTE 0))
                                     (DECLARE (SPECVARS UNREADBITSINBYTE BITSFROMBYTE))
                                     (PROGN FIRST . REST))))

(PUTPROPS BINBITS MACRO [OPENLAMBDA (STREAM NBITS)
                        (BIND (BITSREAD ← 0)
                              (NBITSTOREAD ← NBITS) DO (COND
                                        ((IGEQ UNREADBITSINBYTE NBITSTOREAD)
                                        ; Don't need to read next byte
                                          (SETQ UNREADBITSINBYTE (IDIFFERENCE
                                                                    UNREADBITSINBYT
                                                                    NBITSTOREAD))
                                          (SETQ BITSREAD (CL:LOGIOR (CL:ASH BITSREAD NBITSTOREA
                                                                            )
                                                                    (LRSH BITSFROMBYTE
                                                                          UNREADBITSINBYT
                                                                          )))
                                          (SETQ BITSFROMBYTE (LOGAND BITSFROMBYTE
                                                                     (MASK.1'S 0
                                                                               UNREADBITSINBYT
                                                                               )))
                                          (RETURN BITSREAD)))
                                        :: Have to read more. first take the remaining
                                        :: bits from last byte
                                        (SETQ BITSREAD (CL:LOGIOR (CL:ASH BITSREAD
                                                                          UNREADBITSINBYT
                                                                          )
                                                                  BITSFROMBYTE))
                                        (SETQ NBITSTOREAD (- NBITSTOREAD
                                                             UNREADBITSINBYTE))
                                        (SETQ UNREADBITSINBYTE 8)
                                        (SETQ BITSFROMBYTE (BIN STREAM]

(PUTPROPS GETBINBITSSTATE MACRO ((STREAM)

;; Returns current bin-bits state. which can be restored by
                        ;; SETBINBITSSTATE. both of which must be executed under a
                        ;; BINBITSCONTEXT (LIST (GETFILEPTR STREAM)
                              UNREADBITSINBYTE BITSFROMBYTE)))

(PUTPROPS SETBINBITSSTATE MACRO ((STREAM STATE)

;; Makes the data in STATE become the current bin-bits state when
                        ;; executed inside a BINBITSCONTEXT.

(SETFILEPTR STREAM (CAR STATE))
                        (SETQ UNREADBITSINBYTE (CADR STATE))
                        (SETQ BITSFROMBYTE (CADDR STATE))))
)

(PUTPROPS FULLTEXT COPYRIGHT ("Xerox Corporation" 1992))
```

{DSK}<project>dict>enc>FULLTEXT.NODATE:3

```
(SEARCHTEXT
  [LAMBDA (WORD COMPRESSEDSTREAM WNMAPPERS DIGITSPEC)
    :: Scans forward for WORD in COMPRESSEDSTREAM, starting from current COMPRESSEDSTREAM position, whic
    :: is assumed to be at the beginning of a token. Returns the binbitsstate of the beginning of the
    :: match if it finds one, leaving stream positioned at the beginning of that token. Returns NIL on
    :: failure, leaving stream position unchanged. This is a very simple substring searching loop,
    :: converting to Knuth-Morris-Pratt or Boyer-Moore would presumably improve performance. Cannot be
    :: used to search for punctuation strings, since they have been modified in unknown ways for
    :: separator processing and case shifting. BINBITS machinery is used for processors that can only
    :: read a byte at a time when nibbles (or smaller) digits are specified--should be run under
    :: BINBITSCONTEXT.
    (IF [OR (U-CASEP WORD)
            (AND (U-CASEP (NTHCHAR WORD 1))
                 (L-CASEP (SUBSTRING WORD 2 -1]
      THEN
          :: All upper-case and initial-caps are encoded as lower case, since shifts are attached to
          :: preceding punctuation
          (SETQ WORD (L-CASE WORD)))
    (LET ((ENC (ENCODE-STRING WORD DIGITSPEC WNMAPPERS)))
      (IF ENC
        THEN (BIND BINBITSSTATE (STARTBINBITSSTATE ← (GETBINBITSSTATE COMPRESSEDSTREAM))
                DO (SETQ BINBITSSTATE (GETBINBITSSTATE COMPRESSEDSTREAM))
                   (IF [FOR E IN ENC ALWAYS (EQ (CAR E)
                                                (BINBITS COMPRESSEDSTREAM (CADR E]
                     THEN
                         :: Found a match
                         (SETBINBITSSTATE COMPRESSEDSTREAM BINBITSSTATE)
                         (RETURN BINBITSSTATE)
                     ELSE (SETBINBITSSTATE COMPRESSEDSTREAM BINBITSSTATE)

:: Skip a complete token by checking continuation bits. We wouldn't have
                          :: to bother with token-alignment if digits were all of the same size
                          :: (e.g. (4 4 4) but not (4 8 4))

[FOR D IN DIGITSPEC UNTIL (EQ 0 (LOGAND (BINBITS COMPRESSEDSTREAM D)
                                                                  (LLSH 1 (SUB1 D]
                   (IF (EOFP COMPRESSEDSTREAM)
                     THEN (SETBINBITSSTATE COMPRESSEDSTREAM STARTBINBITSSTATE)
                          (RETURN NIL])
)

(DECLARE%: EVAL@COMPILE (PUTPROPS BOUTBITSCONTEXT MACRO ((STREAM . FORMS)      : Open STREAM needed so can cleanup the last
                                                       : byte
                                 (LET ((NEMPTYBITSINBYTE 8)
                                       (BITSINBYTE 0))
                                   (DECLARE (SPECVARS NEMPTYBITSINBYTE BITSINBYTE))
                                   (PROGN . FORMS)
                                   (OR (EQ NEMPTYBITSINBYTE 8)
                                       (BOUT STREAM BITSINBYTE))
                                   STREAM)))

(PUTPROPS BOUTBITS MACRO (OPENLAMBDA (STREAM BITS NBITS)
                          (BIND (BITSREMAINING ← BITS)
                                (NBITSREMAINING ← NBITS)
                             DO (COND
                                  ((IGREATERP NEMPTYBITSINBYTE NBITSREMAINING)
                                                        : BITSREMAINING is less than 256
                                   (SETQ NEMPTYBITSINBYTE (IDIFFERENCE NEMPTYBITSINBYTE
                                                                       NBITSREMAINING))
                                   (SETQ BITSINBYTE (CL:LOGIOR BITSINBYTE (CL:ASH BITSREMAINING
                                                                                  NEMPTYBITSINBYTE)))
                                   (RETURN)))       : BITSREMAINING may be a bignum
                                [BOUT STREAM (CL:LOGIOR BITSINBYTE (CL:ASH BITSREMAINING
                                                                            (IMINUS (SETQ NBITSREMAINING
                                                                                          (IDIFFERENCE
                                                                                            NBITSREMAINING
                                                                                            NEMPTYBITSINBYTE
                                                                                            ]
                                (SETQ BITSREMAINING (LOGAND BITSREMAINING (- (CL:ASH 1 NBITSREMAINING)
                                                                              1)))
                                (SETQ BITSINBYTE 0)
                                (SETQ NEMPTYBITSINBYTE 8))
```

{DSK}<project>dict>enc>FULLTEXT.NODATE;3

(DECOMPRESS-TEXT
  [LAMBDA (COMPRESSEDFILE WNMAPPERFILES DECOMPRESSEDFILE DIGITSPEC)
    :: Decompresses the tokens encoded in COMPRESSEDFILE, writing the results on DECOMPRESSEDFILE.
    (RESETLST
        (LET (DECSTREAM COMPSTREAM (WNMAPPERS (READ-WORDNUMBER-MAPPERS WNMAPPERFILES))
                    (DEFAULTSEPR '% )
                    (CANCELDEFAULTSEPRCHAR '~)
                    (CASESHIFT '↑))
            [RESETSAVE [SETQ COMPSTREAM (OPENSTREAM COMPRESSEDFILE 'INPUT 'OLD '((TYPE BINARY]
                    '(PROGN (CLOSEF OLDVALUE]
            [RESETSAVE [SETQ DECSTREAM (OPENSTREAM DECOMPRESSEDFILE 'OUTPUT 'NEW '((TYPE TEXT]
                    '(PROGN (CLOSEF OLDVALUE)
                            (AND RESETSTATE (DELFILE OLDVALUE]
            [BINBITSCONTEXT (BIND STRING WHATNEXT (LASTSTRING ← "") UNTIL (EOFP COMPSTREAM)
                    DO                              ; Compute the next token number and its
                                                    ; corresponding word-number mapper number
                            (SETQ WHATNEXT (PRINT-STRING (READ-TOKEN WNMAPPERS DIGITSPEC
                                                                COMPSTREAM)
                                                WHATNEXT DEFAULTSEPR CANCELDEFAULTSEPRCHAR
                                                CASESHIFT DECSTREAM]
            (FULLNAME DECSTREAM)))])

(PRINT-STRING
  [LAMBDA (STRING WHATNEXT DEFAULTSEPR CANCELSEPR CASESHIFT DESTINATION)
    :: This is a simple string-printer, except that it puts a DEFAULTSEPR before the string if WHATNEXT
    :: contains SEPR and it doesn't begin with CANCELSEPR. Alls capitalizes or upper-cases if WHATNEXT
    :: contains INITIALCAP or ALLCAPS. It returns the WHATNEXT for the next word depending on whether
    :: this word ends with CANCELSEPR and whether it contains CASESHIFT's to affect the next word.
    (LET (NEXT FIRSTCHAR LASTCHAR)
        (SETQ FIRSTCHAR (IF (EQ CANCELSEPR (NTHCHAR STRING 1))
                            THEN 2
                            ELSE (IF (MEMB 'SEPR WHATNEXT)
                                    THEN (PRIN3 DEFAULTSEPR DESTINATION))
                                1))
        (SETQ LASTCHAR (IF (EQ CANCELSEPR (NTHCHAR STRING -1))
                            THEN (SETQ NEXT NIL)
                                (SUB1 (NCHARS STRING))
                            ELSE (SETQ NEXT '(SEPR))
                                (NCHARS STRING)))
        (IF (NEQ CASESHIFT (NTHCHAR STRING LASTCHAR))
            ELSEIF (EQ CASESHIFT (NTHCHAR STRING (SUB1 LASTCHAR)))
                THEN (PUSH NEXT 'ALLCAPS)
                    (SETQ LASTCHAR (- LASTCHAR 2))
            ELSE (PUSH NEXT 'INITIALCAP)
                (SETQ LASTCHAR (- LASTCHAR 1)))
        (IF (MEMB 'ALLCAPS WHATNEXT)
            THEN (SETQ STRING (U-CASE STRING))
            ELSEIF (MEMB 'INITIALCAP WHATNEXT)
                THEN (SETQ STRING (L-CASE STRING T)))
        (FOR I FROM FIRSTCHAR TO LASTCHAR DO (PRINTCCODE (NTHCHARCODE STRING I)
                                                    DESTINATION))
        NEXT])

(READ-TOKEN
  [LAMBDA (WNMAPPERS DIGITSPEC COMPSTREAM)
    (FOR D NEXT (TOKEN ← 0)
        (CONTIN ← T)
        (WNMAPNUM ← 0) IN DIGITSPEC WHILE CONTIN DO (ADD WNMAPNUM 1)
                                                (SETQ NEXT (BINBITS COMPSTREAM D))
                                                [SETQ CONTIN (NEQ 0 (LOGAND NEXT
                                                                    (LLSH 1 (SUB1 D]
                                                [SETQ TOKEN (LOGOR (LLSH TOKEN (SUB1 D))
                                                                (LOGAND NEXT (MASK.1'S
                                                                        0
                                                                        (SUB1 D]
        FINALLY (RETURN (GetWordForNumber TOKEN (CAR (NTH WNMAPPERS WNMAPNUM])
)

(DEFINEQ

UNITED STATES PATENT AND TRADEMARK OFFICE
CERTIFICATE OF CORRECTION

PATENT NO. : 5,325,091

DATED : June 28, 1994

INVENTOR(S) : Ronald M. Kaplan, et al.

It is certified that error appears in the above-identified patent and that said Letters Patent is hereby corrected as shown below:

On the face page of the above-identified issued patent, please insert, at "[56]," the following list of references:

U.S. PATENT DOCUMENTS

| | | | |
|---|---|---|---|
| 4,560,976 | 12/24/85 | Finn | 340/347 |
| 4,562,423 | 12/31/85 | Humblet | 340/347 |
| 4,701,744 | 10/20/87 | DeVilbiss | 340/347 |
| 4,843,389 | 06/27/89 | Lisle et al. | 341/106 |
| 4,862,167 | 08/29/89 | Copeland, III | 341/107 |

Signed and Sealed this

Twentieth Day of June, 1995

Attest:

BRUCE LEHMAN

*Attesting Officer*   *Commissioner of Patents and Trademarks*